United States Patent
Cha et al.

(10) Patent No.: US 11,251,377 B2
(45) Date of Patent: Feb. 15, 2022

(54) ORGANIC LIGHT EMITTING DEVICE

(71) Applicant: LG CHEM, LTD., Seoul (KR)

(72) Inventors: Yong Bum Cha, Daejeon (KR); Sung Jae Lee, Daejeon (KR); Yeon Hwan Kim, Daejeon (KR); Sang Young Jeon, Daejeon (KR); Seong Mi Cho, Daejeon (KR)

(73) Assignee: LG Chem, Ltd., Seoul (KR)

( * ) Notice: Subject to any disclaimer, the term of this patent is extended or adjusted under 35 U.S.C. 154(b) by 377 days.

(21) Appl. No.: 16/486,483

(22) PCT Filed: May 11, 2018

(86) PCT No.: PCT/KR2018/005453
§ 371 (c)(1),
(2) Date: Aug. 15, 2019

(87) PCT Pub. No.: WO2019/013441
PCT Pub. Date: Jan. 17, 2019

(65) Prior Publication Data
US 2020/0058877 A1     Feb. 20, 2020

(30) Foreign Application Priority Data
Jul. 14, 2017    (KR) .................. 10-2017-0089892

(51) Int. Cl.
*H01L 51/00*     (2006.01)
*H01L 51/52*     (2006.01)

(52) U.S. Cl.
CPC ........ *H01L 51/0067* (2013.01); *H01L 51/006* (2013.01); *H01L 51/0054* (2013.01); *H01L 51/0072* (2013.01); *H01L 51/0073* (2013.01); *H01L 51/5206* (2013.01); *H01L 51/5221* (2013.01)

(58) Field of Classification Search
None
See application file for complete search history.

(56) References Cited

U.S. PATENT DOCUMENTS

| | | |
|---|---|---|
| 2004/0251816 A1 | 12/2004 | Leo et al. |
| 2015/0236266 A1 | 8/2015 | Kho et al. |
| 2017/0054087 A1 | 2/2017 | Zeng et al. |
| 2017/0194569 A1 | 7/2017 | Kim et al. |
| 2017/0237017 A1 | 8/2017 | Parham et al. |
| 2018/0233669 A1 | 8/2018 | Lee et al. |
| 2018/0337348 A1* | 11/2018 | Jung ................ H01L 51/0072 |
| 2019/0006590 A1 | 1/2019 | Park et al. |

FOREIGN PATENT DOCUMENTS

| | | |
|---|---|---|
| JP | 2017-107992 | 6/2017 |
| KR | 10-2000-0051826 | 8/2000 |
| KR | 10-1111413 | 2/2012 |
| KR | 10-2015-0096595 | 8/2015 |
| KR | 10-2016-0149527 | 12/2016 |
| KR | 10-2017-0041886 | 4/2017 |
| KR | 10-1744248 | 6/2017 |
| KR | 10-2017-0075877 | 7/2017 |
| WO | 2003/012890 | 2/2003 |
| WO | 2013/002514 | 1/2013 |
| WO | 2017/023021 | 2/2017 |

* cited by examiner

*Primary Examiner* — Robert S Loewe
(74) *Attorney, Agent, or Firm* — Dentons US LLP

(57) ABSTRACT
Provided is an organic light emitting device.

16 Claims, 1 Drawing Sheet

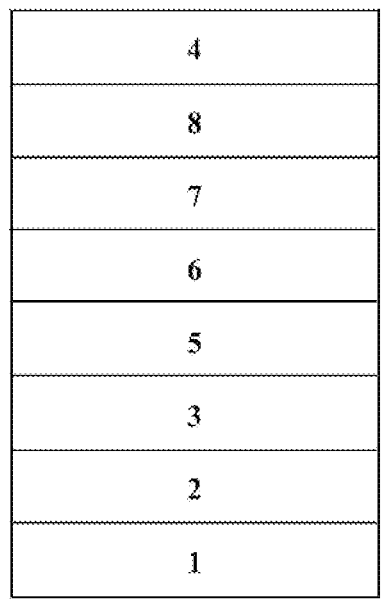

ORGANIC LIGHT EMITTING DEVICE

CROSS-REFERENCE TO RELATED APPLICATION(S)

This application is a National Stage Application of International Application No. PCT/KR2018/005453 filed on May 11, 2018, which claims priority to and the benefits of the filing date of Korean Patent Application No. 10-2017-0089892 filed with the Korean Intellectual Property Office on Jul. 14, 2017, the entire contents of which are incorporated herein by reference.

FIELD

The present invention relates to an organic light emitting device.

In general, an organic light emitting phenomenon refers to one where electrical energy is converted into light energy by using an organic material. The organic light emitting device using the organic light emitting phenomenon has characteristics such as a wide viewing angle, excellent contrast, a fast response time, and excellent luminance, driving voltage, and response speed, and thus many studies have proceeded thereon.

The organic light emitting device generally has a structure which includes an anode, a cathode, and an organic material layer interposed between the anode and the cathode. The organic material layer frequently has a multilayered structure that includes different materials in order to enhance efficiency and stability of the organic light emitting device, and for example, the organic material layer can be formed of a hole injection layer, a hole transport layer, a light emitting layer, an electron transport layer, an electron injection layer, and the like. In the structure of the organic light emitting device, if a voltage is applied between two electrodes, the holes are injected from an anode into the organic material layer and the electrons are injected from the cathode into the organic material layer, and when the injected holes and the electrons meet each other, an exciton is formed, and light is emitted when the exciton falls to a ground state.

There is a continuing need for the development of new materials for the organic materials used such organic light emitting devices.

PRIOR ART LITERATURE

[Patent Literature]
(Patent Literature 1) Korean Patent Laid-open Publication No. 10-2000-0051826

DETAILED DESCRIPTION OF THE INVENTION

Technical Problem

It is an object of the present invention to provide an organic light emitting device.

Technical Solution

An organic light emitting device is provided, including: an anode; a cathode provided to face the anode; and at least one organic material layer provided between the anode and the cathode, wherein the organic material layer includes a light emitting layer, the light emitting layer includes a compound of the following Chemical Formula 1, and the organic light emitting device includes a compound of the following Chemical Formula 2 between the anode and the light emitting layer:

[Chemical Formula 1]

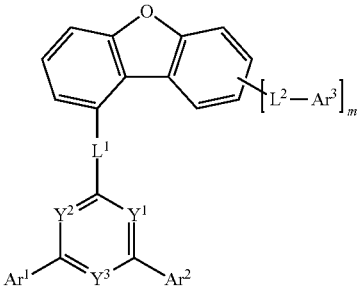

In Chemical Formula 1:
$L^1$ is a single bond or a substituted or unsubstituted arylene group having 6 to 60 carbon atoms;
$L^2$ is a single bond, a substituted or unsubstituted arylene group having 6 to 60 carbon atoms, or a substituted or unsubstituted heteroarylene group having 2 to 60 carbon atoms containing at least one of O, N, Si, and S;
$Y^1$ to $Y^3$ are each independently N or C—$R^1$, provided that at least one of them is N, and $R^1$ is hydrogen or a substituted or unsubstituted alkyl group having 1 to 40 carbon atoms;
$Ar^1$ and $Ar^2$ are each independently a substituted or unsubstituted aryl group having 6 to 60 carbon atoms, or a substituted or unsubstituted heteroaryl group having 2 to 60 carbon atoms containing at least one of O, N, Si and S;
$Ar^3$ is a substituted or unsubstituted aryl group having 6 to 60 carbon atoms; and
m is an integer from 1 to 2.

[Chemical Formula 2]

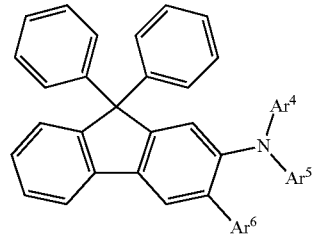

In Chemical Formula 2:
$Ar^4$ to $Ar^6$ are each independently a substituted or unsubstituted aryl group having 6 to 60 carbon atoms.

Advantageous Effects

An organic light emitting device capable of achieving low voltage driving and exhibiting high efficiency and a long lifetime characteristic by using the compound of Chemical Formula 1 as a host material of the light-emitting layer, and using the compound of Chemical Formula 2 as a material of the organic material layer between the anode and the light emitting layer, is provided.

BRIEF DESCRIPTION OF DRAWING

FIG. 1 shows an example an organic light emitting device including a substrate 1, an anode 2 a hole injection layer 3, a hole transport layer 5, an electron blocking layer 6, a light emitting layer 7, an electron transport layer 8, and a cathode 4.

DETAILED DESCRIPTION OF THE EMBODIMENTS

Hereinafter, the present invention will be described in more detail to help understanding of the present invention.

An organic light emitting device including the compound of Chemical Formula 1 as the light emitting layer, and including the compound of Chemical Formula 2 between the anode and the light emitting layer, is provided.

In the present disclosure, the notation

means a bond linked to another compound, and a direct bond means the case in which no separate atom is present at $L^1$ or $L^2$. For example, in Chemical Formula 1, when $L_1$ is a single bond and $Y^1$ to $Y^3$ are N, a triazine substituent substituted with $Ar^1$ and $Ar^2$ can be directly linked to dibenzofuran.

As used herein, the term "substituted or unsubstituted" means being unsubstituted or substituted by $R^a$, wherein $R^a$ can be deuterium, a halogen, a cyano group, a nitro group, an amino group, an alkyl group having 1 to 40 carbon atoms, a haloalkyl group having 1 to 40 carbon atoms, a substituted or unsubstituted heteroalkyl group having 1 to 40 carbon atoms containing at least one of O, N, Si, and S, a substituted or unsubstituted heterohaloalkyl group having 1 to 40 carbon atoms containing at least one of O, N, Si, and S, or an alkenyl group having 2 to 40 carbon atoms.

In the present disclosure the halogen can be fluorine, chlorine, bromine, or iodine.

In the present disclosure, an alkyl group having 1 to 40 carbon atoms can be a straight-chain, branched, or cyclic alkyl group. Specifically, the alkyl group having 1 to 40 carbon atoms can be a straight-chain alkyl group having 1 to 40 carbon atoms, a straight-chain alkyl group having 1 to 20 carbon atoms, a straight-chain alkyl group having 1 to 10 carbon atoms, a branched or cyclic alkyl group having 3 to 40 carbon atoms, a branched or cyclic alkyl group having 3 to 20 carbon atoms, or a branched or cyclic alkyl group having 3 to 10 carbon atoms. More specifically, the alkyl group having 1 to 40 carbon atoms can be a methyl group, an ethyl group, an n-propyl group, an iso-propyl group, an n-butyl group, an iso-butyl group, a t-butyl group, an n-pentyl group, an iso-pentyl group, a neo-pentyl group, a cyclohexyl group, or the like, but is not limited thereto.

In the present disclosure, a heteroalky group having 1 to 40 carbon atoms can be one in which at least one carbon of the alkyl group is independently substituted with O, N, Si, or S. As an example of the straight-chain alkyl group, the heteroalkyl group in which the $1^{st}$ carbon of an n-butyl group is substituted with O is an n-propoxy group, the heteroalkyl group substituted with N is an n-propylamino group, the heteroalkyl group substituted with Si is an n-propylsilyl group, and the heteroalkyl group substituted with S is an n-propylthio group. In addition, as an example of the branched alkyl group, the heteroalkyl group in which the $1^{st}$ carbon of neopentyl group is substituted with O is t-butoxy group, the heteroalkyl group substituted with N is a t-butylamino group, the heteroalkyl group substituted with Si is a t-butylsilyl group, and the heteroalkyl group substituted with S is a t-butylthio group. Further, as an example of the cyclic alkyl group, the heteroalkyl group in which the $2^{nd}$ carbon of a cyclohexyl group is substituted with O is a 2-tetrahydropyranyl group, the heteroalkyl group substituted with N is a 2-piperidinyl group, the heteroalkyl group substituted with Si is a 1-sila-cyclohexyl group, and the heteroalkyl group substituted with S is a 2-tetrahydrothiopyranyl group. Specifically, the heteroalkyl group having 1 to 40 carbon atoms can include a straight-chain, branched, or cyclic hydroxyalkyl group having 1 to 40 carbon atoms, a straight-chain, branched, or cyclic alkoxy group having 1 to 40 carbon atoms, a straight-chain, branched, or cyclic alkoxyalkyl group having 2 to 40 carbon atoms, a straight-chain, branched, or cyclic aminoalkyl group having 1 to 40 carbon atoms, a straight-chain, branched, or cyclic alkylamino group having 1 to 40 carbon atoms, a straight-chain, branched, or cyclic alkylaminoalkyl group having 1 to 40 carbon atoms, a straight-chain, branched, or cyclic silylalkyl (oxy) group having 1 to 40 carbon atoms, a straight-chain, branched, or cyclic alkyl(oxy)silyl group having 1 to 40 carbon atoms, a straight-chain, branched, or cyclic alkyl (oxy)silylalkyl(oxy) group having 1 to 40 carbon atoms; a straight-chain, branched, or cyclic mercaptoalkyl group having 1 to 40 carbon atoms, a straight-chain, branched, or cyclic alkylthio group having 1 to 40 carbon atoms, or a straight-chain, branched, or cyclic alkylthioalkyl group having 2 to 40 carbon atoms. More specifically, the heteroalkyl group having 1 to 40 carbon atoms can include a hydroxymethyl group, a methoxy group, an ethoxy group, an n-propoxy group, an iso-propoxy group, a t-butoxy group, a cycloheptoxy group, a methoxymethyl group, an iso-propoxymethyl group, a cycloheptoxymethyl group, a 2-tetrahydropyranyl group, an aminomethyl group, a methylamino group, an n-propylamino group, a t-butylamino group, a methylaminopropyl group, a 2-piperidinyl group, an n-propylsilyl group, a trimethylsilyl group, a dimethylmethoxysilyl group, a t-butylsilyl group, a 1-sila-cyclohexyl group, an n-propylthio group, a t-butylthio group, a 2-tetrahydrothiopyranyl group, or the like. However, the present invention is not limited thereto.

In the present disclosure, an alkenyl group having 2 to 40 carbon atoms can be a straight-chain, branched, or cyclic alkenyl group. Specifically, the alkenyl group having 2 to 40 carbon atoms can include a straight-chain alkenyl group having 2 to 40 carbon atoms, a straight-chain alkenyl group having 2 to 20 carbon atoms, a straight-chain alkenyl group having 2 to 10 carbon atoms, a branched alkenyl group having 3 to 40 carbon atoms, a branched alkenyl group having 3 to 20 carbon atoms, a branched alkenyl group having 3 to 10 carbon atoms, a cyclic alkenyl group having 5 to 40 carbon atoms, a cyclic alkenyl group having 5 to 20 carbon atoms, or a cyclic alkenyl group having 5 to 10 carbon atoms. More specifically, the alkenyl group having 2 to 40 carbon atoms can include an ethenyl group, a propenyl group, a butenyl group, a pentenyl group, a cyclohexenyl group, or the like. However, the present invention is not limited thereto.

In the present disclosure, an aryl group having 6 to 60 carton atoms can be a monocyclic aryl group or a polycyclic aryl group. Specifically, the aryl group having 6 to 60 carbon atoms can be a monocyclic or polycyclic aryl group having 6 to 30 carbon atoms; or a monocyclic or polycyclic aryl group having 6 to 20 carbon atoms. More specifically, the aryl group having 6 to 60 carbon atoms can be a phenyl group, a biphenyl group, a terphenyl group, or the like as the monocyclic aryl group, and the polycyclic aryl group can include a naphthyl group, an anthracenyl group, a tetracenyl group, a phenanthryl group, a triphenylenyl group, a fluoranthenyl group, a pyrenyl group, a perylenyl group, a chrycenyl group, a fuorenyl group, or the like.

Further, an aryl group having 6 to 60 carbon atoms can have a structure in which two or more selected from the group consisting of a monocyclic aryl group and a polycyclic aryl group are connected to each other. Specifically, the aryl group having 6 to 60 carbon atoms can have a structure in which a polycyclic aryl group and/or a monocyclic aryl group is connected to a polycyclic aryl group. More specifically, the aryl group having 6 to 60 carbon atoms can be a naphthylphenyl group, an anthracenylphenyl group, a phenanthrylphenyl group, a triphenylenylphenyl group, a pyrenylphenyl group, a perylenylphenyl group, a chrycenylphenl group, a fluorenylphenyl group, a phenylnapthyl group, a phenanthracenyl group, a phenylterphenyl group, a phenylnaphthylphenyl group, or the like.

In the present disclosure, a fluorenyl group can be substituted, and two substituent groups can be linked with each other to form a spiro structure. In the case where the fluorenyl group is substituted,

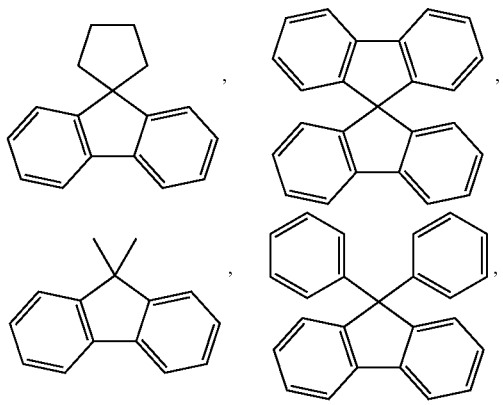

and the like can be formed. However, the structure is not limited thereto.

In the present disclosure, a heteroaryl group having 2 to 60 carbon atoms can be one in which at least one carbon of an aryl group is independently substituted with O, N, Si, or S. For example, the heteroaryl group in which the 9th carbon of the fluorenyl group is substituted with O is a dibenzofuranyl group, the heteroaryl group substituted with N is carbazolyl group, the heteroaryl group substituted with Si is a 9-sila-fluorenyl group, and the heteroaryl group substituted with S is a dibenzothiophenyl group. Specifically, the heteroaryl group having 2 to 60 carbon atoms can be a heteroaryl group having 2 to 30 carbon atoms; or a heteroaryl group having 2 to 20 carbon atoms. More specifically, the heteroaryl group having 2 to 60 carbon atoms can include a thiophene group, a furan group, a pyrrole group, an imidazole group, a triazole group, an oxazole group, an oxadiazole group, a triazole group, a pyridyl group, a bipyridyl group, a pyrimidyl group, a triazine group, a triazole group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, a thiazolyl group, an isoxazolyl group, an oxadiazolyl group, a thiadiazolyl group, a benzothiazolyl group, a phenothiazinyl group, a dibenzofuranyl group, and the like, but are not limited thereto.

In the present disclosure, an arylene group means a divalent organic group from which any hydrogen radical of the above-mentioned aryl group has been removed, and the heteroarylene group means divalent organic group from which any hydrogen radical of the above-mentioned heteroaryl group has been removed.

In Chemical Formula 1, $L^1$ can be a single bond or a phenylene group, and more specifically, can be a single bond.

In Chemical Formula 1, $Y^1$ to $Y^3$ are each independently N or C—H, provided that at least one of them can be N.

In Chemical Formula 1, $Ar^1$ and $Ar^2$ can be each independently a monovalent residue derived from an arene or heteroarene which is selected from the group consisting of benzene, biphenyl, terphenyl, naphthalene, phenanthrene, triphenylene, 9,9-dimethylfluorene, 9,9-diphenylfluorene, spiro[fluorene-9,9'-fluorene], dibenzofuran, dihenzothiophene, N-phenylcarbazole, phenyl-9,9-dimethylfluorene, phenyl dibenzofuran, and phenyl dibenzothiophene.

Specifically, $Ar^1$ and $Ar^2$ can each independently be a monovalent residue derived from an arene which is selected from the group consisting of benzene, biphenyl, and terphenyl.

More specifically, $Ar^1$ and $Ar^2$ can each independently be a phenyl group or a biphenyl group.

In Chemical Formula 1, $L^2$ is a single bond, or divalent residue derived from an arene or heteroarene which is selected from the group consisting of benzene, naphthalene, 9,9 -dimethyfluorene, 9,9-diphenylfluorene, spiro[fluorene-9,9'-fluorene], dibenzofuran, dibenzoxhiophene, benzothieno[2,3-d]pyrimidene), and benzothieno[3,2-d]pyrimidine.

In Chemical Formula 1, $A^3$ can be a monovalent residue derived from an arene which is selected from the group consisting of benzene, biphenyl, terphenyl, naphthalene, anthracene, tetracene, chrysene, phenanthrene, triphenylene, fluoranthene, pyrene, and perylene.

In Chemical Formula 1, $L^2$-$Ar^3$ can be a substituent selected from the group consisting of the following substituent groups:

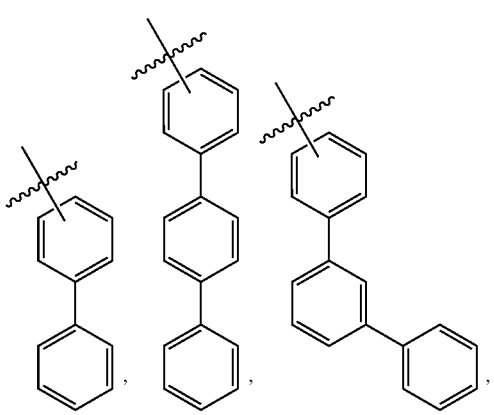

-continued
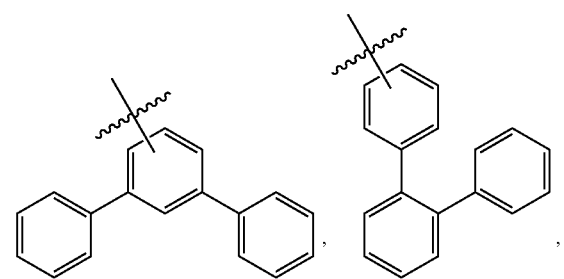
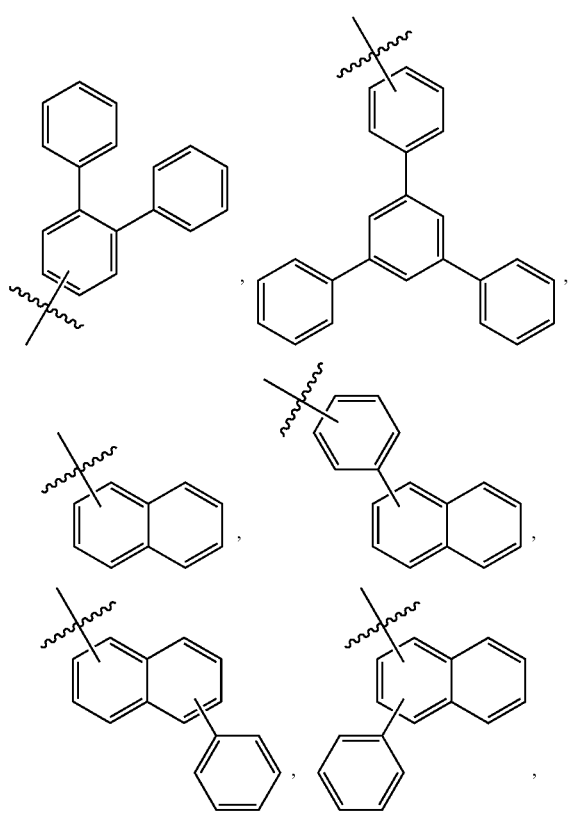
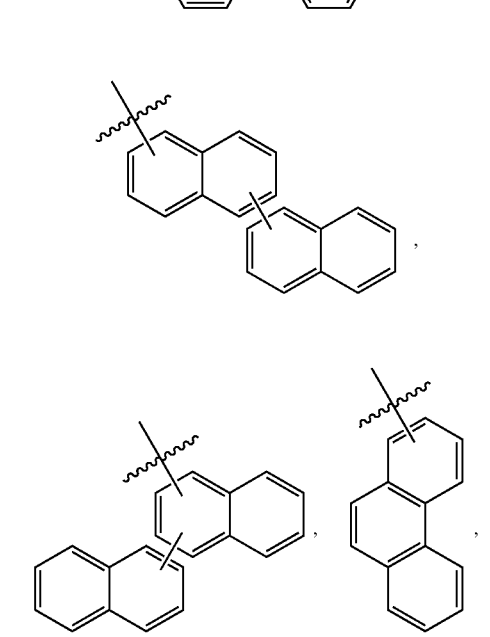
-continued
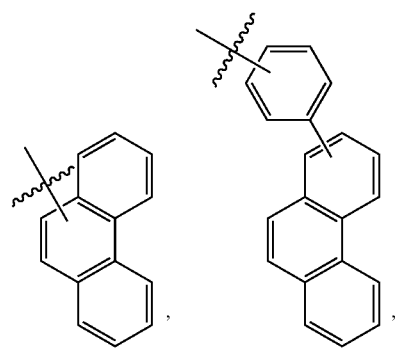
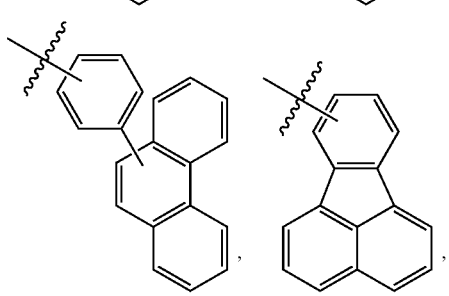
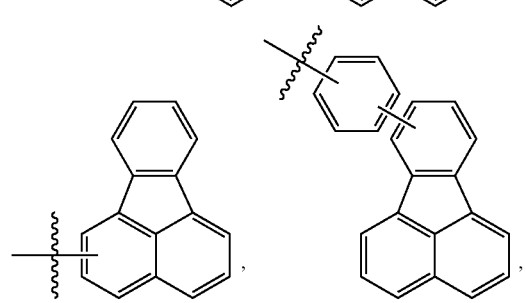
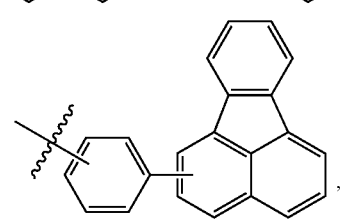
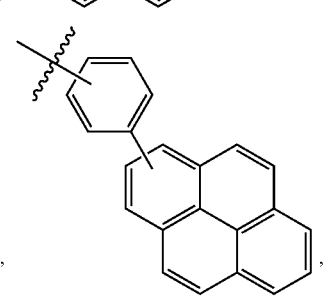
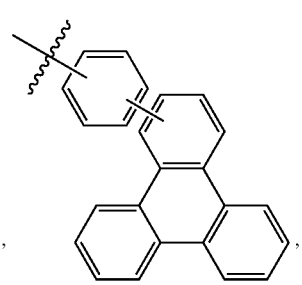

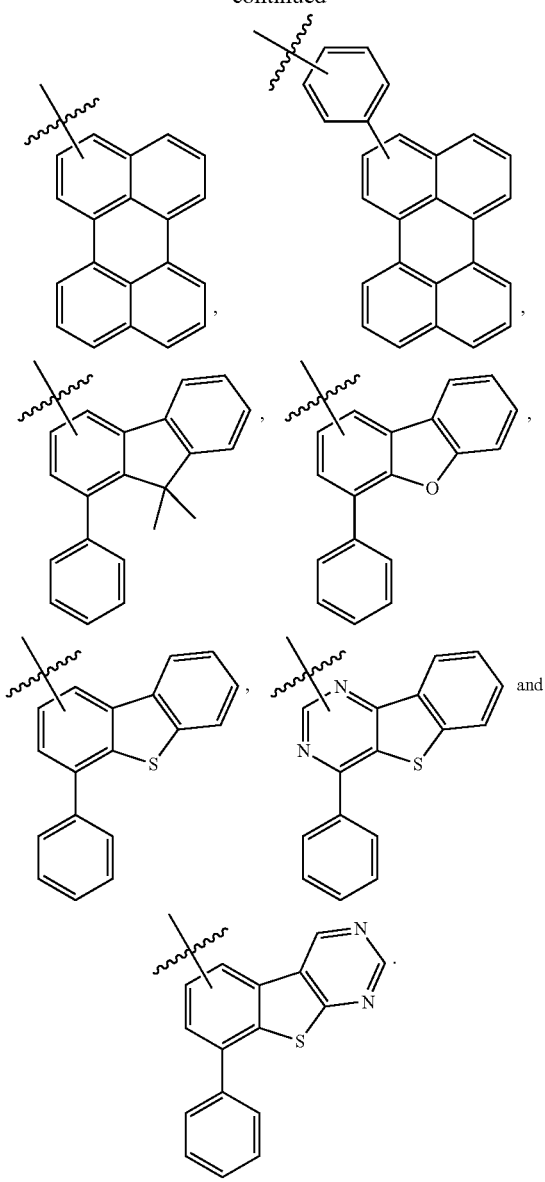

The compound of Chemical Formula 1 can be a compound selected from the group consisting of compounds of the following Chemical Formulae 1-1 and 1-2.

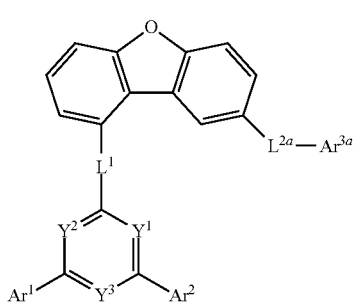

[Chemical Formula 1-1]

In Chemical Formula 1-1:

$L^1$, $Y^1$ to $Y^3$, $Ar^1$, and $Ar^2$ are the same as defined in Chemical Formula 1;

$L^{2a}$ is a single bond, a substituted or unsubstituted arylene group having 6 to 60 carbon atoms, or a substituted or unsubstituted heteroarylene group having 2 to 60 carbon atoms containing at least one of O, N, Si, and S; and $Ar^{3a}$ is a substituted or unsubstituted aryl group having 6 to 60 carbon atoms.

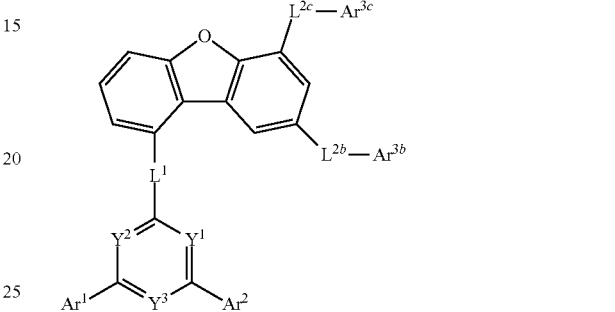

[Chemical Formula 1-2]

In Chemical Formula 1-2:

$L^1$, $Y^1$ to $Y^3$, $Ar^1$, and $Ar^2$ are the same as defined in Chemical Formula 1;

$L^{2b}$ and $L^{2c}$ are each independently a single bond, a substituted or unsubstituted arylene group having 6 to 60 carbon atoms, or a substituted or unsubstituted heteroarylene group having 2 to 60 carbon atoms containing at least one of O, N, Si, and S; and $Ar^{3b}$ and $Ar^{3c}$ are each independently a substituted or unsubstituted aryl group having 6 to 60 carbon atoms.

$L^1$, $Y^1$ to $Y^3$, $Ar^1$, and $Ar^2$ in Chemical Formulae 1-1 and 1-2 are the same as $L^1$, $Y^1$ to $Y^3$, $Ar^1$, and $Ar^2$ in Chemical Formula 1, $L^{2a}$ to $L^{2c}$ correspond to $L^2$ in Chemical Formula 1, $Ar^{3a}$ to $Ar^{3c}$ correspond to $Ar^3$ in Chemical Formula 1, and specific examples of $L^1$ and $L^2$, $Y^1$ to $Y^3$, and $Ar^1$ to $Ar^3$ have been previously described in detail, and thus a detailed description thereof will be omitted here.

The compound of Chemical Formula 1 can be selected from the group consisting of the following compounds:

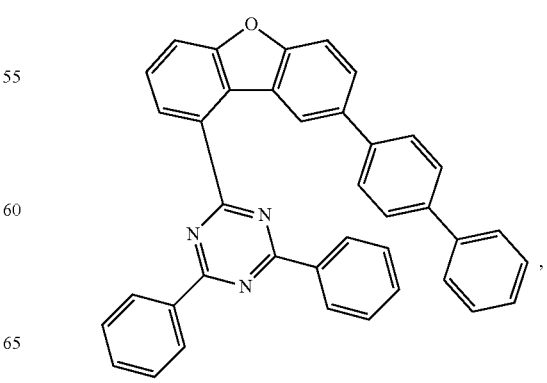

-continued
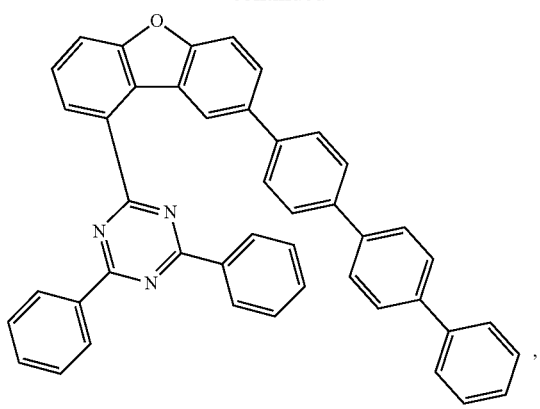
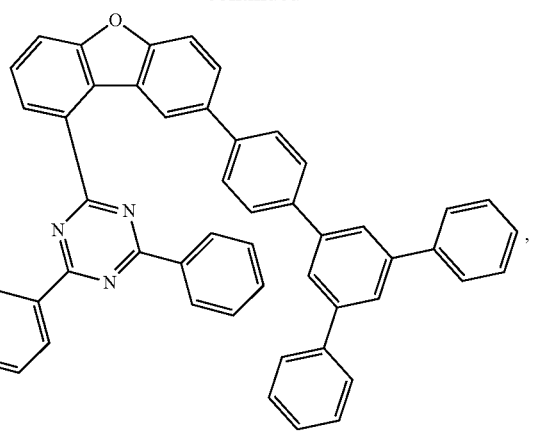
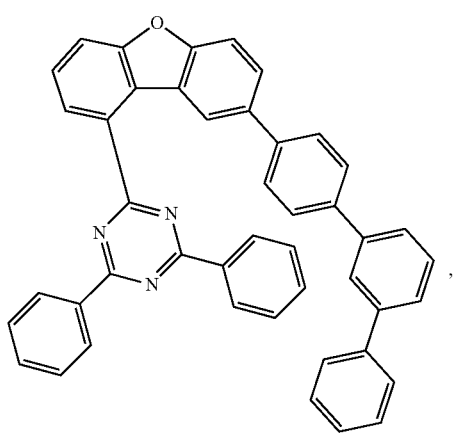
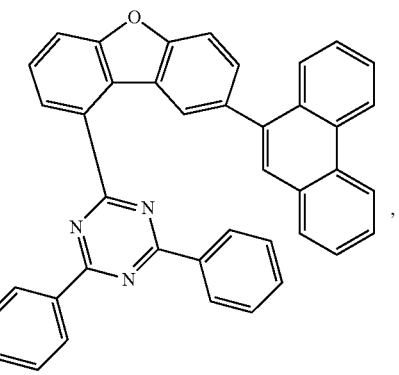
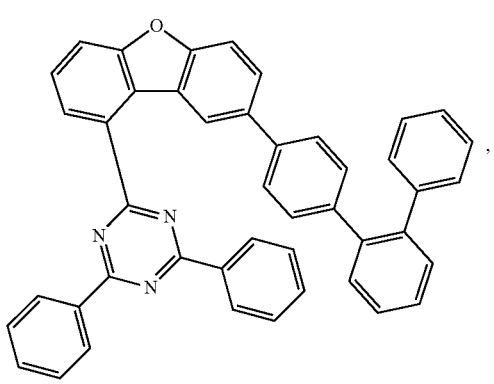
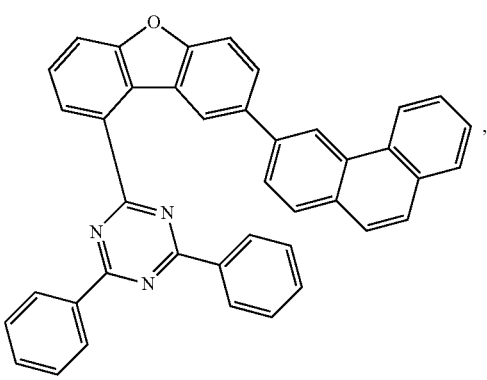
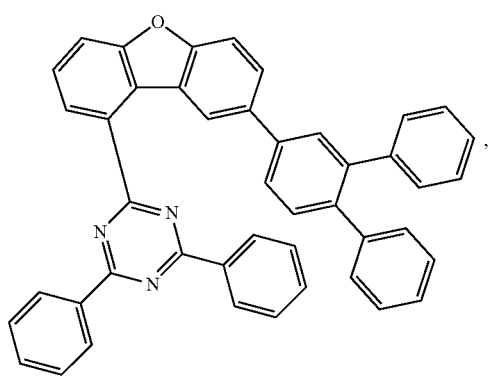
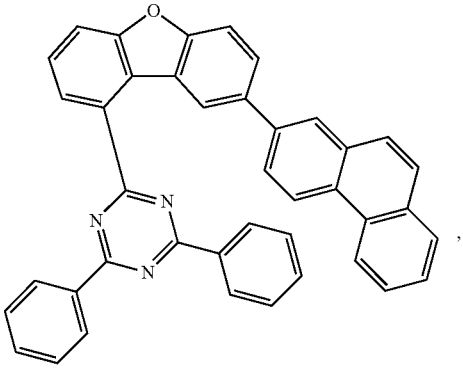

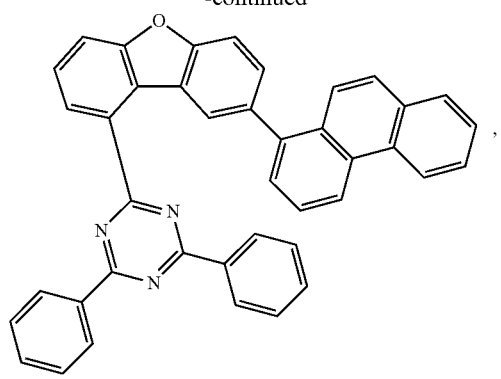
,
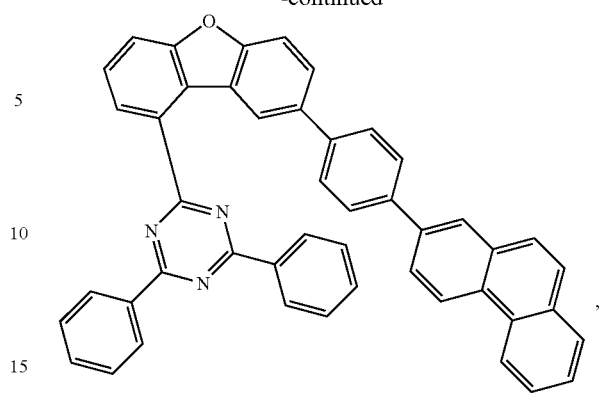
,
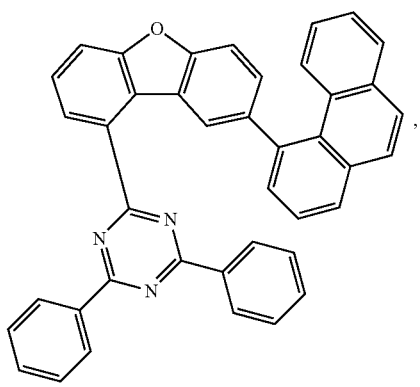
,
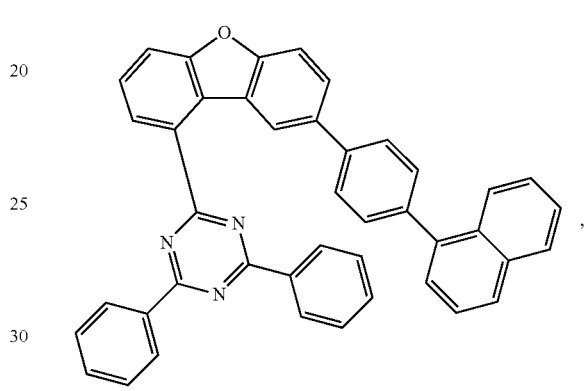
,
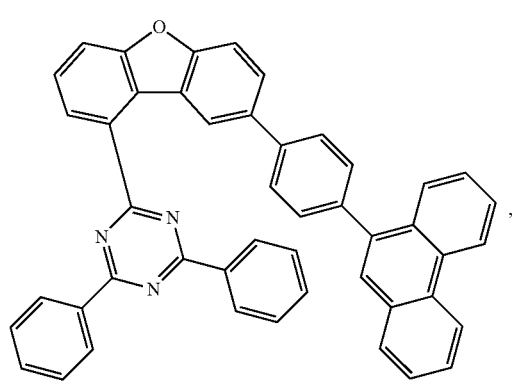
,
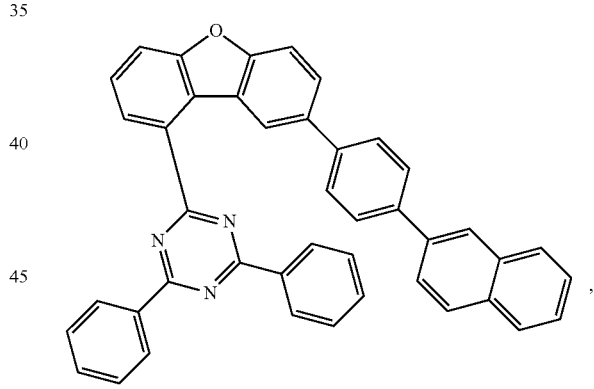
,
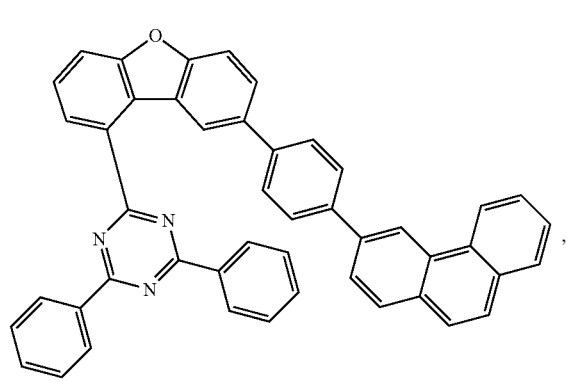
,
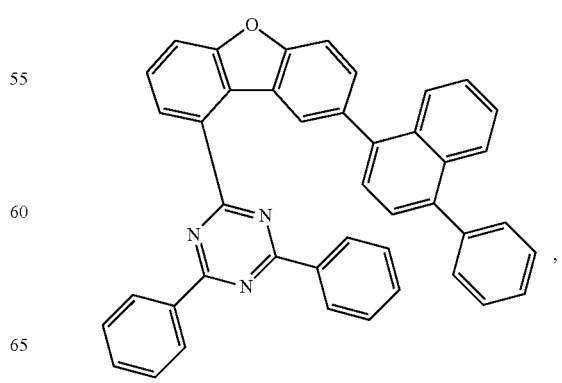
, 15
-continued
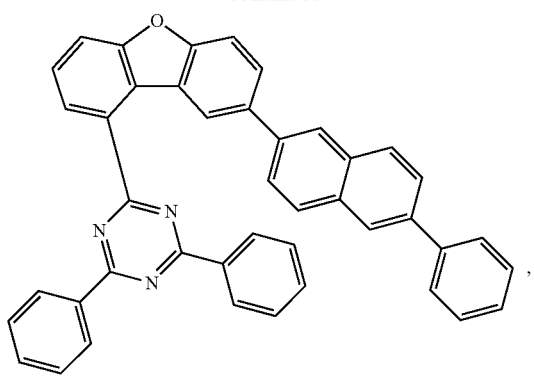
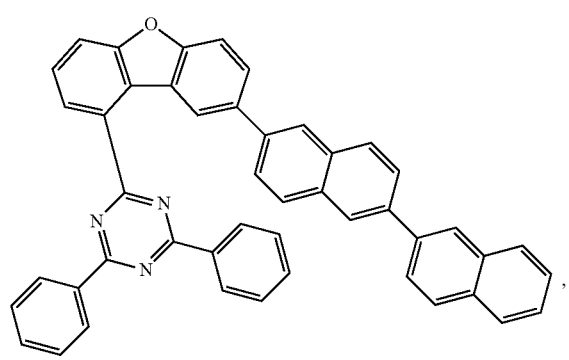
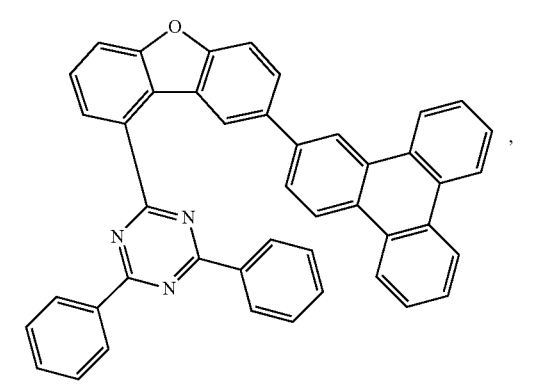
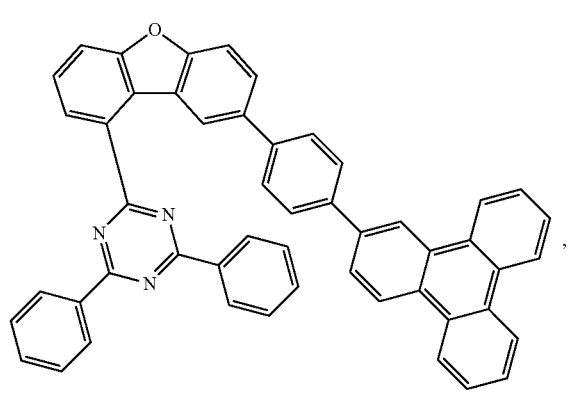
16
-continued
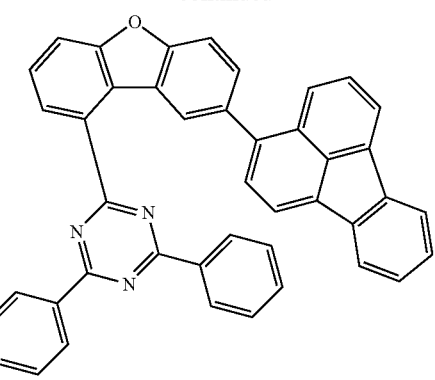
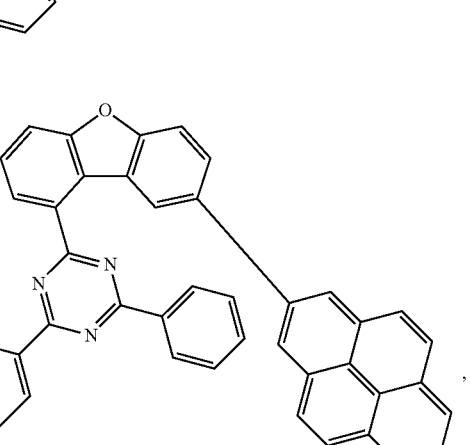
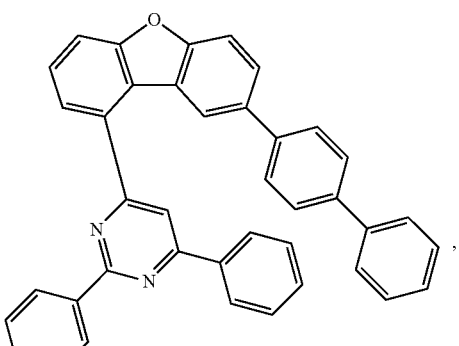
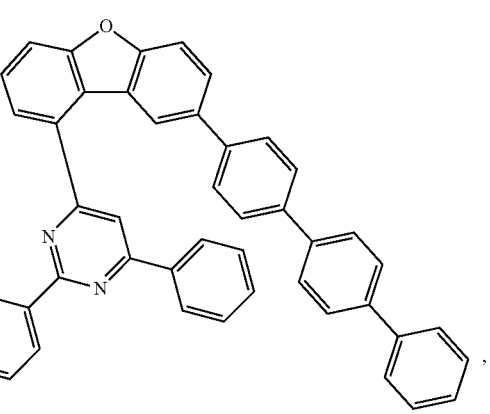

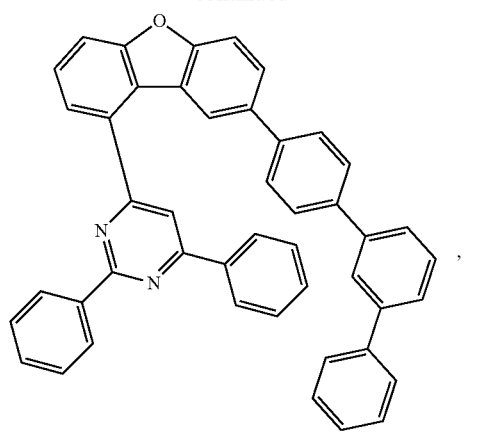
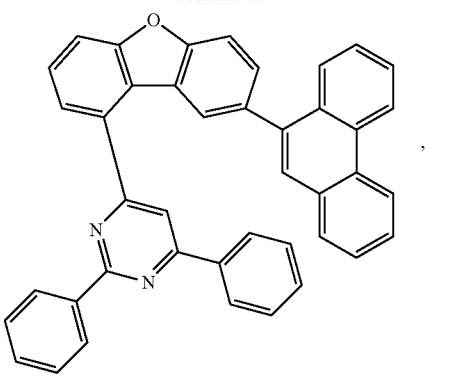
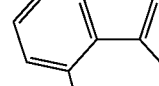

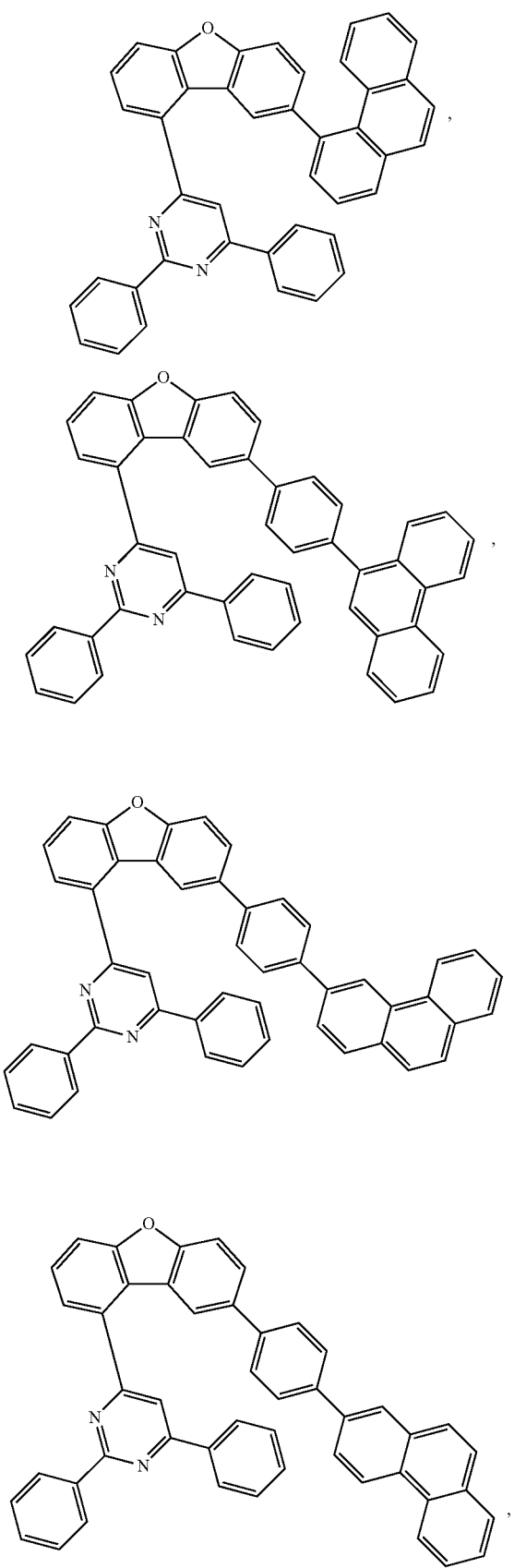
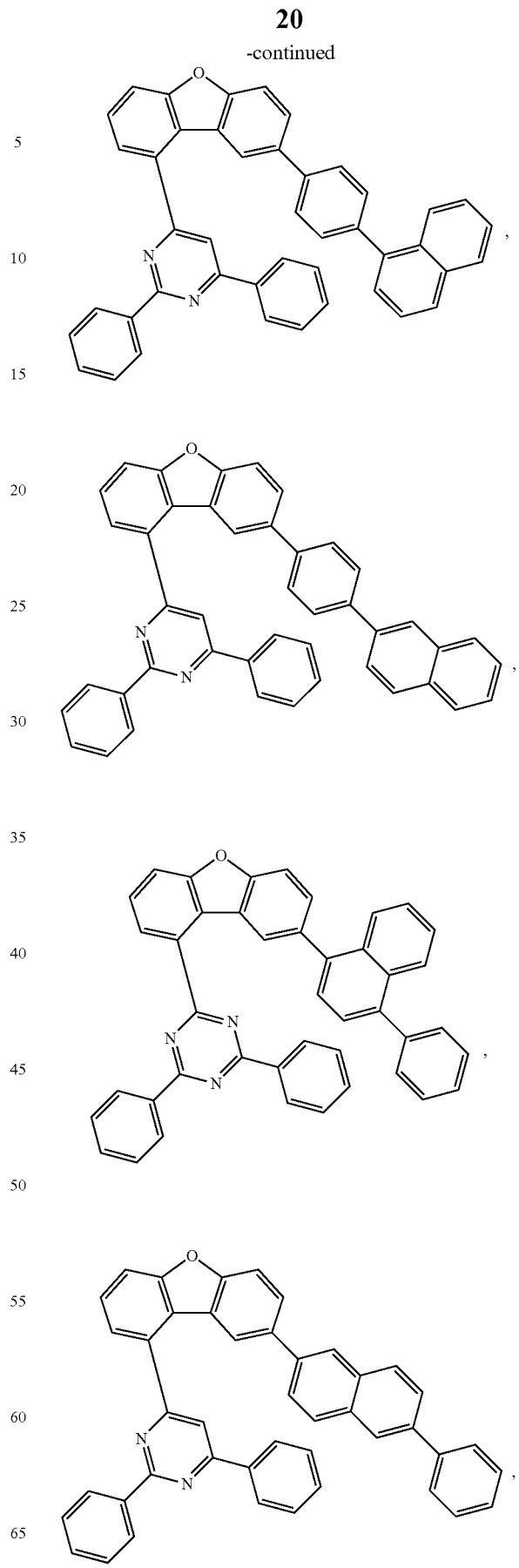

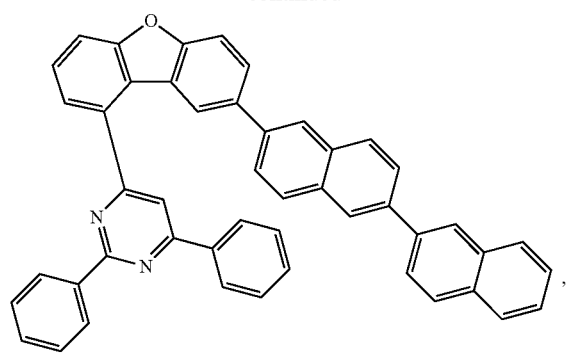
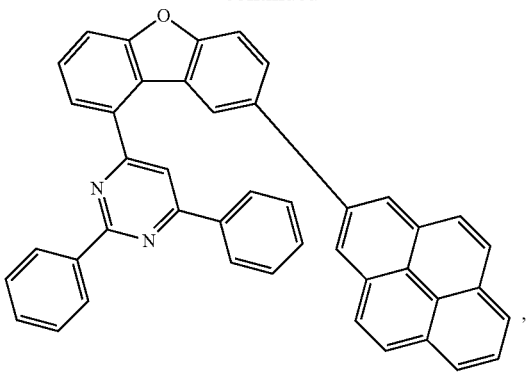
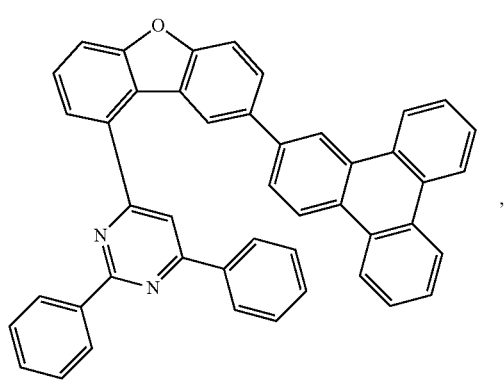
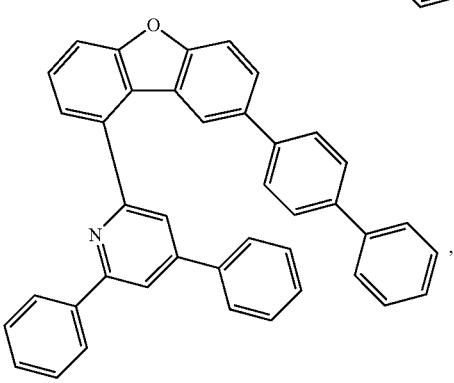
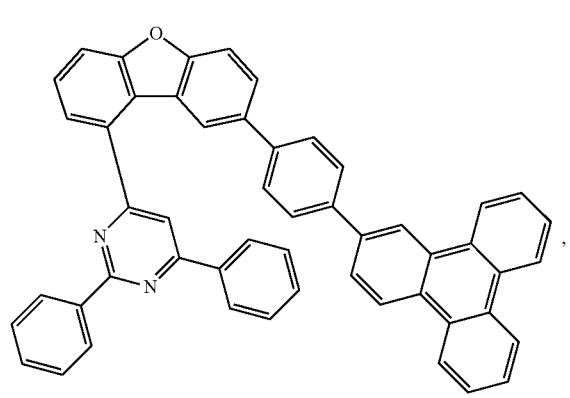
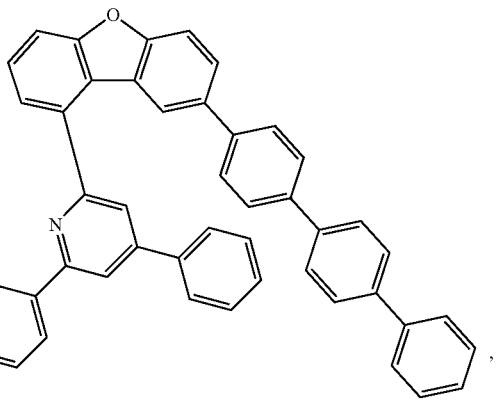
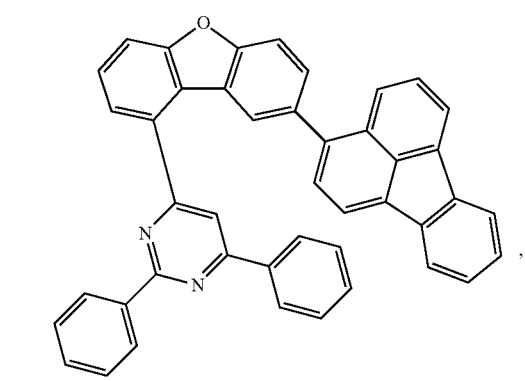
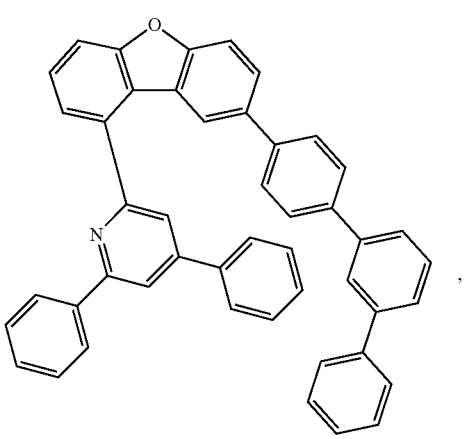

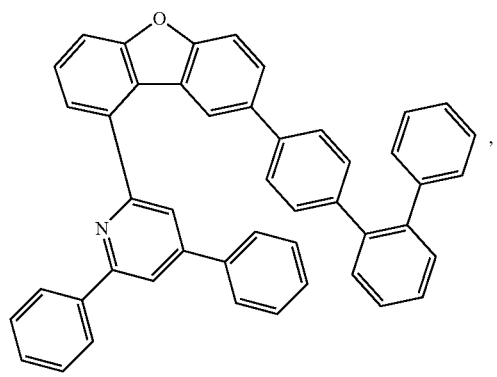
,
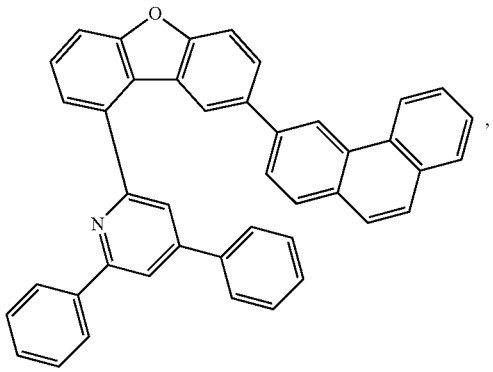
,
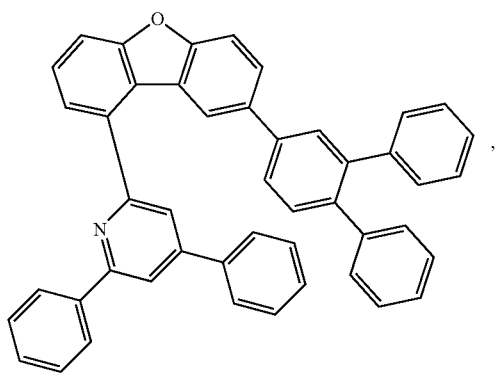
,
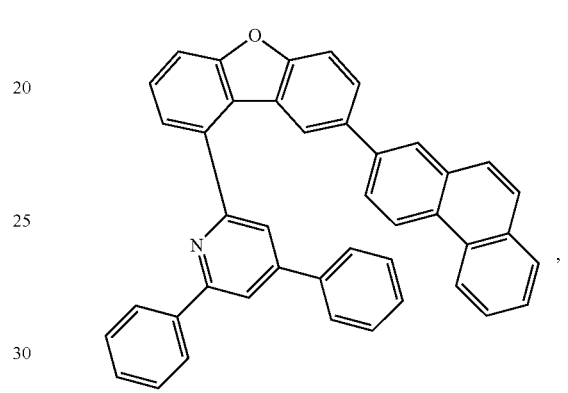
,
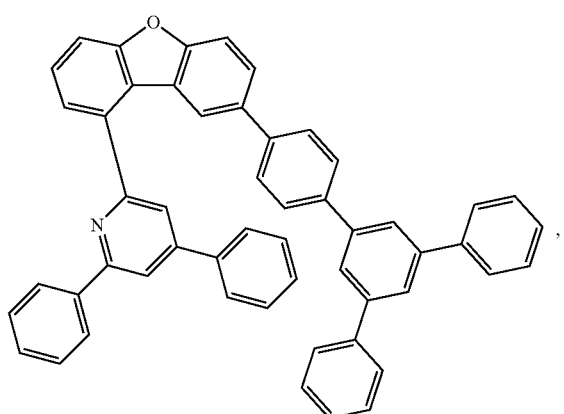
,
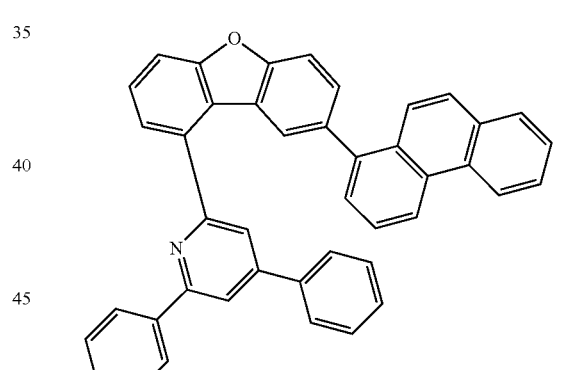
,
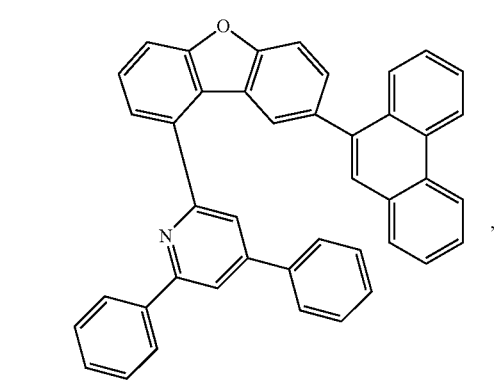
,
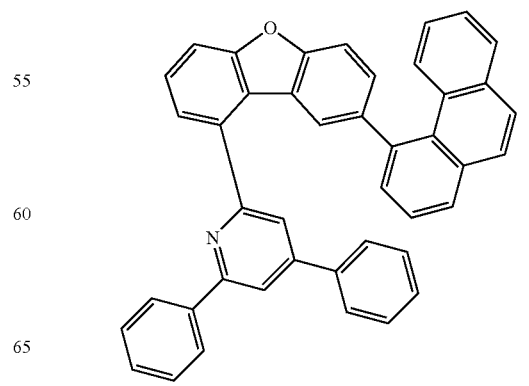
,

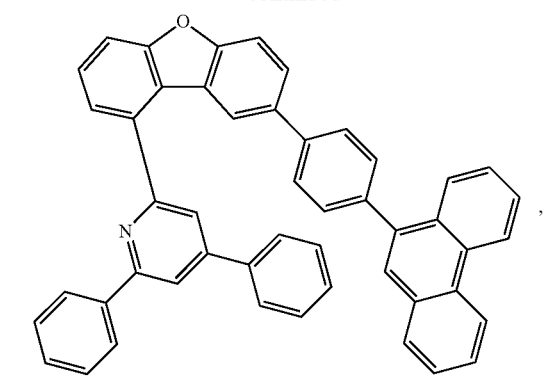,
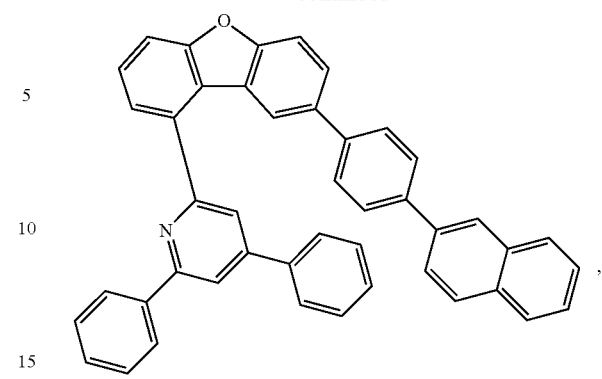,
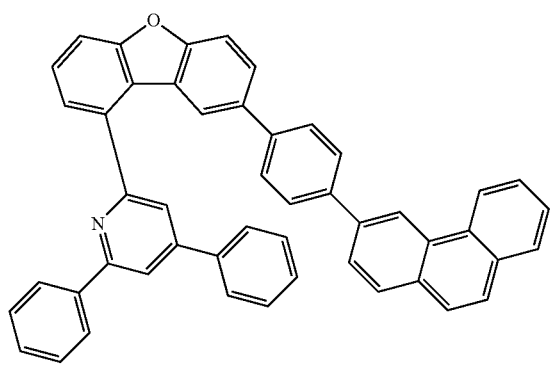,
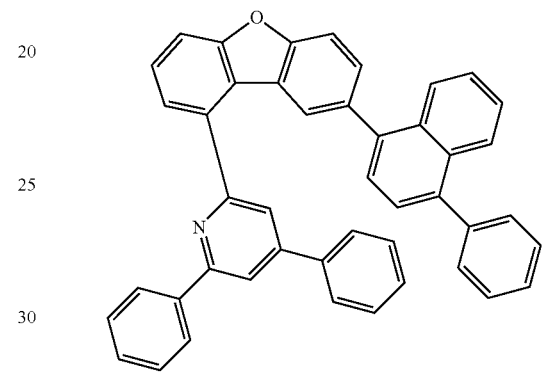,
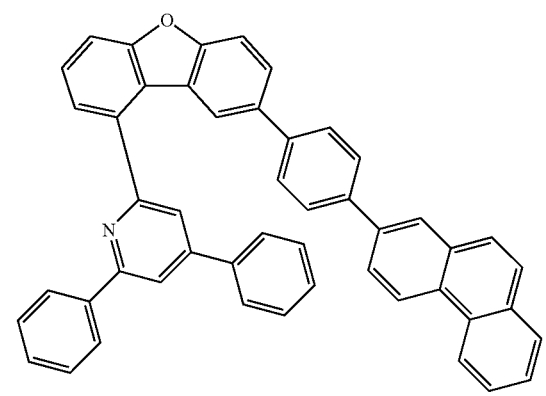,
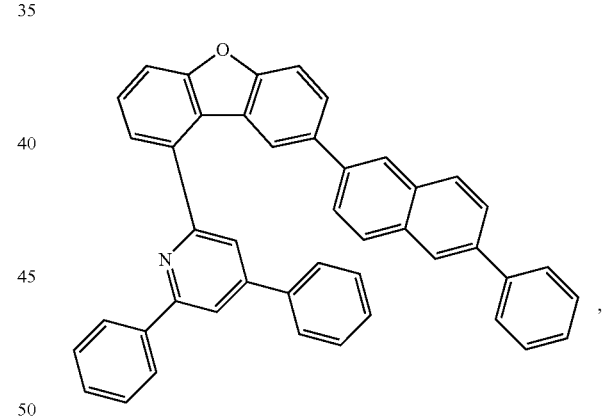,
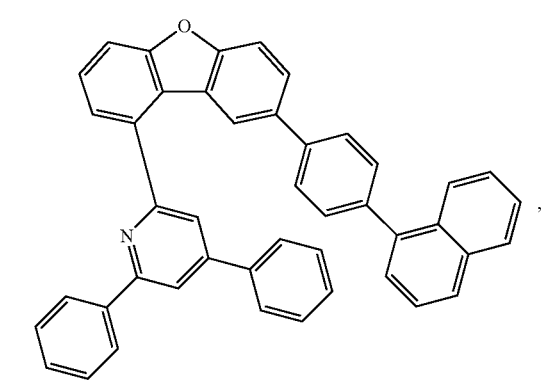,
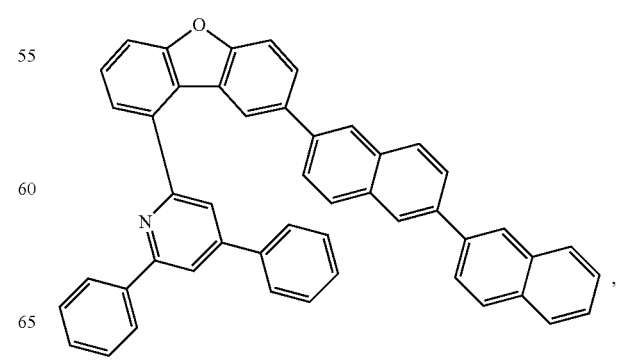,

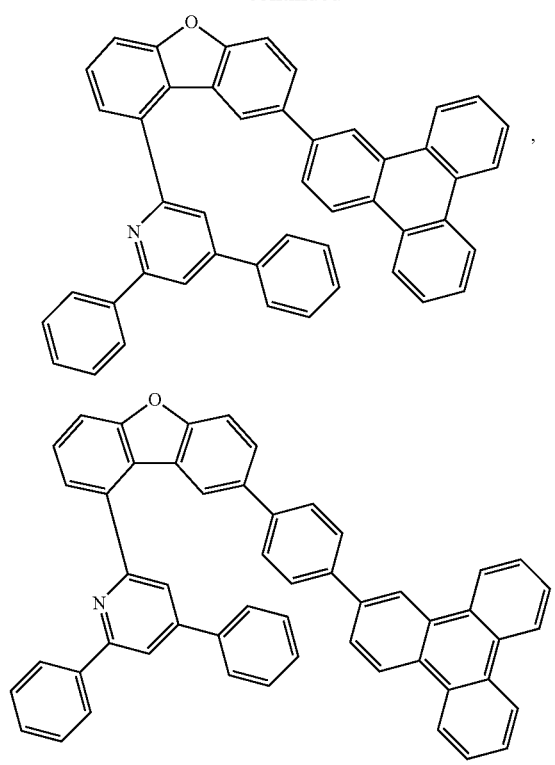
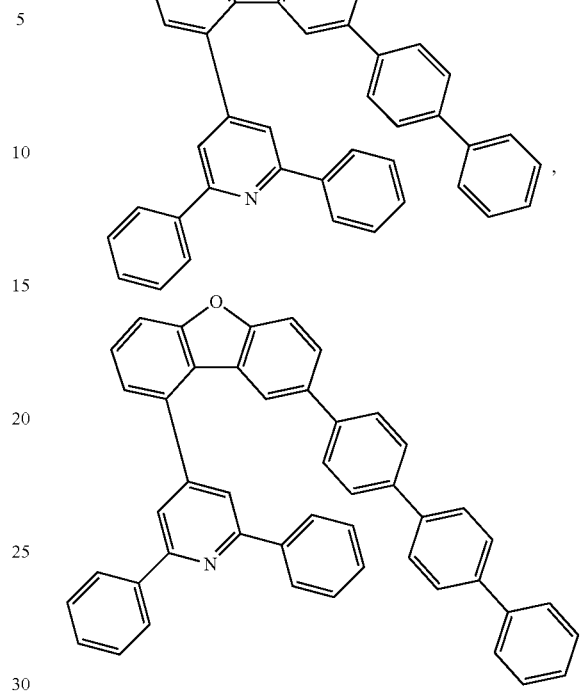
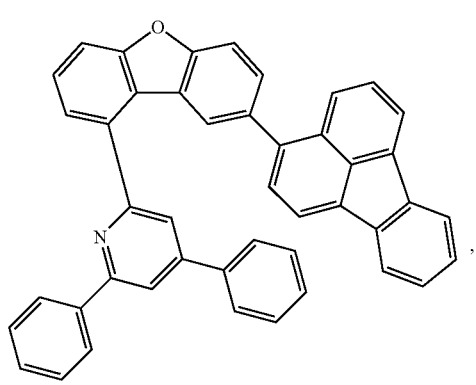
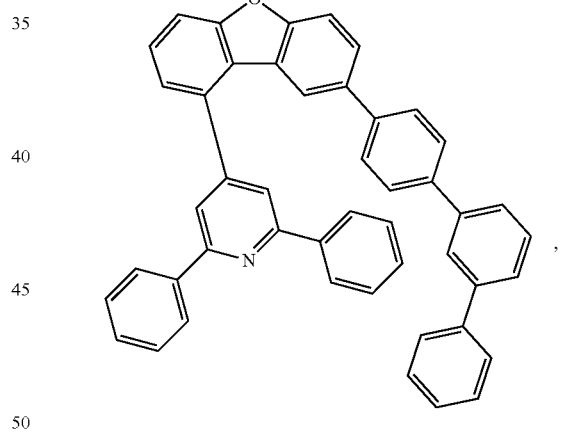
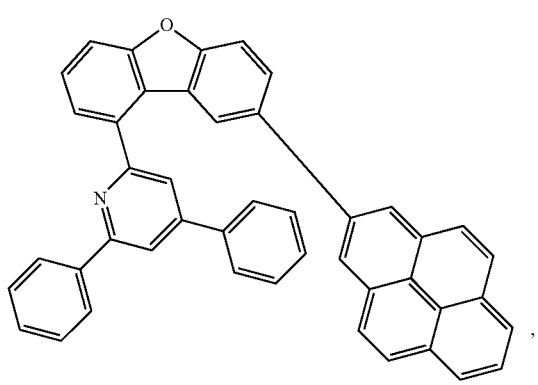
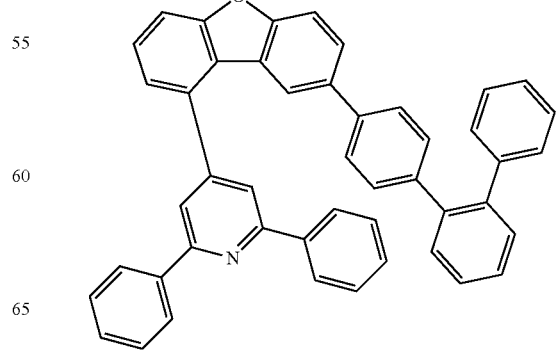

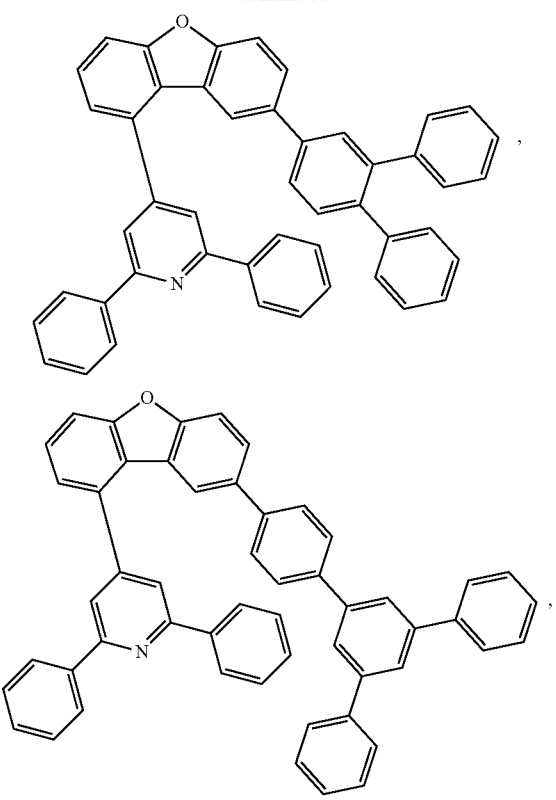
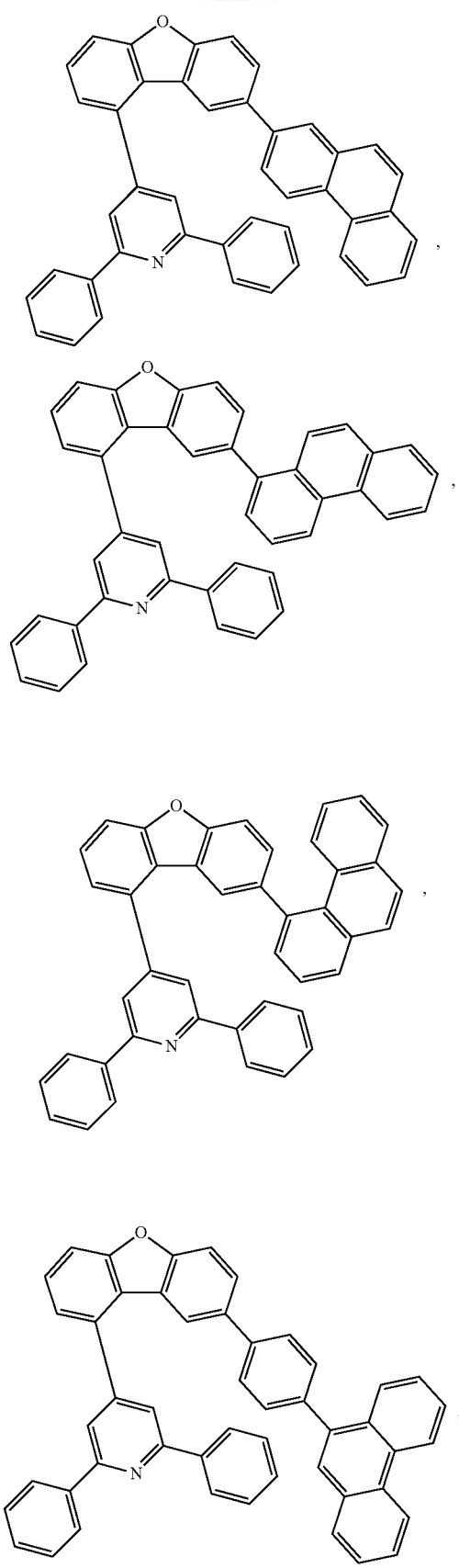

31
-continued
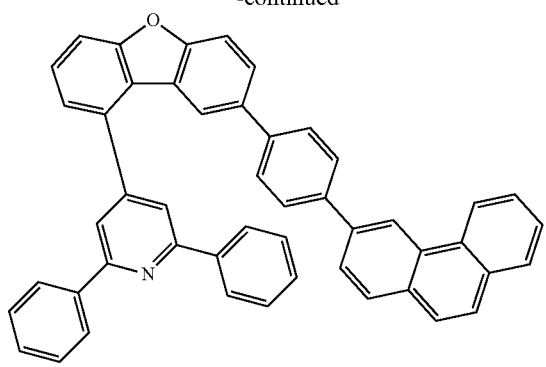
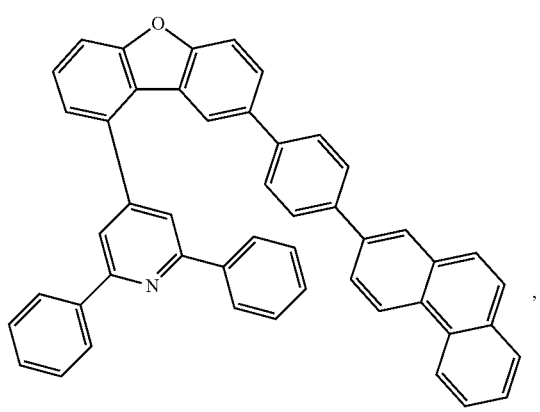
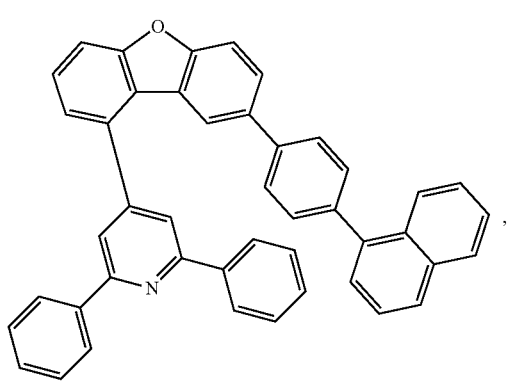
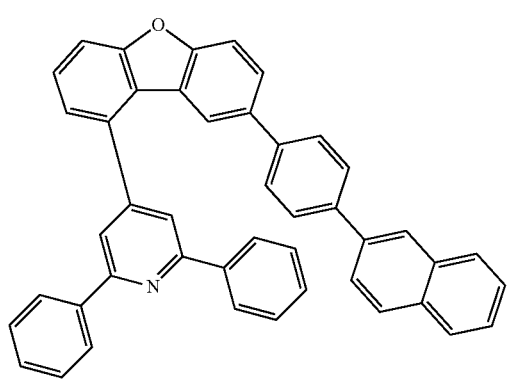
32
-continued
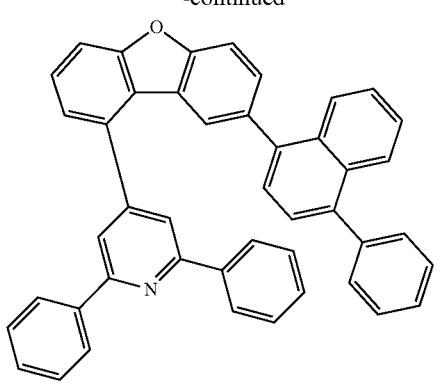
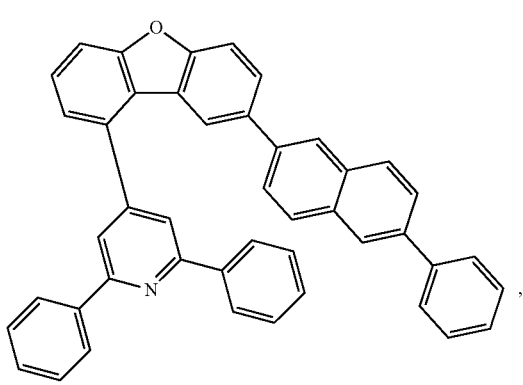
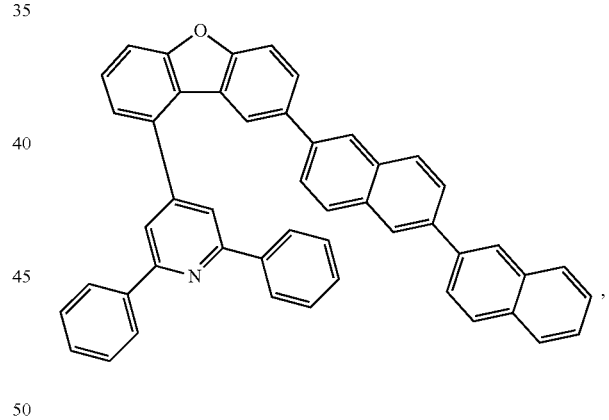
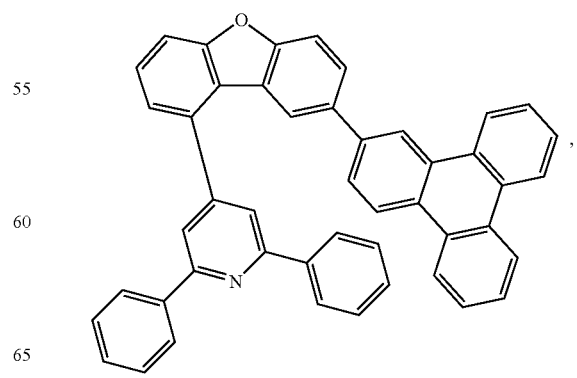

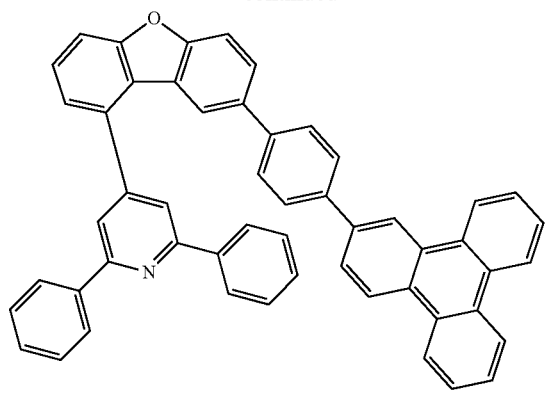
,
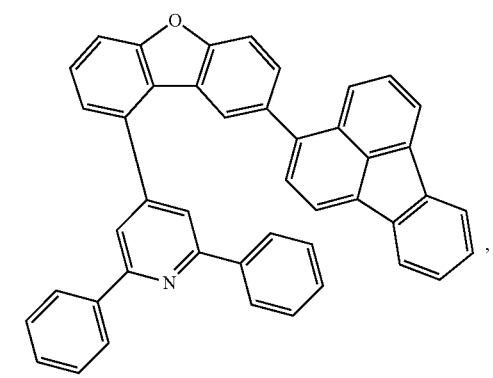
,
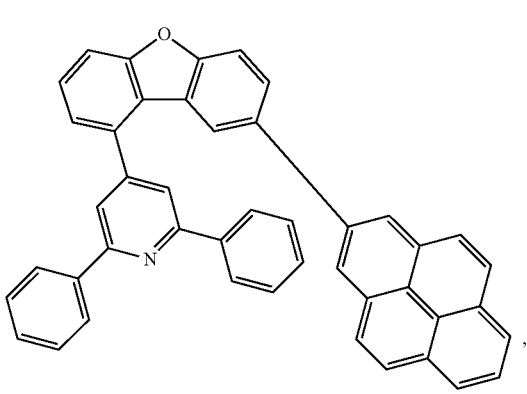
,
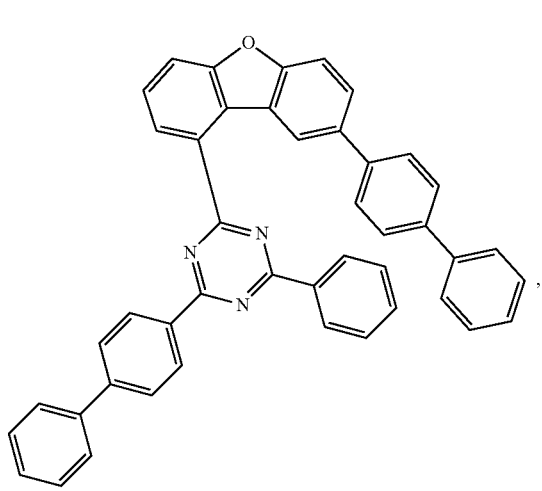
,
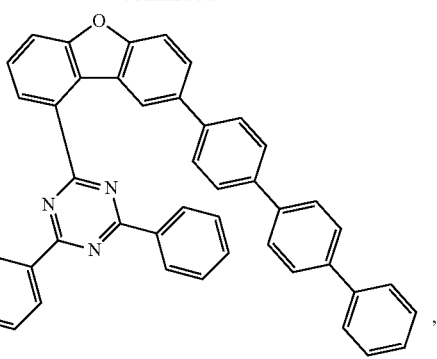
,
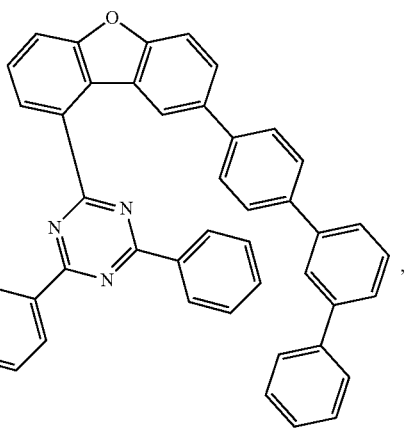
,
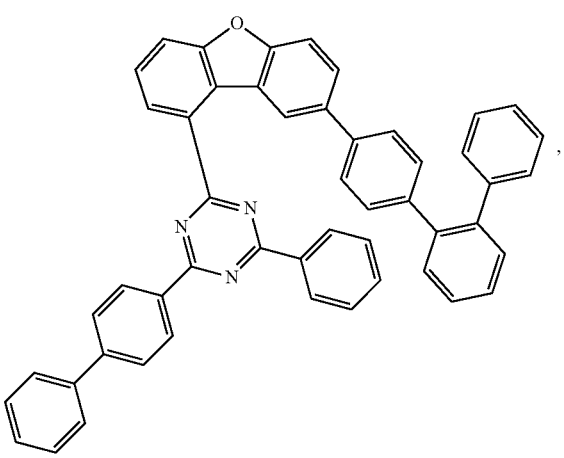
,

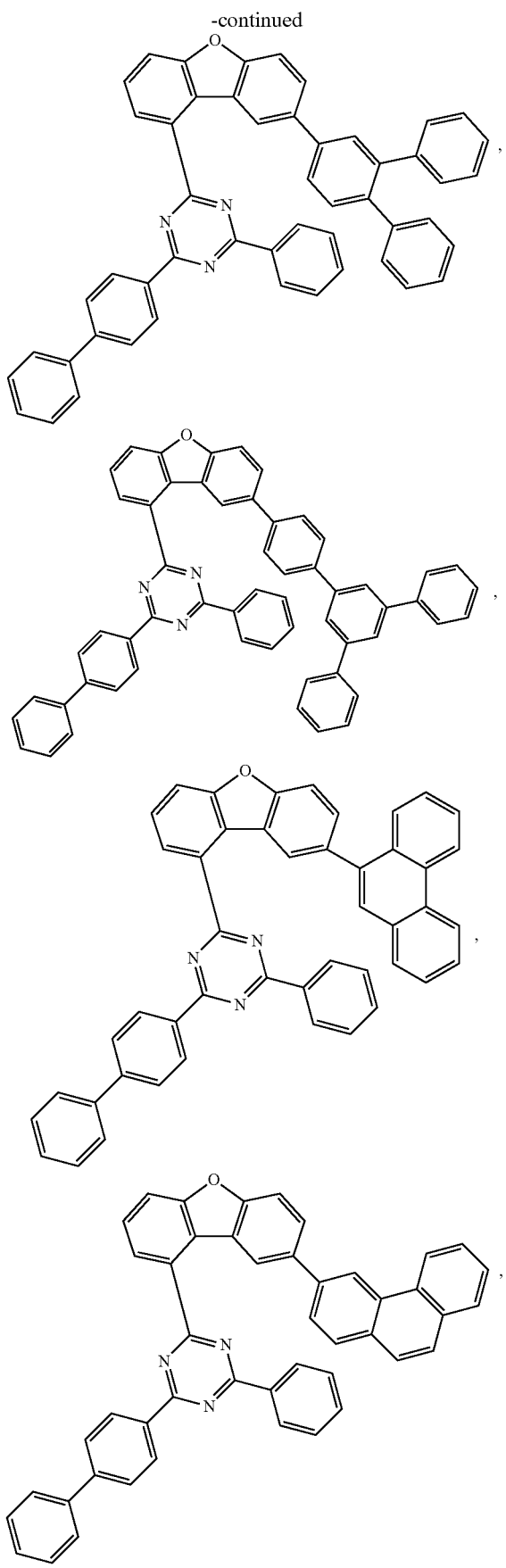
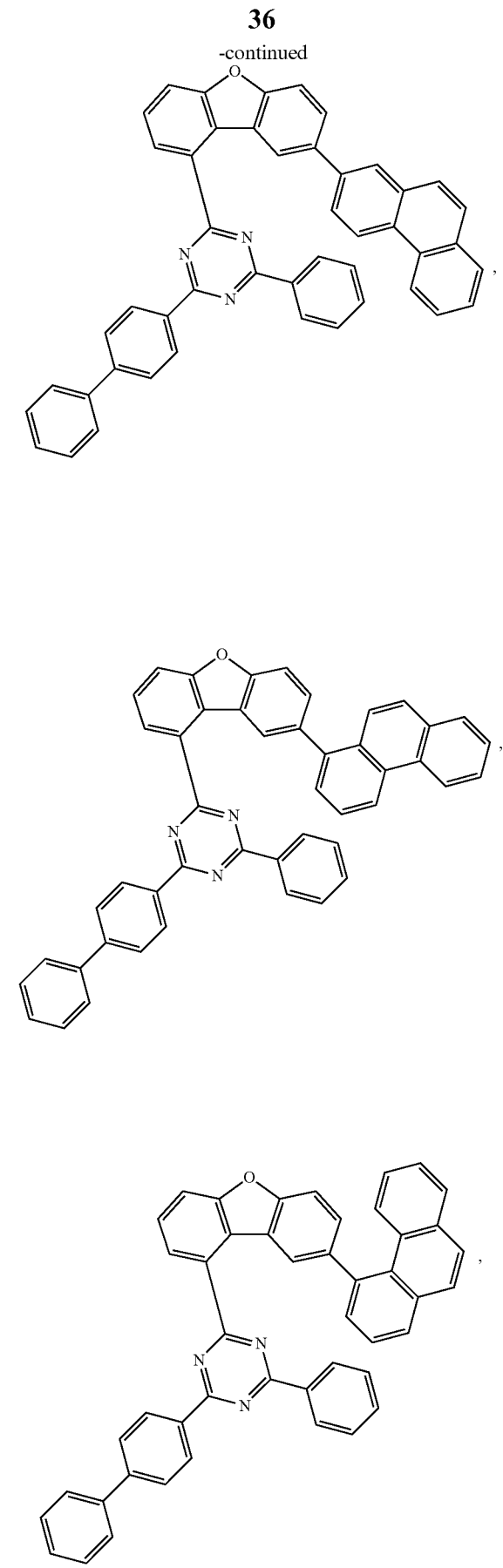

37
-continued
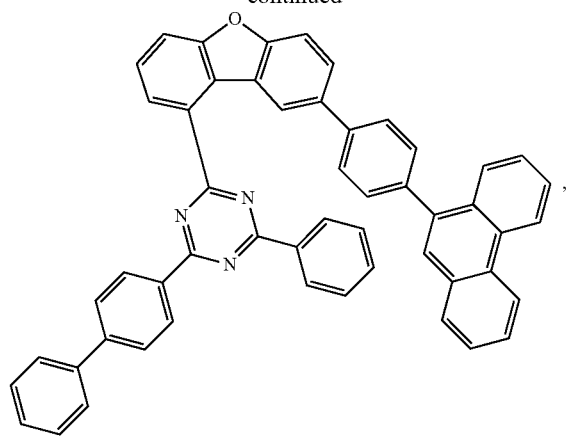
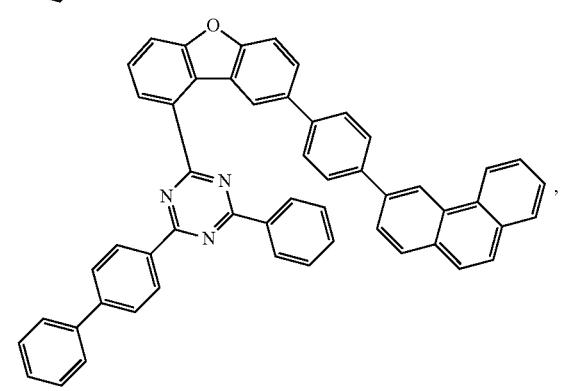
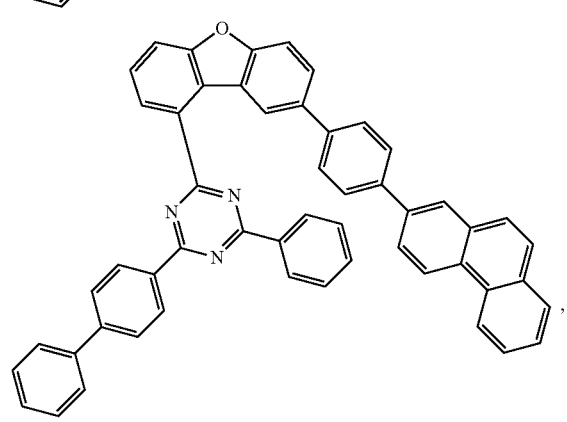
38
-continued
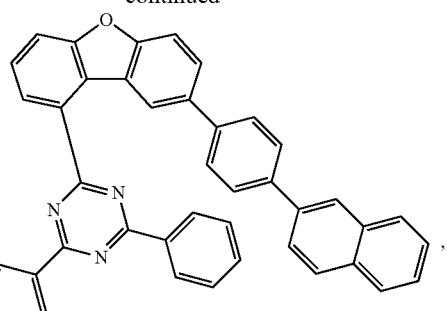
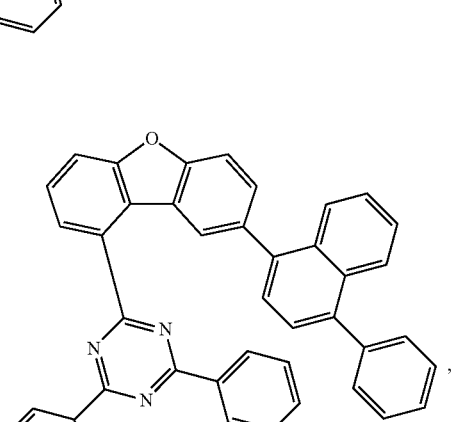
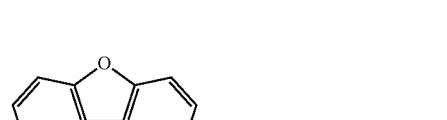
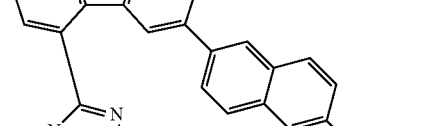

-continued
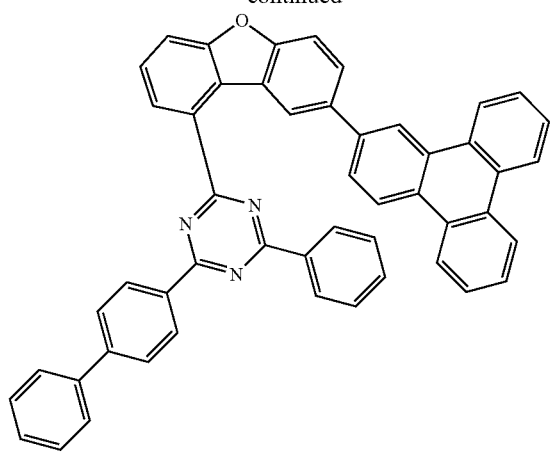
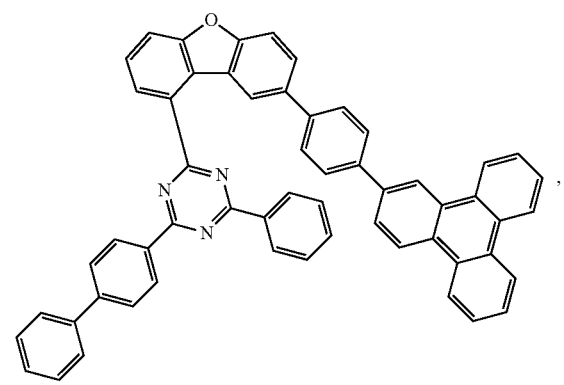
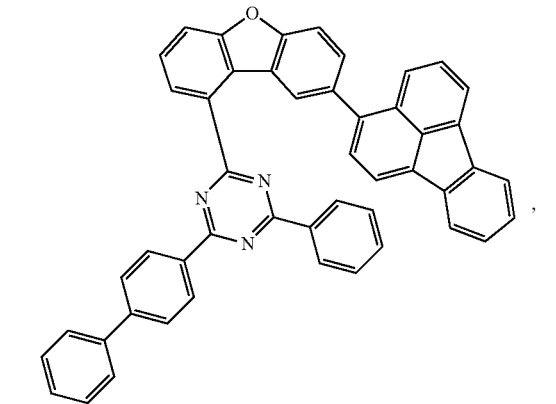
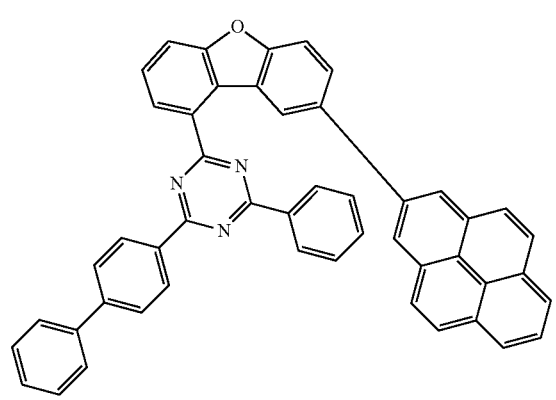
-continued
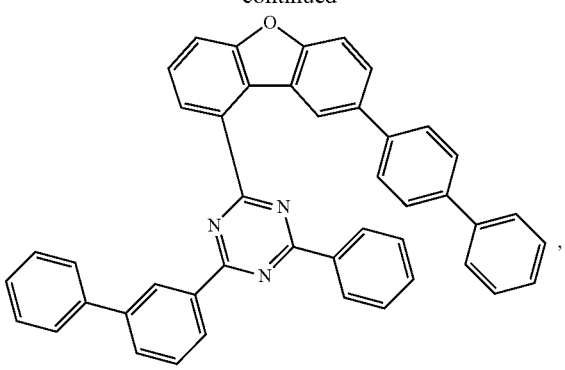
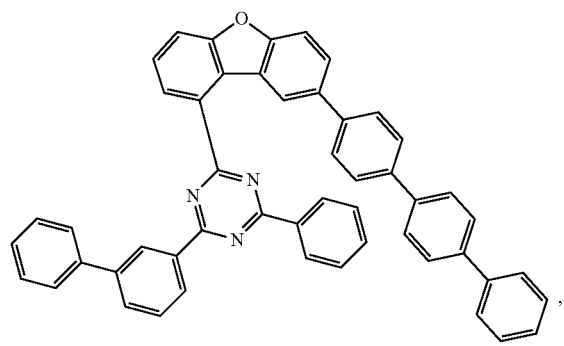
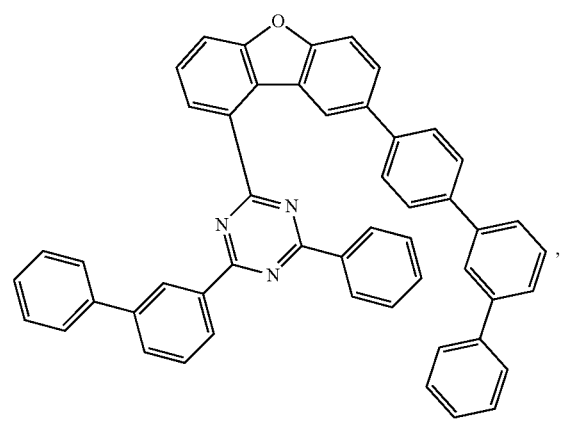
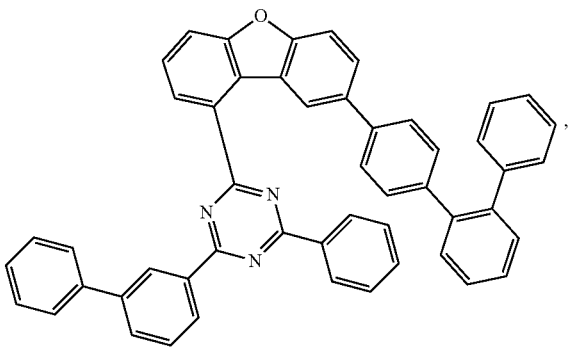

41
-continued
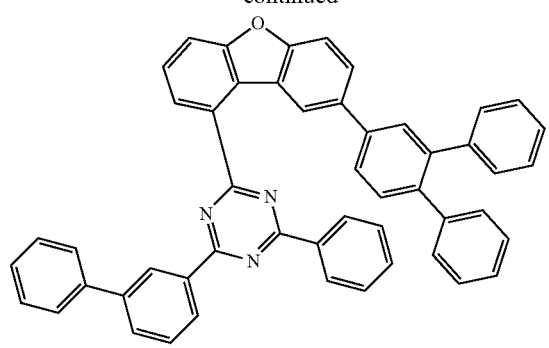
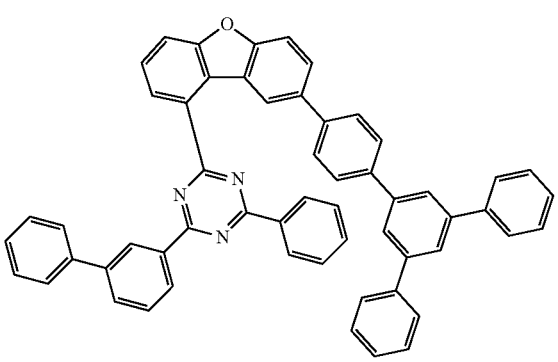
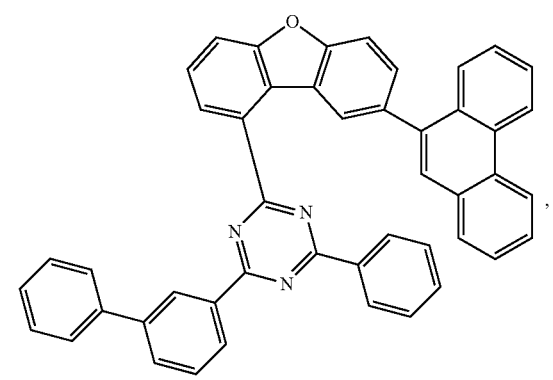
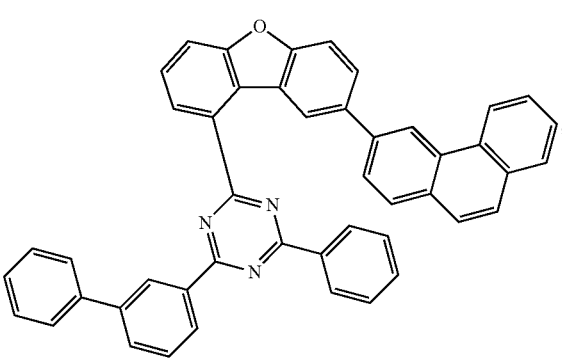
42
-continued
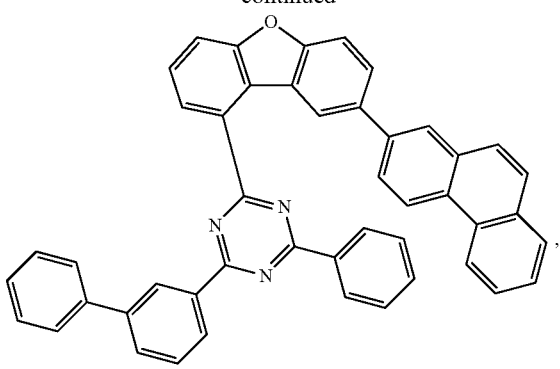
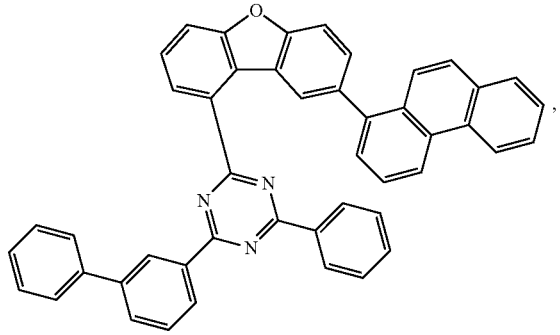
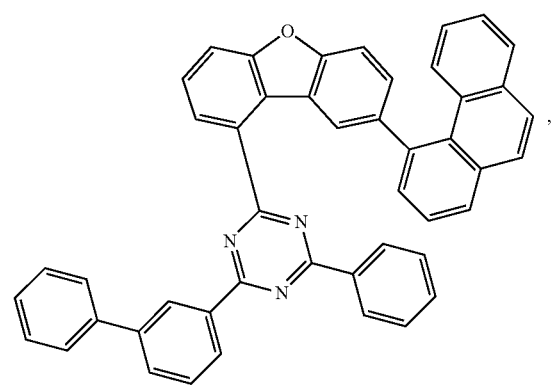
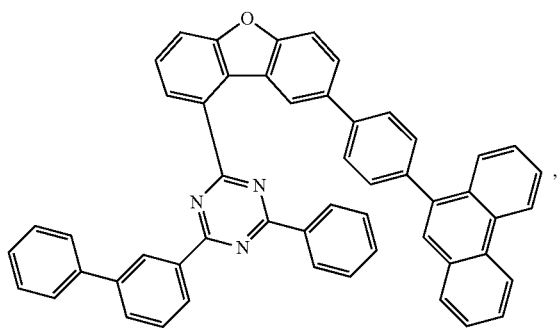
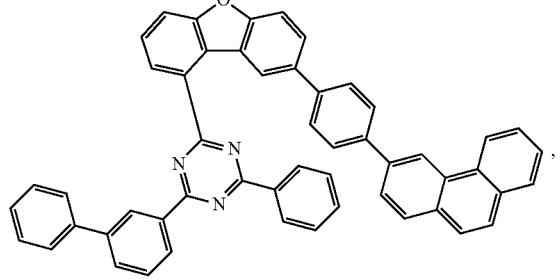

-continued
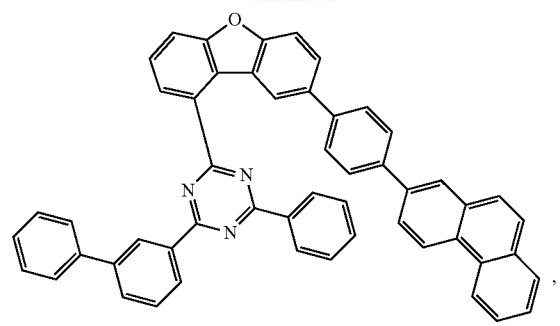
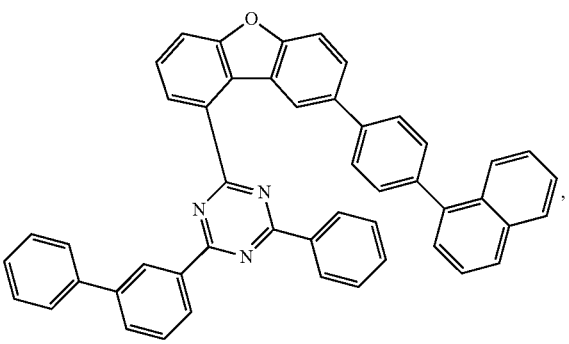
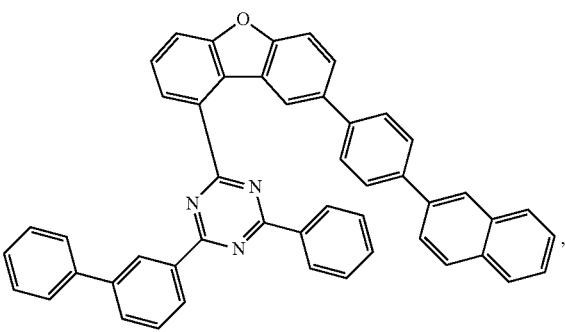
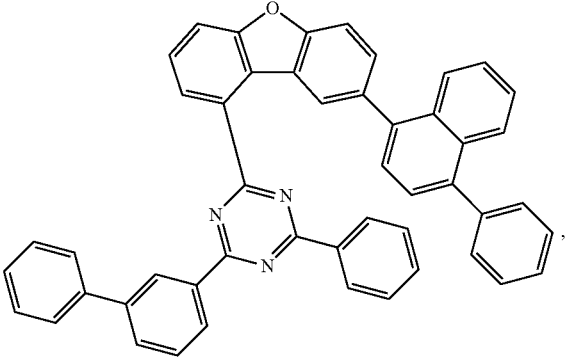
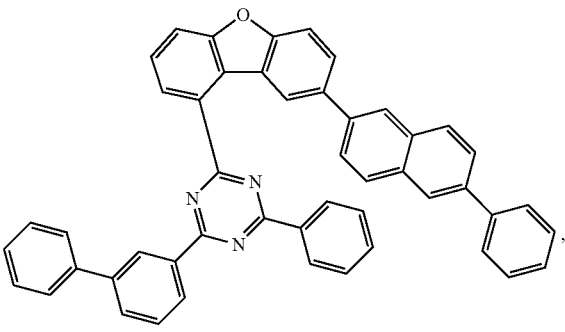
-continued
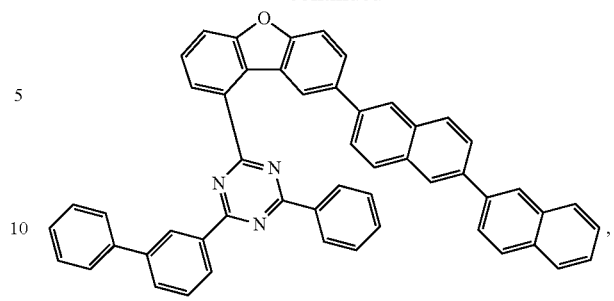
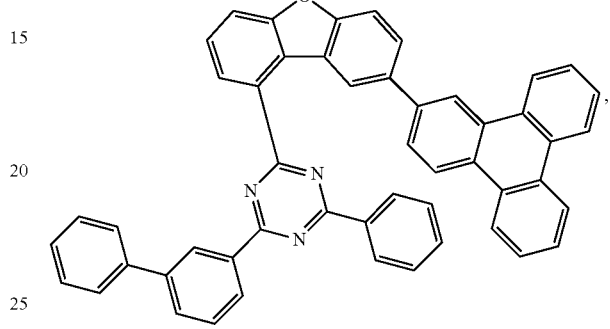
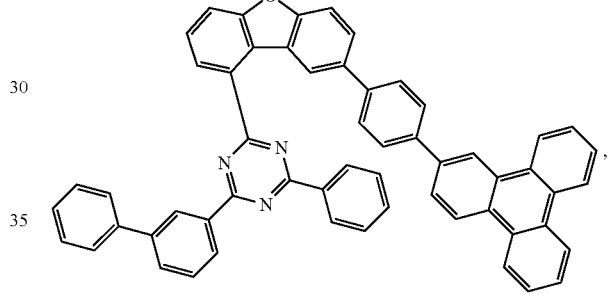
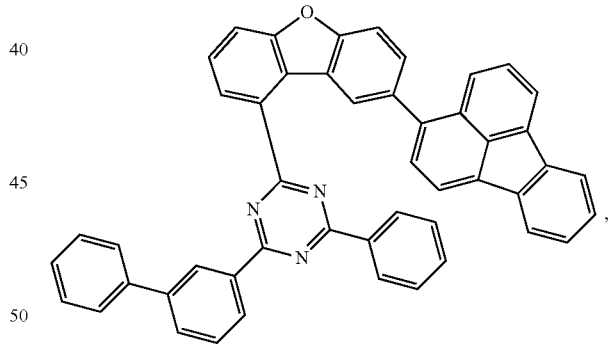
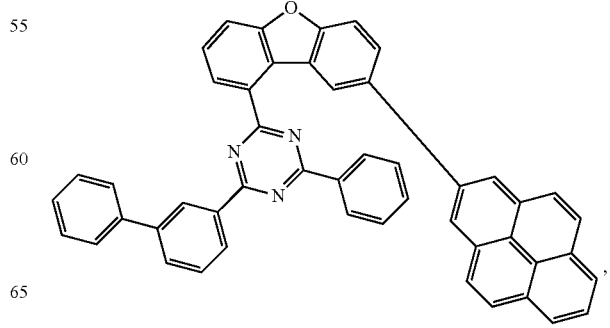

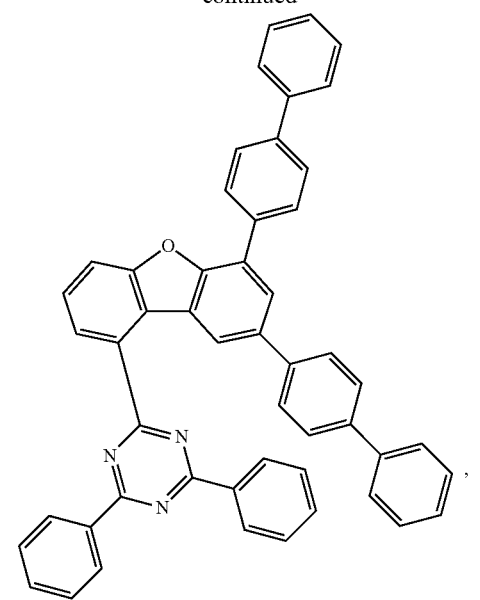
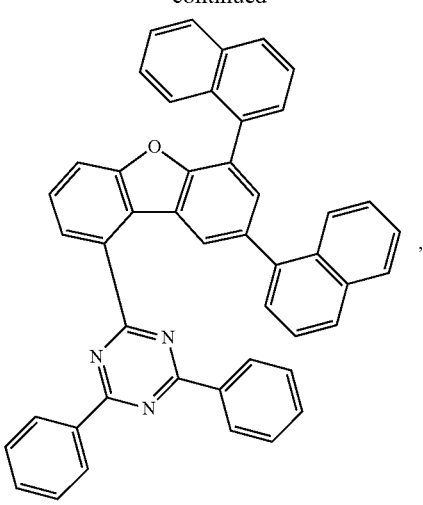
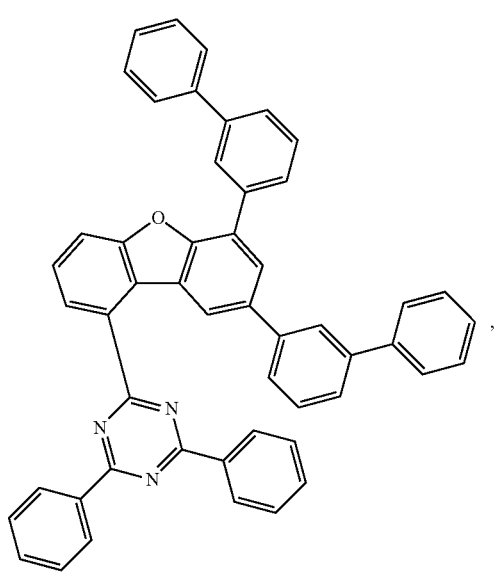
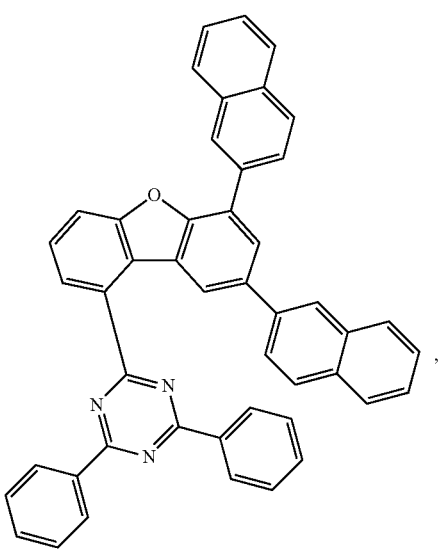
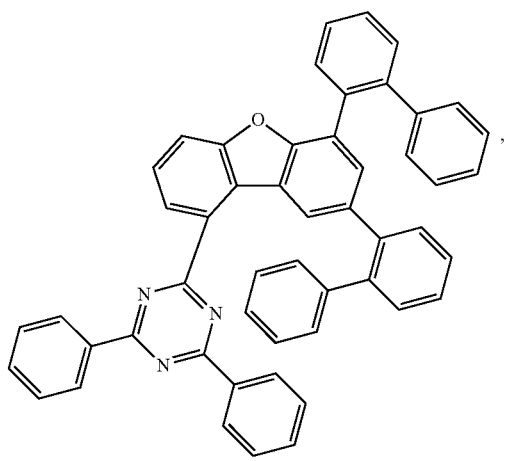

-continued
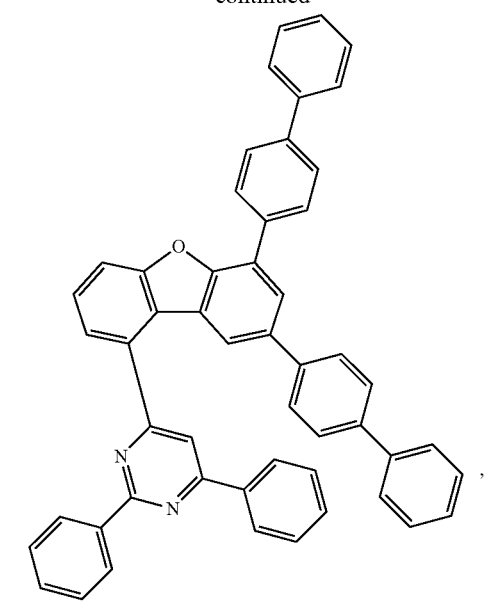
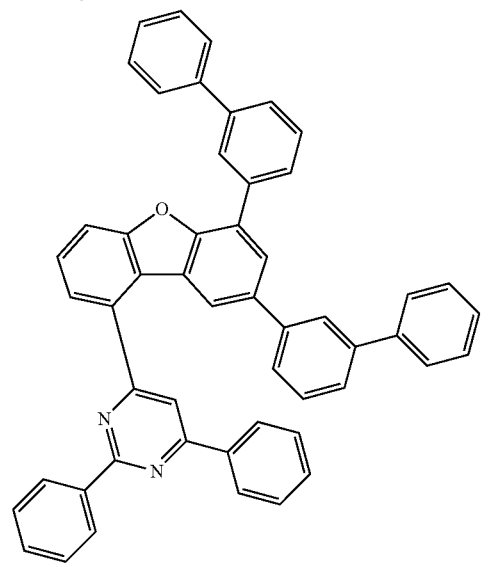
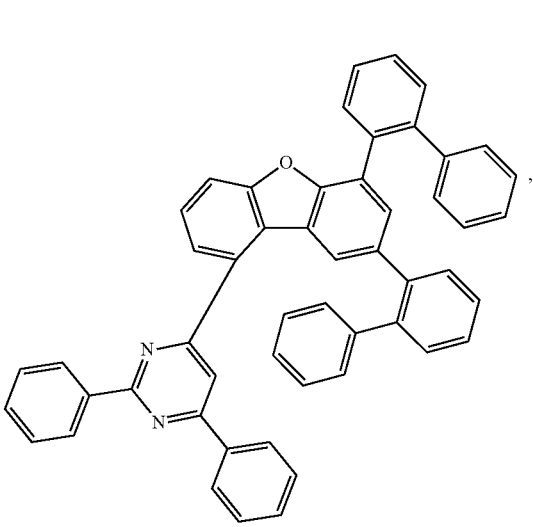
-continued
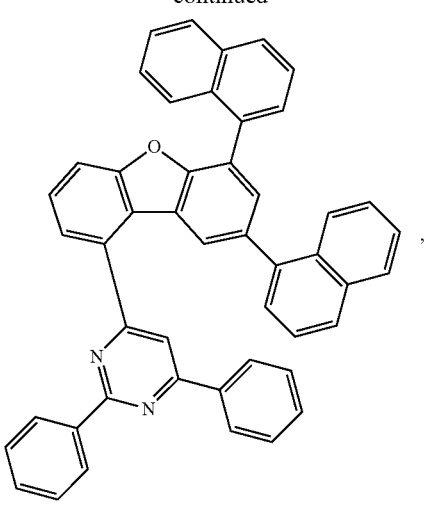
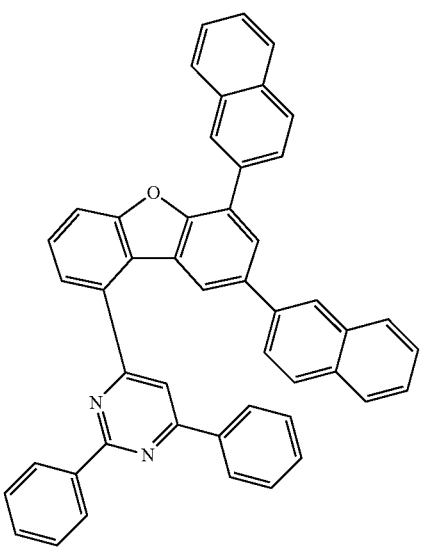
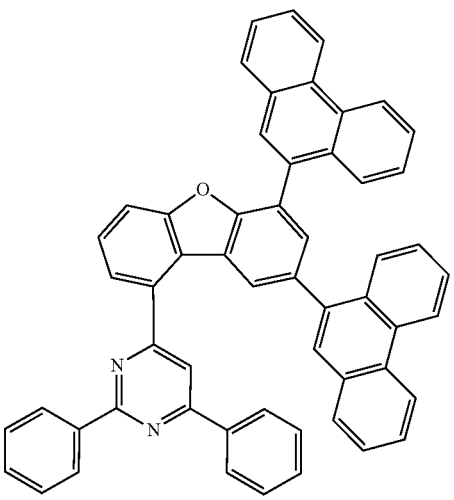

-continued
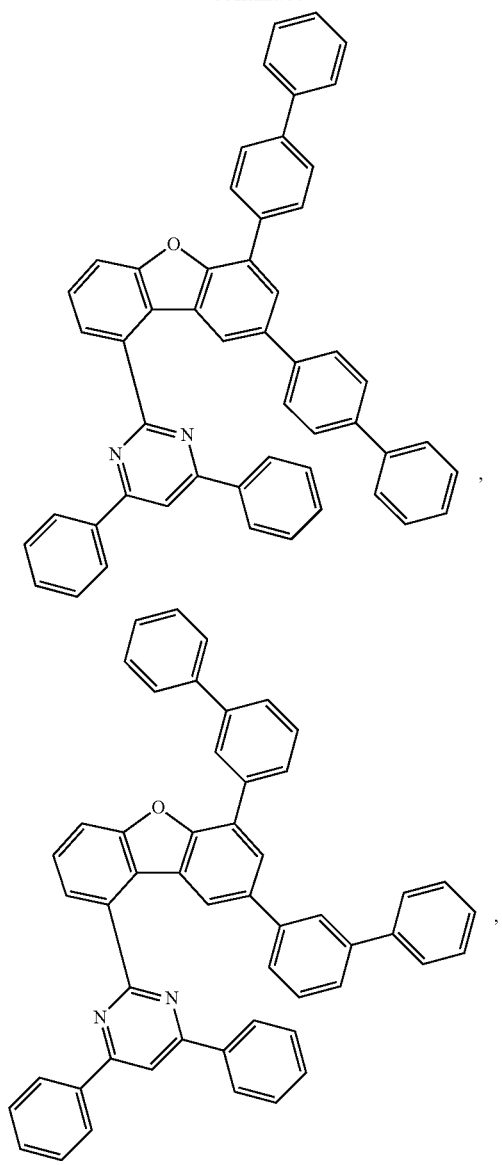
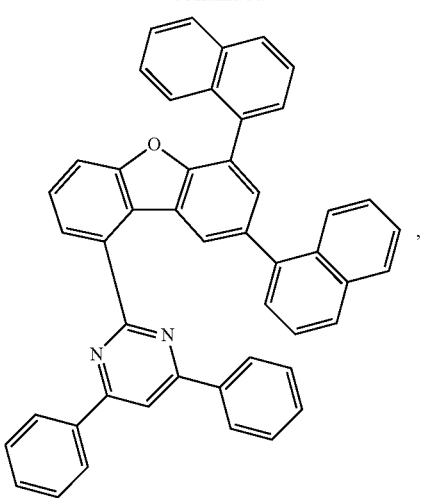
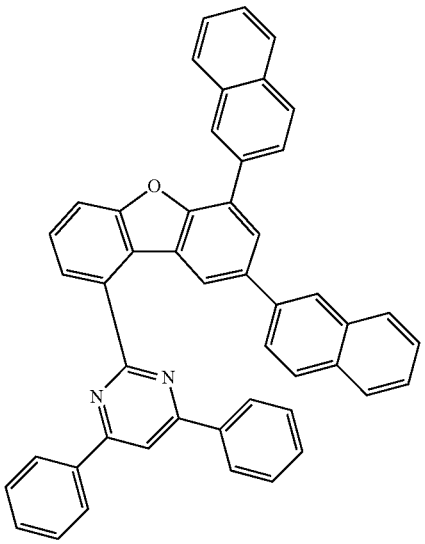
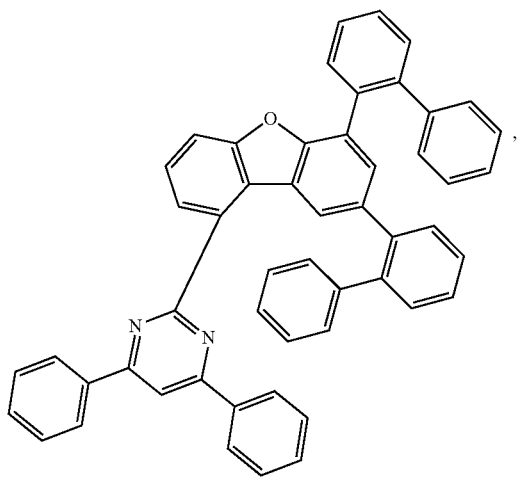
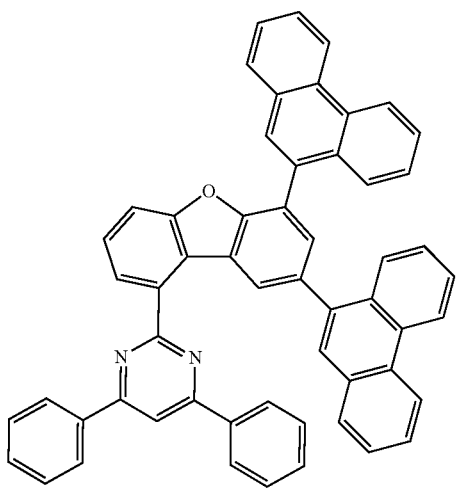

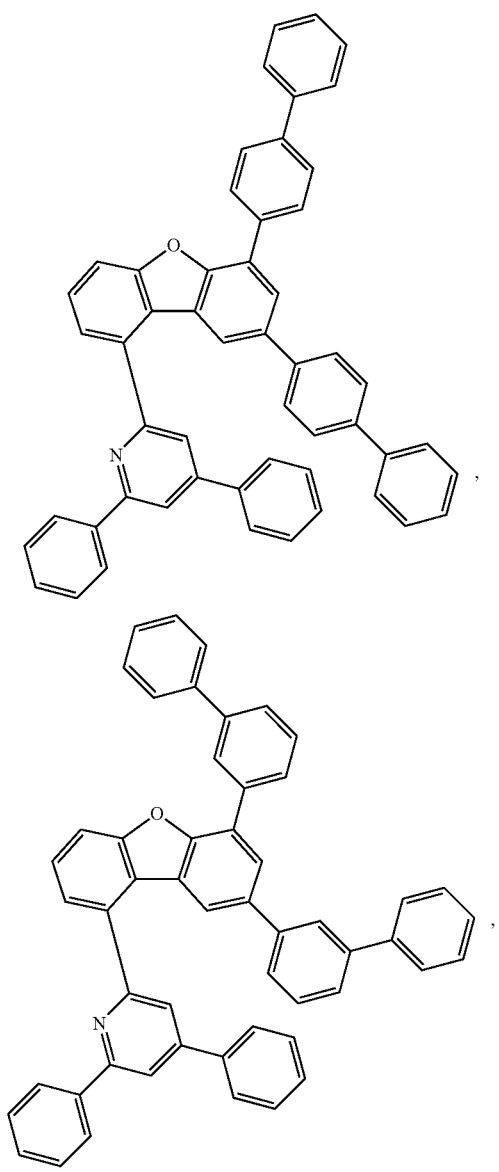
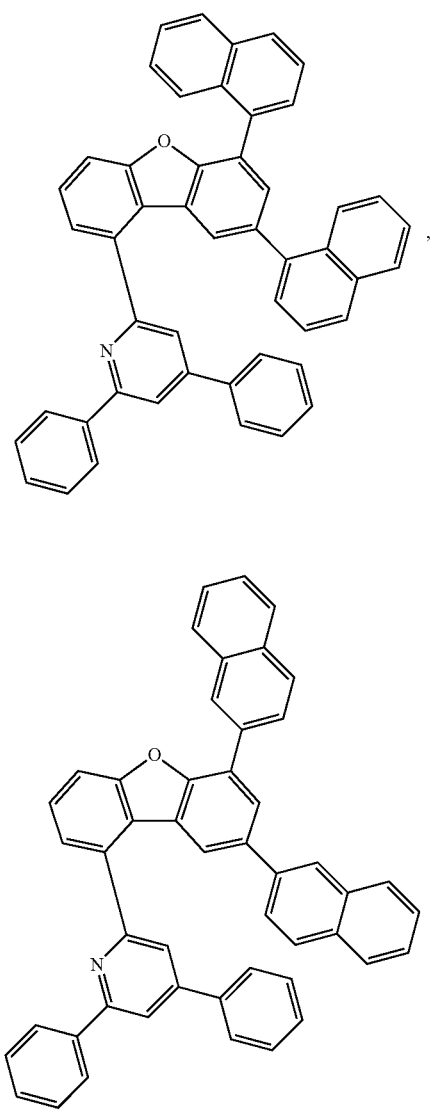
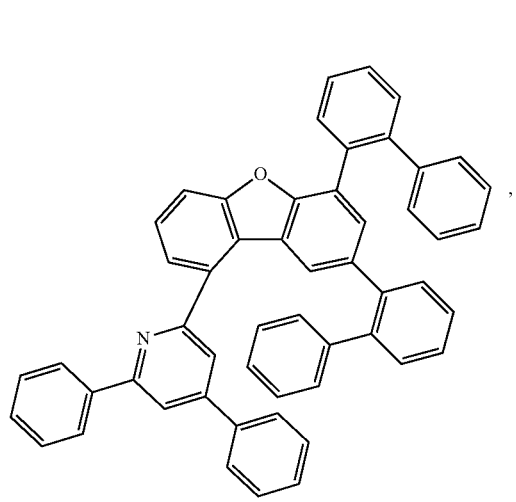
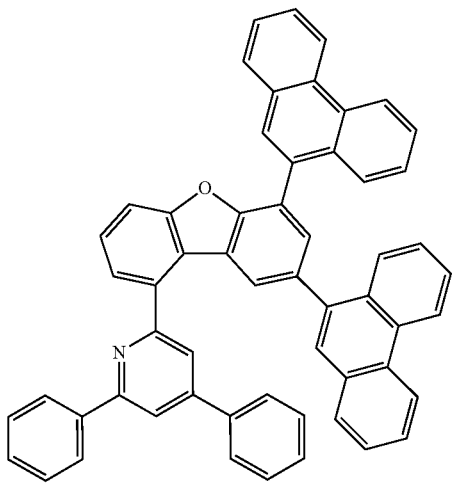

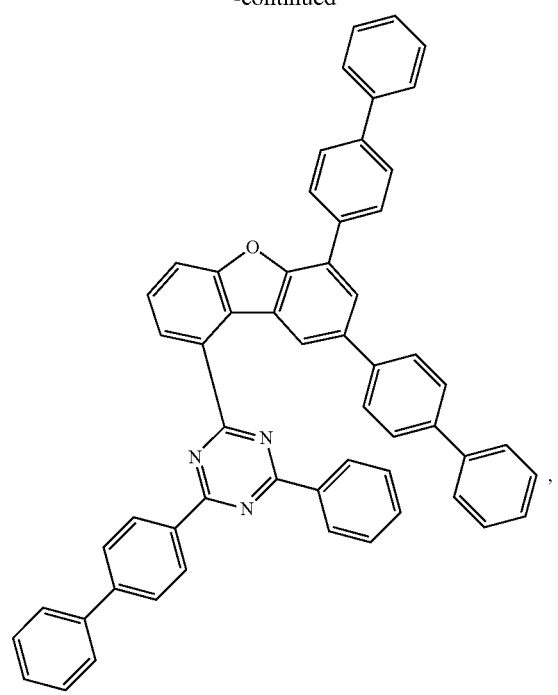
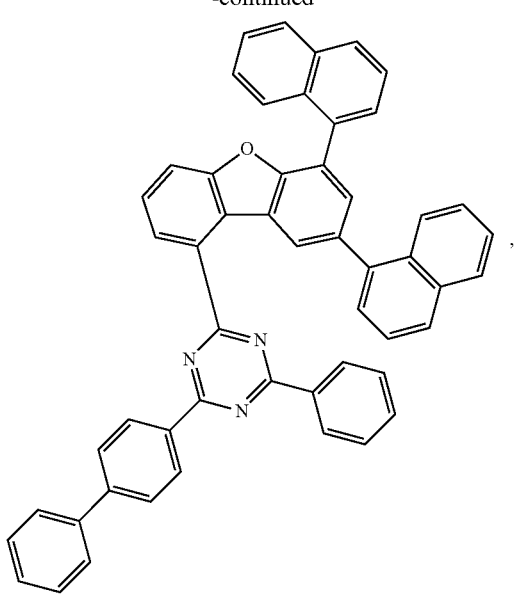
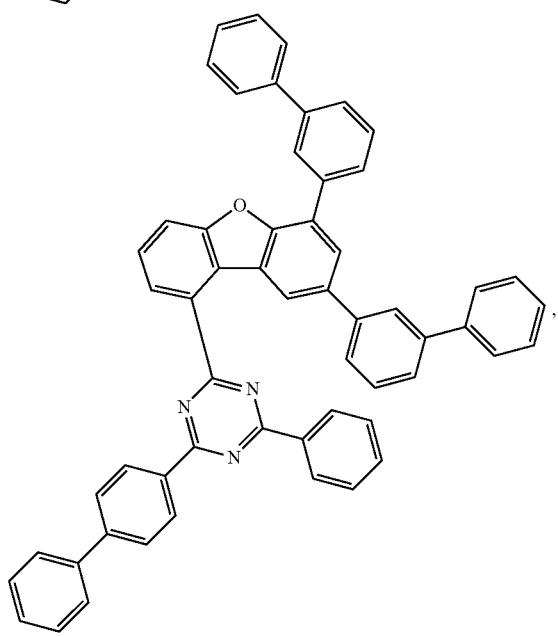
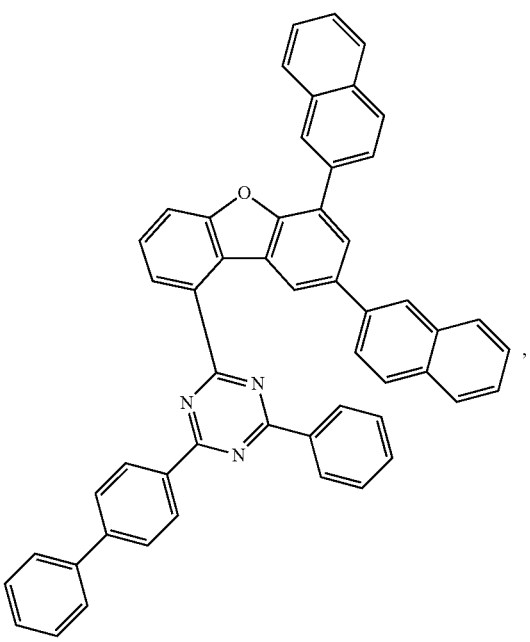
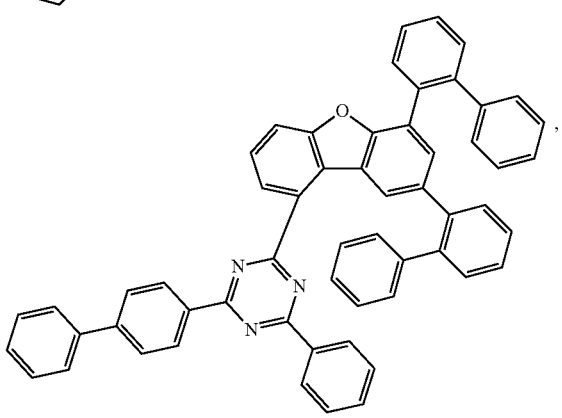

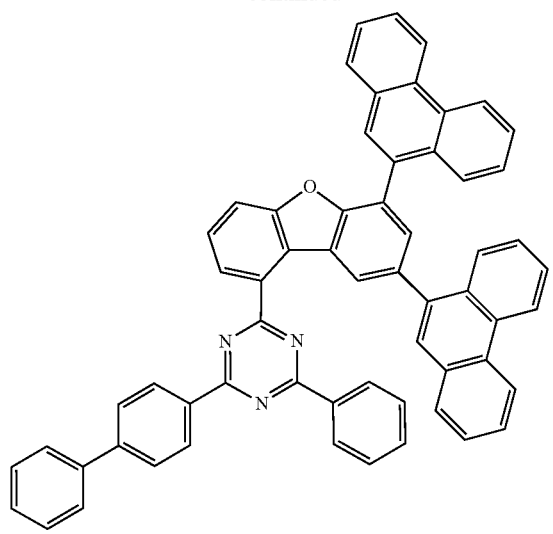
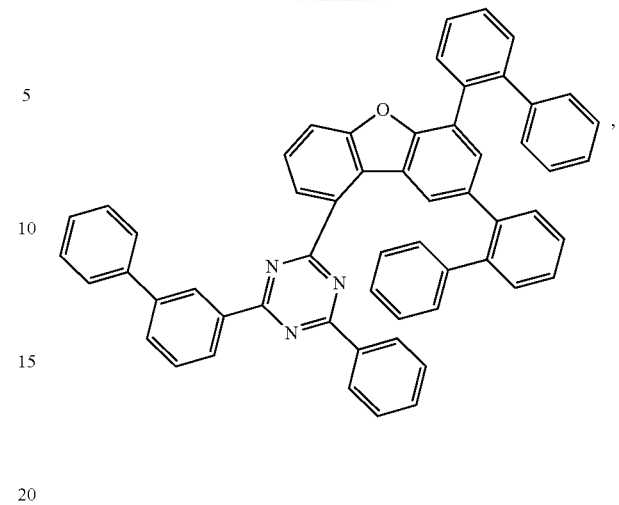
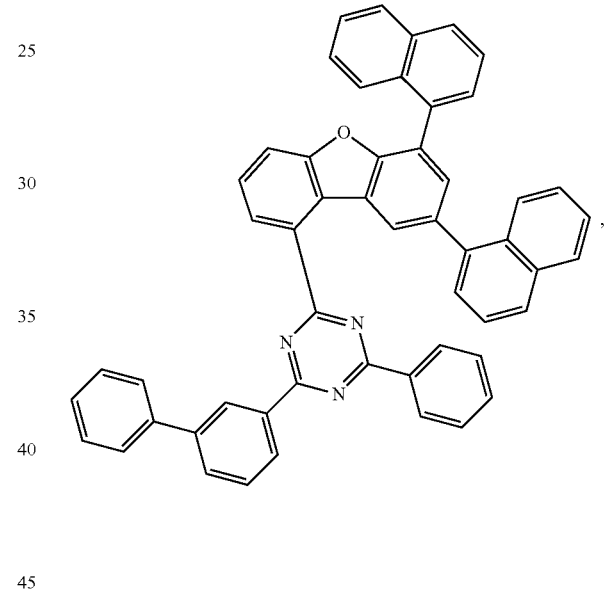
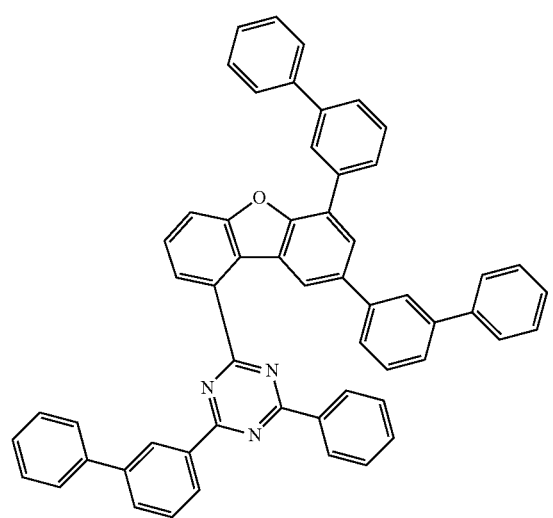
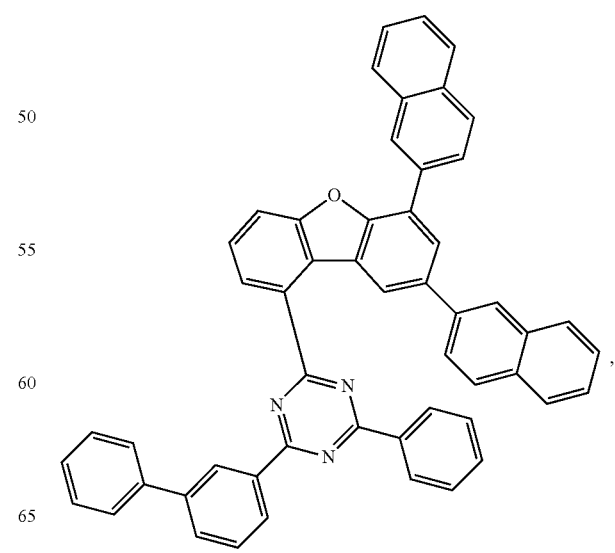

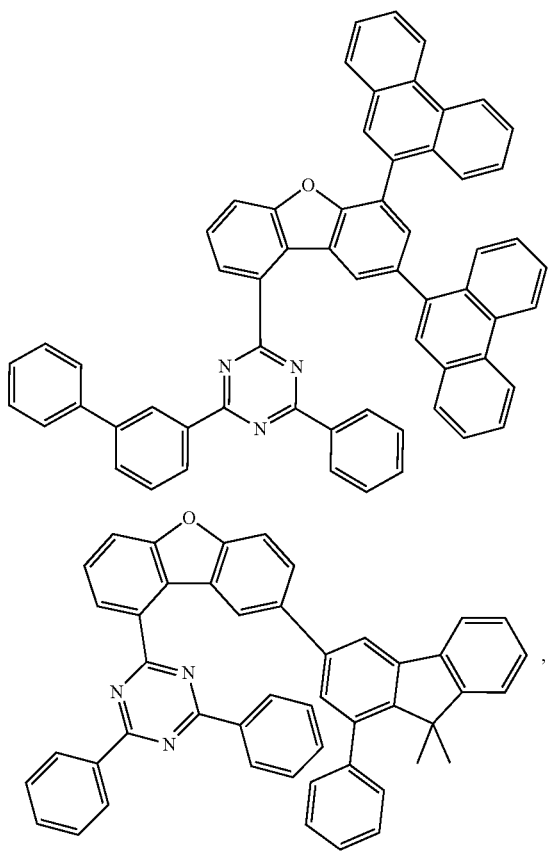

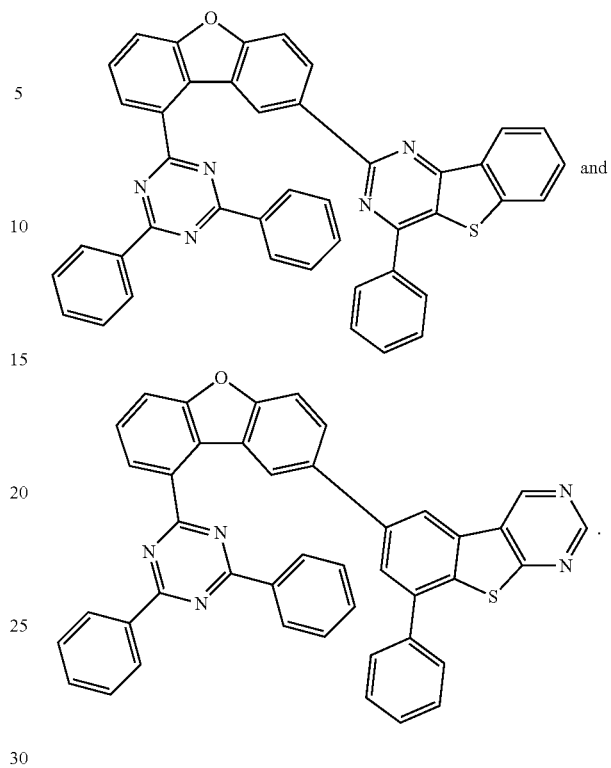

In Chemical Formula 2, $Ar^4$ to $Ar^6$ can each independently be a monovalent residue derived from an arena which is selected from the group consisting of benzene, biphenyl, terphenyl, naphthalene, phenanthrene, triphenylene, 9,9-dimethylfluorene, 9,9-diphenylfluorene, and spiro[fluorene-9,9'-fluorene].

Specifically, $Ar^4$ and $Ar^5$ can each independently be a monovalent residue derived from an arene which is selected from the group consisting of biphenyl, terphenyl and 9,9-dimethylfluorene, and each $Ar^6$ can independently be a monovalent residue derived from an arene which is selected from the group consisting of benzene, biphenyl, terphenyl, naphthalene, phenanthrene, triphenylene, and 9,9-dimethylfluorene.

The compound of Chemical Formula 3 can be selected from the group consisting of the following compounds:

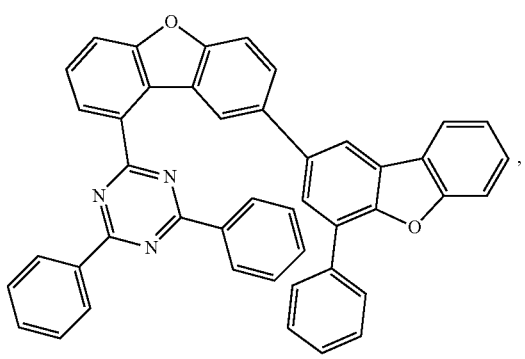

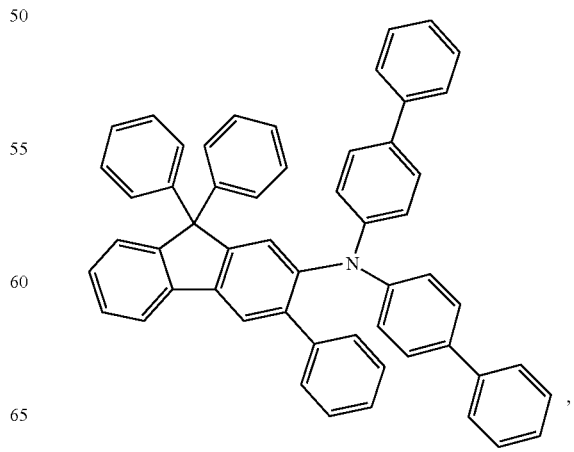

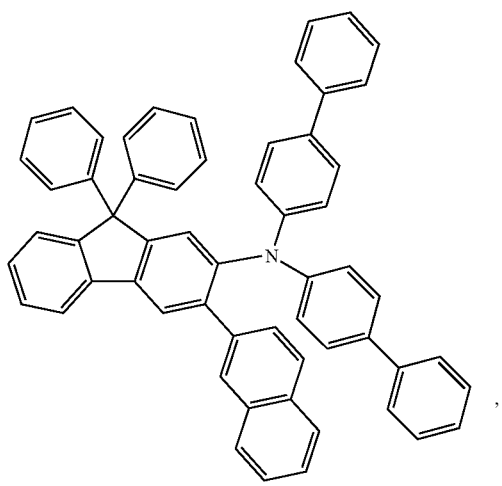
,
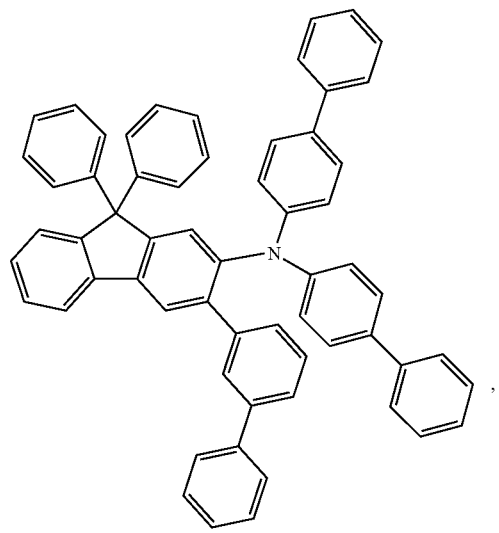
,
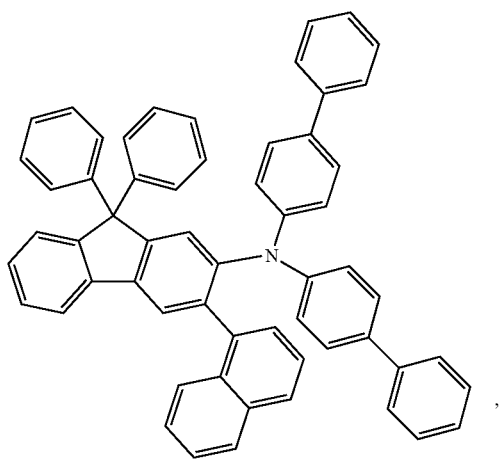
,
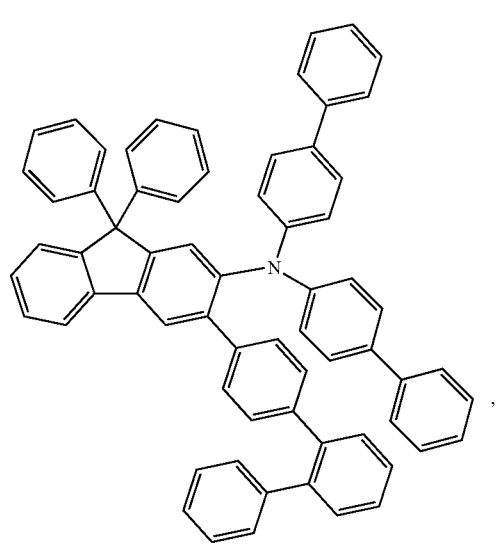
,
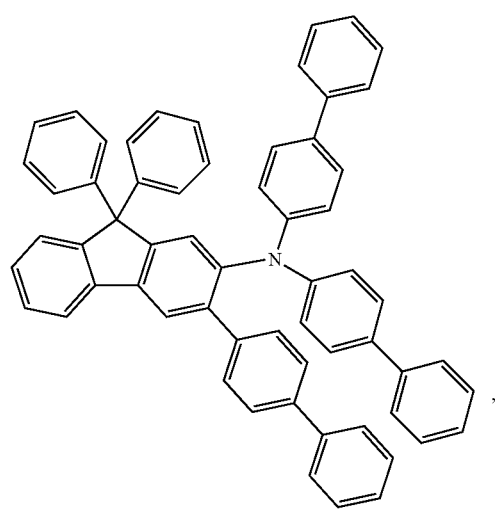
,
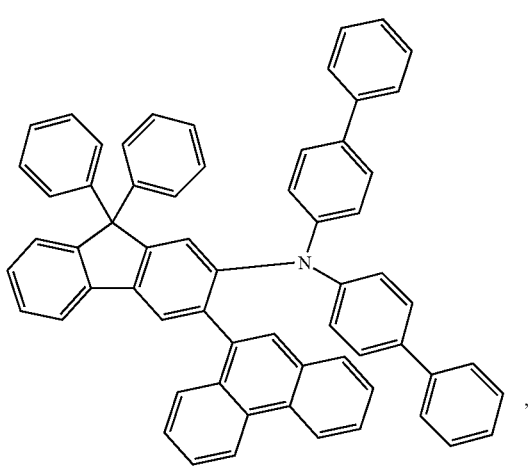
,

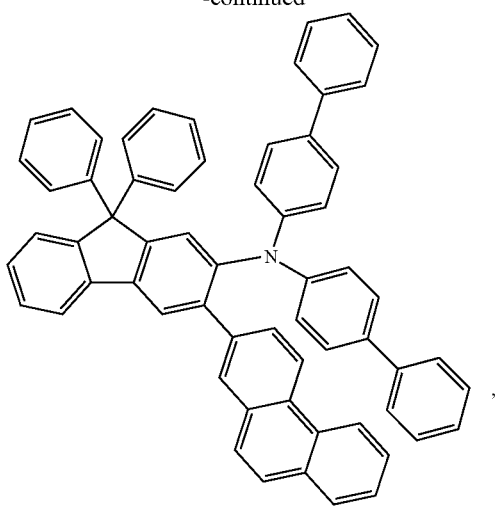
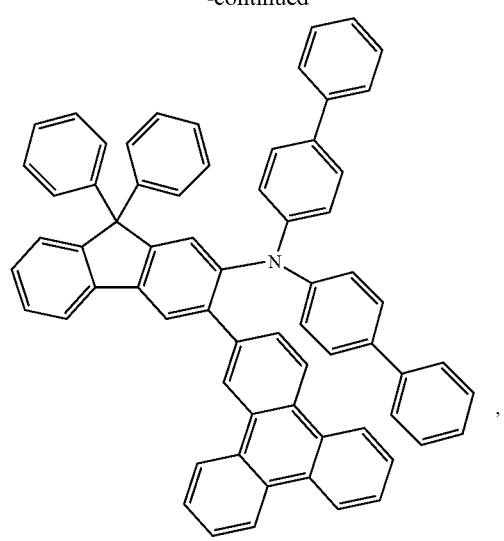
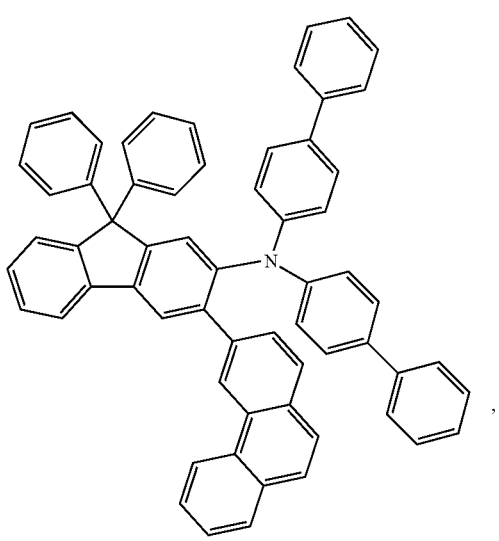
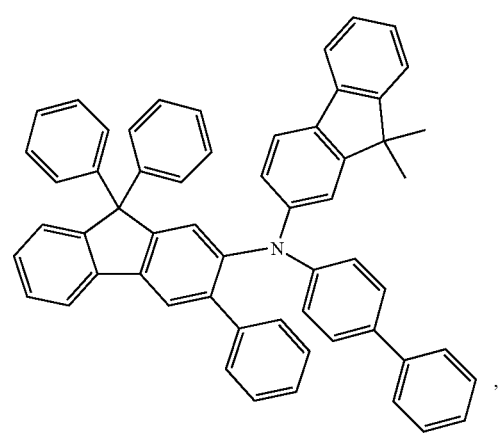
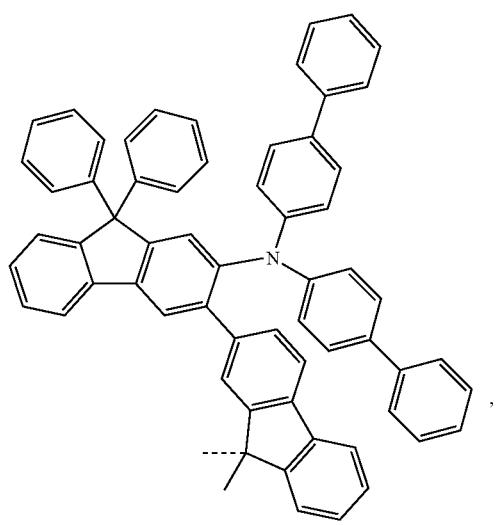
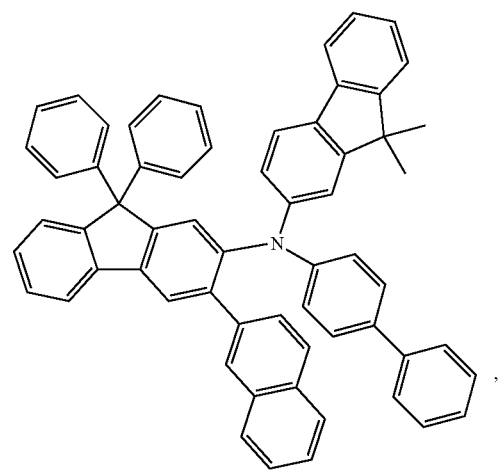

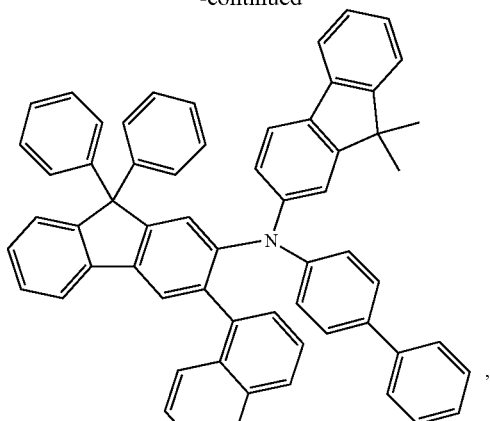
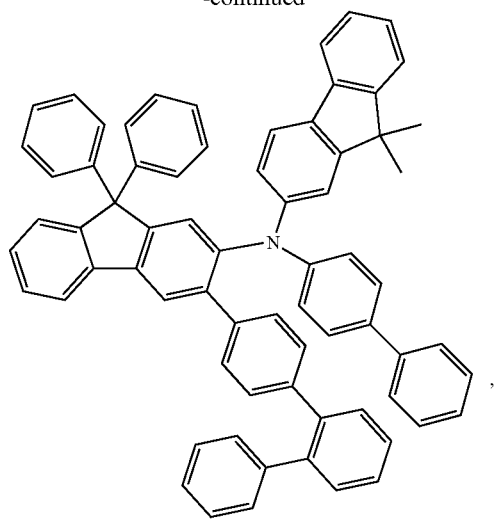
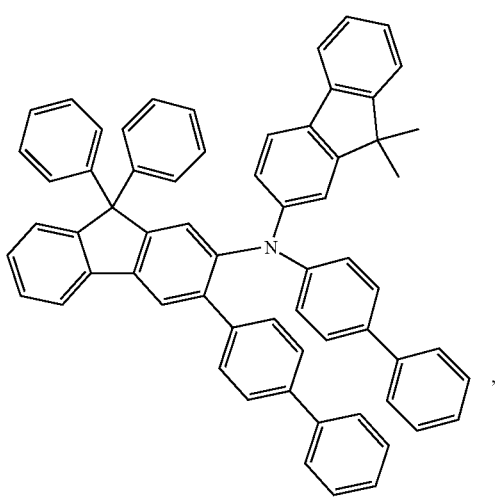
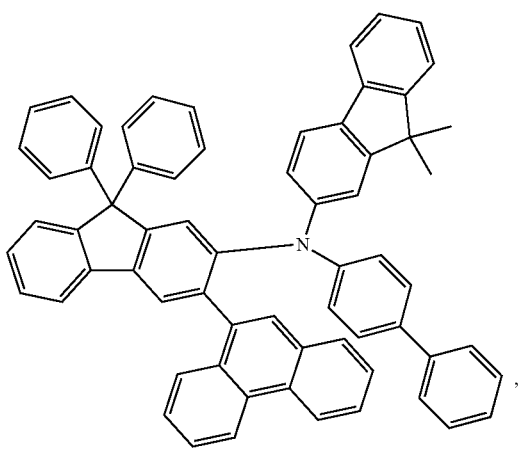
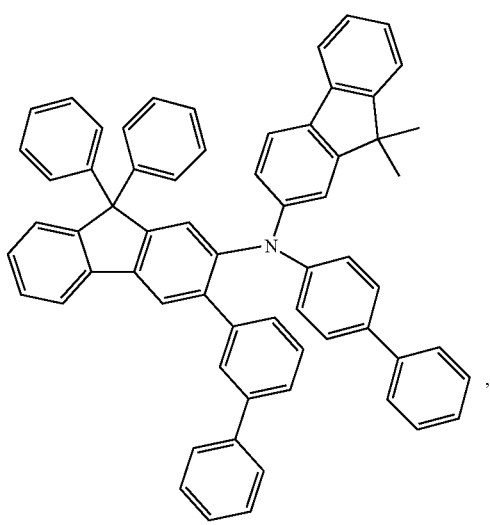
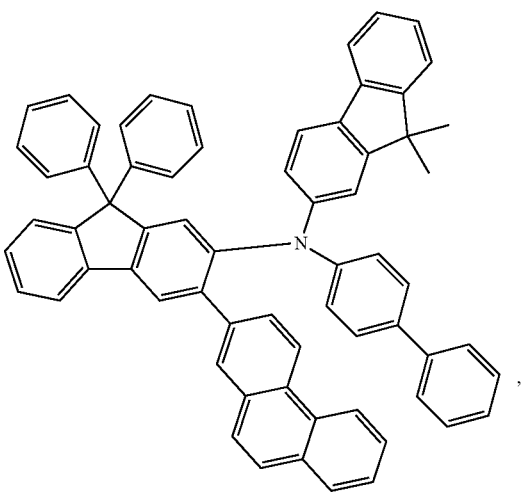

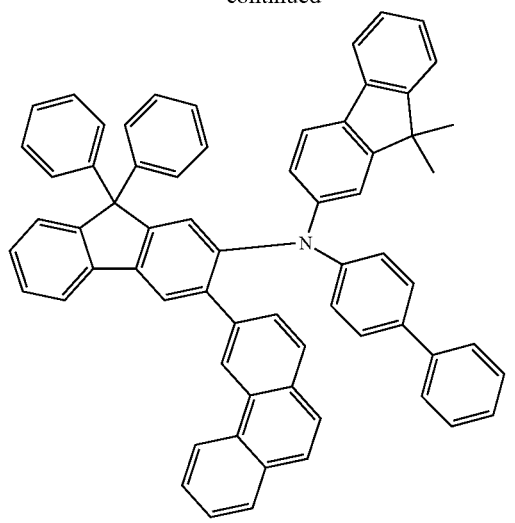
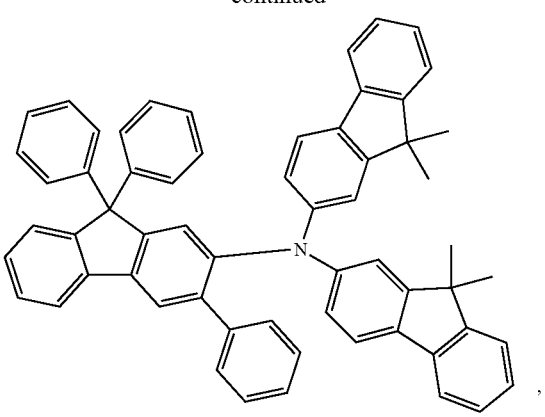
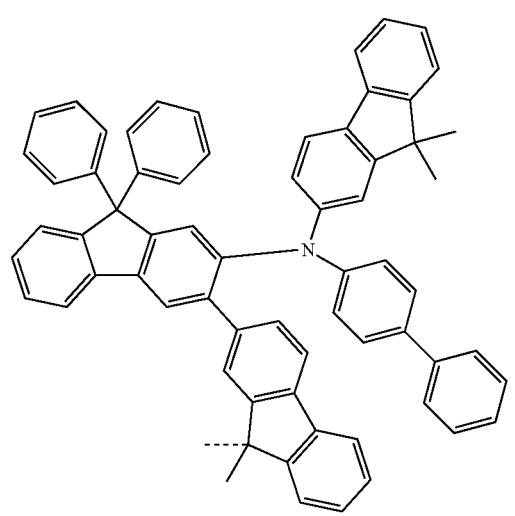
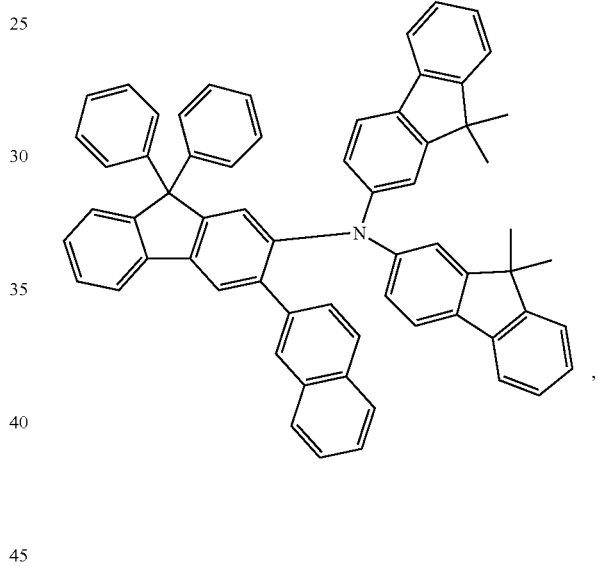
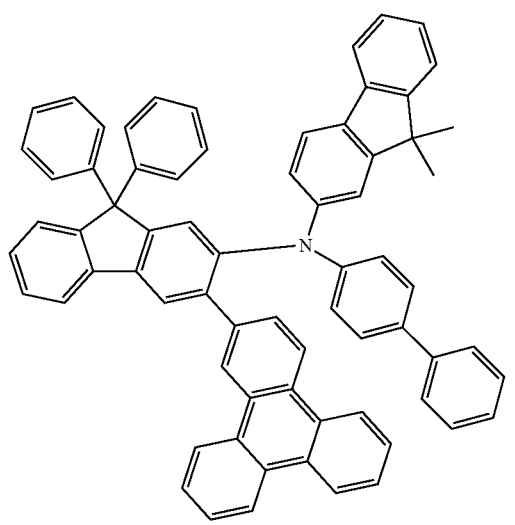
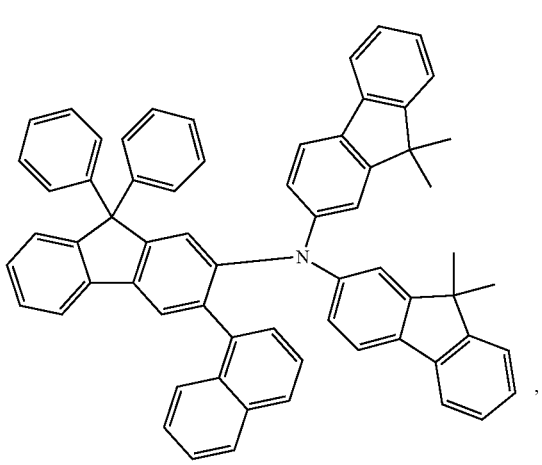

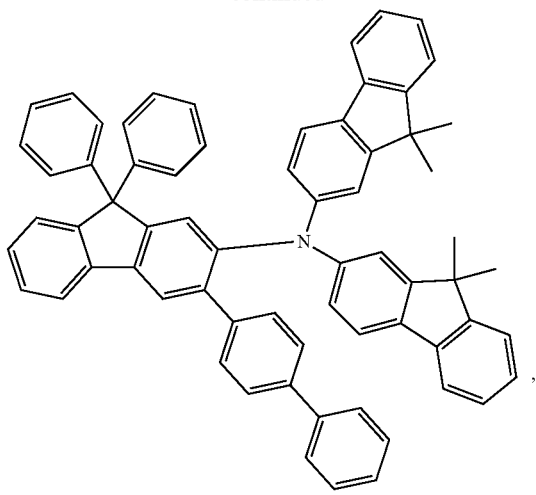
,
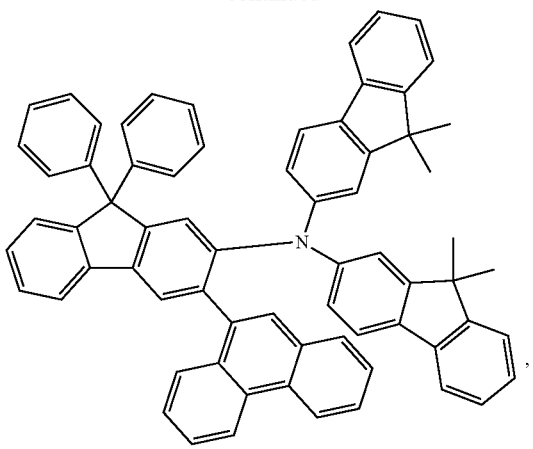
,
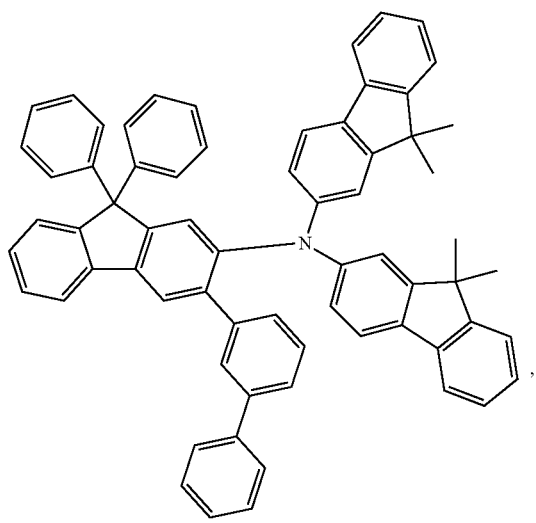
,
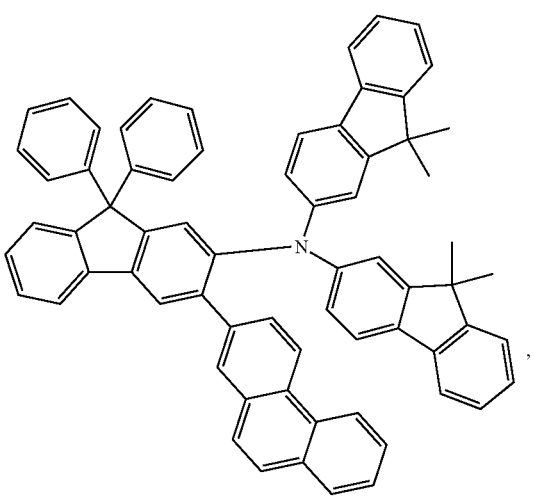
,
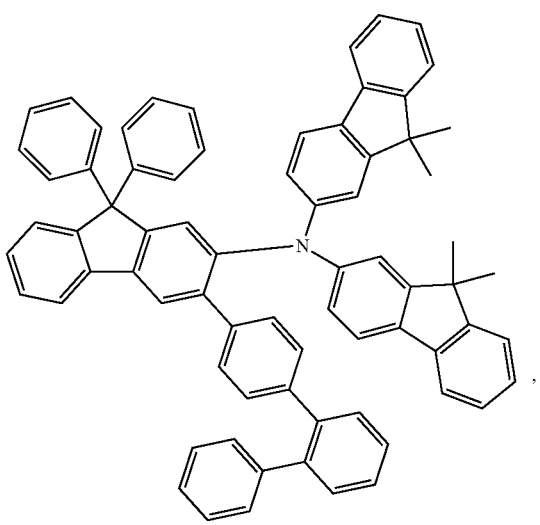
,
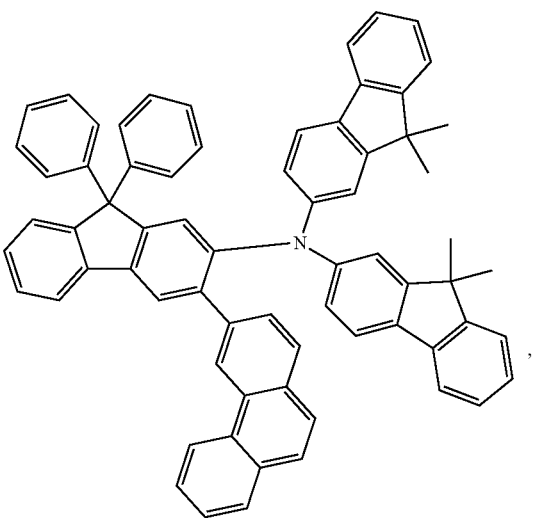
,

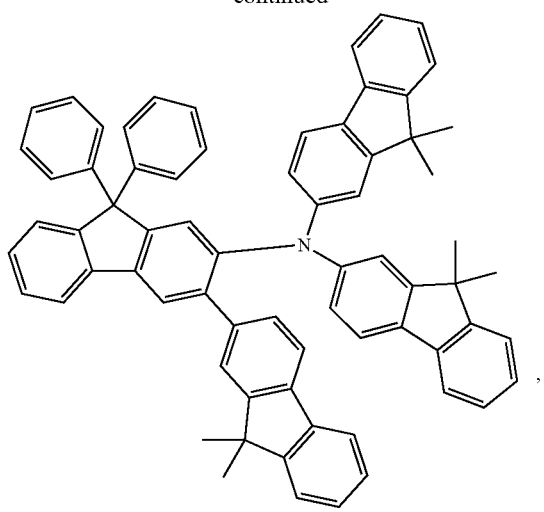,
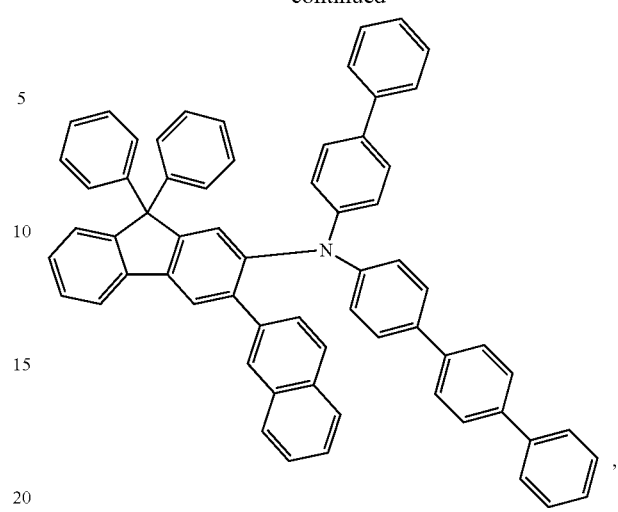,
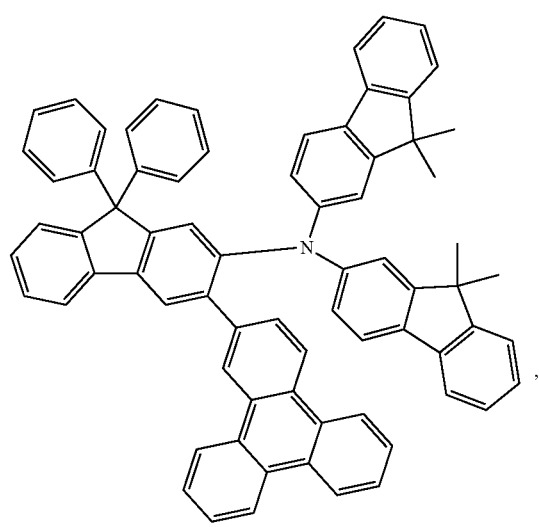,
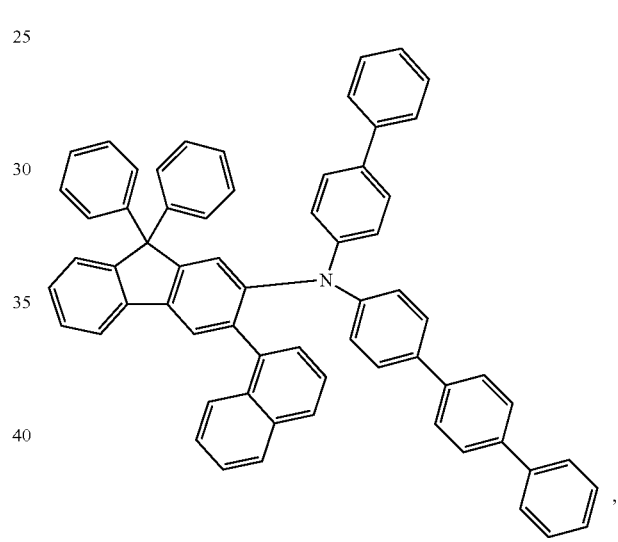,
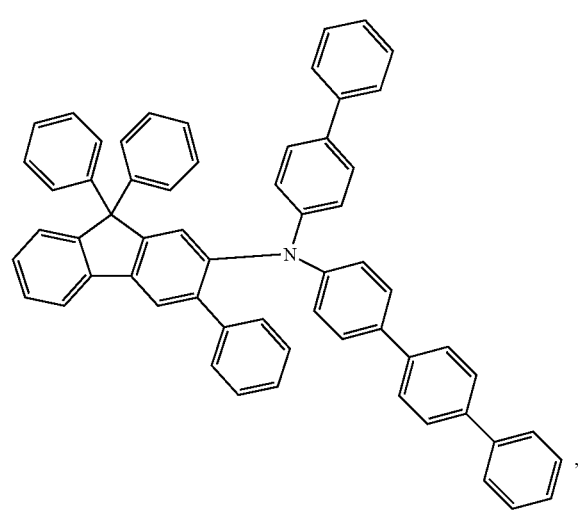,
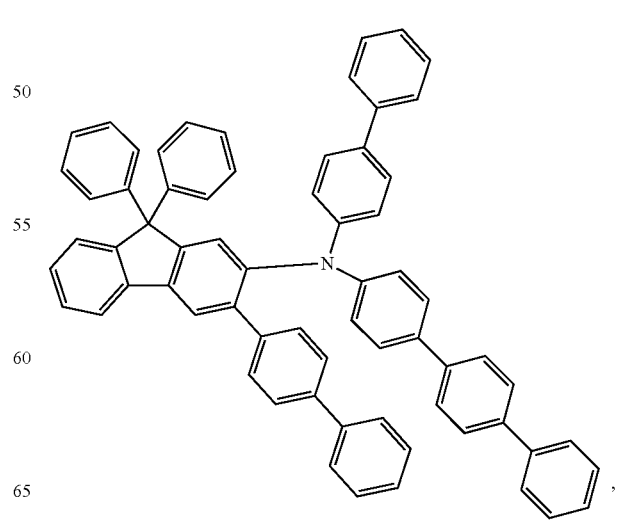,

71
-continued
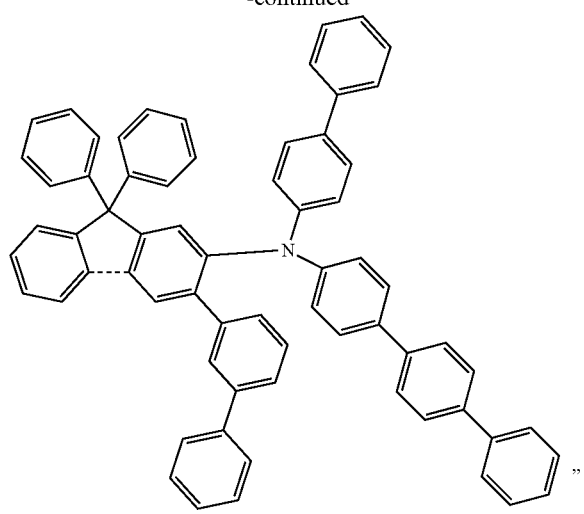
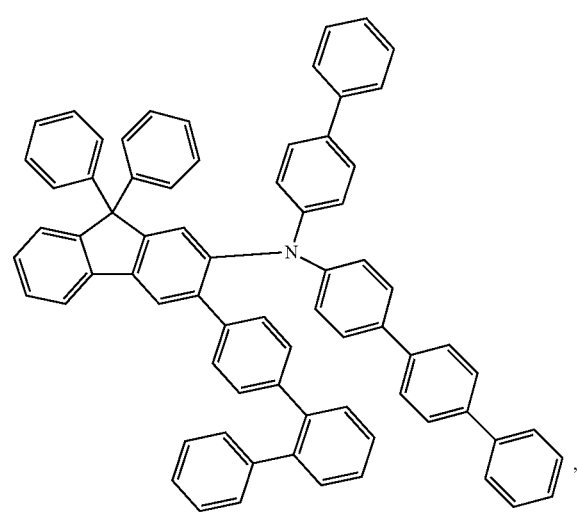
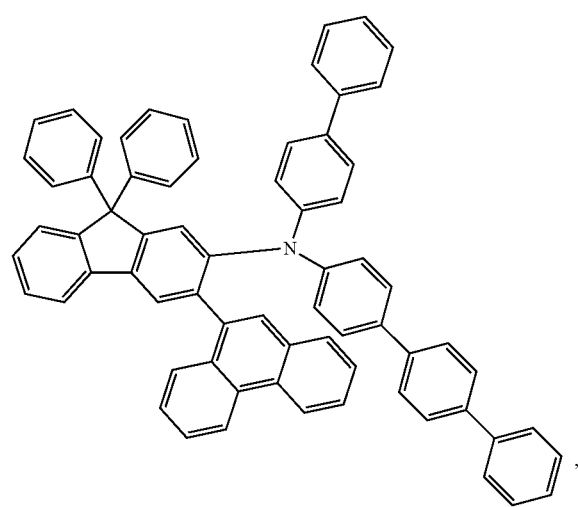
72
-continued
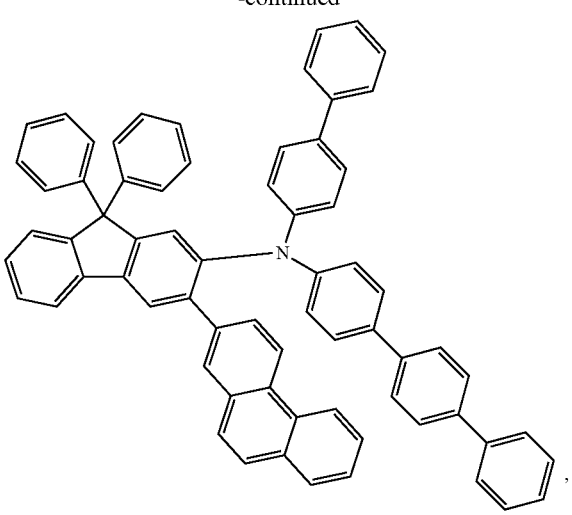
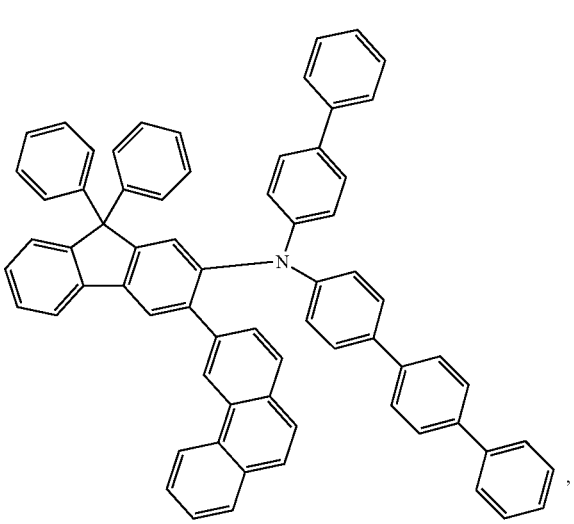
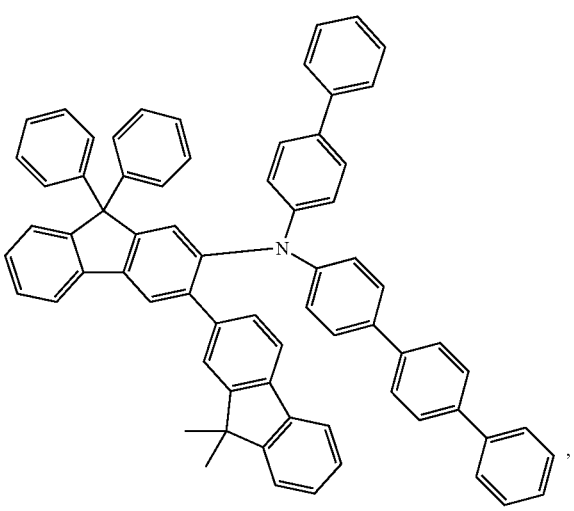

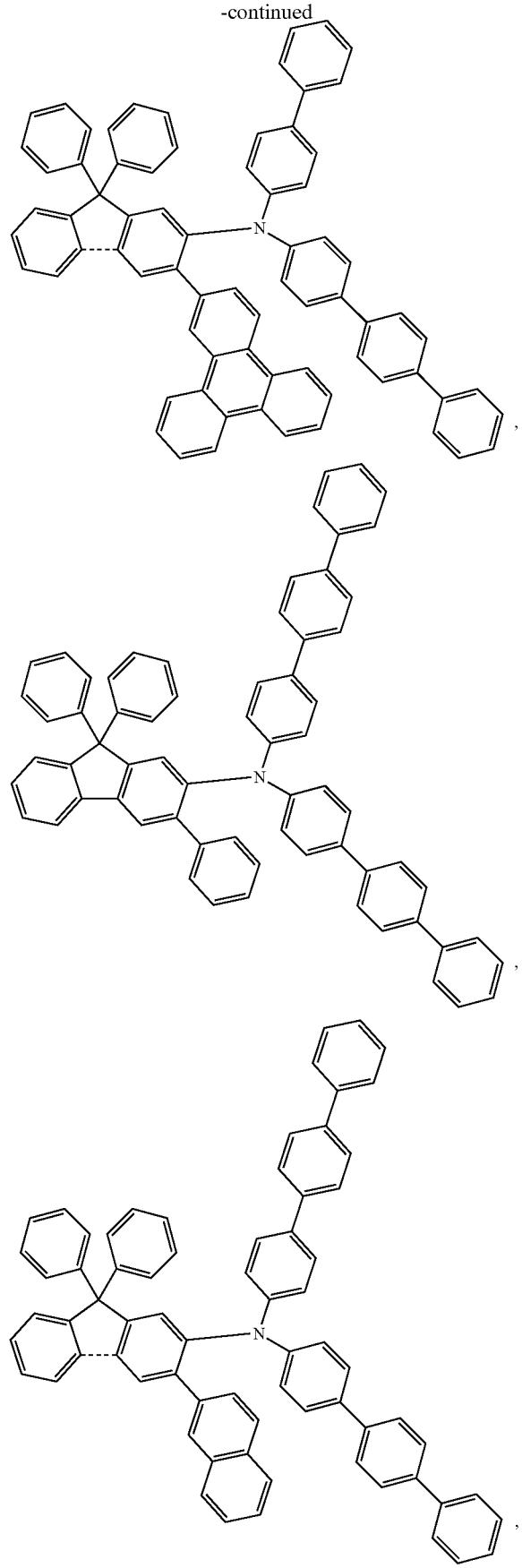
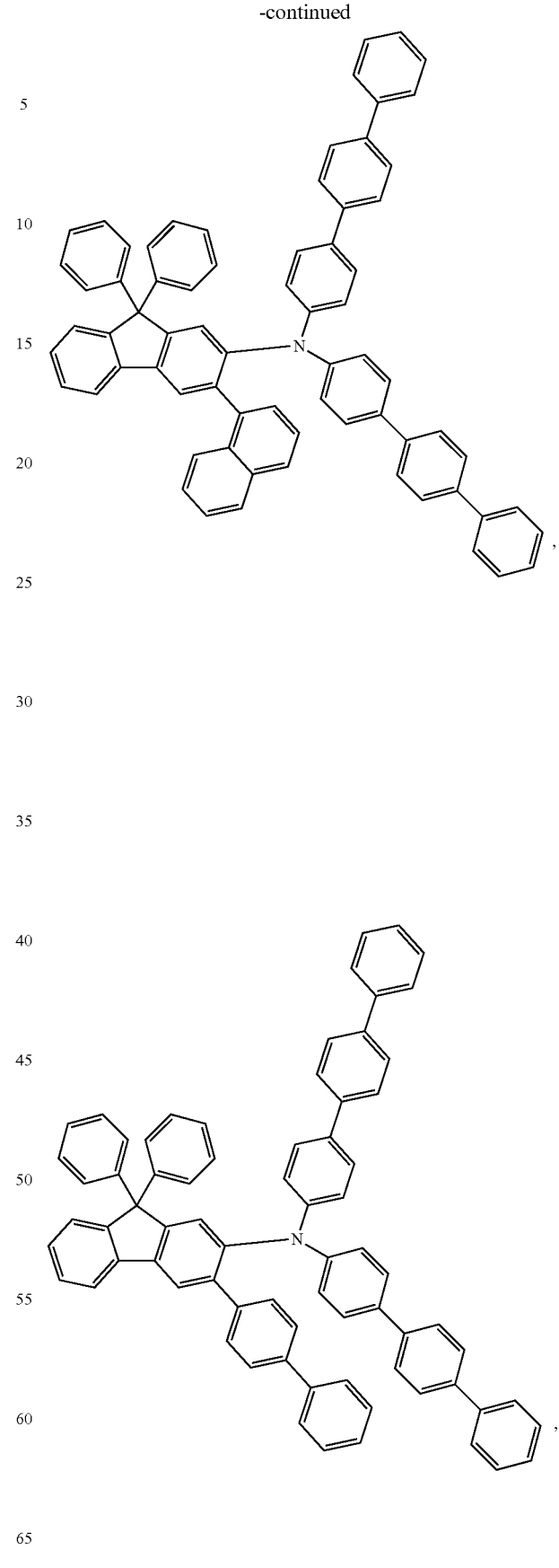

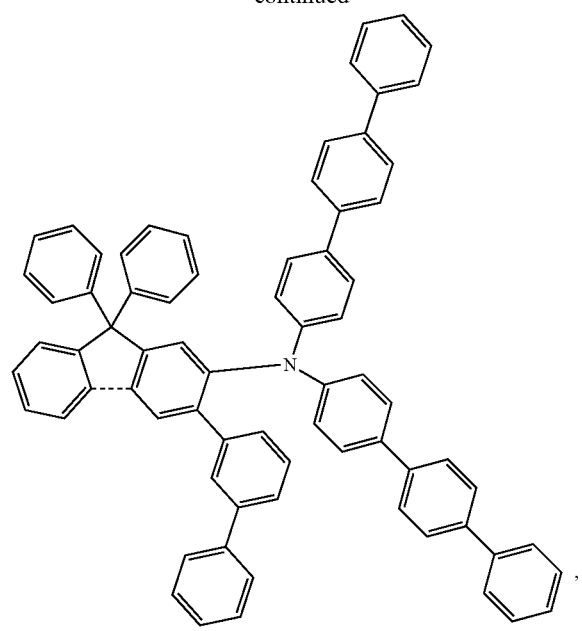
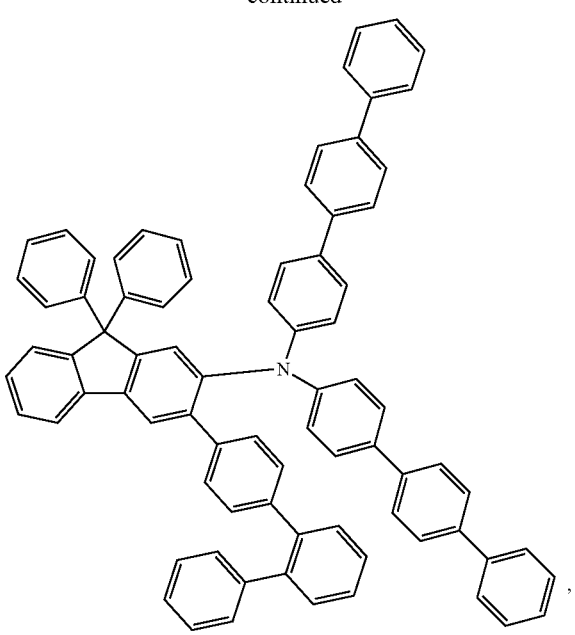
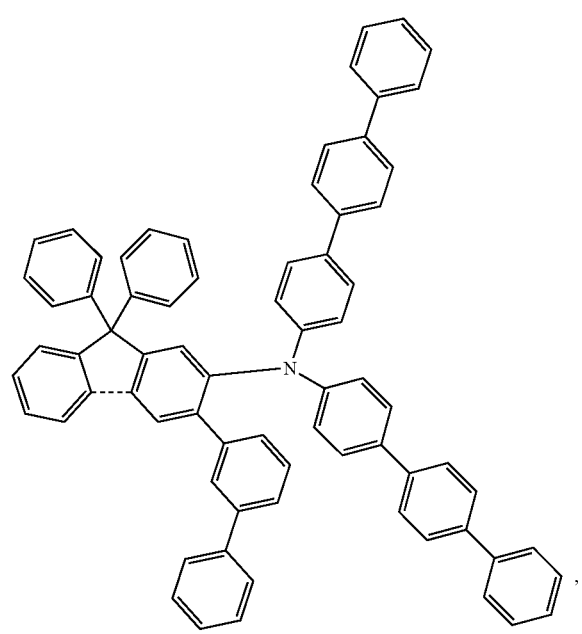
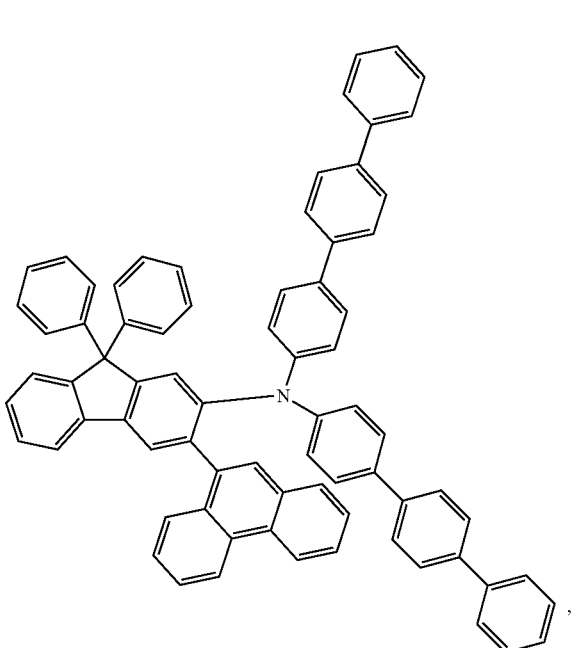

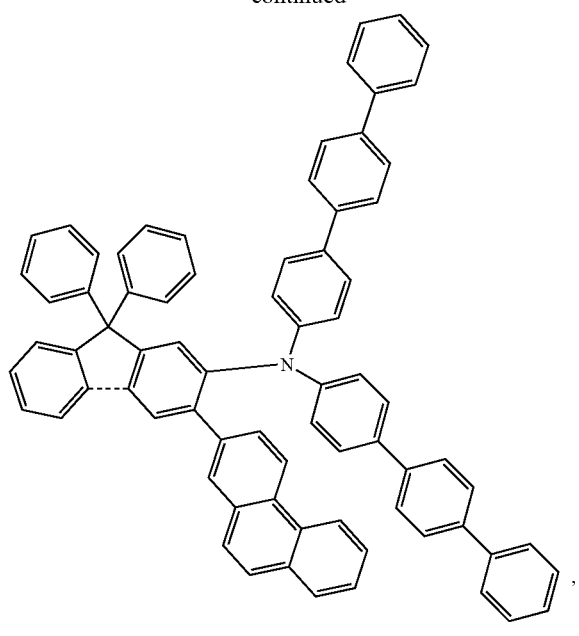

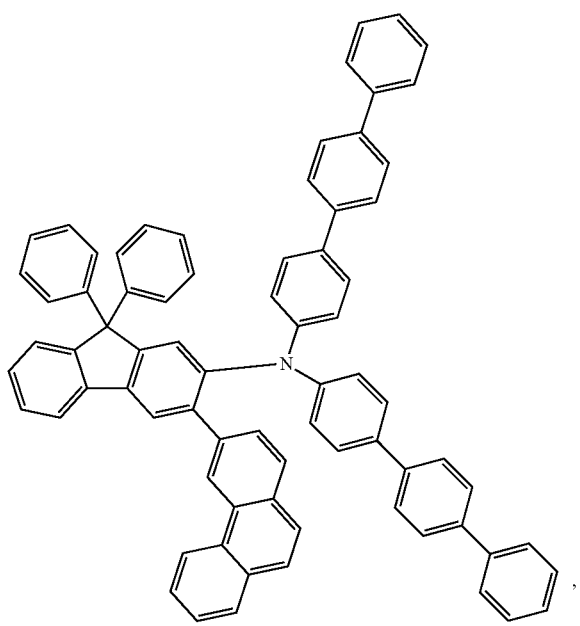

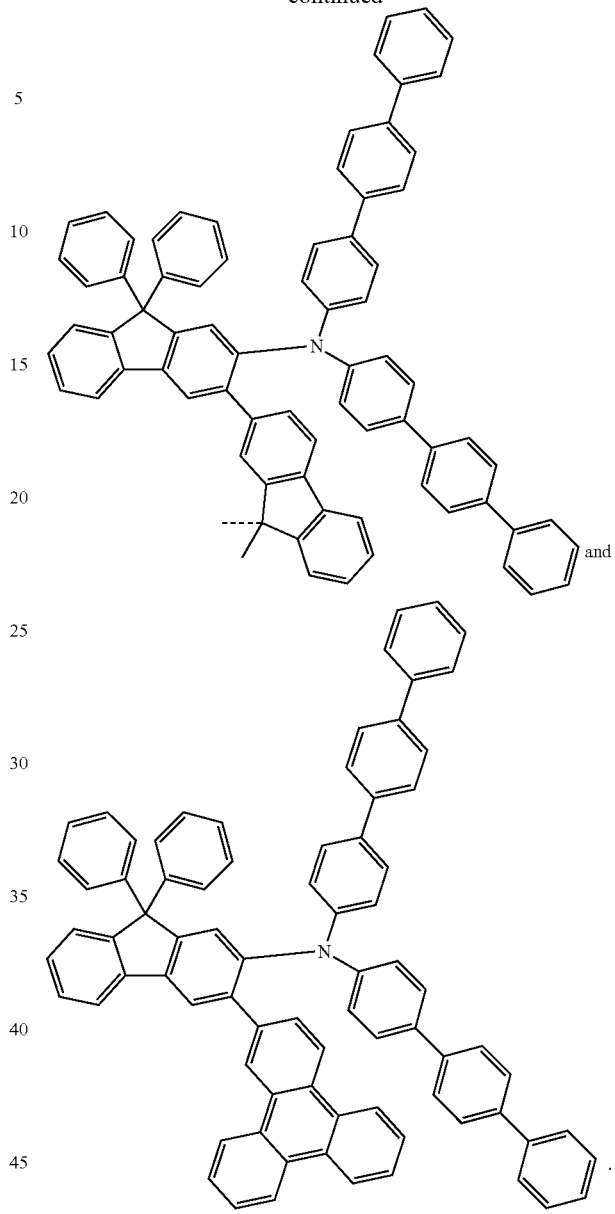

The organic light emitting device of the present invention includes: an anode; a cathode provided to face the anode; and at least one organic material layer provided between the anode and the cathode. The organic material layer can have a multilayered structure in which two or more organic material layers are stacked. Specifically, the organic material layer can include a hole injection layer adjacent to the anode, a hole transport layer provided on the hole injection layer, an electron blocking layer provided on the hole transport layer, and a light emitting layer provided on the electron blocking layer. In addition, the organic light emitting device can include an electron transport layer, an electron injection layer, and the like between the light emitting layer and the cathode. However, the structure of the organic light emitting device is not limited thereto, and it can include a smaller number of organic material layers.

The organic light emitting device according to the present invention can be a normal type of organic light emitting device in which an anode, at least one organic material layer, and a cathode are sequentially stacked on a substrate. Further, the organic light emitting device according to the present invention can be an inverted type of organic light emitting device in which a cathode, at least one organic material layer, and an anode are sequentially stacked on a substrate. For example, the structure of an organic light emitting device according to an embodiment of the present invention is illustrated in FIG. 1.

FIG. 1 shows an example of an organic light emitting device including a substrate 1, an anode 2, a hole injection layer 3, a hole transport layer 5, an electron blocking layer 6, a light emitting layer 7, an electron transport layer 8, and a cathode 4. In such a structure, the compound of Chemical Formula 1 can be included in the light emitting layer 7, and the compound of Chemical Formula 2 can be included in at least one organic material layer of the hole injection layer 3, the hole transport layer 5, and the electron blocking layer 6, thereby lowering the driving voltage of the organic light emitting device and improving the efficiency and lifetime.

The organic light emitting device according to the present invention can be manufactured by materials and methods known in the art, except that the compound of Chemical Formula 1 is included in the light emitting layer, and the compound of Chemical Formula 2 is included in at least one organic material layer of the hole injection layer, the hole transport layer, and the electron blocking layer. In addition, a plurality of organic material layers can be formed of the same material or different materials.

For example, the organic light emitting device according to the present invention can be manufactured by sequentially stacking any one electrode of the anode and the cathode, an organic material layer, and another electrode of the anode and the cathode on a substrate. In this case, the organic light emitting device can be manufactured by depositing a metal, metal oxides having conductivity, or an alloy thereof on the substrate using a PVD (physical vapor deposition) method such as a sputtering method or an e-beam evaporation method to form an anode, forming organic material layers including the hole injection layer, the hole transport layer, the light emitting layer, and the electron transport layer thereon, and then depositing a material that can be used as the cathode thereon. In addition to such a method, the organic light emitting device can be manufactured by sequentially depositing a cathode material, an organic material layer, and an anode material on a substrate (International Publication WO2003/012890). However, the manufacturing method is not limited thereto.

In addition, the compound of Chemical Formula 1 and the compound of Chemical Formula 2 can be formed into an organic layer by a solution coating method as well as a vacuum deposition method at the time of manufacturing an organic light emitting device. Herein, the solution coating method means spin coating, dip coating, doctor blading, inkjet printing, screen printing, a spray method, roll coating, or the like, but is not limited thereto.

As the anode material, generally, a material having a large work function is preferably used so that holes can be smoothly injected into the organic material layer. Specific examples of the anode material include metals such as vanadium, chrome, copper, zinc, and gold, or an alloy thereof; metal oxides such as zinc oxides, indium oxides, indium tin oxides (ITO), and indium zinc oxides (IZO); a combination of metals and oxides, such as ZnO:Al or $SnO_2$:Sb; conductive polymers such as poly(3-methylthiophene), poly[3,4-(ethylene-1,2-dioxy)thiophene](PEDOT), polypyrrole, polyaniline, and the like, but are not limited thereto.

As the cathode material, generally, a material having a small work function is preferably used so that electrons can be easily injected into the organic material layer. Specific examples of the cathode material include metals such as magnesium, calcium, sodium, potassium, titanium, indium, yttrium, lithium, gadolinium, aluminum, silver, tin, and lead, or an alloy thereof; a multilayered structure material such as LiF/Al or $LiO_2$/Al; and the like, but are not limited thereto.

The hole injection layer is a layer for injecting holes from the electrode, and the hole injection material is preferably a compound which has an ability of transporting the holes, thus a hole injecting effect in the anode and an excellent hole injecting effect to the light emitting layer or the light emitting material, prevents movement of an exciton generated in the light emitting layer to the electron injection layer or the electron injection material, and has an excellent thin film forming ability. As the hole injection material, the compound of Chemical Formula 2 or a compound known as an existing hole injection material can be used. It is preferable that a HOMO (highest occupied molecular orbital) of the hole injection material is between the work function of the anode material and a HOMO of a peripheral organic material layer. Specific examples of the hole injection material include metal porphyrin, oligothiophene, an arylamine-based organic material, a hexanitrilehexaazatriphenylene-based organic material, a quinacridone-based organic material, a perylene-based organic material, anthraquinone, a polyaniline and polythiophene-based conductive polymer, and the like, but are not limited thereto.

The hole transport layer is a layer that receives holes from a hole injection layer and transports the holes to the light emitting layer. As the material for forming the hole transport layer, the compound of Chemical Formula 2 can be used. Since the compound of Chemical Formula 2 has been previously described in detail, a detailed description thereof will be omitted here.

Since the compound of Chemical Formula 2 has large mobility to the holes, it is suitable for receiving holes from the anode or the hole injection layer and transferring the holes to the light emitting layer.

On the other hand, if the hole injection layer or the electron blocking layer has been formed of the compound of Chemical Formula 2, the hole transport layer can be formed of a hole transport material known in the art. Specific examples of such hole transport material include an arylamine-based organic material, a conductive polymer, a block copolymer in which a conjugate portion and a non-conjugate portion are present together, and the like, but are not limited thereto.

An electron blocking layer can be formed between the hole transport layer and the light emitting layer so as to prevent electrons transferred to the light emitting layer from moving toward the anode. As the material for forming such an electron blocking layer, the compound of Chemical Formula 2 can be used. In particular, when an electron blocking layer is formed of the compound of Chemical Formula 2, the efficiency of the organic light emitting device can be remarkably improved.

The light emitting layer is a layer which can receive holes and electrons transported from a hole transport layer and an electron transport layer, respectively, and combine the holes and the electrons to emit light in a visible ray region. Such light emitting layer can include a host material and dopant material.

As the host material, the compound of Chemical Formula 1 can he used. Since the compound of Chemical Formula 1 has been previously described in detail, a detailed description thereof will be omitted here.

In addition, as the host material, the compound of Chemical Formula 1 and the compound of the following Chemical Formula 3 can be used.

[Chemical Formula 3]

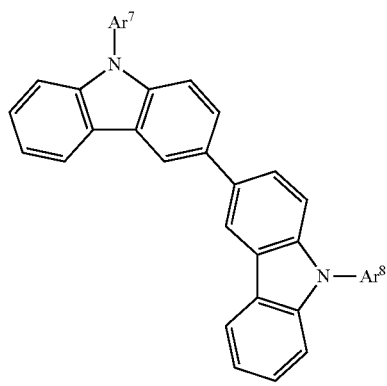

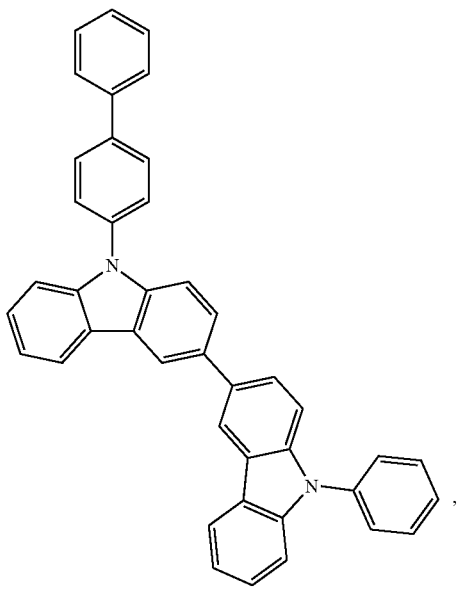

In Chemical Formula 3, $Ar^7$ and $Ar^8$ are each independently a substituted unsubstituted aryl group having 6 to 60 carbon atoms.

In Chemical Formula 3, $Ar^7$ and $Ar^8$ can each independently be a monovalent residue derived from an arene which is selected from the group consisting of benzene, biphenyl, terphenyl, naphthalene, phenanthrene, triphenylene, 9,9-dimethylfluorene, 9,9-diphenylfluorene, spiro[fluorene-9,9'-fluorene], phenylterphenyl, phenylnaphthalene, and phenylphenanthrene.

The compound of Chemical Formula 3 can be selected from the group consisting of the following compounds:

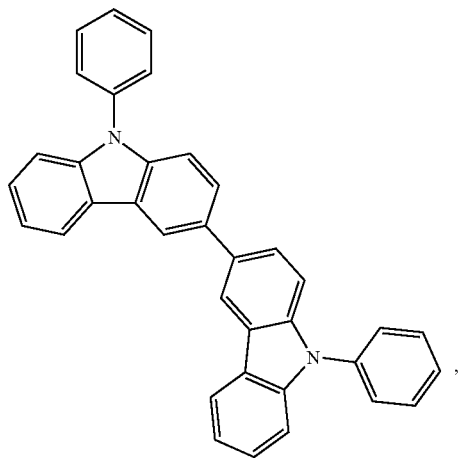

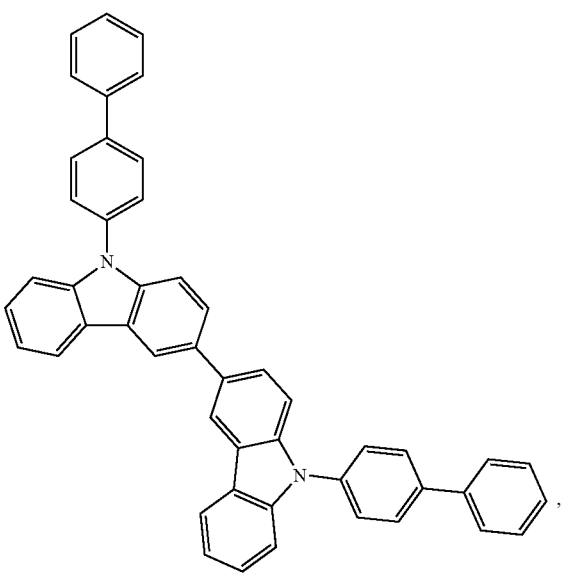

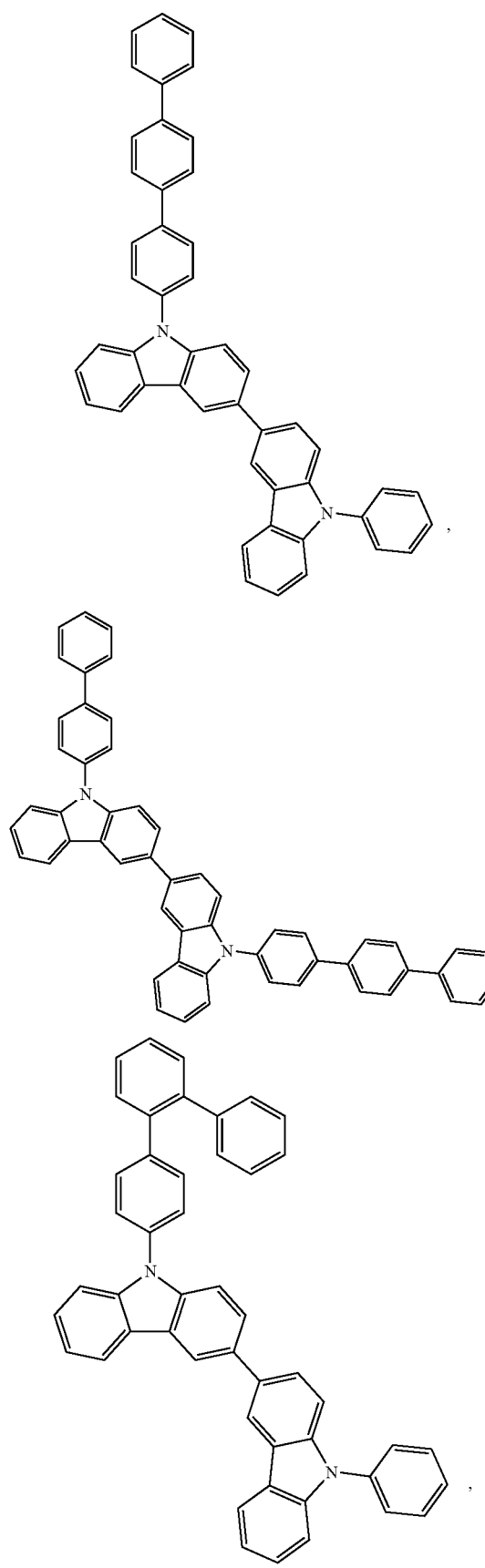
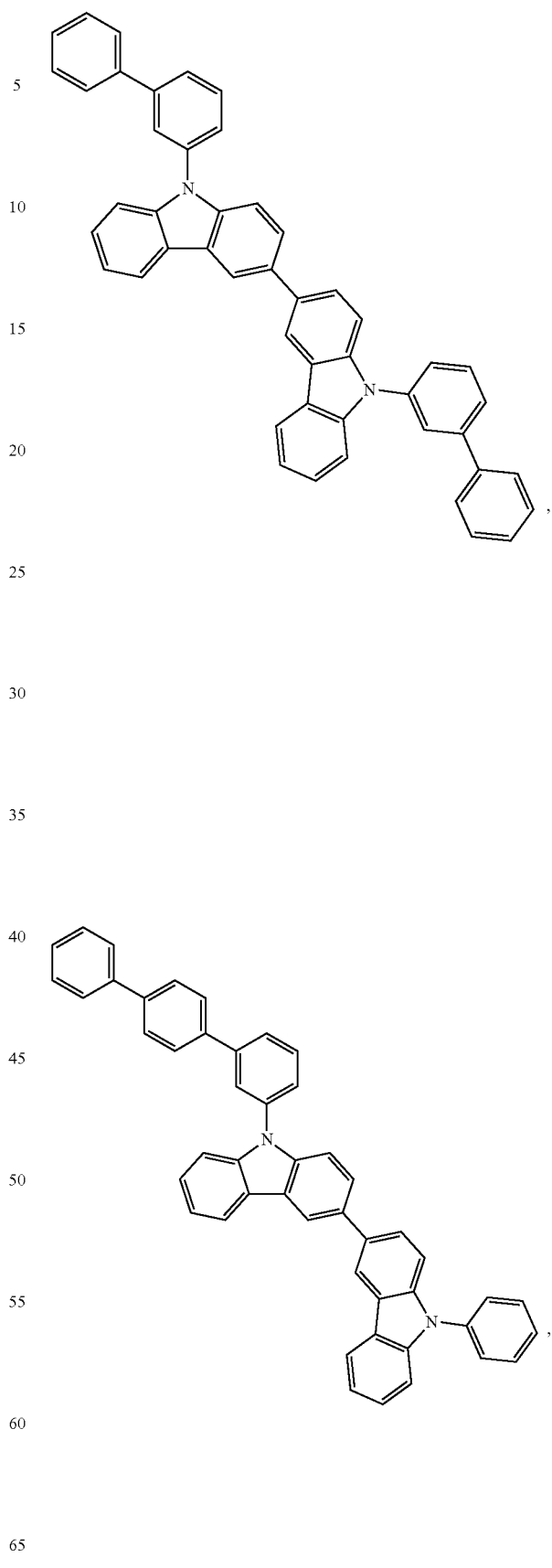

85
-continued
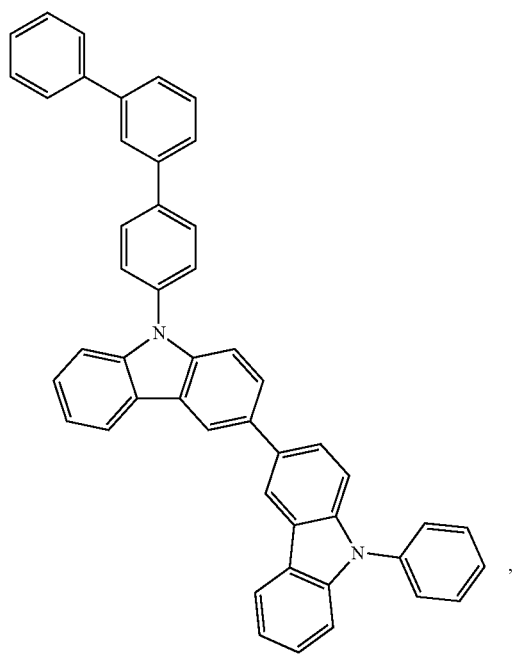
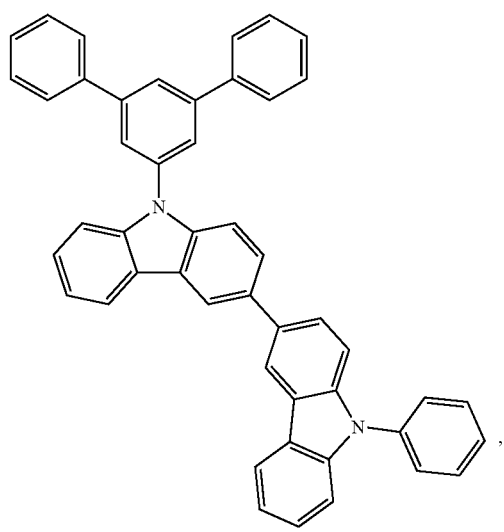
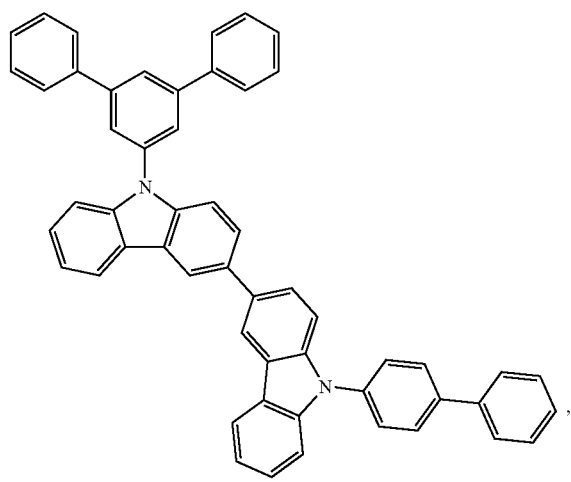
86
-continued
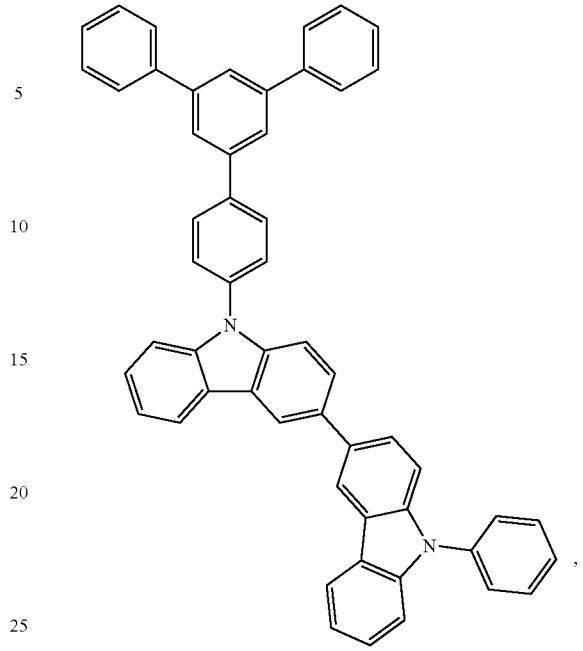
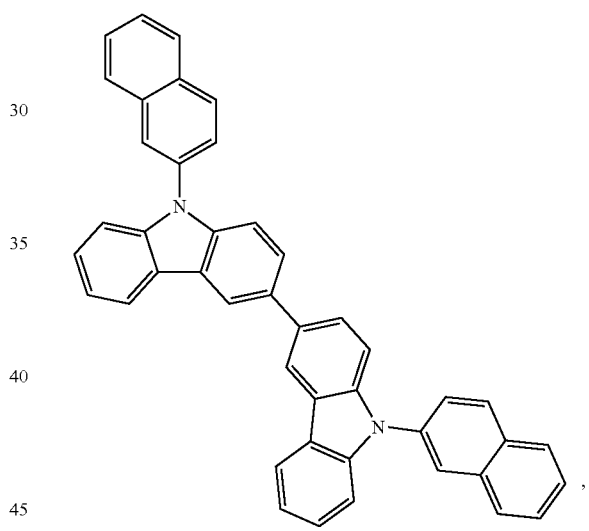
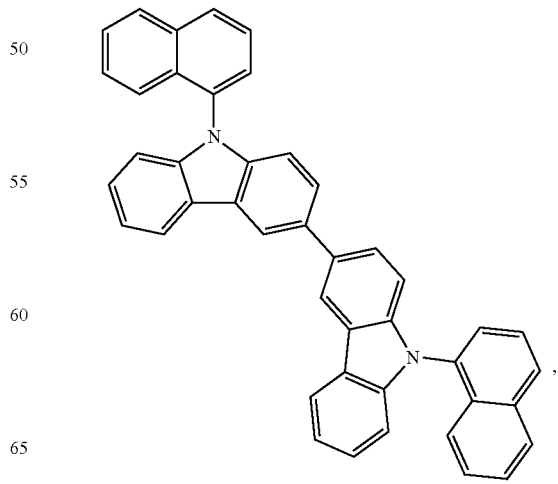

87
-continued
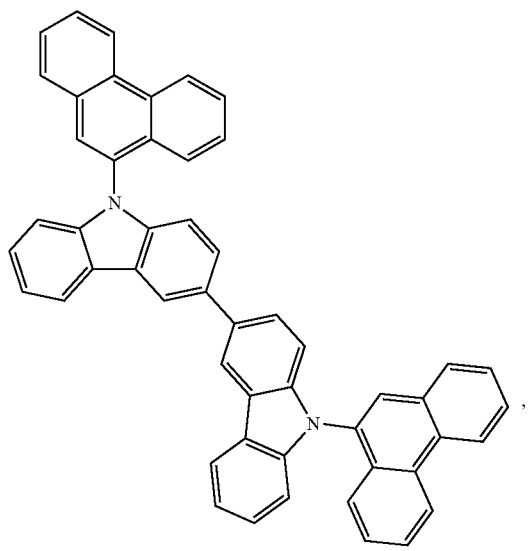
,
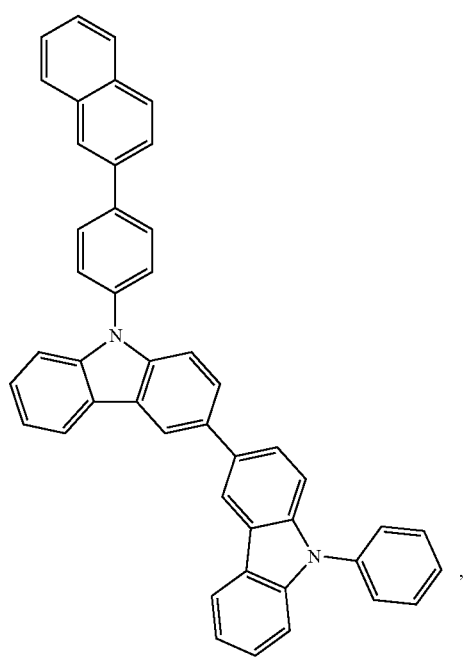
,
88
-continued
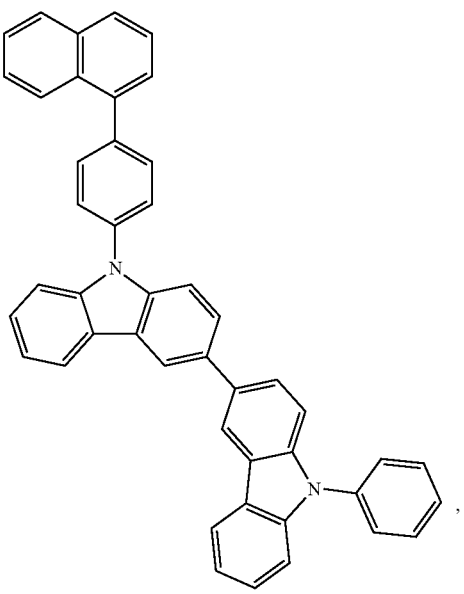
,
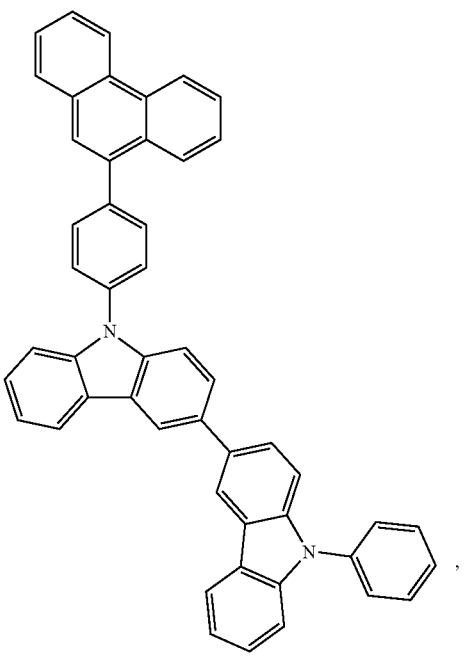
, -continued

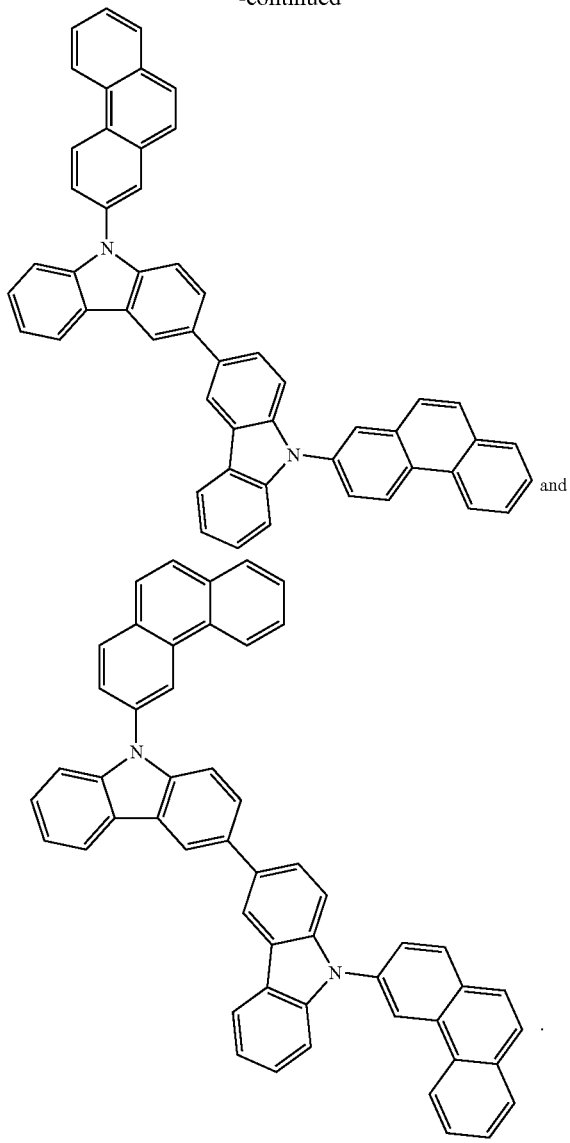

and

The light emitting layer can further include a host material known in the art to which the present invention belongs, in addition to the compounds of Chemical Formulae 1 and 3. Specific examples of such host material include a condensed. aromatic ring derivative or a heterocyclic compound. Specific examples of such host material can he a fused aromatic ring derivative, a heterocycle-containing compound, or the like. Specific examples of the fused aromatic ring derivatives include anthracene derivatives, pyrene derivatives, naphthalene derivatives, pentacene derivatives, phenanthrene compounds, and fluoranthene compounds. Examples of heterocyclic compounds include carbazole derivatives, dibenzofuran derivatives, ladder-type furan compounds, pyrimidine derivatives, and the like, but are not limited thereto.

Examples of the dopant material include an aromatic amine derivative, a styrylamine compound, a boron complex, a fluoranthene compound, a metal complex, and the like. Specific examples of the aromatic amine derivatives include substituted or unsubstituted fused aromatic ring derivatives having an arylamino group, and examples thereof include pyrene, anthracene, chrysene, and periflanthene having the arylamino group, and the like, the styrylamine compound is a compound where at least one arylvinyl group is substituted in substituted or unsubstituted arylamine, in which one or two or more substituent groups selected from the group consisting of an aryl group, a silyl group, an alkyl group, a cycloalkyl group, and an arylamino group are substituted or unsubstituted. Specific examples thereof include styrylamine, styryldiamine, styryltriamine, styryltetramine, and the like, but are not limited thereto. Further, examples of the metal complex include an iridium complex, a platinum complex, and the like, but are not limited thereto.

The electron transport layer is a layer which receives electrons from an electron injection layer and transports the electrons to a light emitting layer, and an electron transport material is suitably a material which can receive electrons well from a cathode and transfer the electrons to a light emitting layer, and has large mobility for electrons. Specific examples thereof include: an Al complex of 8-hydroxyquinoline; a complex including $Alq_3$; an organic radical compound; a hydroxyflavone-metal complex; and the like, but are not limited thereto. The electron transport layer can be used with any desired cathode material, as used according to the related art. In particular, appropriate examples of the cathode material are a typical material which has a low work function, followed by an aluminum layer or a silver layer. Specific examples thereof include cesium, barium, calcium, ytterbium, and samarium, in each case followed by an aluminum layer or a silver layer.

The electron injection layer is a layer which injects electrons from an electrode, and is preferably a compound which has a capability of transporting electrons, has an effect of injecting electrons from a cathode and an excellent effect of injecting electrons into a light emitting layer or a light emitting material, prevents excitons produced from the light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, a metal complex compound, a nitrogen-containing 5-membered ring derivative, and the like, but are not limited thereto.

The metal complex compound can include 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato) gallium, bis(10-hydroxybenzo[h]quinolinato)beryllium, bis (10-hydroxybenzo[h]quinolinato)zinc, bis(2-methyl-8-quinolinato)chlorogallium, bis(2-methyl-8-quinolinato) (o-cresolato)gallium, bis(2-methyl-8-quinolinato) (1-naphtholato)aluminum, bis(2-methyl-8-quinolinato) (2-naphtholato)gallium, and the like, but is not limited thereto.

The organic light emitting device according to the present invention can be a front emission type, a rear emission type, or a double side emission type according to the materials used.

The manufacture of the organic emitting device will be described in detail in the following examples. However, these examples are presented for illustrative purposes only, and the scope of the present invention is not limited thereto.

EXAMPLE 1

Manufacture of Organic Light Emitting Device

A glass substrate on which ITO (indium tin oxide) was coated at a thickness of 1300 Å was put into distilled water in which a detergent was dissolved, and ultrasonically washed. In this case, a product manufactured by Fischer Co., was used as the detergent, and distilled water filtered twice using a filter manufactured by Millipore Co., was used as the distilled water. After the ITO substrate was washed for 30 minutes, ultrasonic washing was conducted twice using distilled water for 10 minutes. After the washing using distilled water was completed, the ITO substrate was ultrasonically washed using solvents of isopropyl alcohol, acetone, and methanol, and then dried, after which it was transferred to a plasma cleaner. In addition, the ITO substrate was cleaned for 5 minutes using oxygen plasma, and then transferred to a vacuum depositor.

On the ITO electrode prepared as above, the following Compound HI-1 was thermally vacuum-deposited to a thickness of 50 Å to form a hole injection layer. The following compound HT-1 was thermally vacuum-deposited on the hole injection layer to a thickness of 1200 Å to form a hole transport layer, and the following compound 2-1 was vacuum-deposited on the hole transport layer to a thickness of 400 Å to form an electron blocking layer. Then, the following compound 1-1, and 6 wt % of a phosphorescent dopant YGD-1 relative to the weight of the compound 1-1, were co-deposited on the electron blocking layer to form a light emitting layer with a thickness of 350 Å. The following compound. ET-1 was vacuum-deposited on the light emitting layer to a thickness of 200 Å to form an electron transport layer, and the following compound ET-2 and 2 wt % of Li relative to the weight of the compound ET-2 were co-deposited to form an electron injection layer with a thickness of 100 Å. Aluminum was then deposited on the electron injection layer to a thickness of 1000 Å to form a cathode.

In the above process, the vapor deposition rate of the organic material was maintained at 0.4 to 0.7 Å/s, the vapor deposition rate of aluminum was maintained at 2 Å/s, and the degree of vacuum during vapor deposition was maintained at $1 \times 10^{-7} \sim 5 \times 10^{-8}$ torr, thereby manufacturing an organic light emitting device.

HI-1

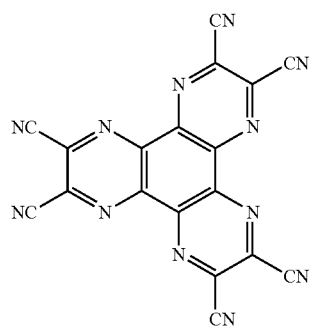

HT-1

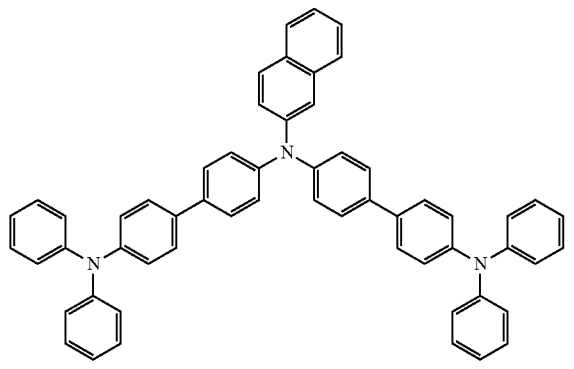

HT-2

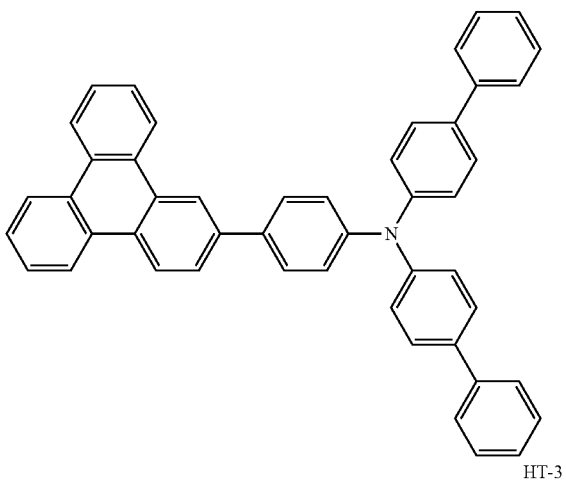

HT-3

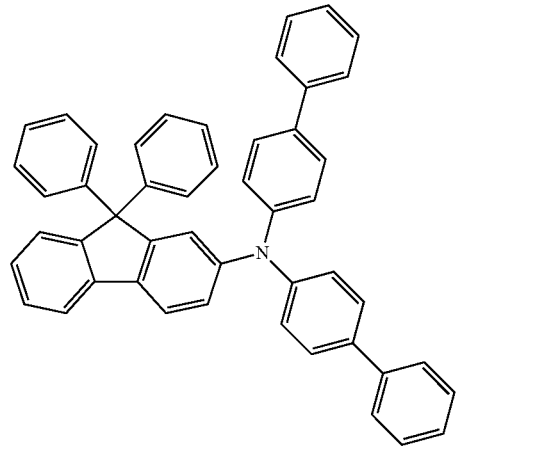

YGH-1

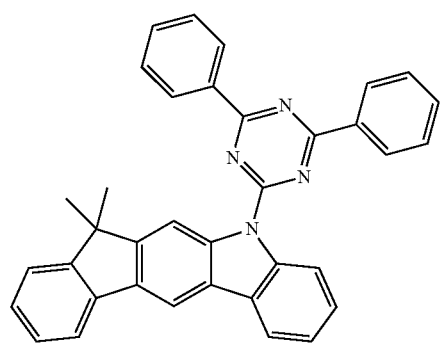

YGH-2
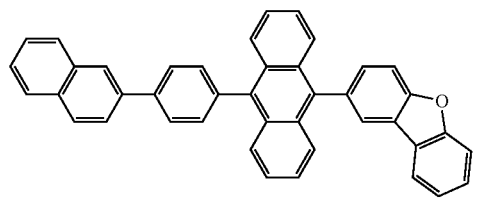
YGD-1
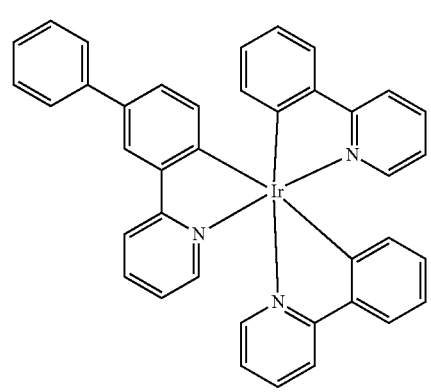
ET-1
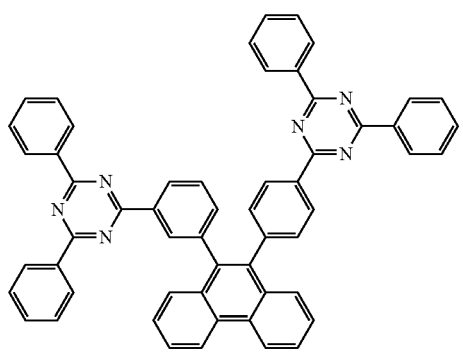
ET-2
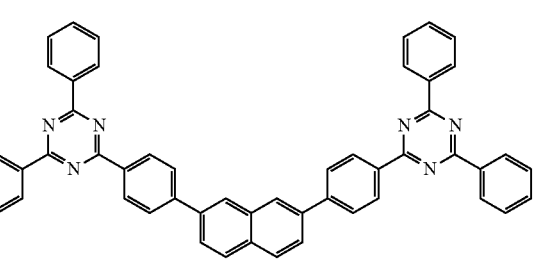
1-1
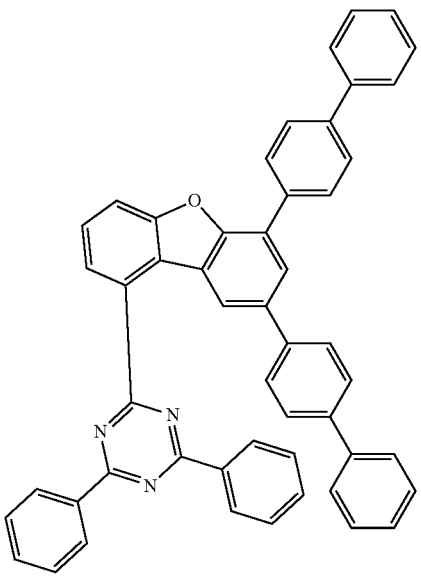
1-2
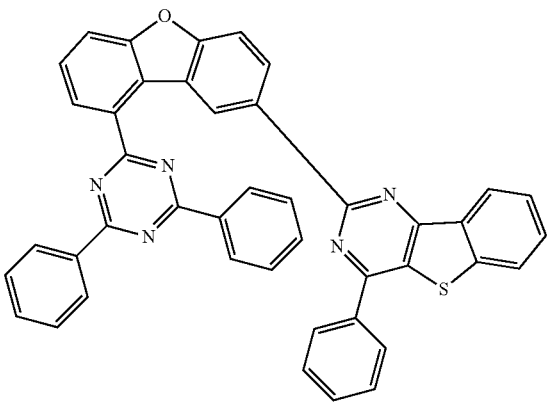
1-3
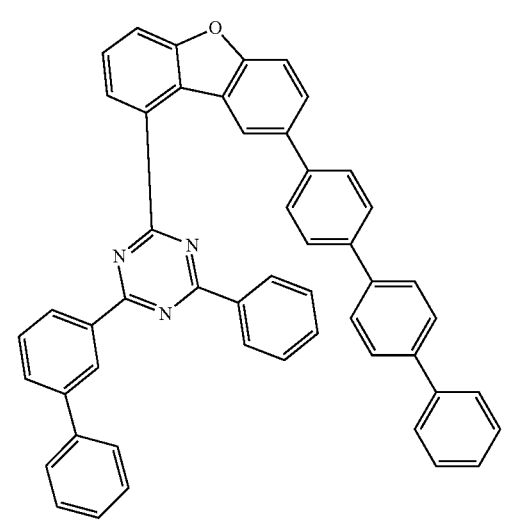

-continued 1-4

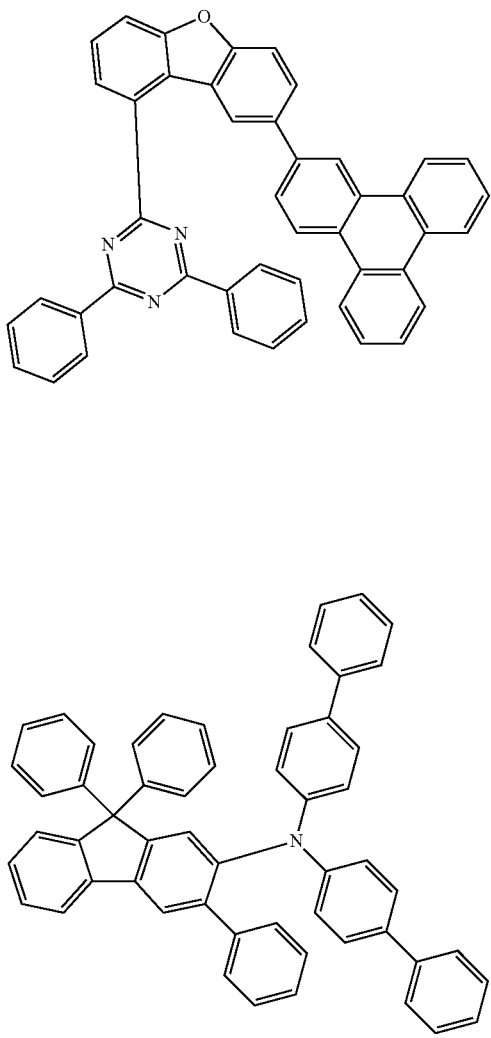

2-1

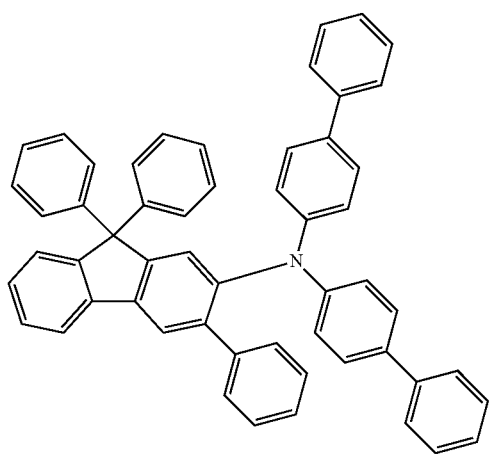

2-2

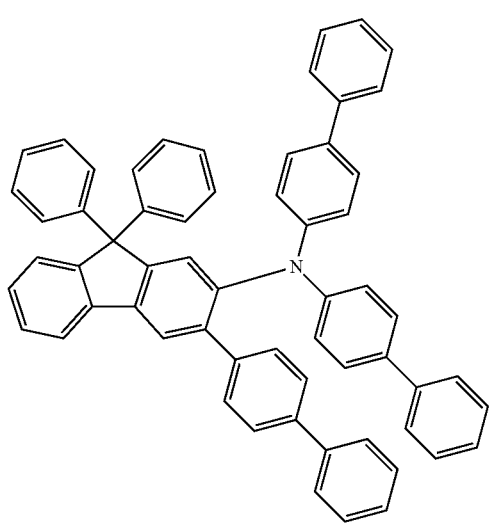

-continued 2-3

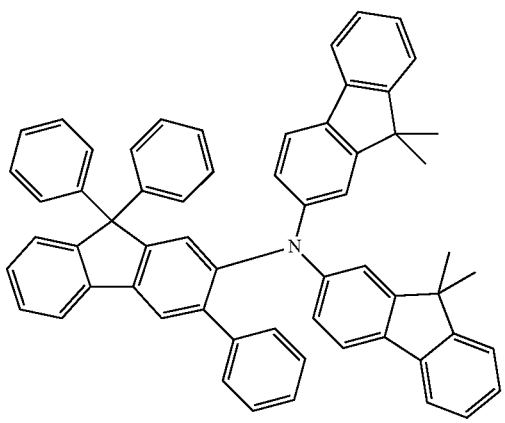

2-4

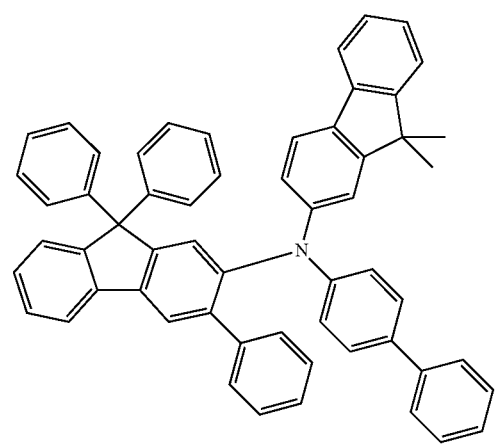

EXAMPLES 2 to 16 and COMPARATIVE EXAMPLES 1 to 11

Manufacture of Organic Light Emitting Device

An organic light emitting device was manufactured in the same manner as Example 1, except that the compound for forming the electron blocking layer and the light emitting layer was changed as shown in Table 1 below.

Test Example: Evaluation of Performance of Organic Light Emitting Device

The voltage, efficiency, and lifetime of the organic light emitting devices manufactured in accordance with Examples 1 to 16 and Comparative Examples 1 to 1 were measured at current density of 10 mA/cm². The lifetime (LT95), which defined as the time required for the luminance to decrease to 95% of its initial value (6000 nit), was measured at a current density of 20 mA/cm².

TABLE 1

|  | Electron blocking layer | Light emitting layer | Voltage (V) | Current efficiency (cd/A) | LT95 (h) |
| --- | --- | --- | --- | --- | --- |
| Example 1 | 2-1 | 1-1 | 3.65 | 6.43 | 295 |
| Example 2 | 2-1 | 1-2 | 3.64 | 6.49 | 295 |
| Example 3 | 2-1 | 1-3 | 3.66 | 6.48 | 305 |
| Example 4 | 2-1 | 1-4 | 3.64 | 6.45 | 280 |
| Example 5 | 2-2 | 1-1 | 3.83 | 6.32 | 290 |
| Example 6 | 2-2 | 1-2 | 3.86 | 6.37 | 290 |

TABLE 1-continued

| | Electron blocking layer | Light emitting layer | Voltage (V) | Current efficiency (cd/A) | LT95 (h) |
|---|---|---|---|---|---|
| Example 7 | 2-2 | 1-3 | 3.85 | 6.35 | 315 |
| Example 8 | 2-2 | 1-4 | 3.84 | 6.36 | 275 |
| Example 9 | 2-3 | 1-1 | 3.77 | 6.31 | 295 |
| Example 10 | 2-3 | 1-2 | 3.78 | 6.32 | 290 |
| Example 11 | 2-3 | 1-3 | 3.78 | 6.33 | 320 |
| Example 12 | 2-3 | 1-4 | 3.75 | 6.34 | 285 |
| Example 13 | 2-4 | 1-1 | 3.87 | 6.32 | 305 |
| Example 14 | 2-4 | 1-2 | 3.83 | 6.30 | 315 |
| Example 15 | 2-4 | 1-3 | 3.84 | 6.37 | 330 |
| Example 16 | 2-4 | 1-4 | 3.88 | 6.39 | 310 |
| Comparative Example 1 | HT-2 | YGH-1 | 4.16 | 5.96 | 225 |
| Comparative Example 2 | HT-3 | YGH-1 | 4.12 | 6.12 | 240 |
| Comparative Example 3 | HT-2 | YGH-2 | 4.40 | 5.81 | 205 |
| Comparative Example 4 | 2-1 | YGH-1 | 4.09 | 6.42 | 250 |
| Comparative Example 5 | 2-2 | YGH-1 | 3.98 | 6.46 | 265 |
| Comparative Example 6 | 2-3 | YGH-1 | 4.01 | 6.43 | 255 |
| Comparative Example 7 | 2-4 | YGH-1 | 4.06 | 6.39 | 250 |
| Comparative Example 8 | HT-2 | 1-1 | 4.05 | 6.12 | 285 |
| Comparative Example 9 | HT-2 | 1-2 | 4.04 | 6.15 | 285 |
| Comparative Example 10 | HT-2 | 1-3 | 4.05 | 6.07 | 290 |
| Comparative Example 11 | HT-2 | 1-4 | 3.99 | 6.17 | 295 |

Table 1 shows the basic characteristics of the organic light emitting devices (Comparative Examples 1 to 3) using a conventional compound, the organic light emitting devices (Comparative Examples 4 to 7) using a compound of Chemical Formula 2 as an electron blocking layer but using a conventional compound as a material for a light emitting layer, and the organic light emitting devices (Comparative Examples 8 to 11) using a compound of Chemical Formula 1 as a material for a light emitting layer but using a conventional compound as a material for an electron blocking layer.

When comparing the examples and comparative examples, when compounds of Chemical Formulae 1 and 2 were used as materials for the light emitting layer and the electron blocking layer, respectively, it was confirmed that they exhibited low driving voltages, high efficiency, and long lifetimes as compared with the conventional organic light emitting devices. In particular, when the compound 2-1 was used as the material for the electron blocking layer, the driving voltage was the lowest, and when the compound 1-3 was used as the material for the light emitting layer, the lifetime was the longest.

On the other hand, when comparing Comparative Examples 1, 2, and 4, in Comparative Example 4 in which the material for the electron blocking layer of Comparative Example 1 was changed to a compound of Chemical Formula 2, the efficiency was improved compared with Comparative Example 1, but in Comparative Example 3 in which it was changed to a compound of Chemical Formula 2 where $Ar^6$ is hydrogen, the efficiency improvement effect could not be confirmed.

As a result, it is confirmed that the organic light emitting device of the present invention exhibits improved efficiency by including a compound having a structure in which the 3-position of 9,9-dimethylfluorene is substituted as in Chemical Formula 2 between the anode and the light emitting layer, and that it shows a long lifetime while exhibiting a low driving voltage and improved efficiency by including a compound having a structure in which the 4-position of dibenzofuran having electron stability is substituted with triazine having excellent electron injecting ability and thermal stability as in Chemical Formula 1 in the light emitting layer.

EXPLANATION OF ITEM NUMBERS

1: substrate
2: anode
3: hole injection layer
4: cathode
5: hole transport layer
6: electron blocking layer
7: light emitting layer
8: electron transport layer

The invention claimed is:

1. An organic light emitting device comprising: an anode; a cathode provided to face the anode; and at least one organic material layer provided between the anode and the cathode, wherein:
the organic material layer includes a light emitting layer;
the light emitting layer includes a compound of the following Chemical Formula 1; and
the organic light emitting device includes a compound of the following Chemical Formula 2 between the anode and the light emitting layer:

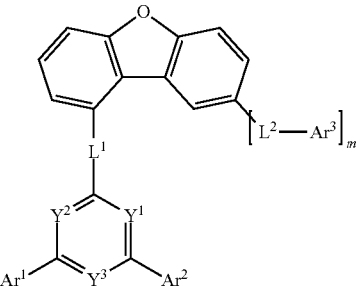

[Chemical Formula 1]

Wherein in Chemical Formula 1:
$L^1$ is a single bond or a substituted or unsubstituted arylene group having 6 to 60 carbon atoms;
$L^2$ is a single bond, a substituted or unsubstituted arylene group having 6 to 60 carbon atoms, or a substituted or unsubstituted heteroarylene group having 2 to 60 carbon atoms containing at least one of O, N, Si, and S;
$Y^1$ to $Y^3$ are each independently N or C—$R^1$, provided that at least one of $Y^1$ to $Y^3$ is N, and $R^1$ is hydrogen or a substituted or unsubstituted alkyl group having 1 to 40 carbon atoms;
$Ar^1$ and $Ar^2$ are each independently a substituted or unsubstituted aryl group having 6 to 60 carbon atoms, or a substituted or unsubstituted heteroaryl group having 2 to 60 carbon atoms containing at least one of O, N, Si, and S;
$Ar^3$ is a substituted or unsubstituted aryl group having 6 to 60 carbon atoms; and
m is an integer of 1 to 2;

[Chemical Formula 2]

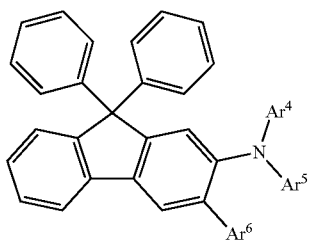

wherein in Chemical Formula 2:

Ar$^4$ to Ar$^6$ are each independently a substituted or unsubstituted aryl group having 6 to 60 carbon atoms.

2. The organic light emitting device of claim 1, wherein L$^1$ is a single bond or a phenylene group.

3. The organic light emitting device of claim 1, wherein Y$^1$ to Y$^3$ are each independently N or C—H, provided that at least one of Y$^1$ to Y$^3$ is N.

4. The organic light emitting device of claim 1, wherein Ar$^1$ and Ar$^2$ are each independently a monovalent residue derived from an arene or heteroarene which is selected from the group consisting of benzene, biphenyl, terphenyl, naphthalene, phenanthrene, triphenylene, 9,9-dimethylfluorene, 9,9-diphenylfluorene, spro[fluorene-9,9'-fluorene], dibenzofuran, didbenzothiophene, N-phenylcarbazole, phenyl-9,9-dimethylfluorene, phenyl dibenzofuran, and phenyl dibenzothiophene.

5. The organic light emitting device of claim 1, wherein L$^2$ is a single bond, or a divalent residue derived from an arene or heteroarene which is selected from the group consisting of benzene, naphthalene, 9,9-dimethylfluorene, 9,9-diphenylfluorene, spiro[fluorene-9,9'-fluorene], dibenzofuran, dibenzothiophene, benzothieno[2,3-d]pyrimidene), and benzothieno[3,2-d]pyrimidine.

6. The organic light emitting device of claim 1, wherein Ar$^3$ is a monovalent residue derived from an arene which is selected from the group consisting of benzene, biphenyl, terphenyl, naphthalene, anthracene, tetracene, chrysene, phenanthrene, triphenylene, fluoranthene, pyrene, and perylene.

7. The organic light emitting device of claim 1, wherein L$^2$-Ar$^3$ is a substituent selected from the group consisting of the following substituent groups:

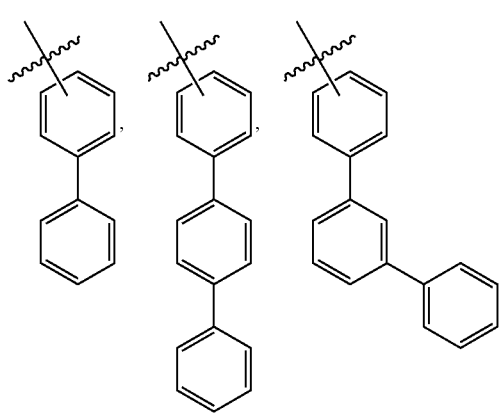

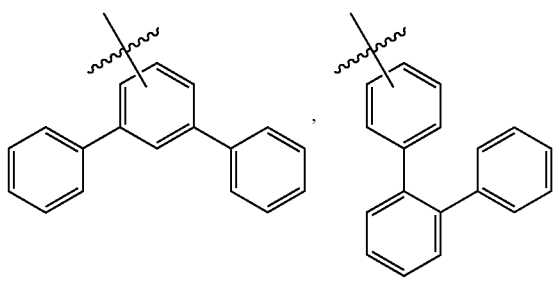

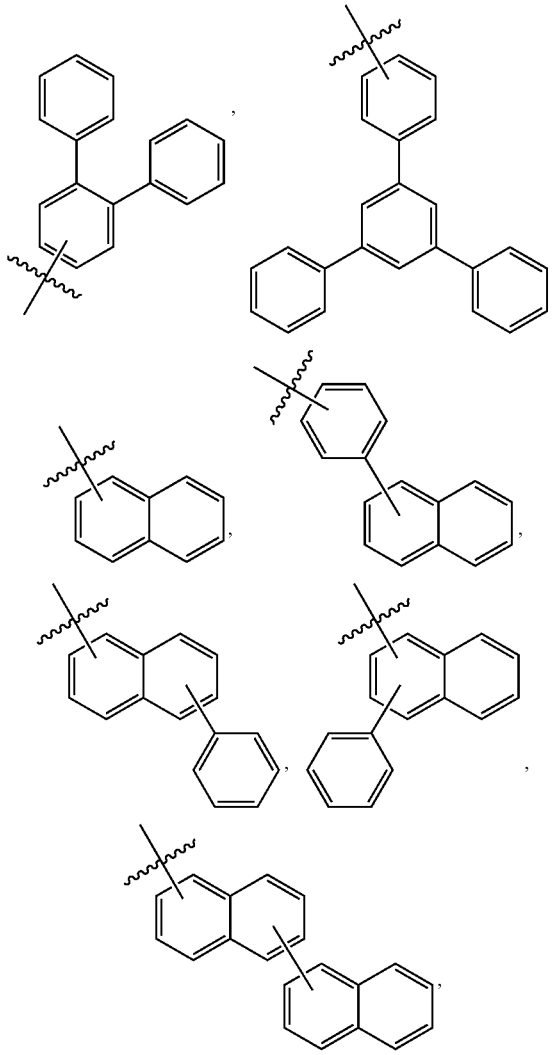

101
-continued
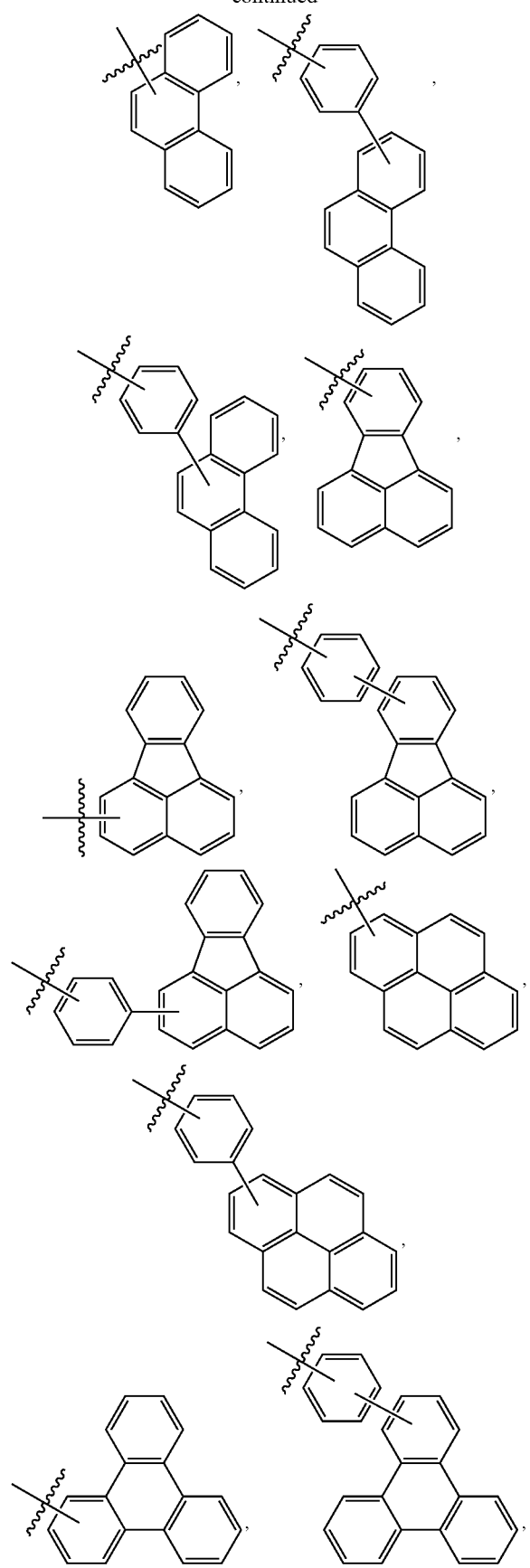
102
-continued
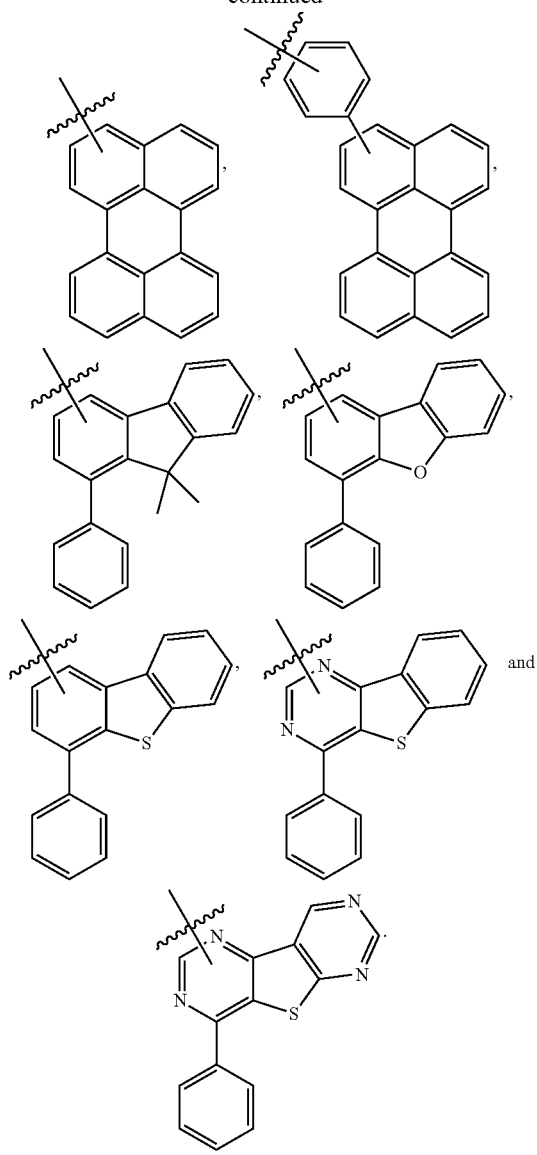
8. The organic light emitting device of claim 1, wherein the compound of Chemical Formula 1 is selected from the group consisting of compounds of the following Chemical Formulae 1-1 and 1-2:
[Chemical Formula 1-1]
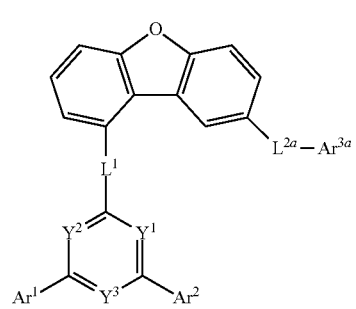

wherein in Chemical Formula 1-1:
- L¹ is a single bond or a substituted or unsubstituted arylene group having 6 to 60 carbon atoms;
- Y¹ to Y³ are each independently N or C—R¹, provided that at least one of Y¹ to Y³ is N, and R¹ is hydrogen or a substituted or unsubstituted alkyl group having 1 to 40 carbon atoms;
- Ar¹ and Ar² are each independently a substituted or unsubstituted aryl group having 6 to 60 carbon atoms, or a substituted or unsubstituted heteroaryl group having 2 to 60 carbon atoms containing at least one of O, N, Si, and S;
- $L^{2a}$ is a single bond, a substituted or unsubstituted arylene group having 6 to 60 carbon atoms, or a substituted or unsubstituted heteroarylene group having 2 to 60 carbon atoms containing at least one of O, N, Si, and S; and
- $Ar^{3a}$ is a substituted or unsubstituted aryl group having 6 to 60 carbon atoms,

[Chemical Formula 1-2]

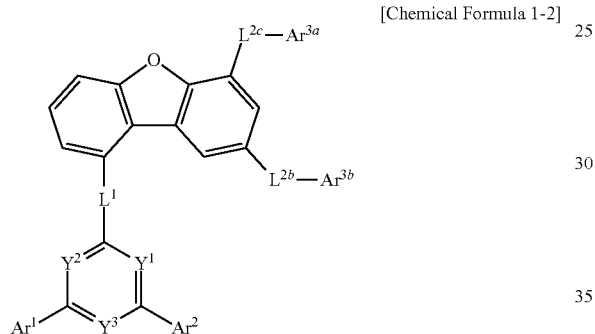

wherein in Chemical Formula 1-2:
- L¹ is a single bond or a substituted or unsubstituted arylene group having 6 to 60 carbon atoms;
- Y¹ to Y³ are each independently N or C—R¹, provided that at least one of Y¹ to Y³ is N, and R¹ is hydrogen or a substituted or unsubstituted alkyl group having 1 to 40 carbon atoms;
- Ar¹ and Ar² are each independently a substituted or unsubstituted aryl group having 6 to 60 carbon atoms, or a substituted or unsubstituted heteroaryl group having 2 to 60 carbon atoms containing at least one of O, N, Si, and S;
- $L^{2b}$ and $L^{2c}$ are each independently a single bond, a substituted or unsubstituted arylene group having 6 to 60 carbon atoms, or a substituted or unsubstituted heteroarylene group having 2 to 60 carbon atoms containing at least one of O, N, Si, and S; and
- $Ar^{3b}$ and $Ar^{3c}$ are each independently a substituted or unsubstituted aryl group having 6 to 60 carbon atoms.

9. The organic light emitting device of claim 1, wherein the compound of Chemical Formula 1 is selected from the group consisting of the following compounds:

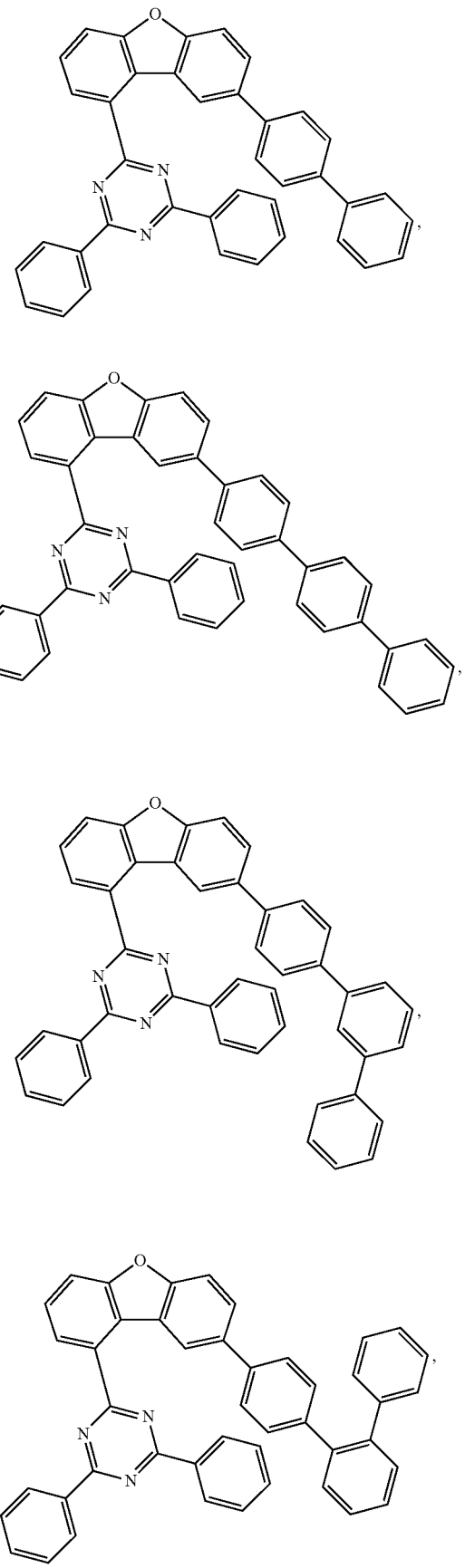

105
-continued
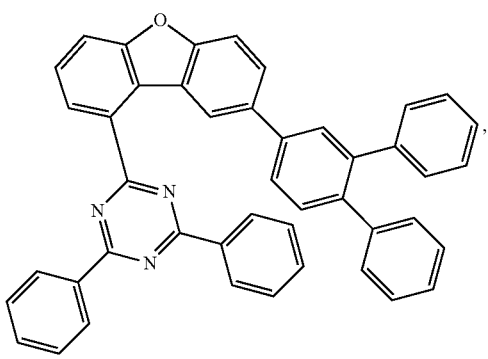
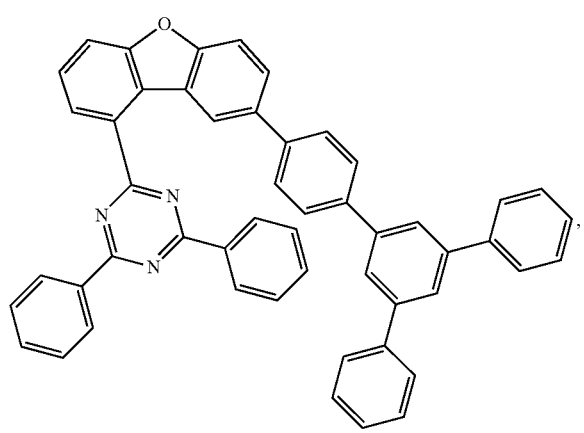
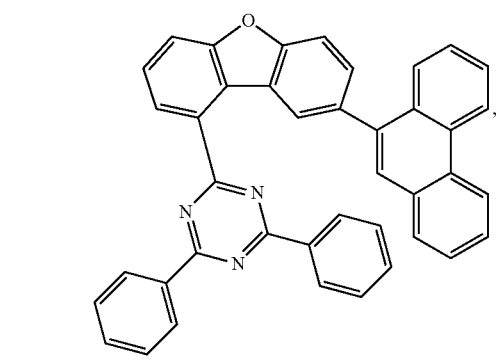
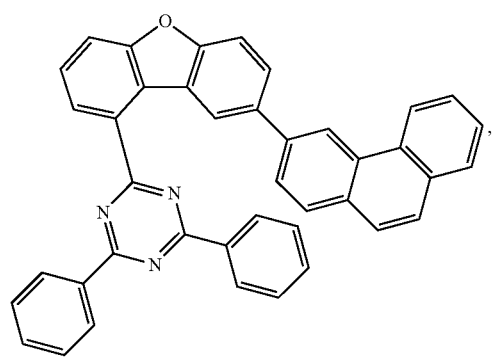
106
-continued
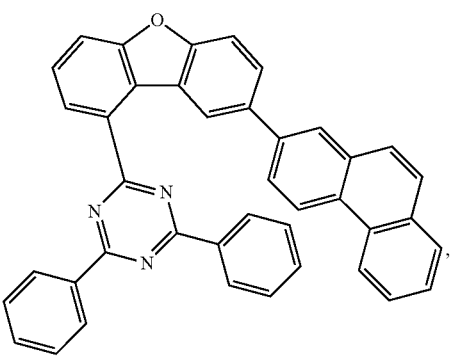
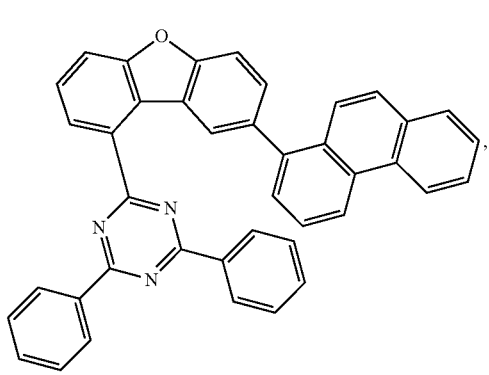
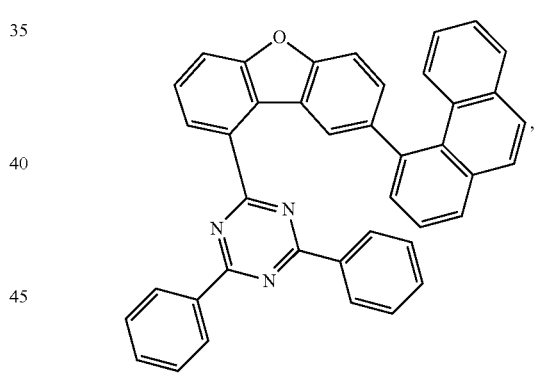
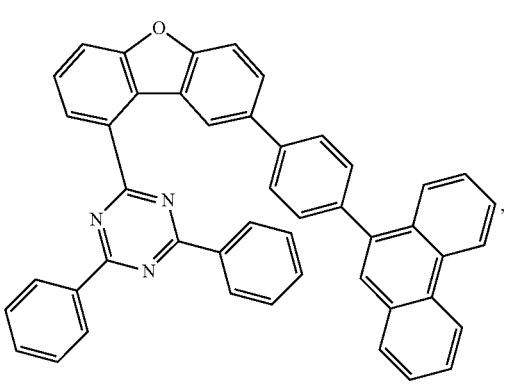

107
-continued
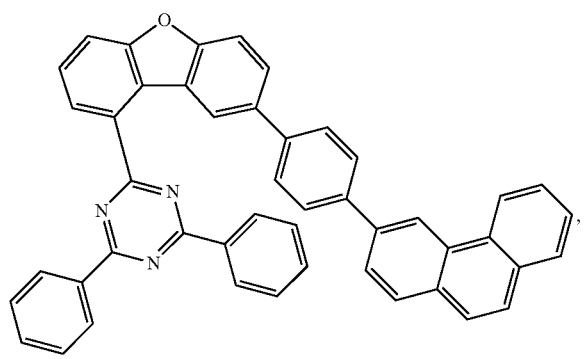
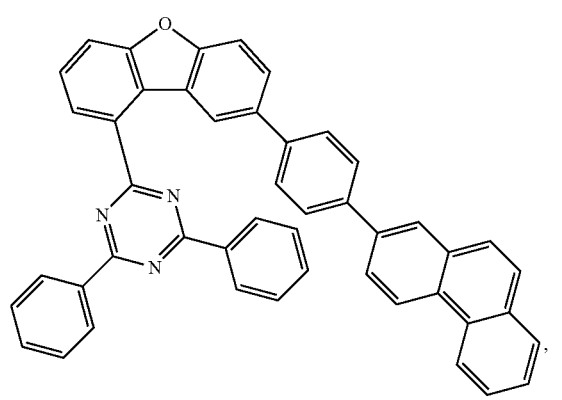
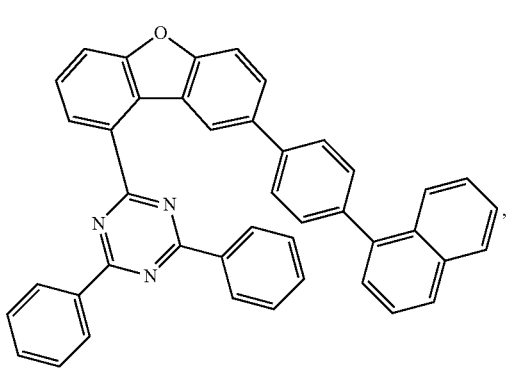
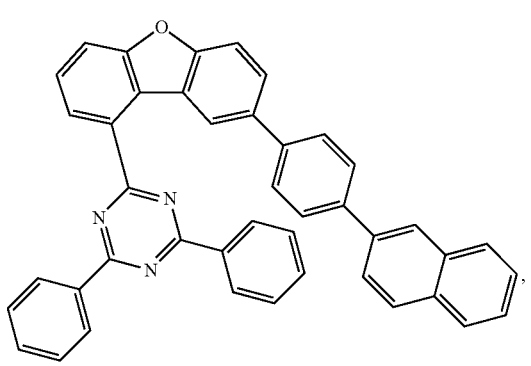
108
-continued
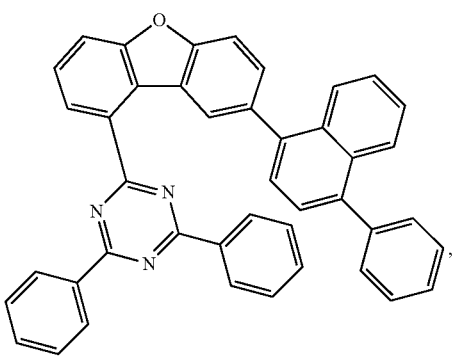
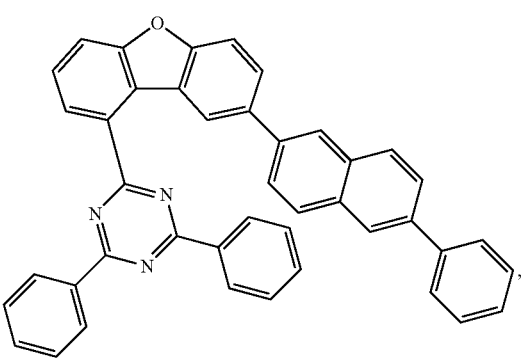
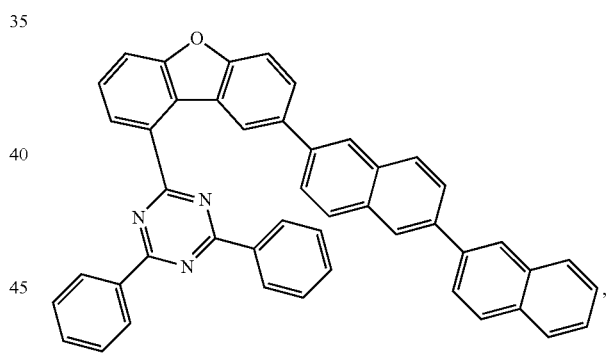
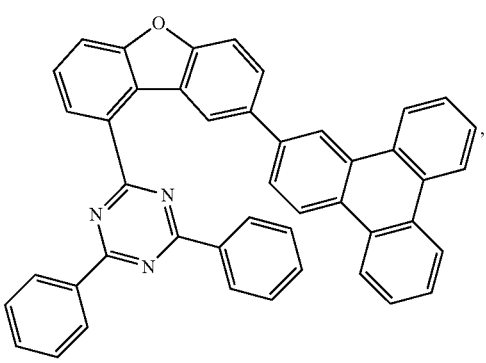

109
-continued
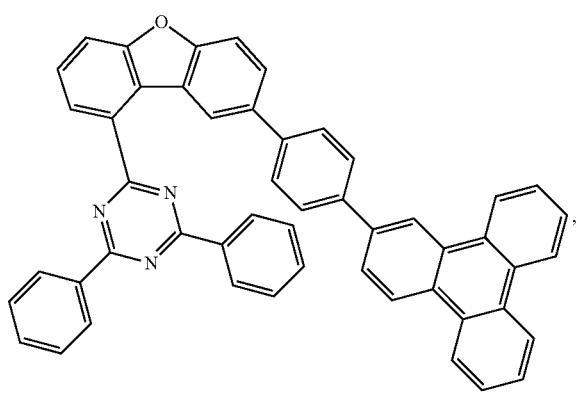
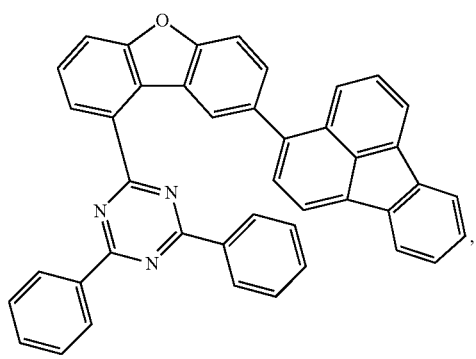
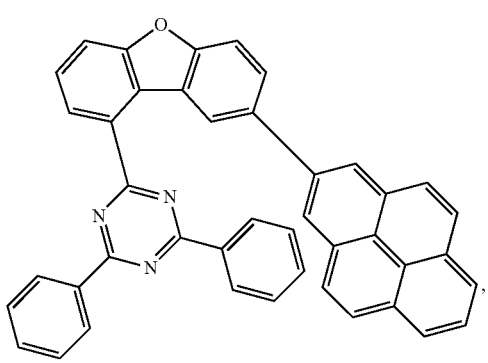
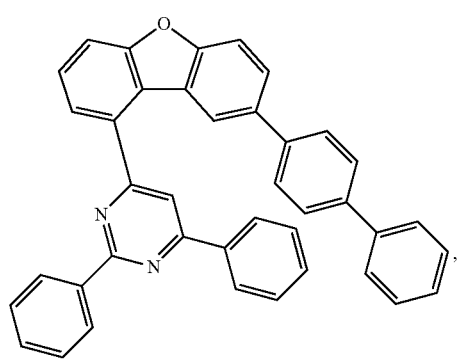
110
-continued
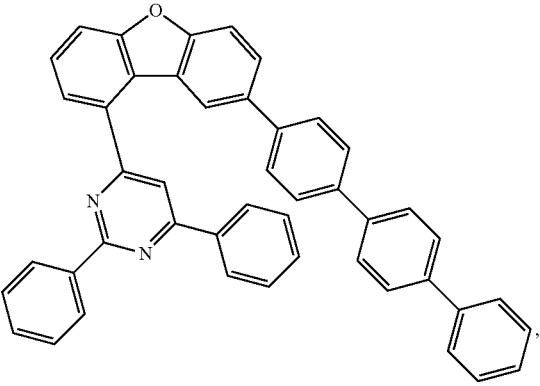
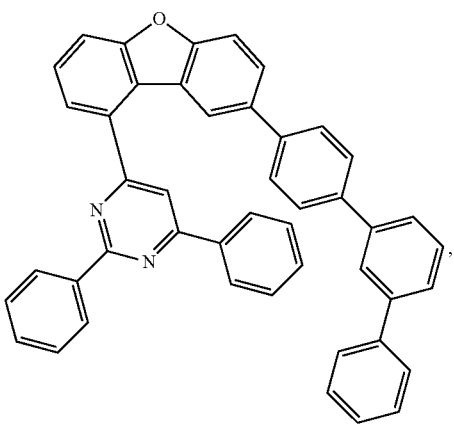
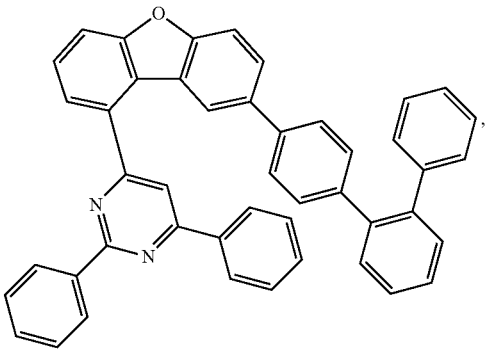
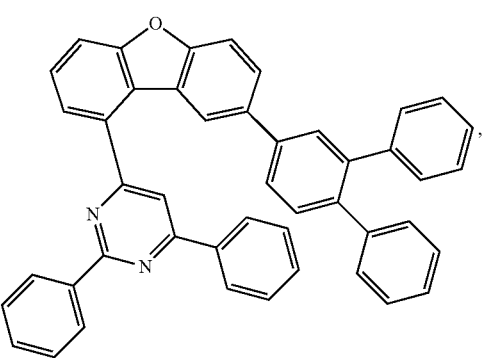

111
-continued
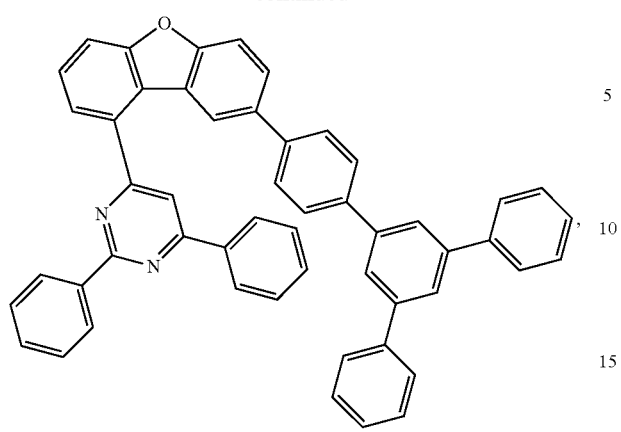
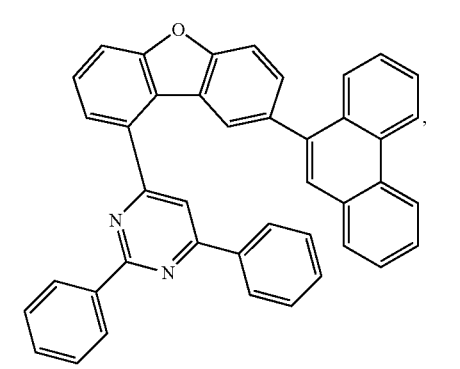
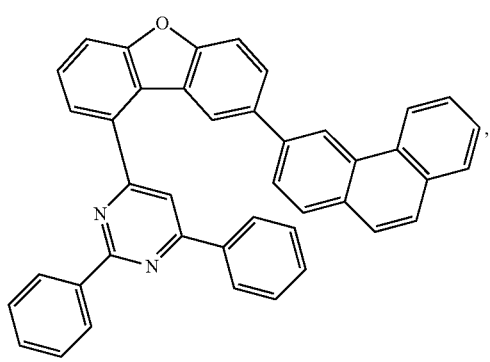
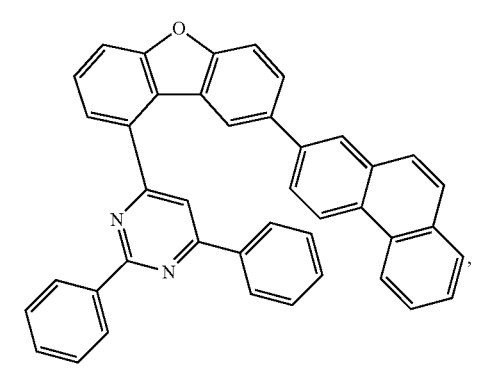
112
-continued
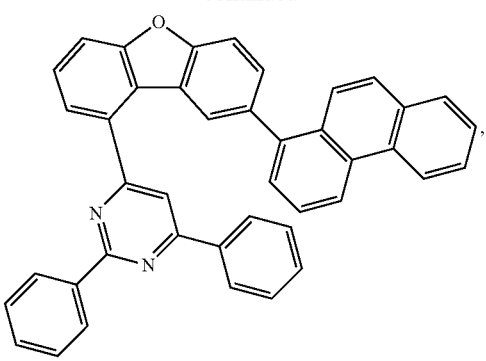
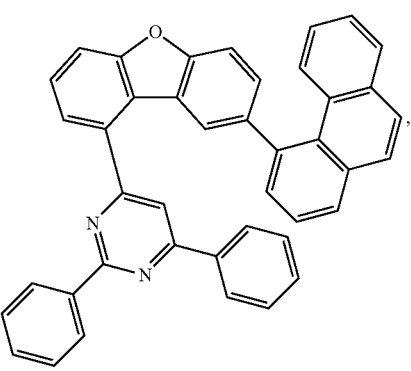
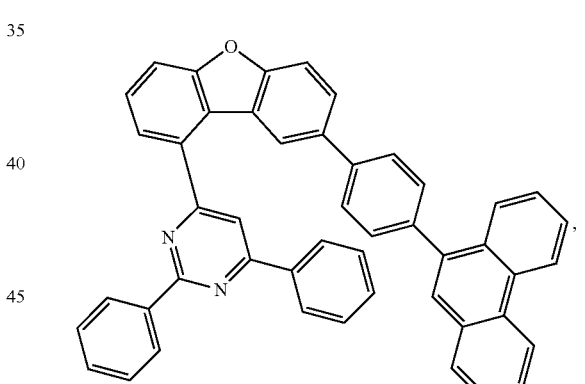
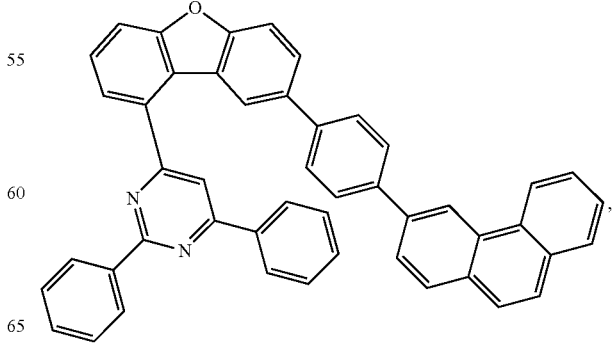

113
-continued
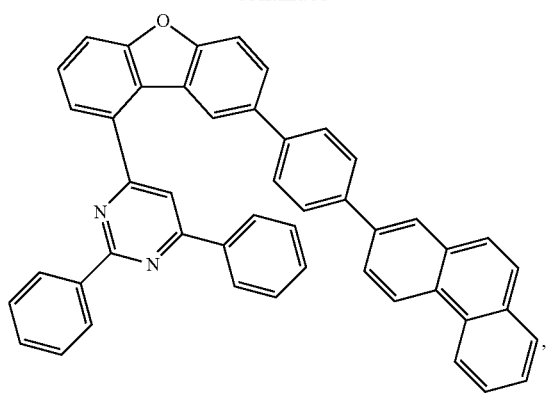
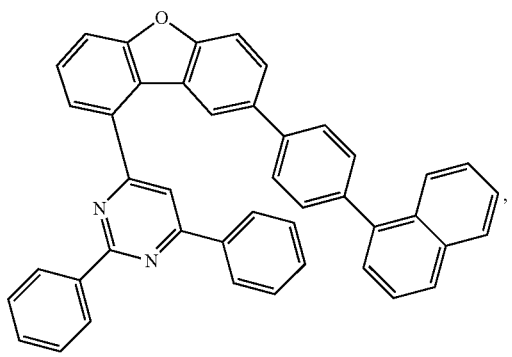
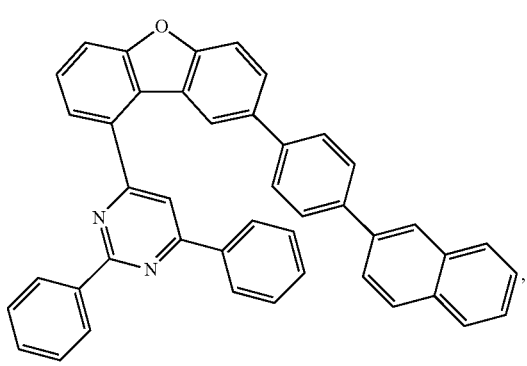
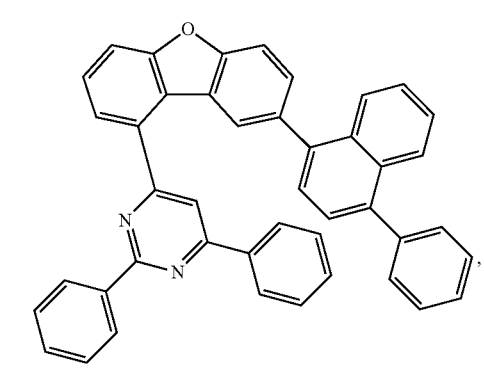
114
-continued
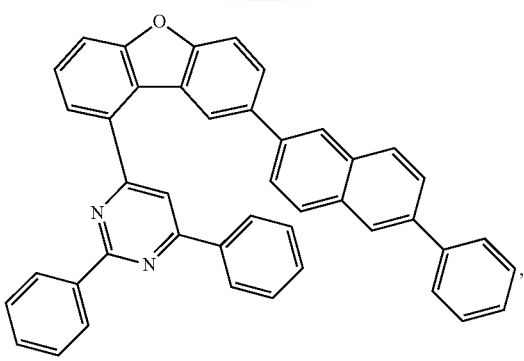
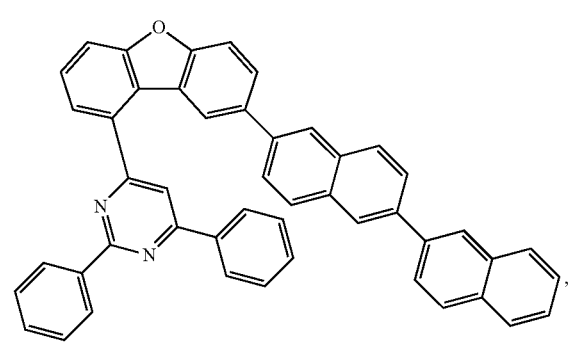
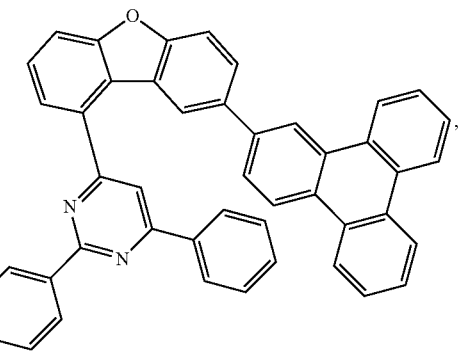
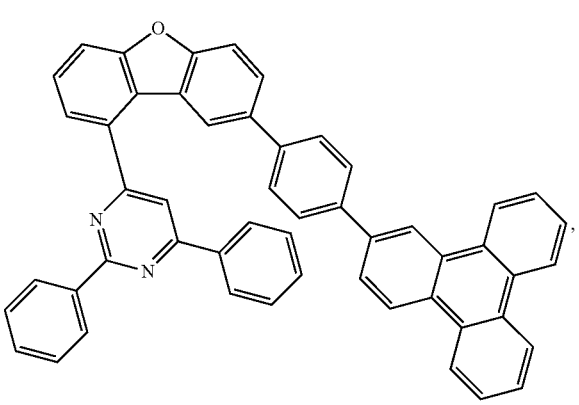

115
-continued
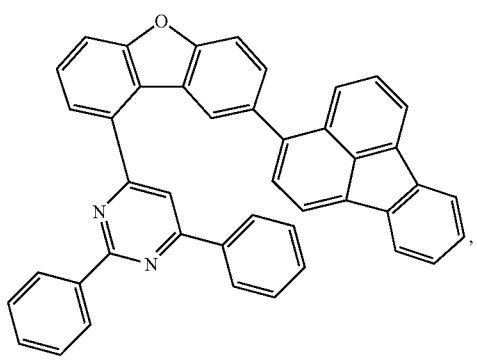
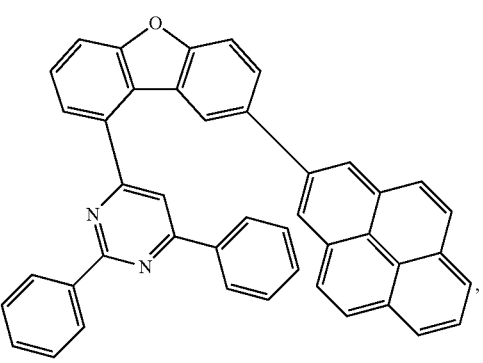
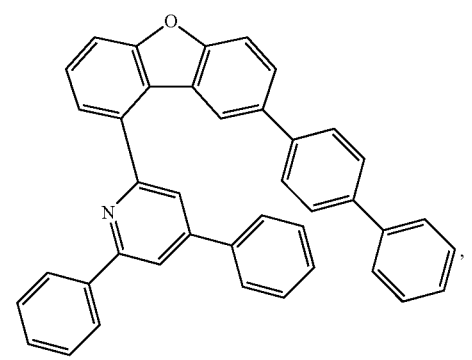
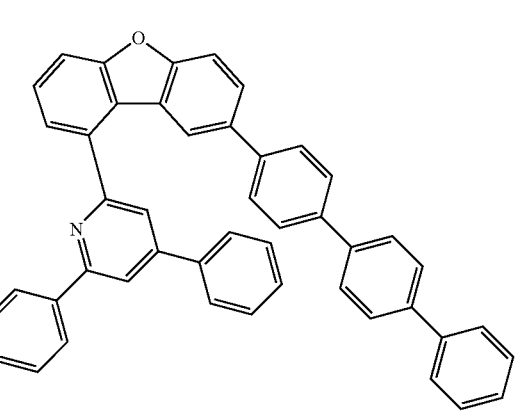
116
-continued
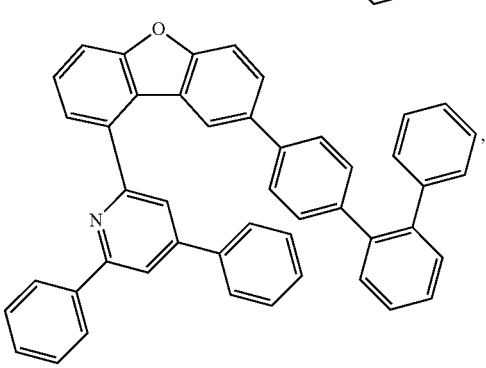
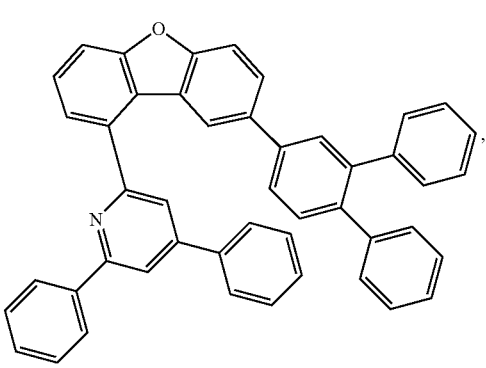
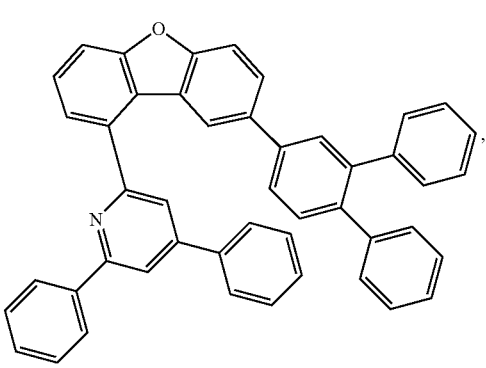
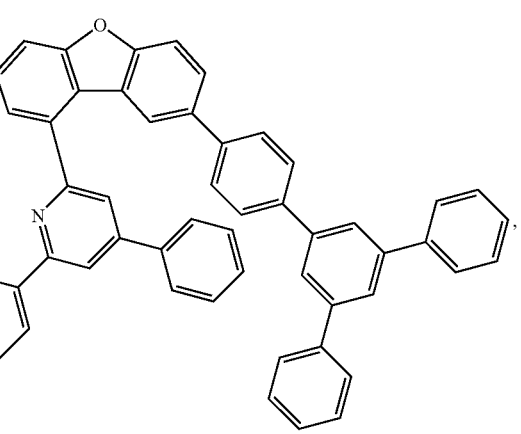

117
-continued
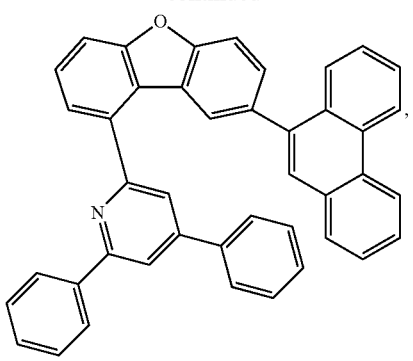
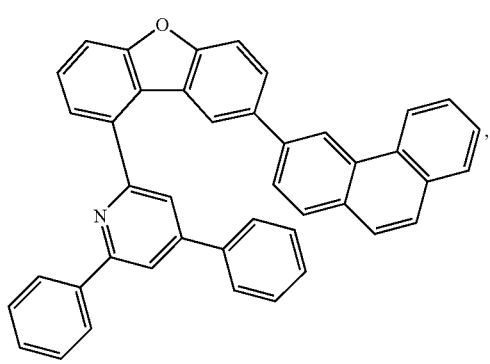
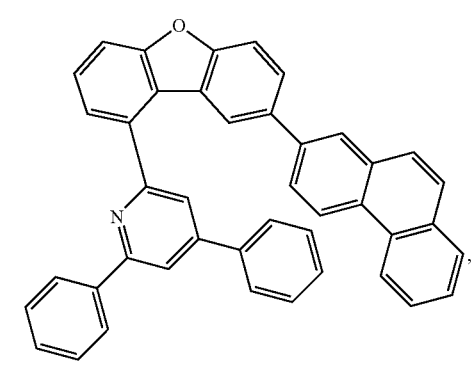
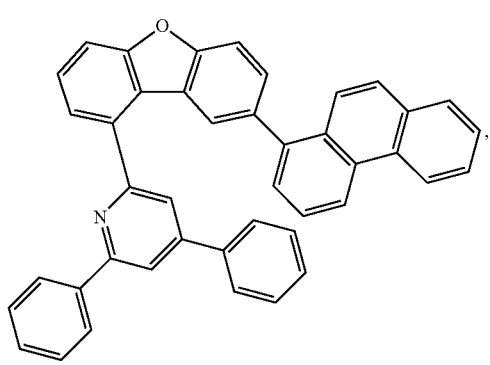
118
-continued
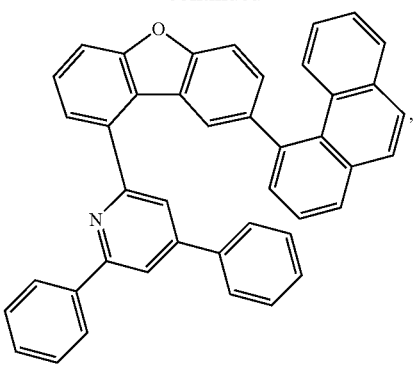
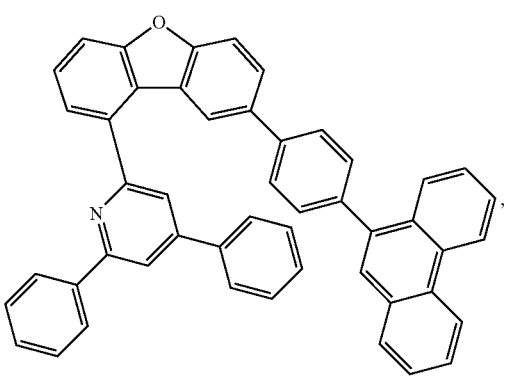
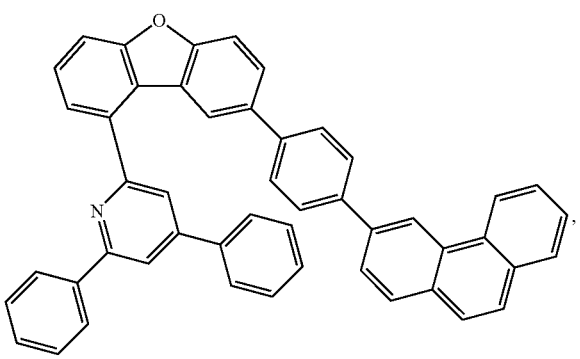
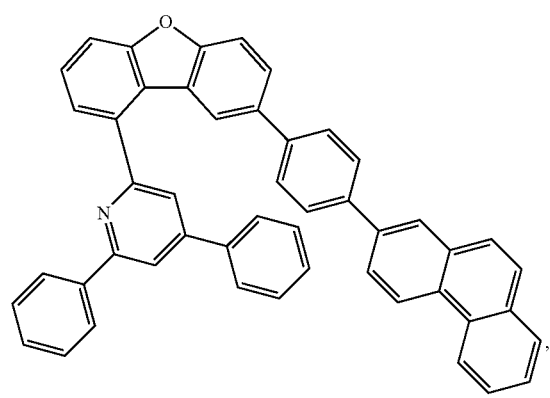

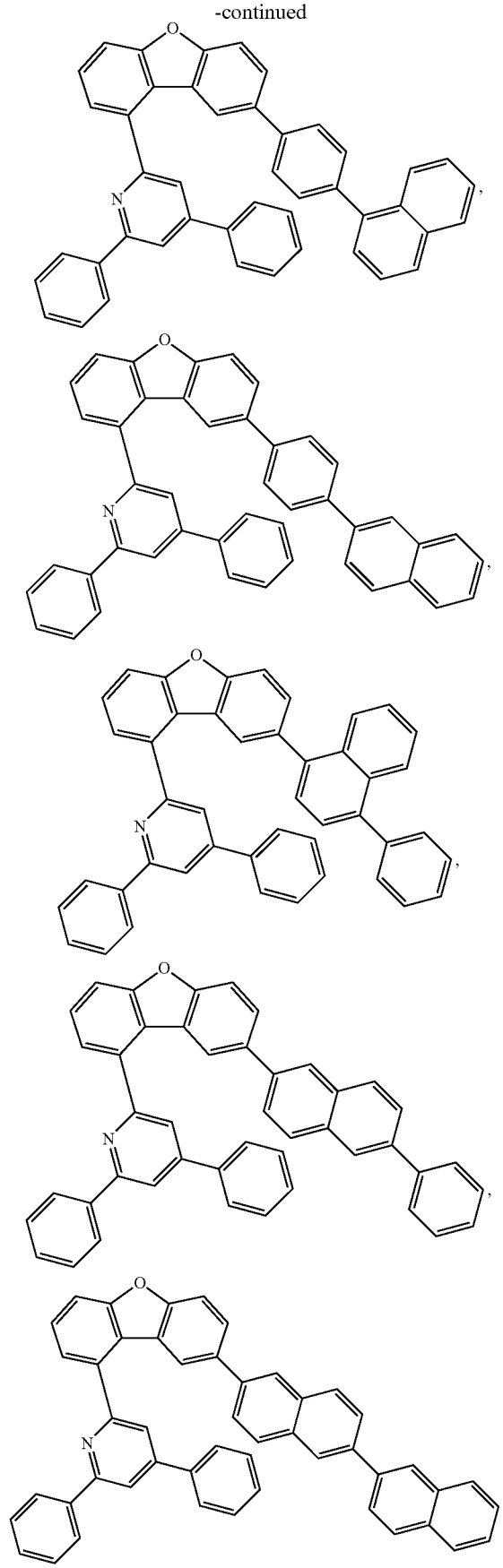
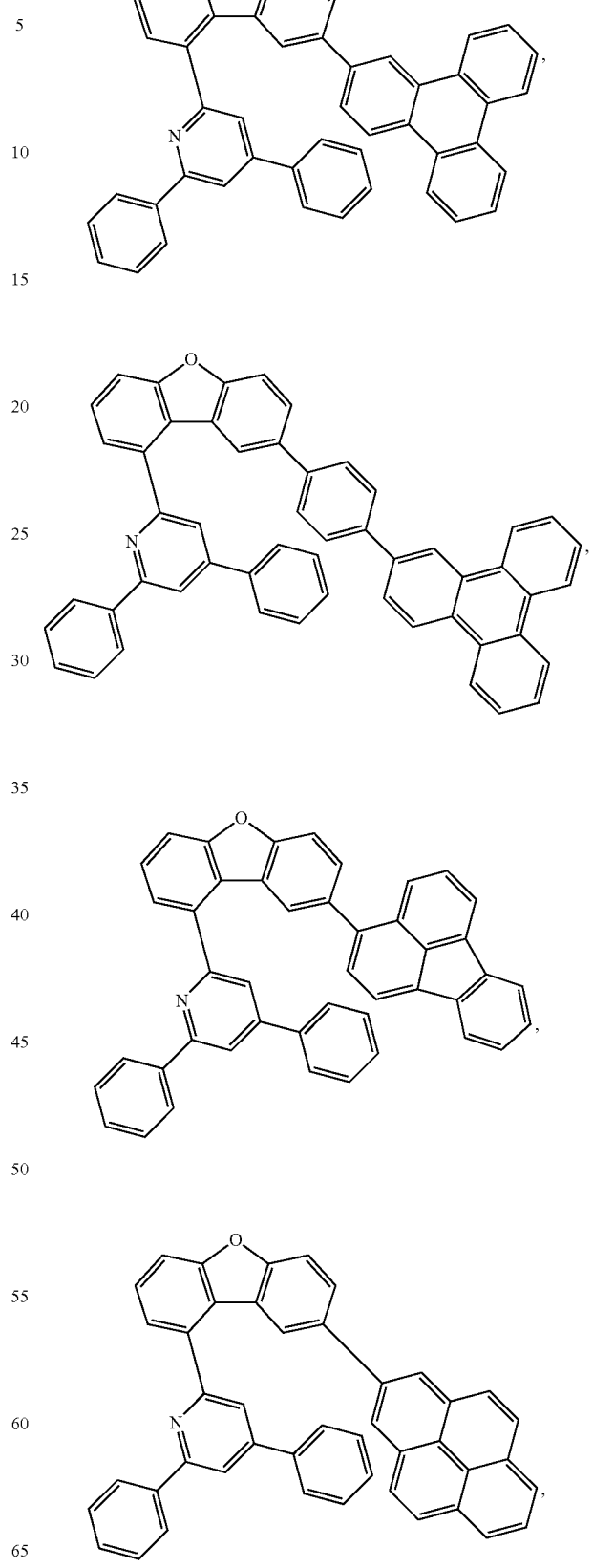

121
-continued
122
-continued
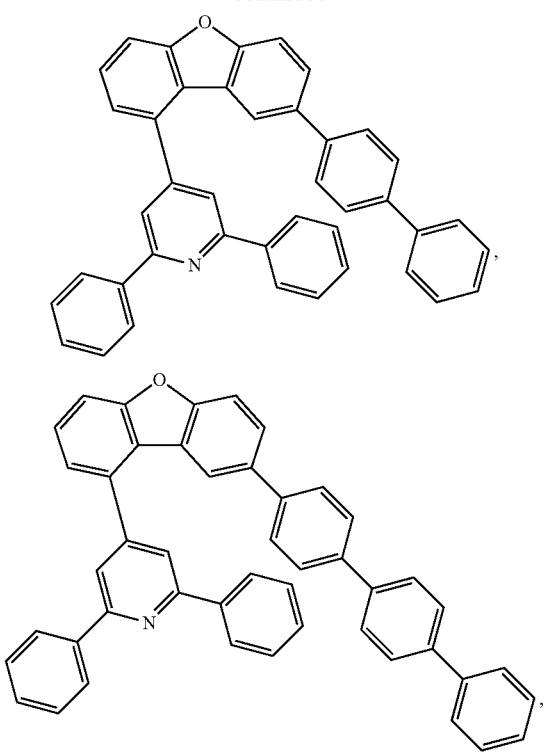
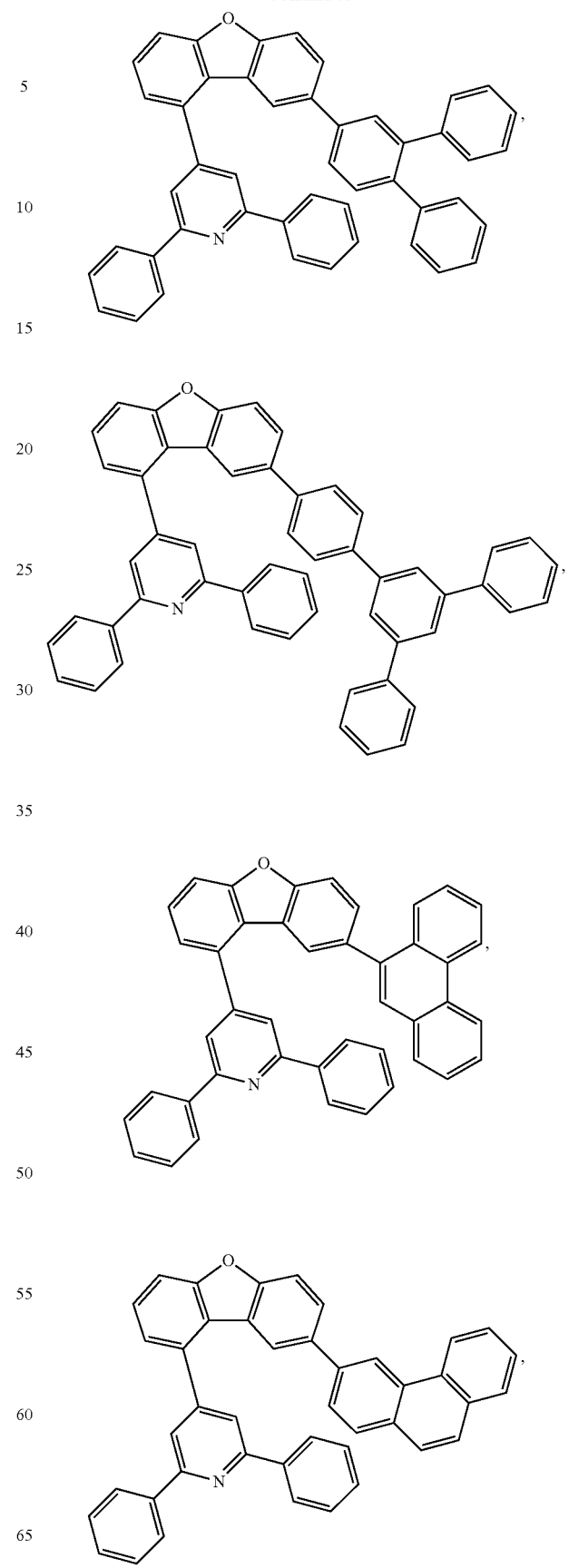

123
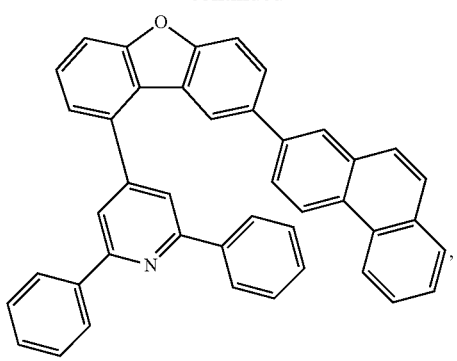
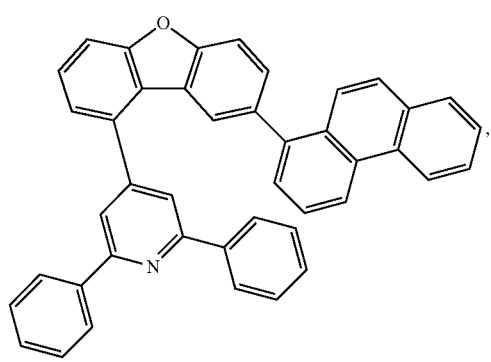
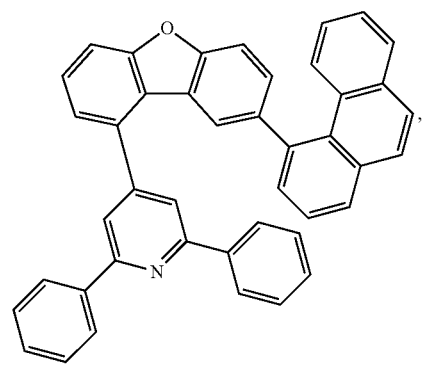
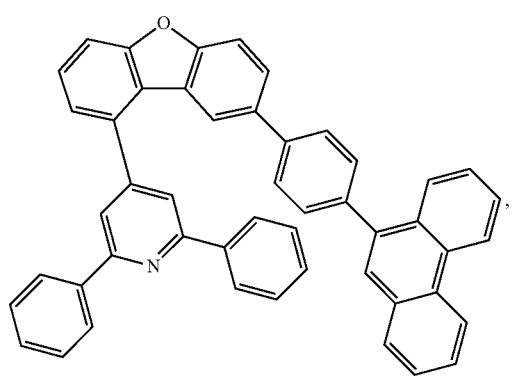
124
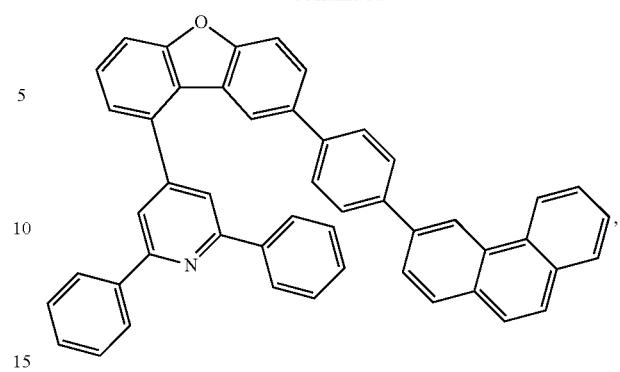
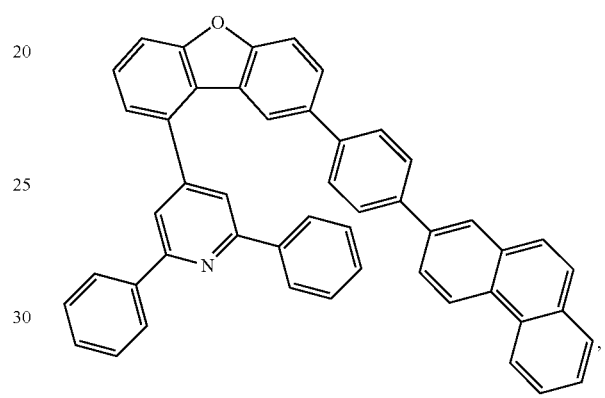
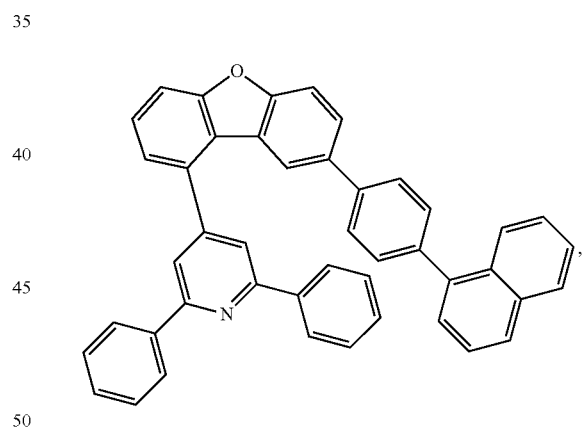
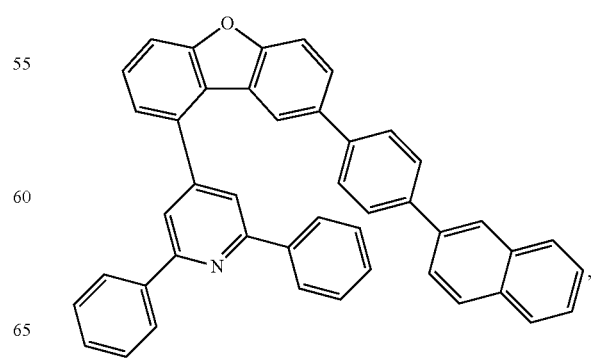

125
-continued
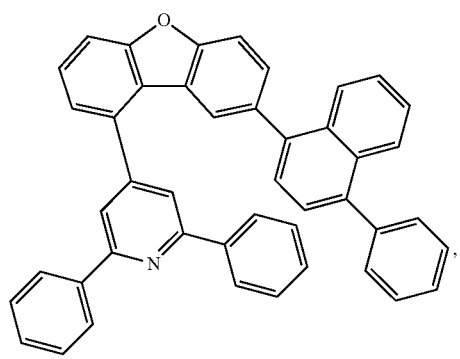
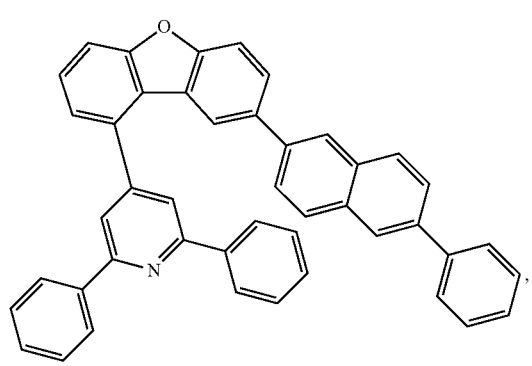
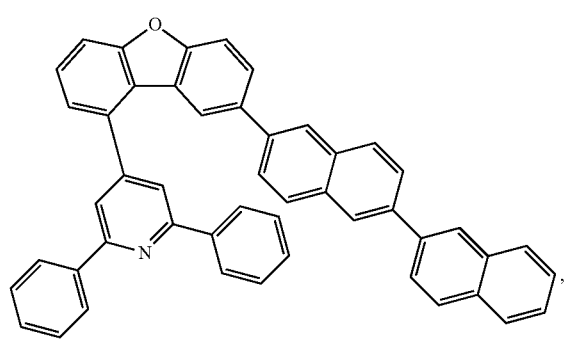
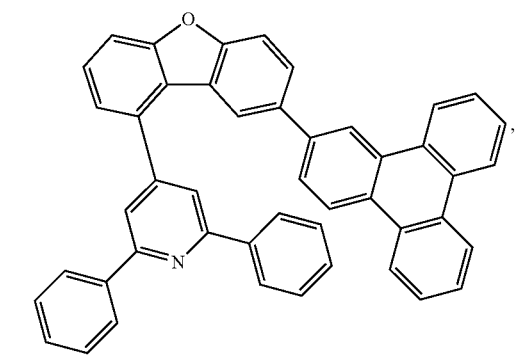
126
-continued
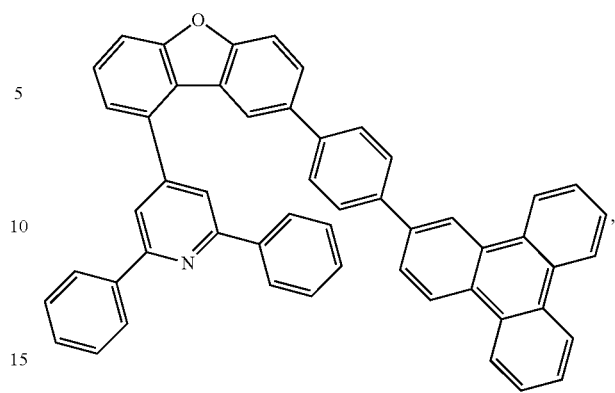
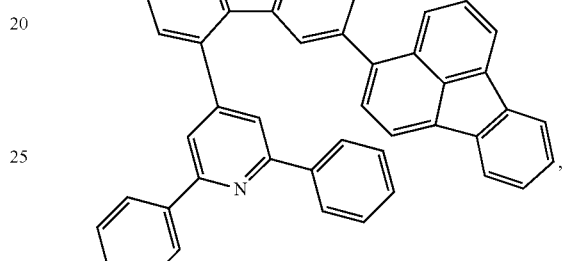
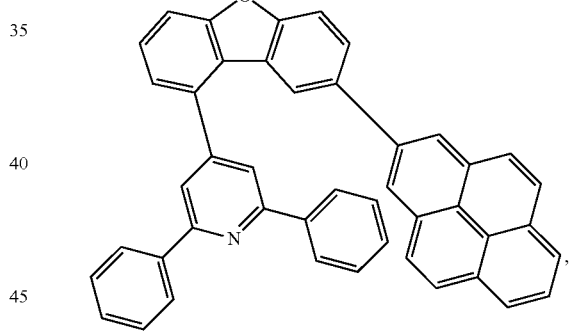
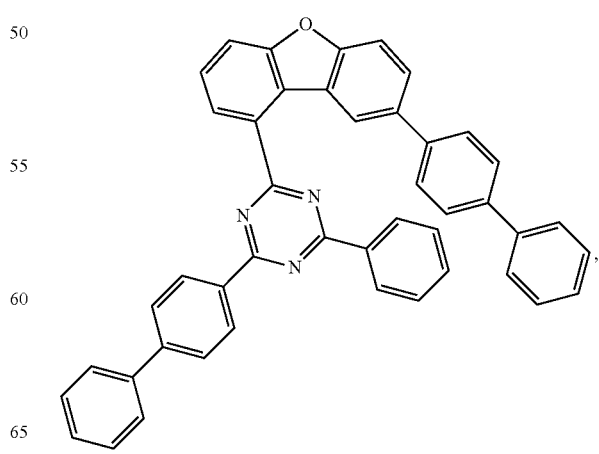

127
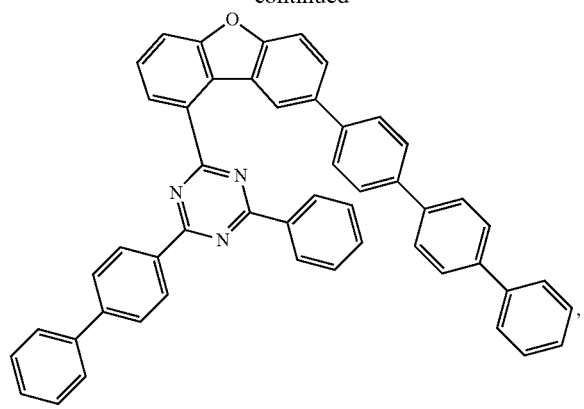
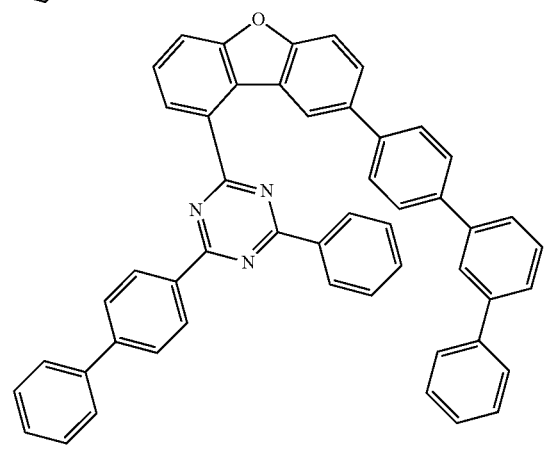
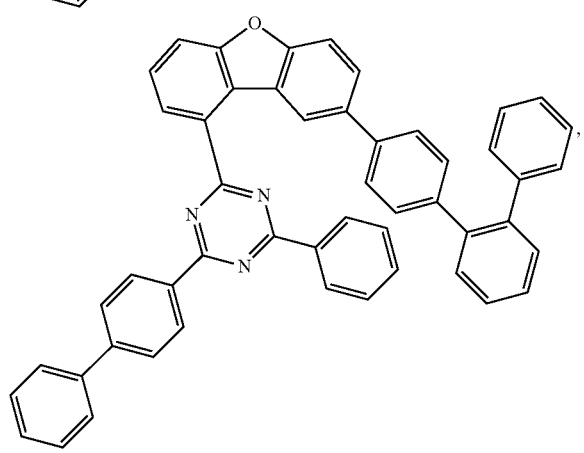
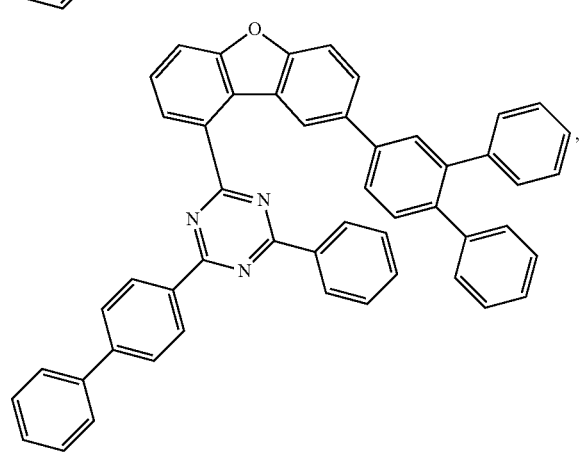
128
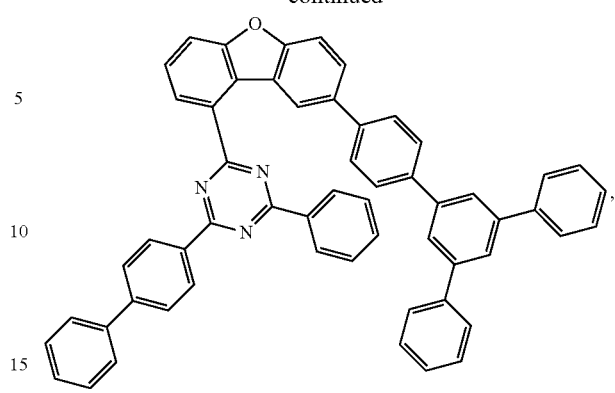
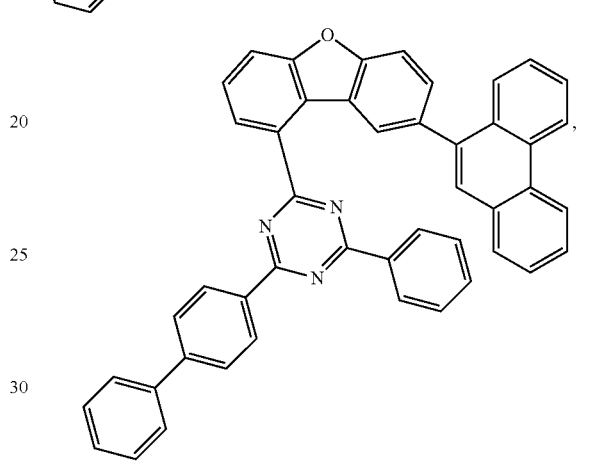
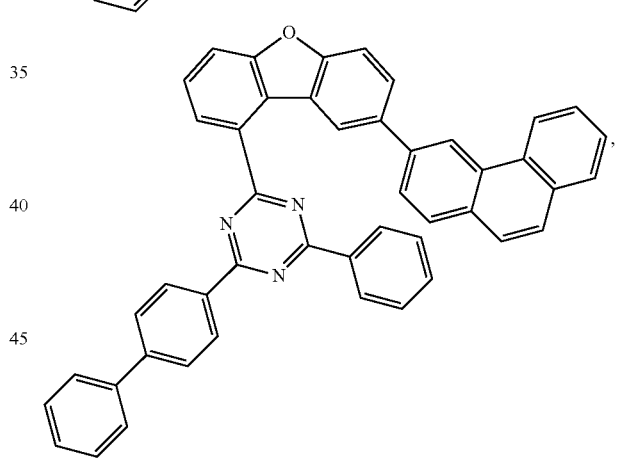
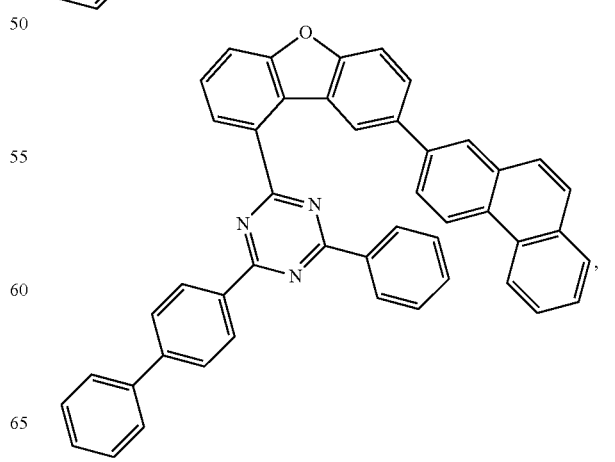

129
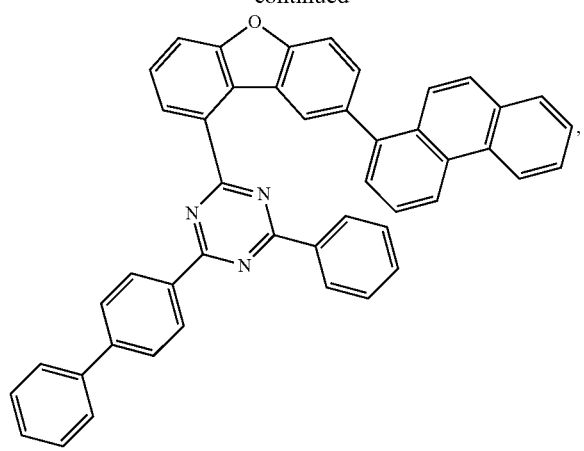
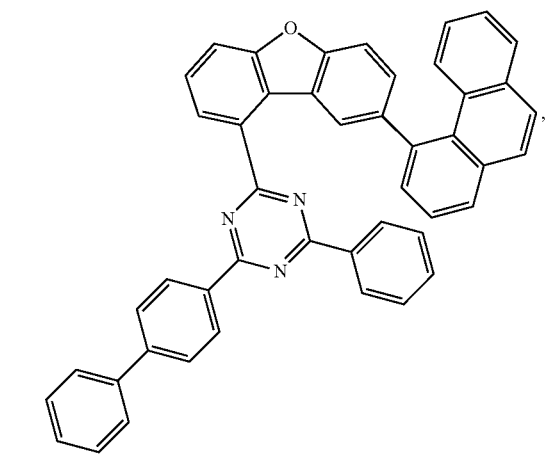
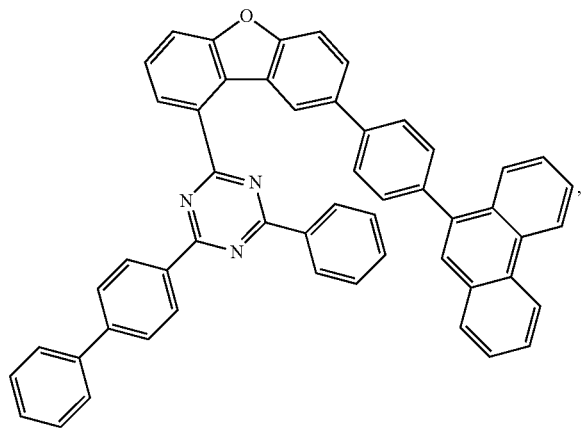
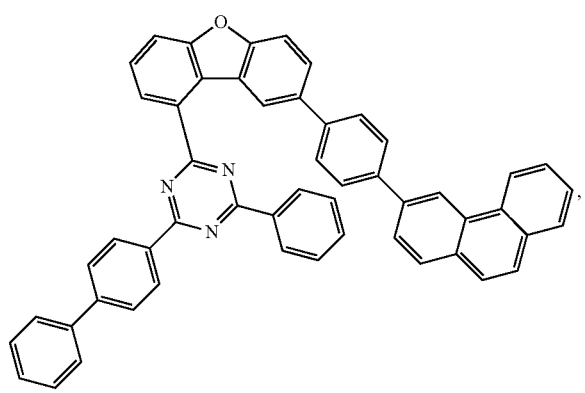
130
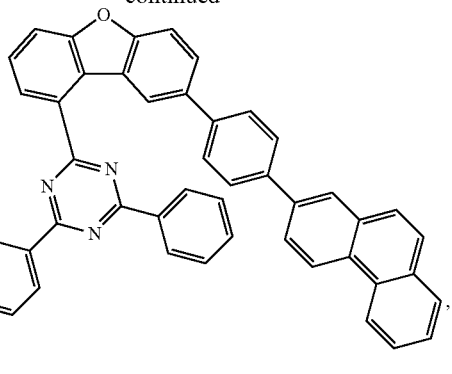
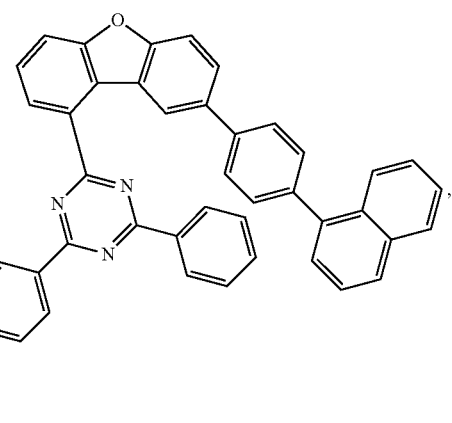
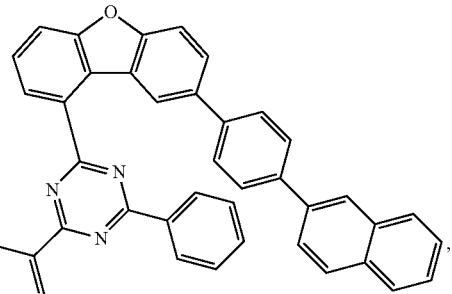
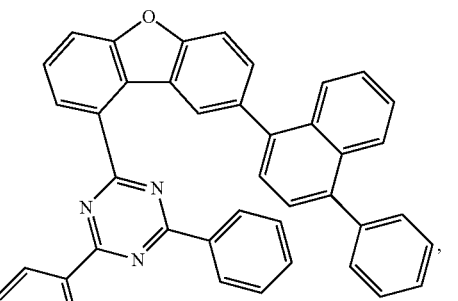

-continued
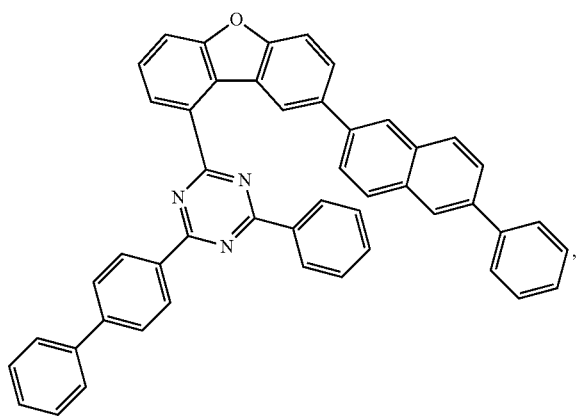
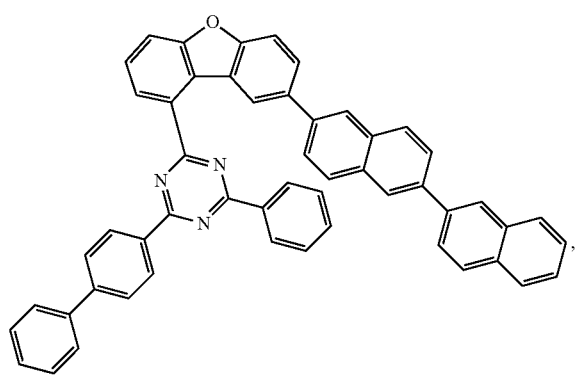
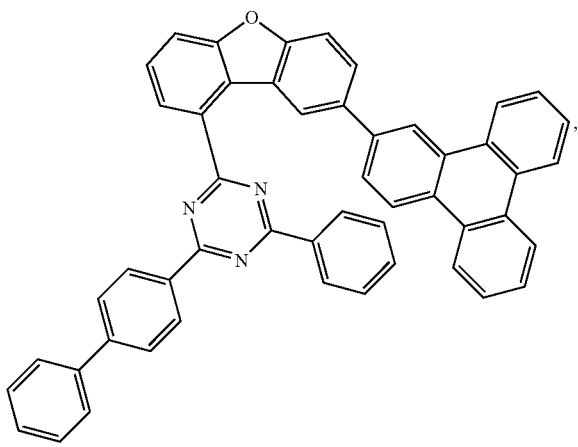
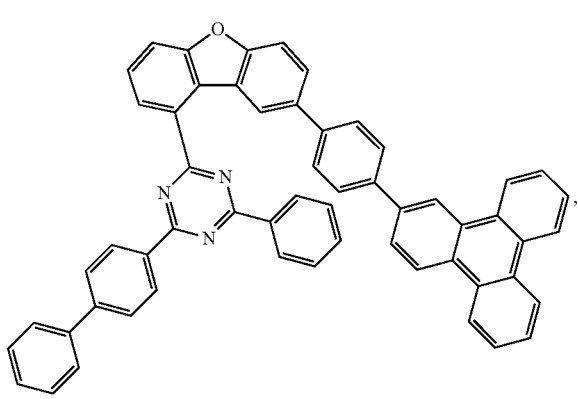
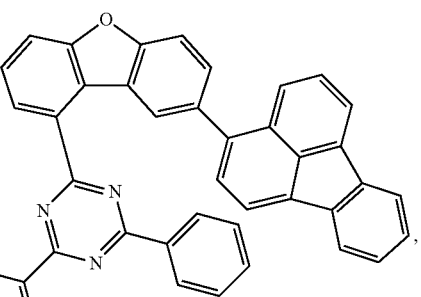
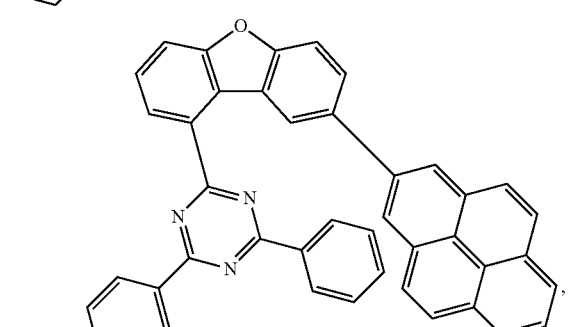
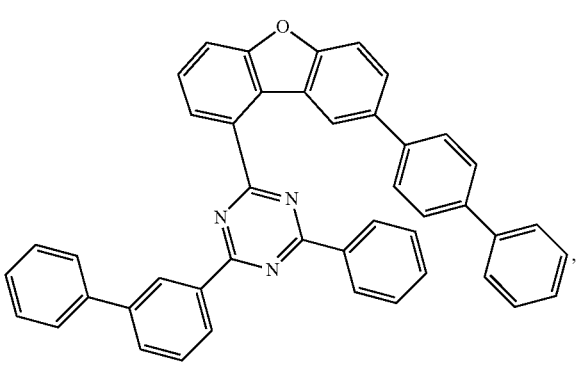
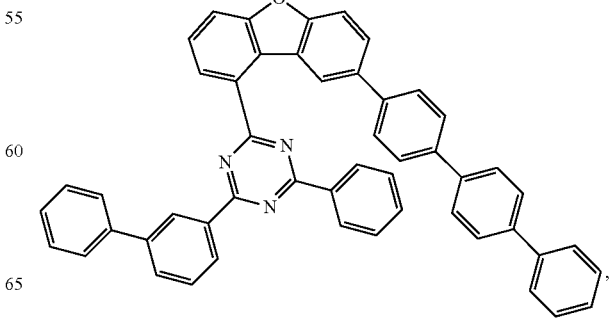

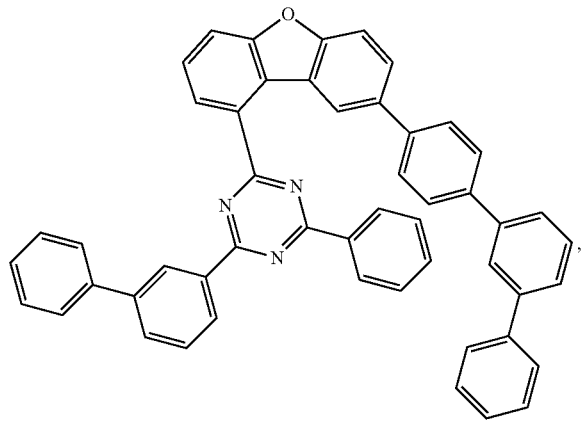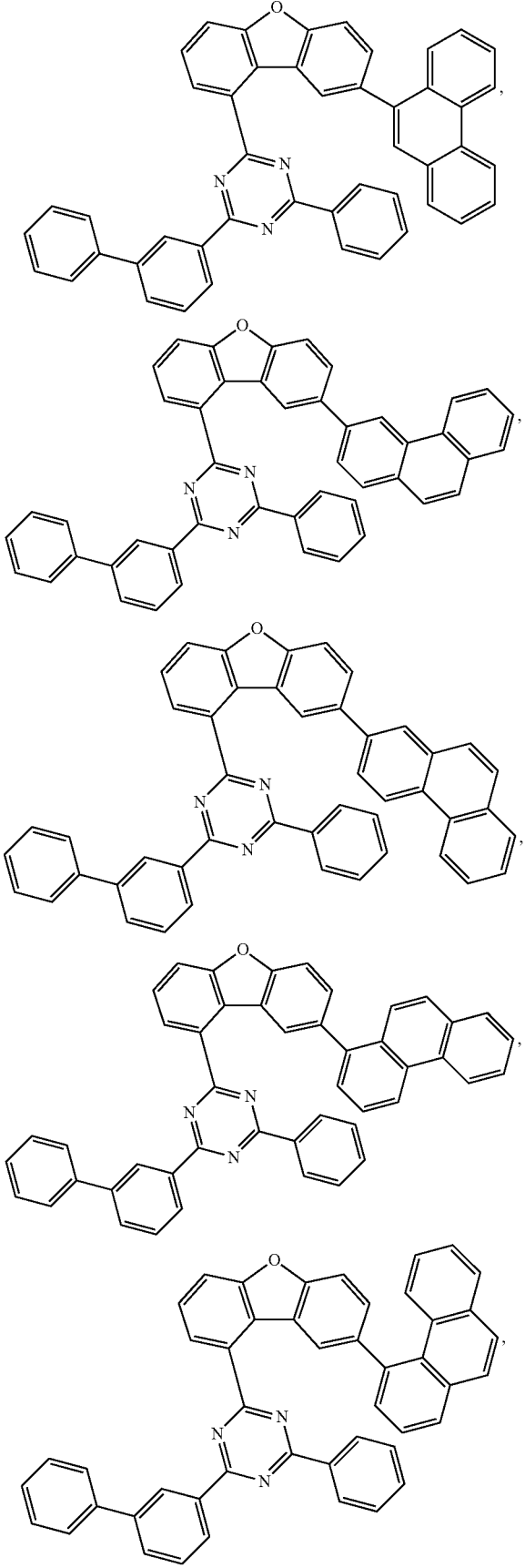

135
-continued
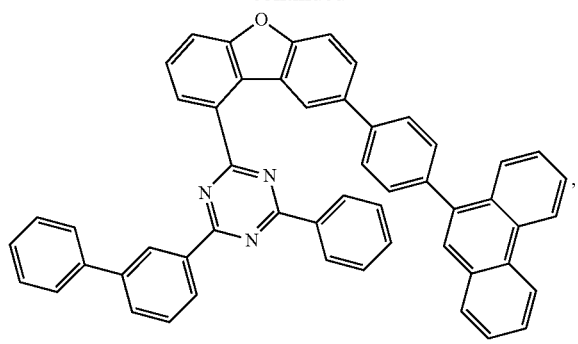
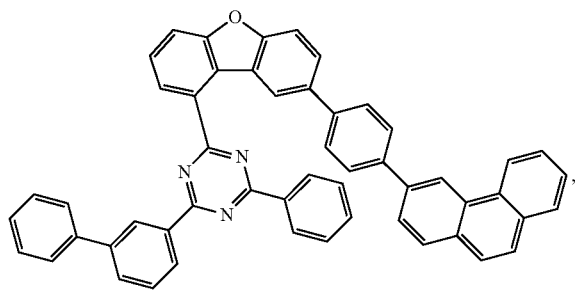
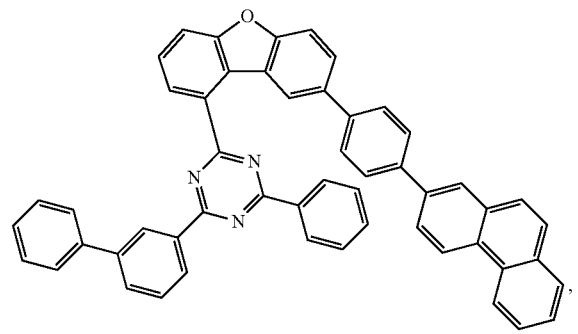
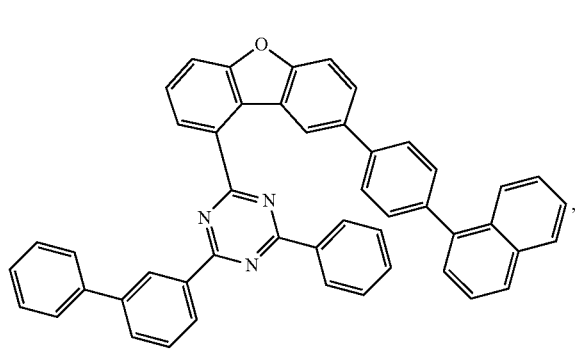
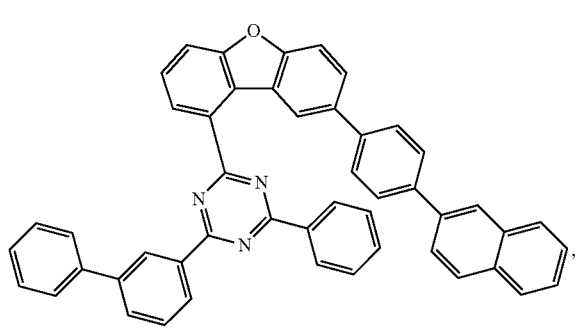
136
-continued
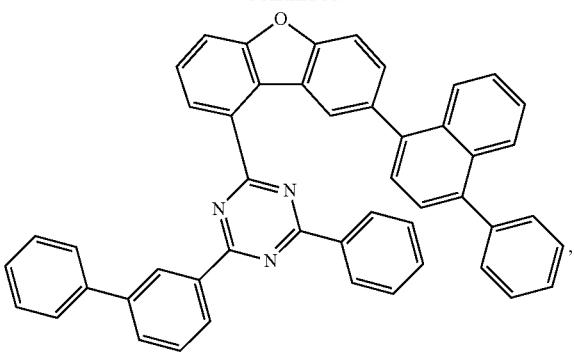
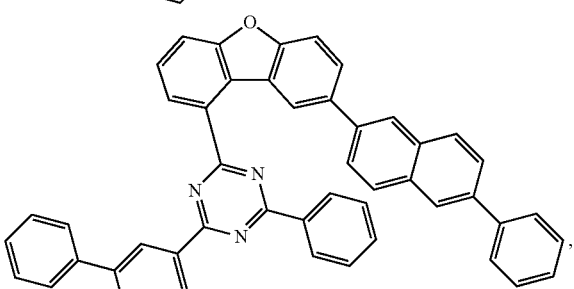
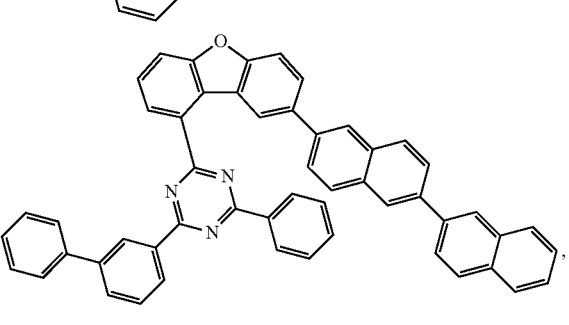
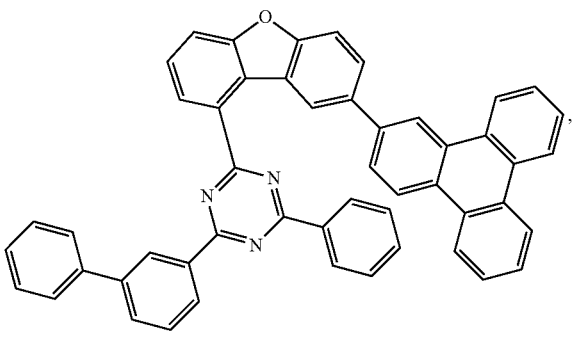
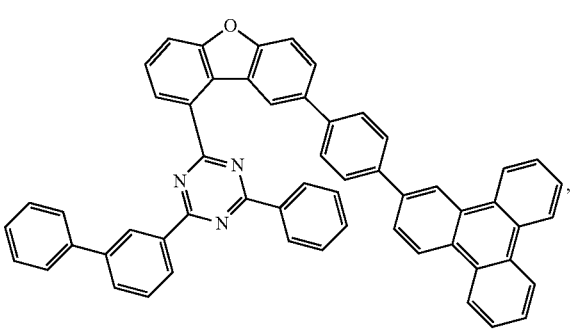

137
-continued
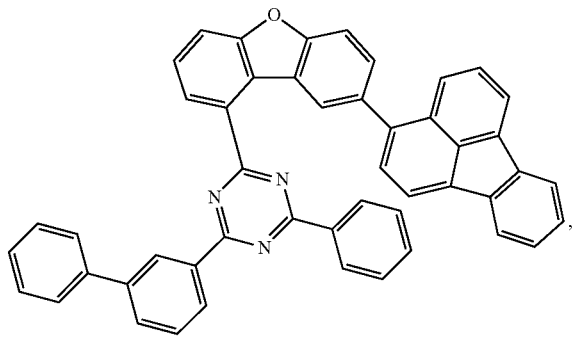
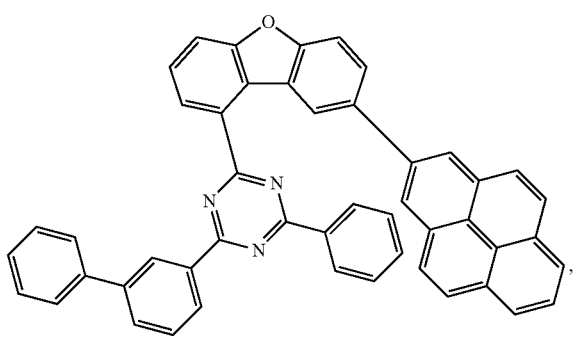
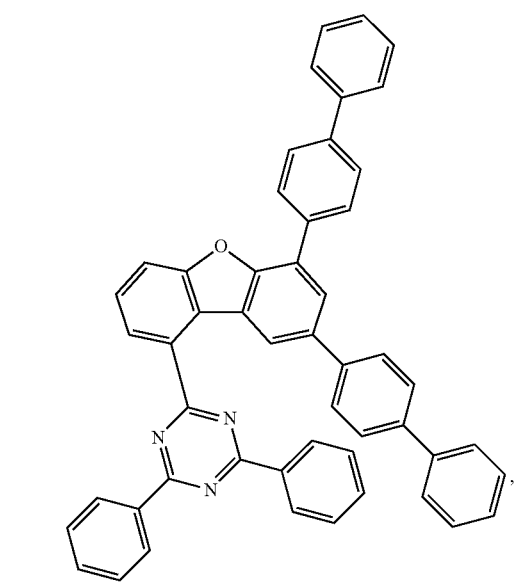
138
-continued
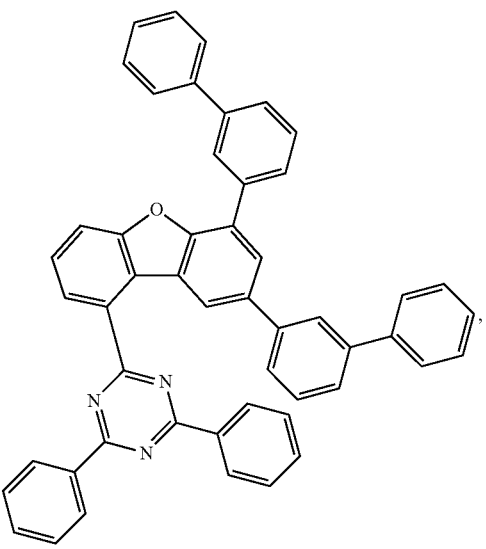
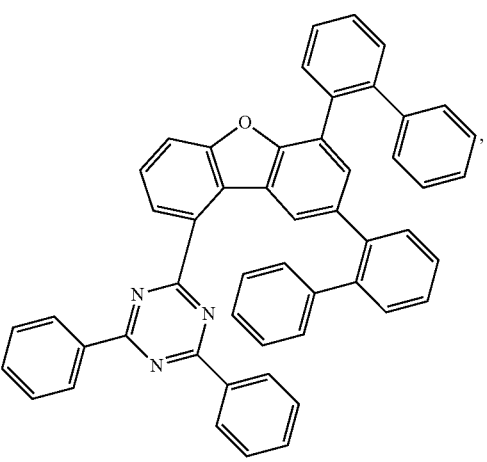
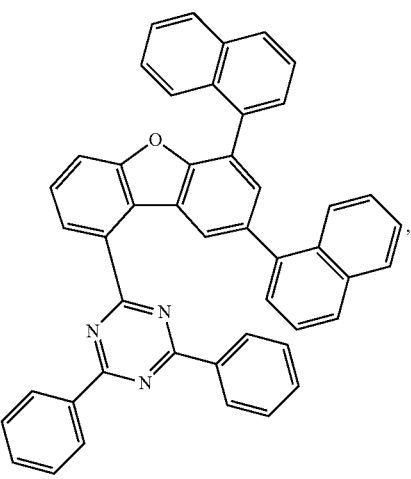

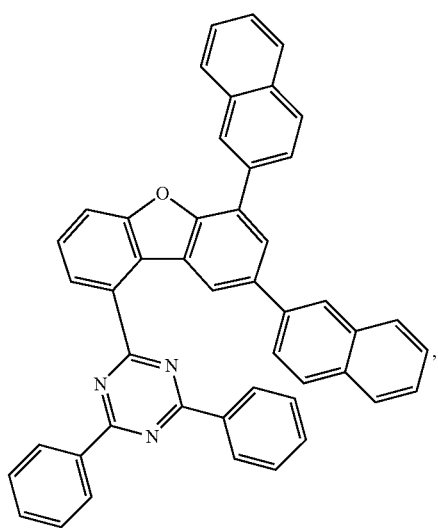
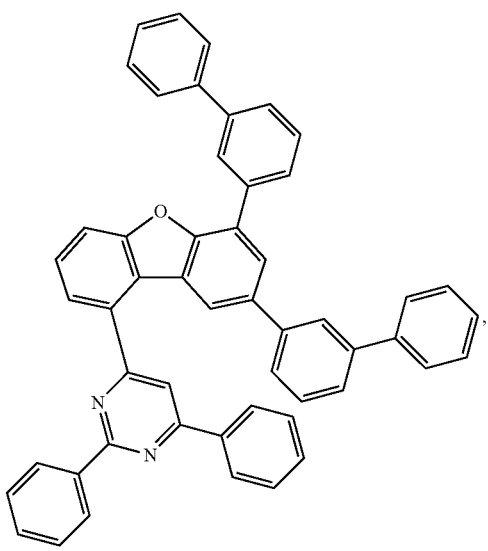
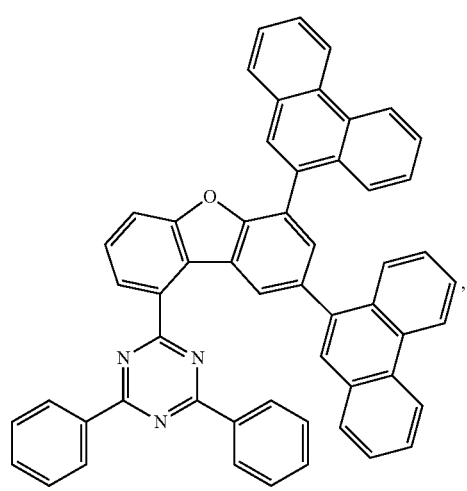
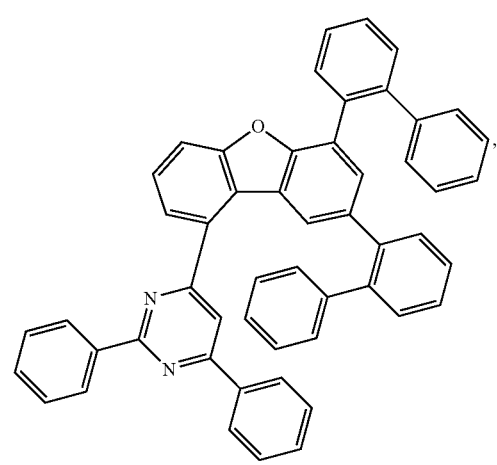
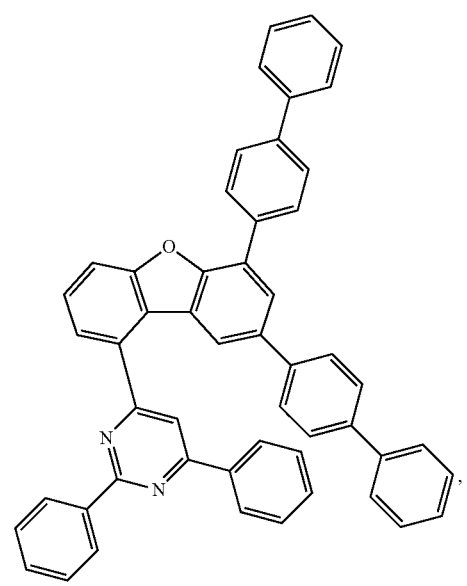
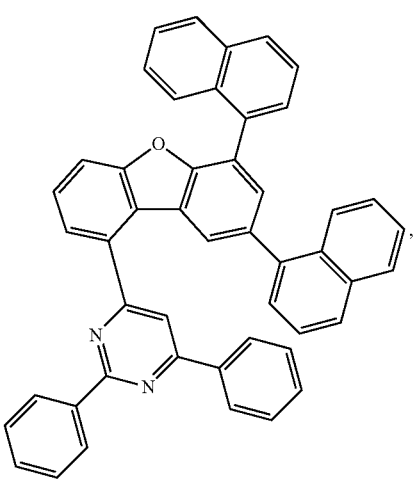

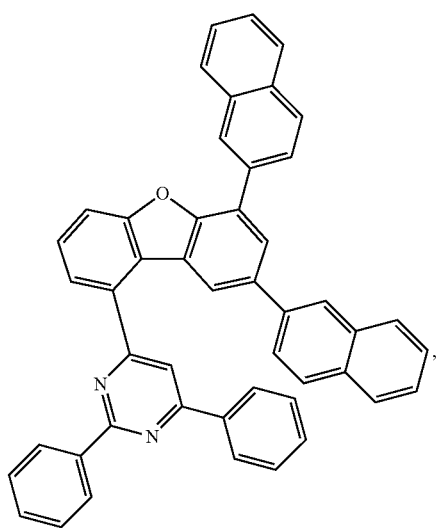
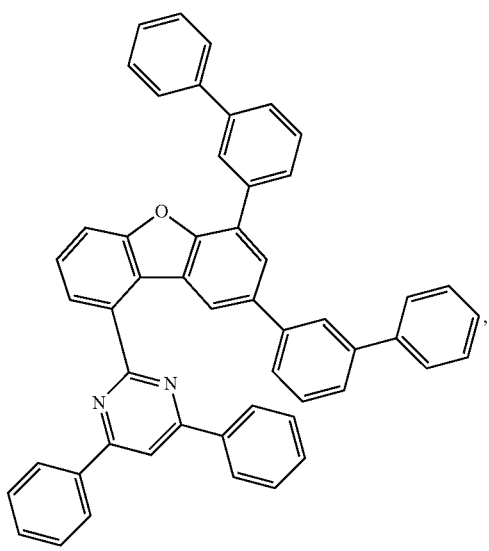
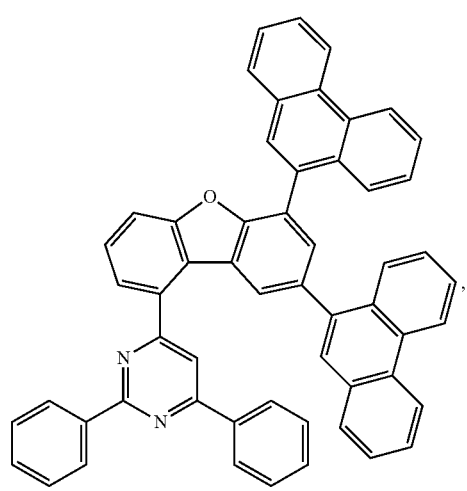
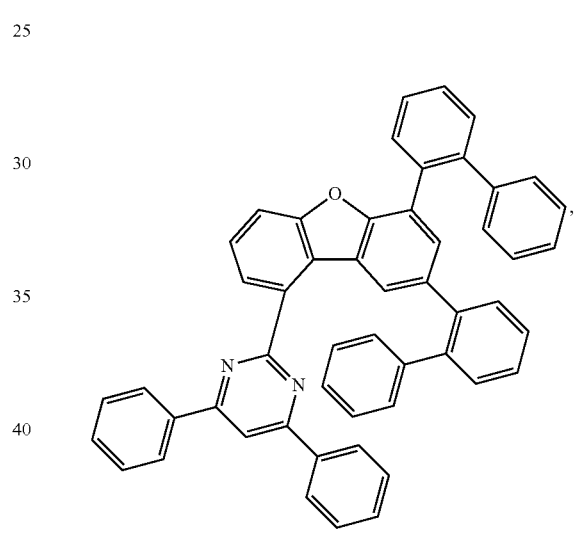
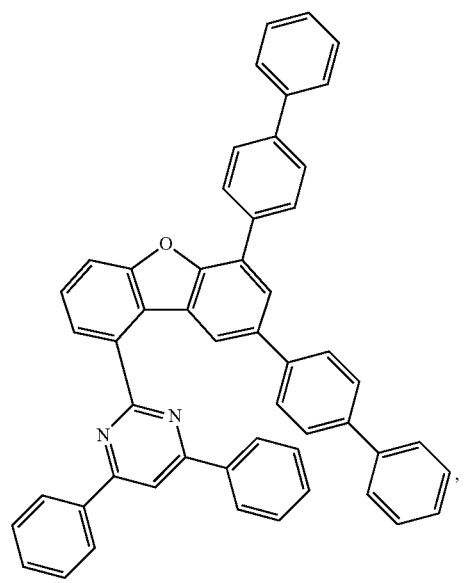
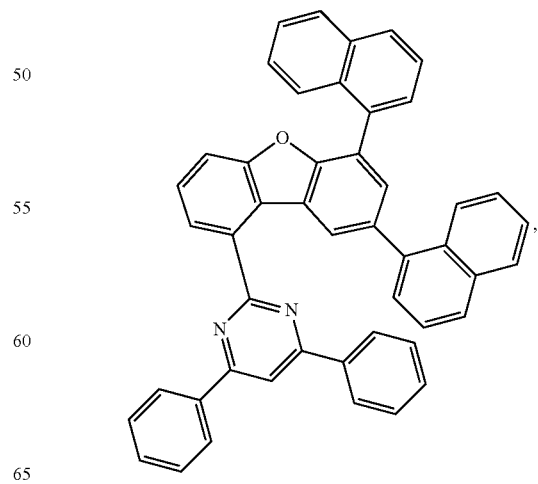

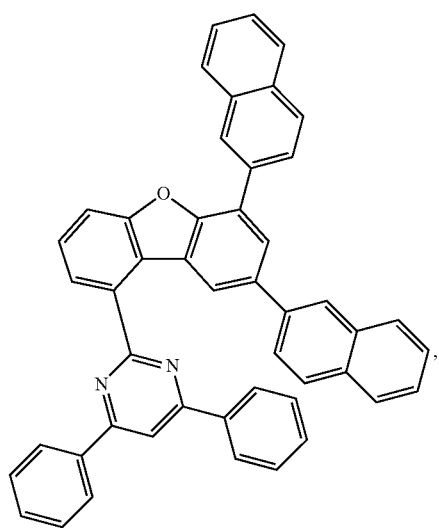
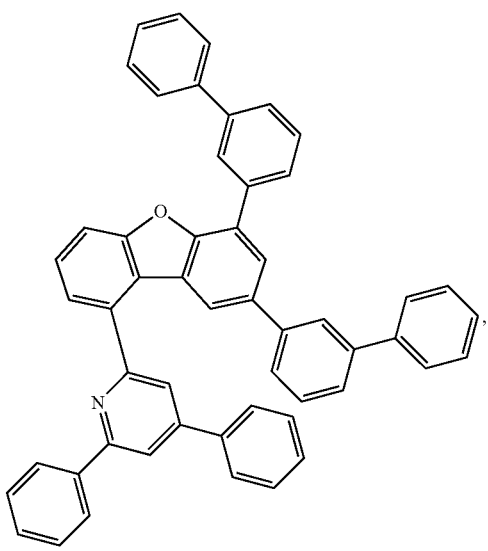
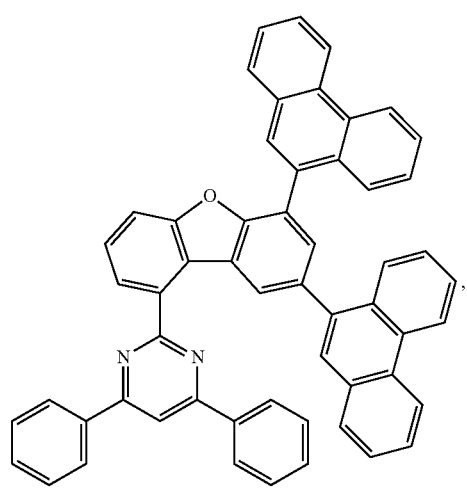
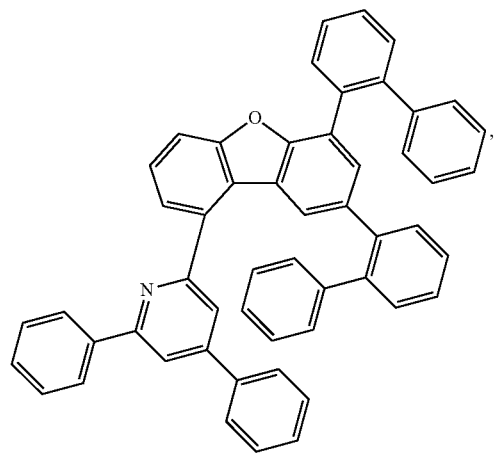
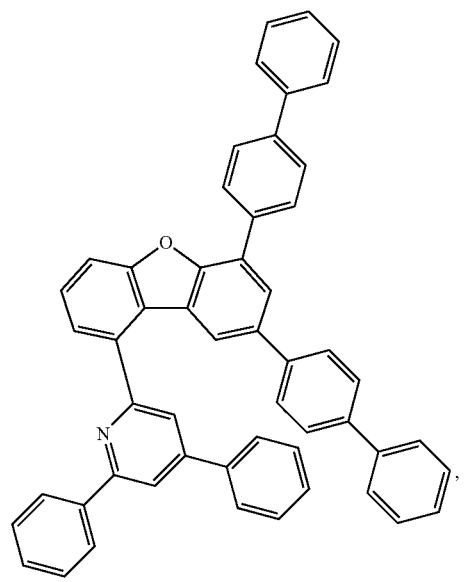
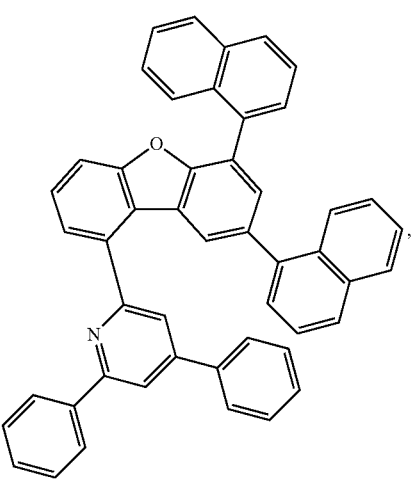

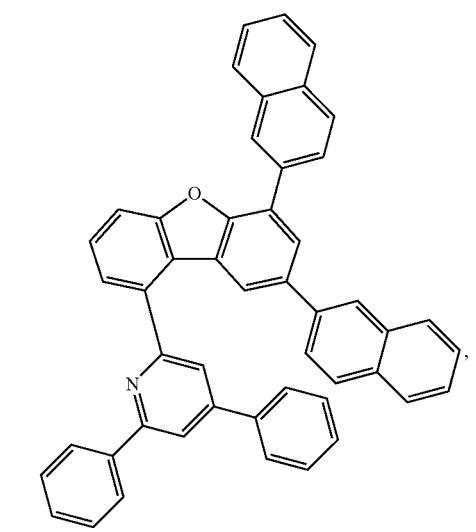
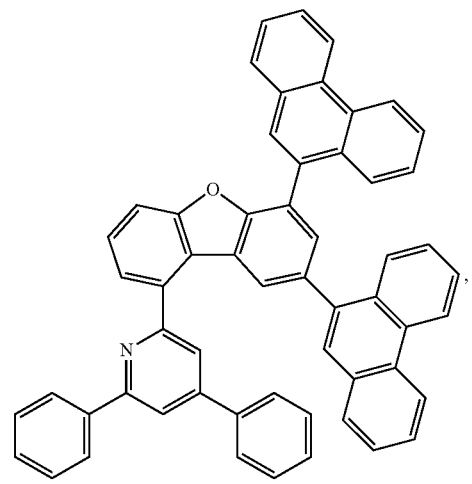
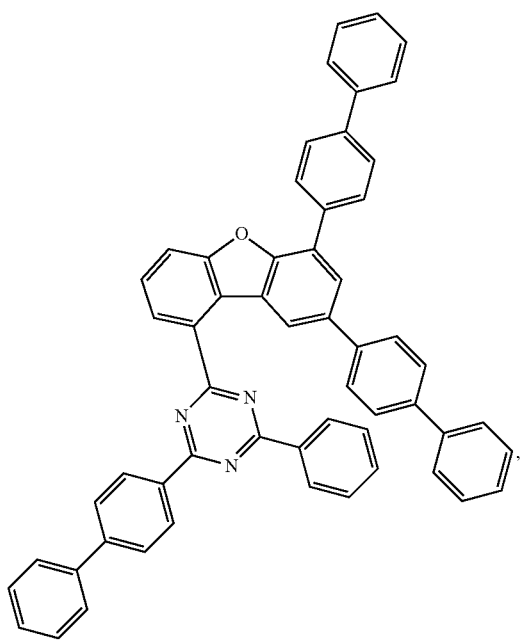
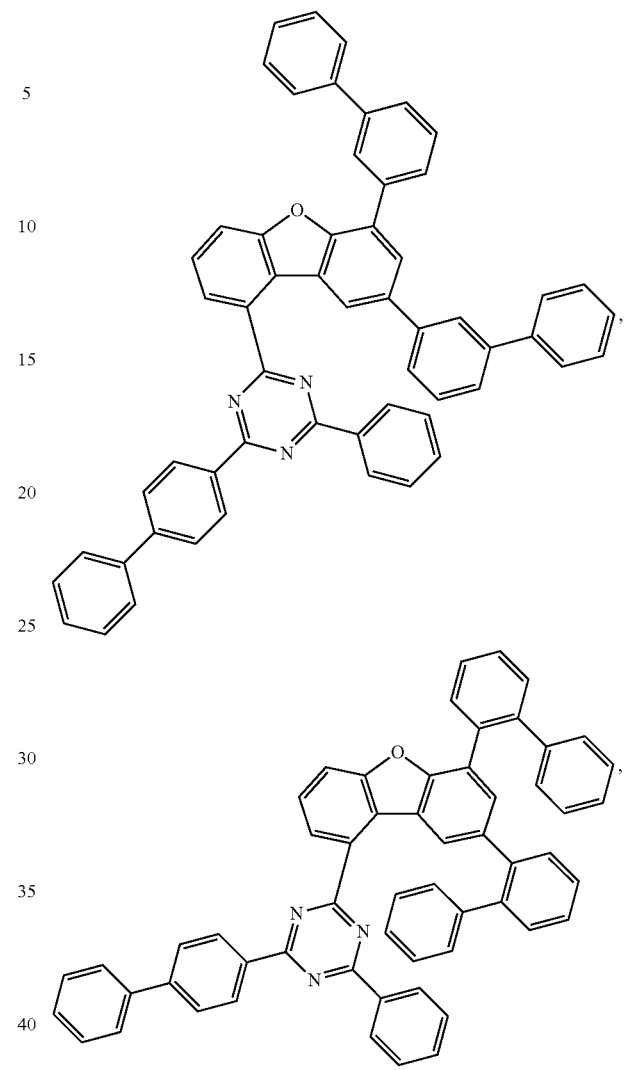
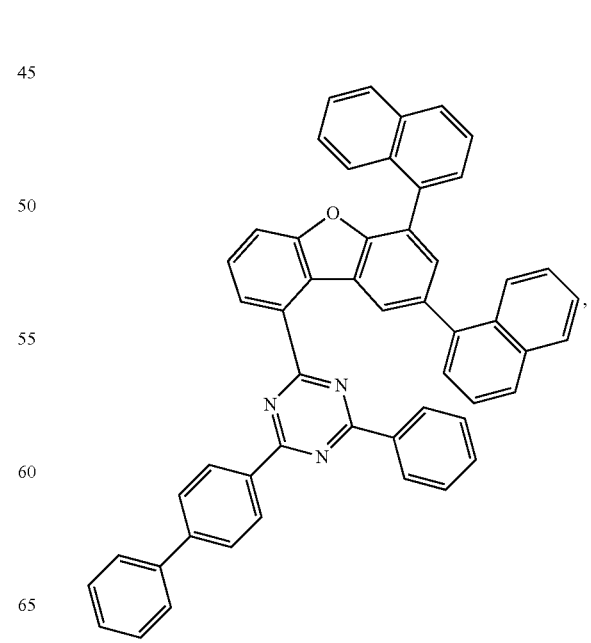

147
-continued
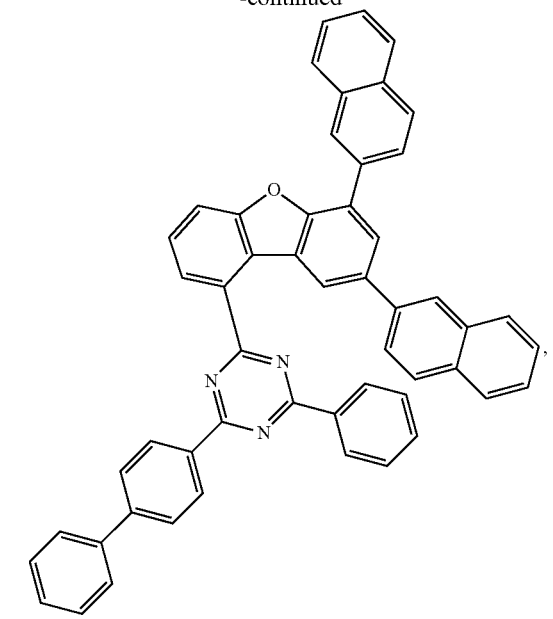
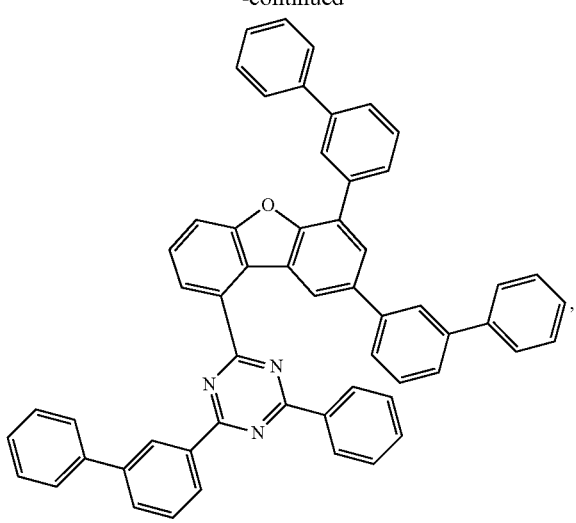
148
-continued
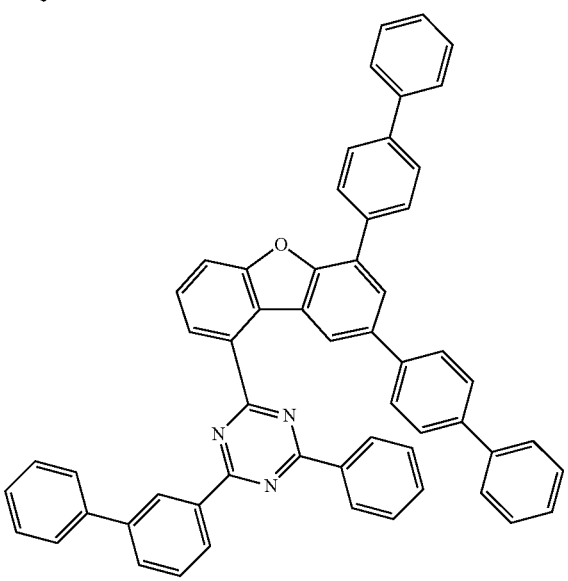
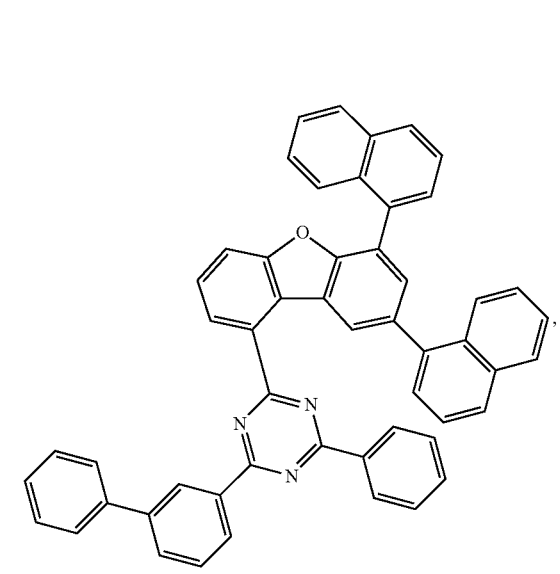

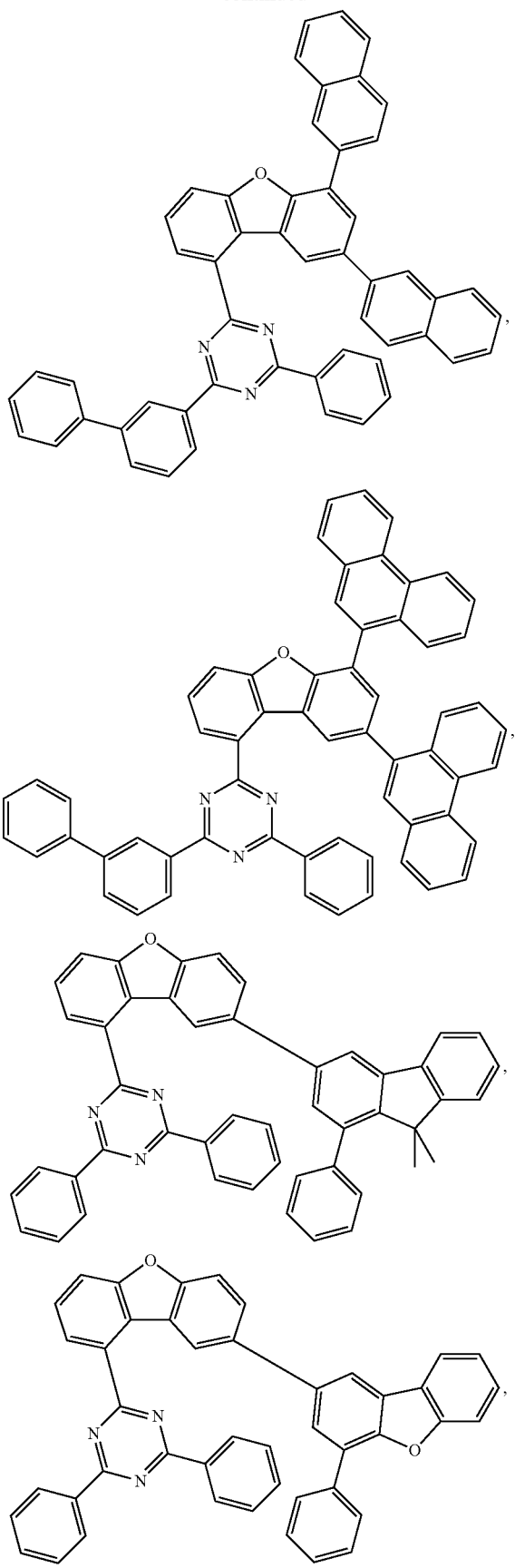

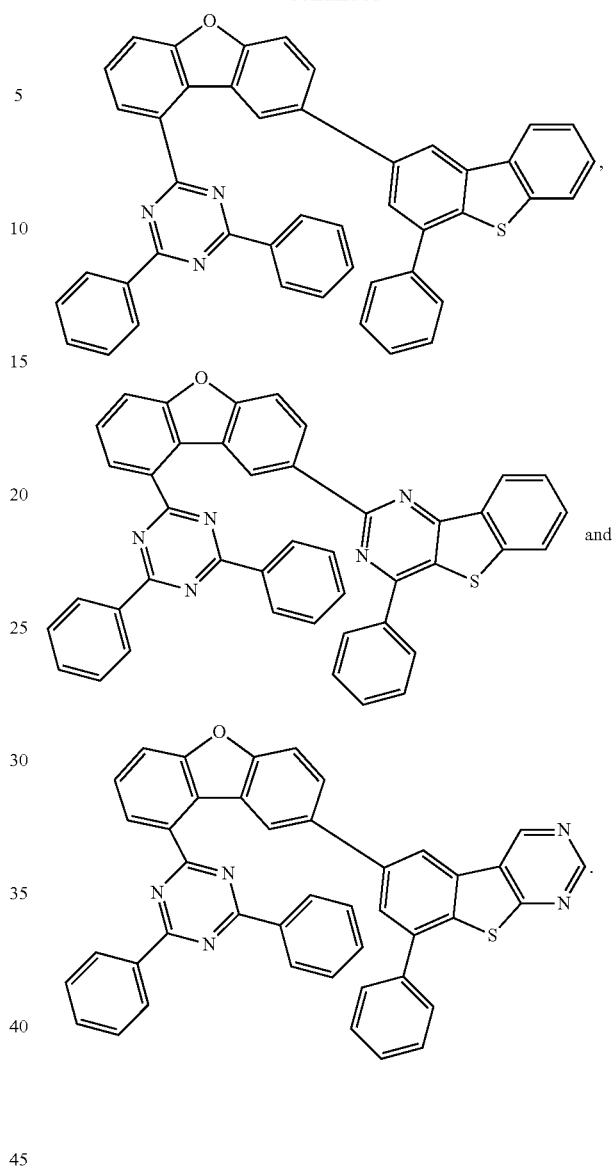

10. The organic light emitting device of claim 1, wherein $Ar^4$ to $Ar^6$ are each independently a monovalent residue derived from an arena which is selected from the group consisting of benzene, biphenyl, terphenyl, naphthalene, phenanthrene, triphenylene, 9,9-dimethylfluorene, 9,9-diphenylfluorene, and spiro[fluorene-9,9′-fluorene].

11. The organic light emitting device of claim 1, wherein $Ar^4$ and $Ar^5$ are each independently a monovalent residue derived from an arena which is selected from the group consisting of biphenyl, terphenyl, and 9,9-dimethylfluorene.

12. The organic light emitting device of claim 1, wherein $Ar^6$ is a monovalent residue derived from an arene which is selected from the group consisting of benzene, biphenyl, terphenyl, naphthalene, phenanthrene, triphenylene, and 9,9-dimethylfluorene.

13. The organic light emitting device of claim 1, wherein the compound of Chemical Formula 2 is selected from the group consisting of the following compounds:

151
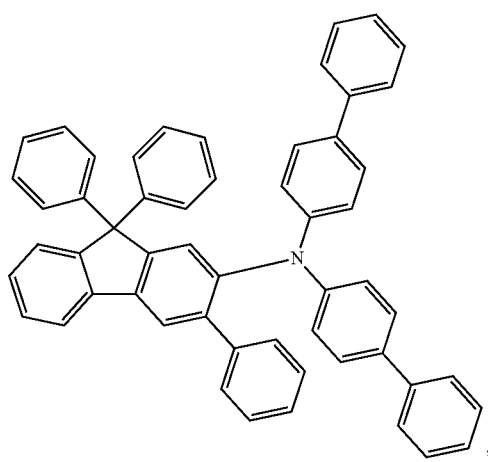
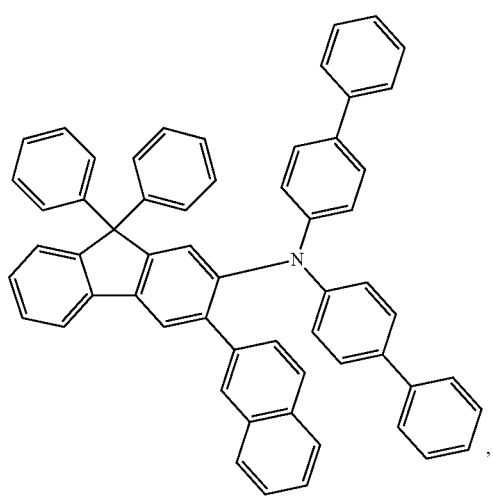
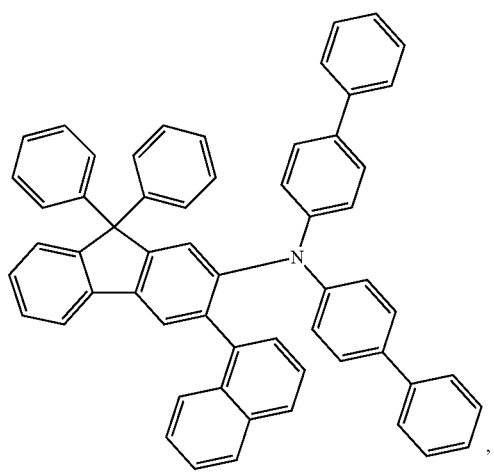
152
-continued
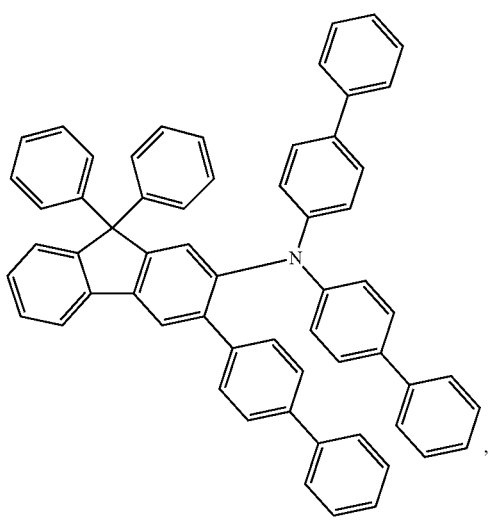
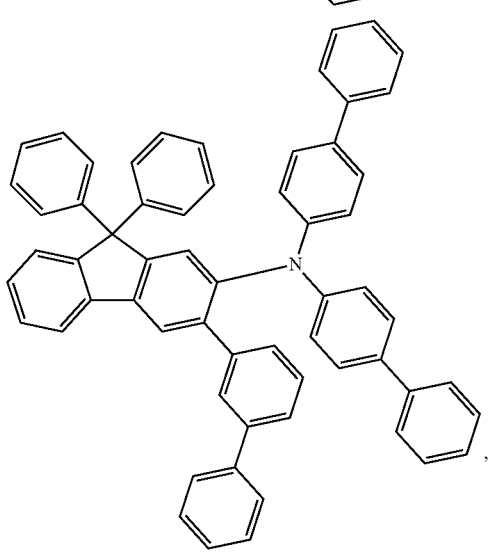
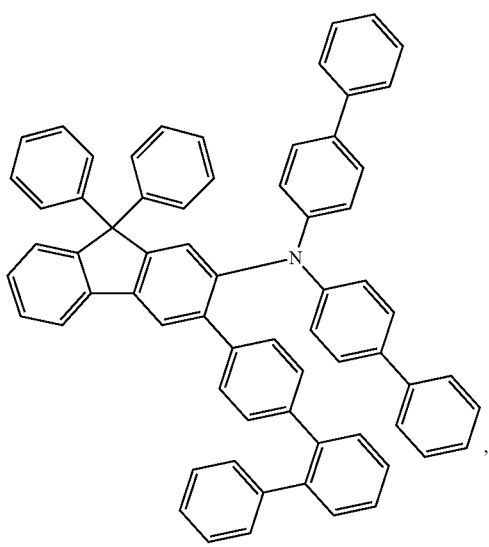

153
-continued
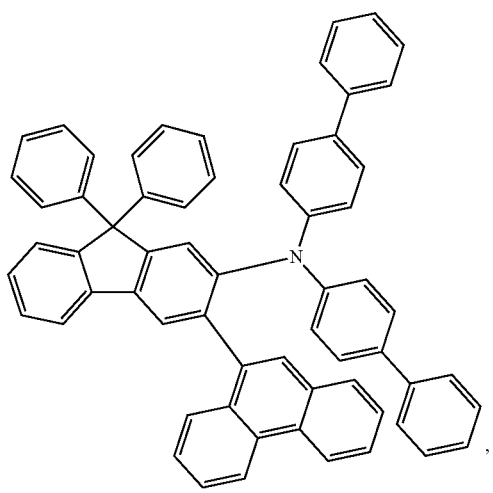
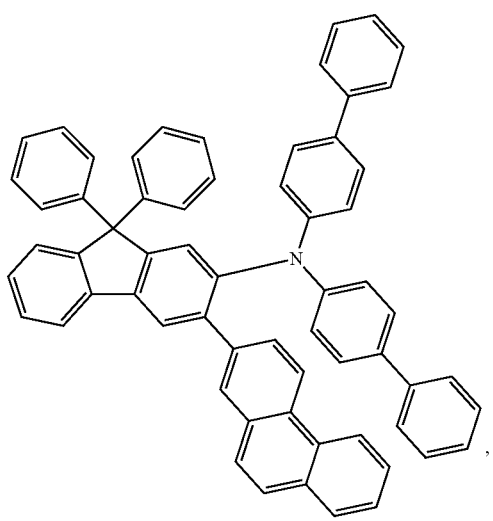
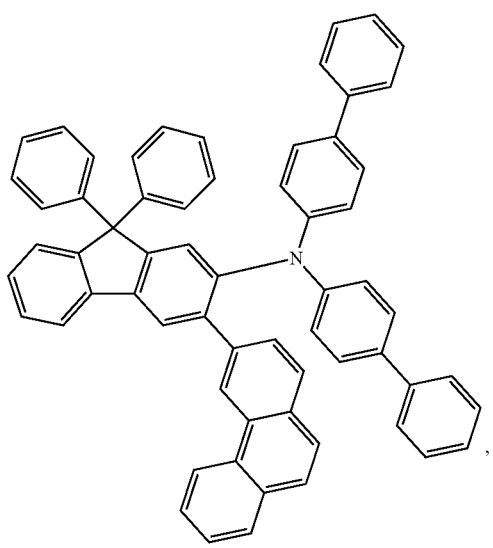
154
-continued
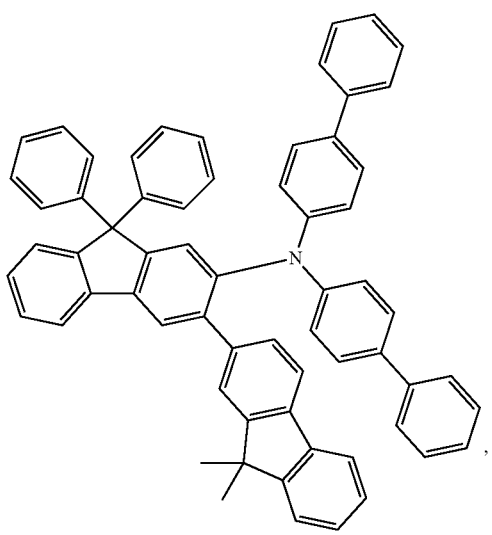
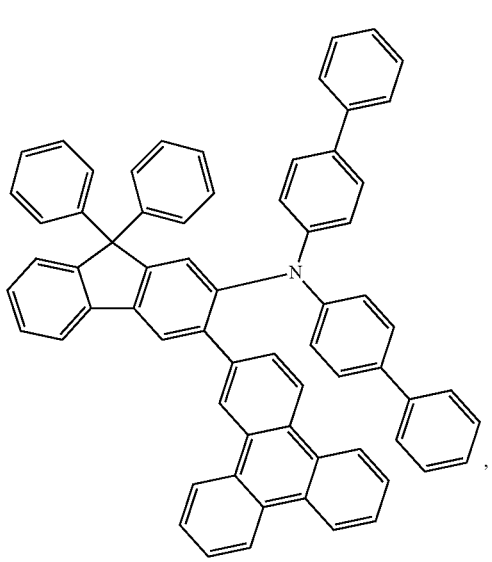
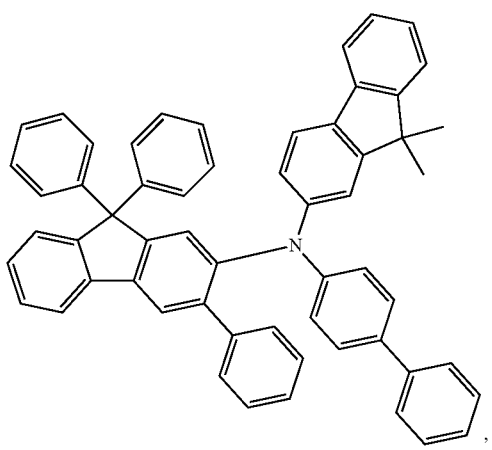

155
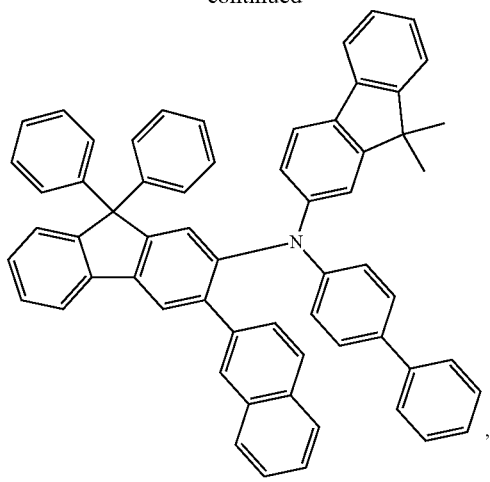
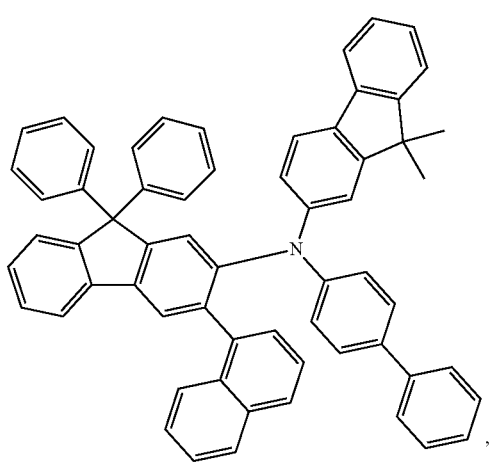
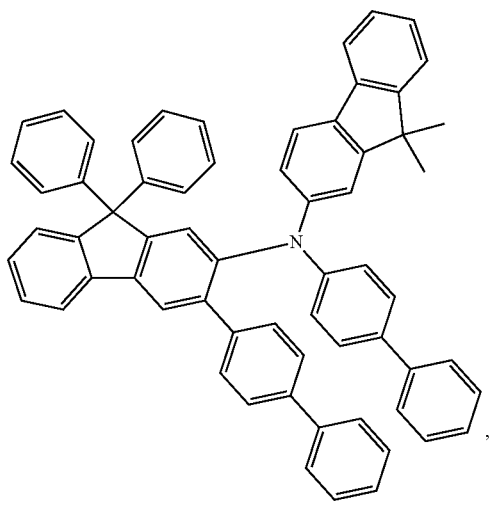
156
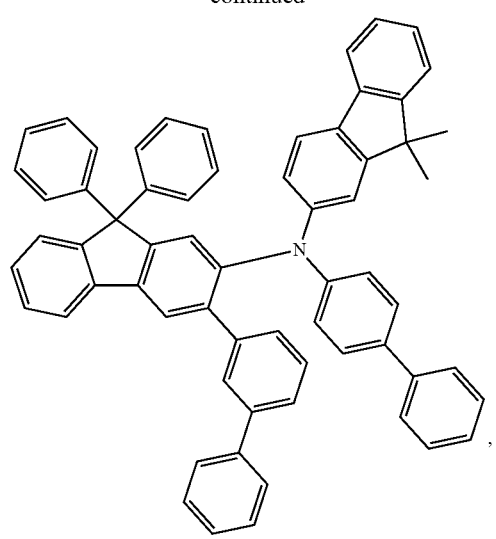
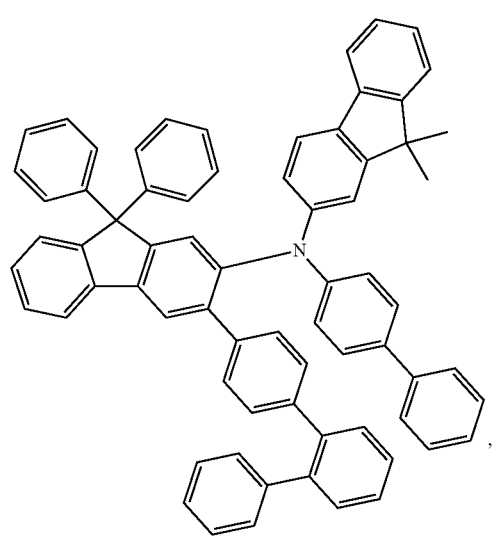
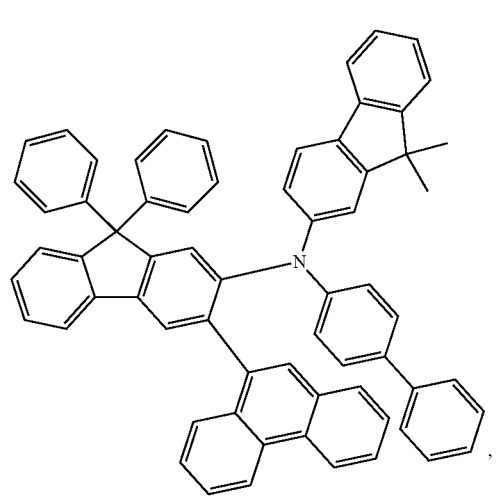

157
-continued
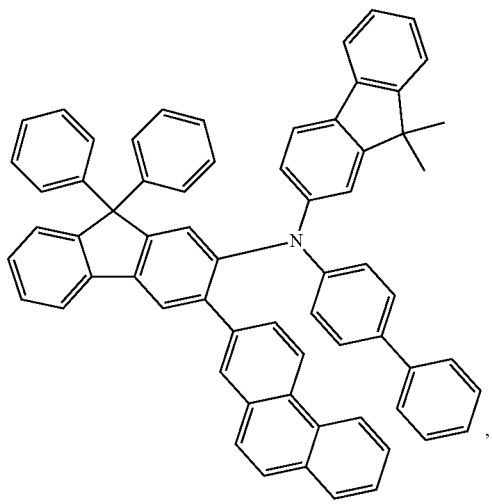
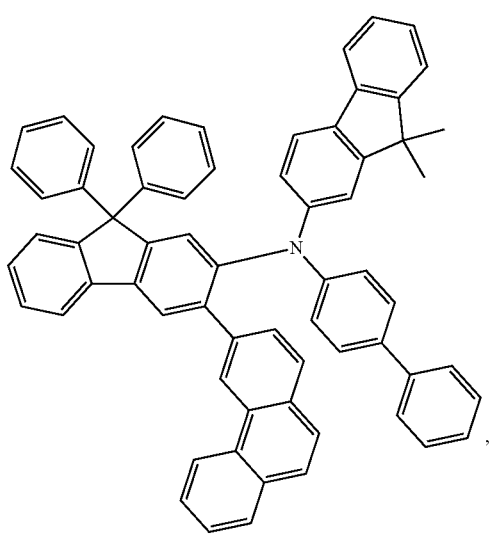
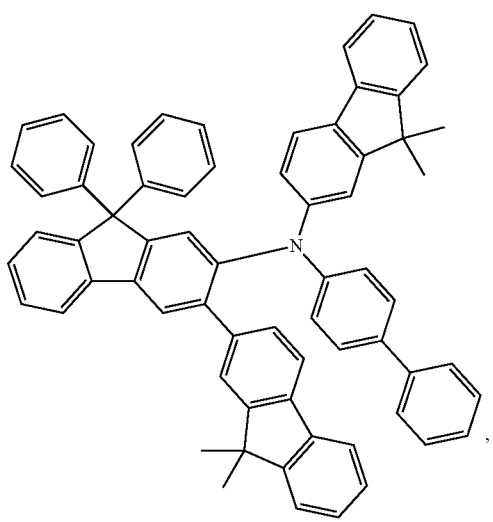
158
-continued
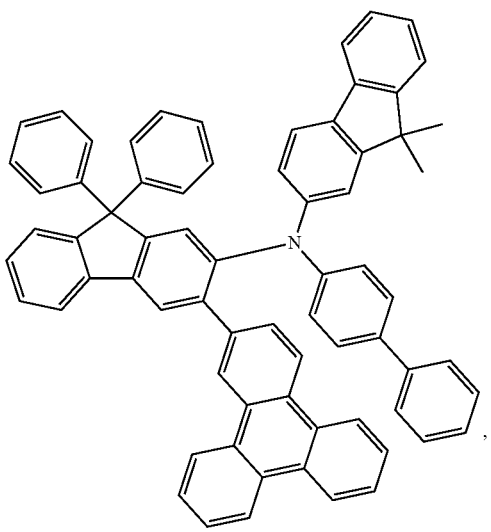
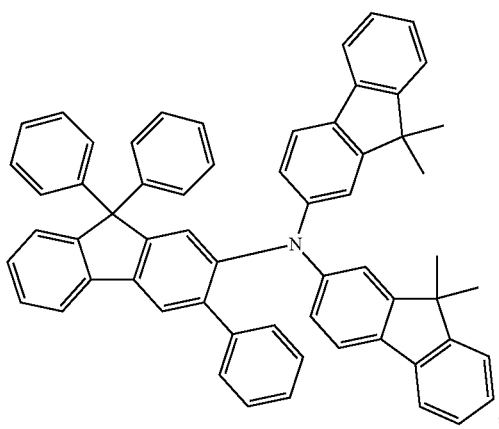
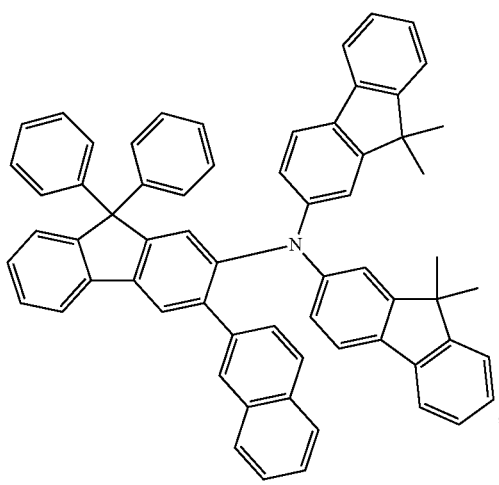

159
-continued
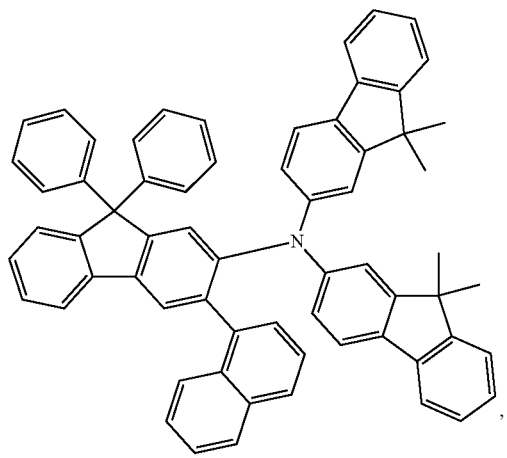
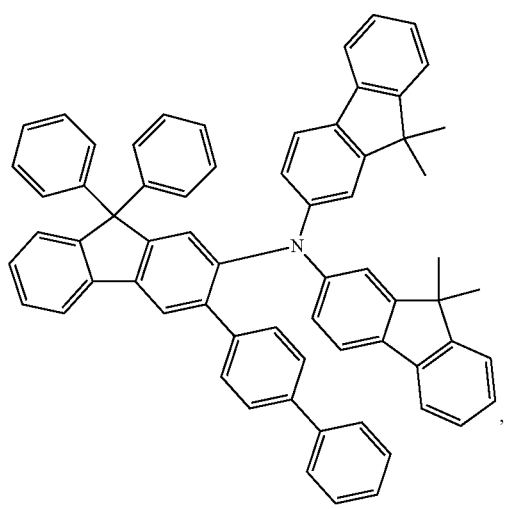
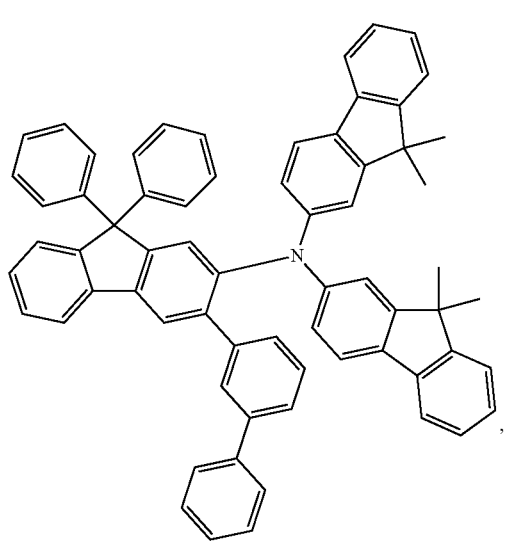
160
-continued
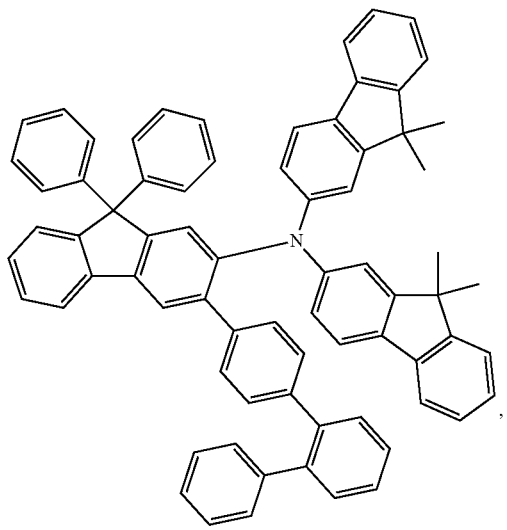
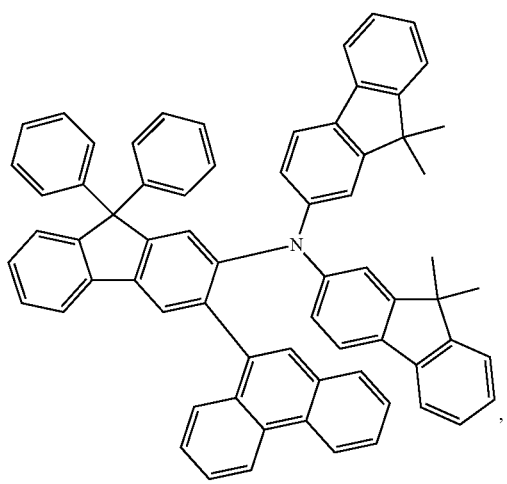

161
-continued
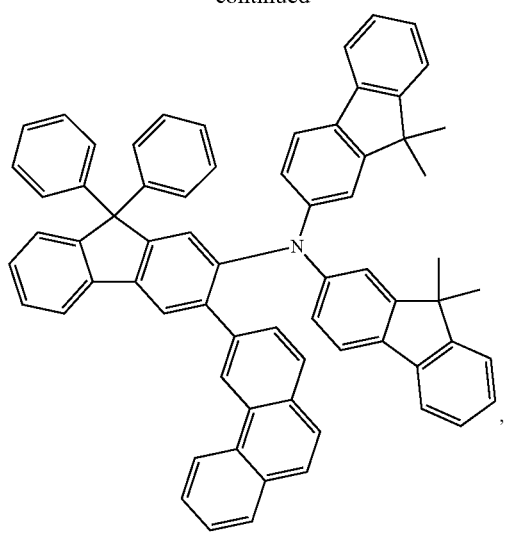
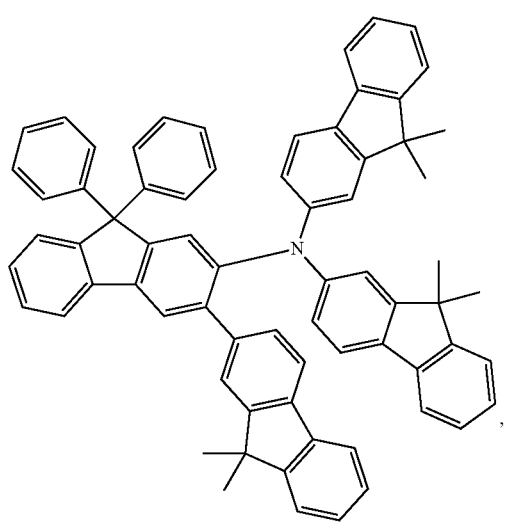
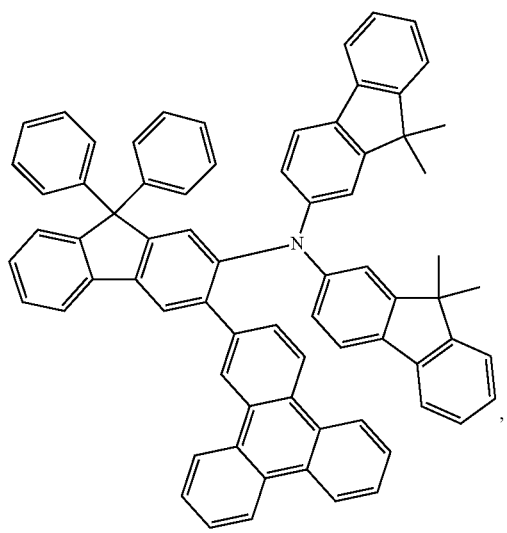
162
-continued
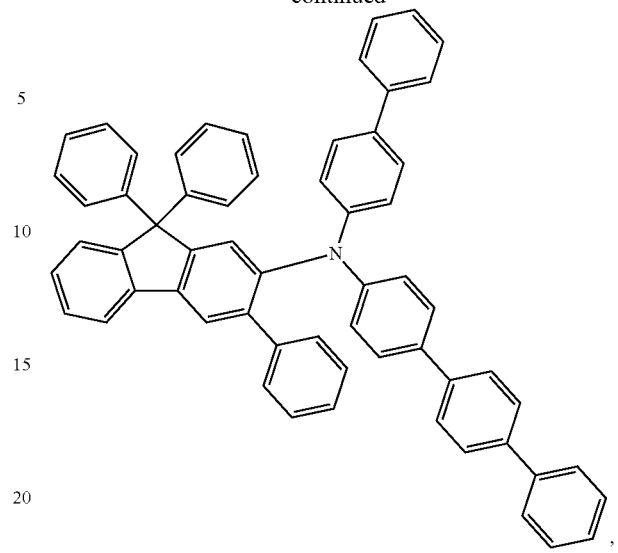
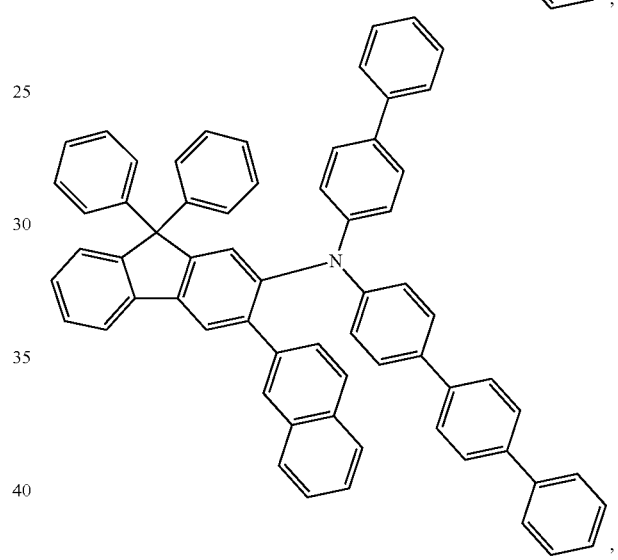
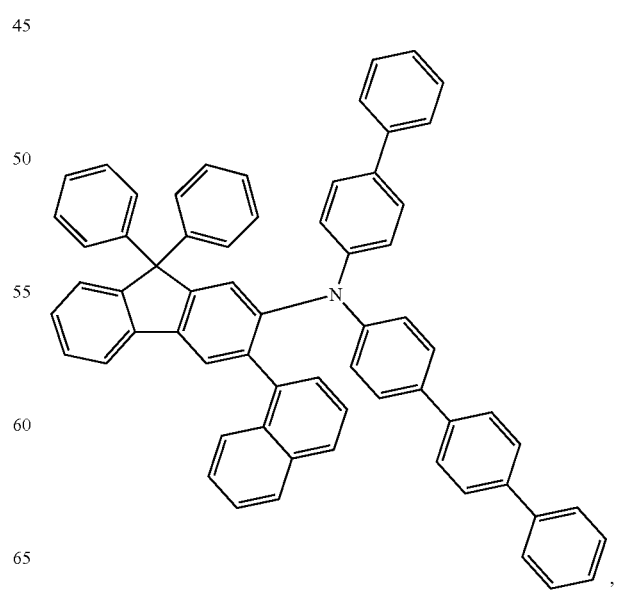

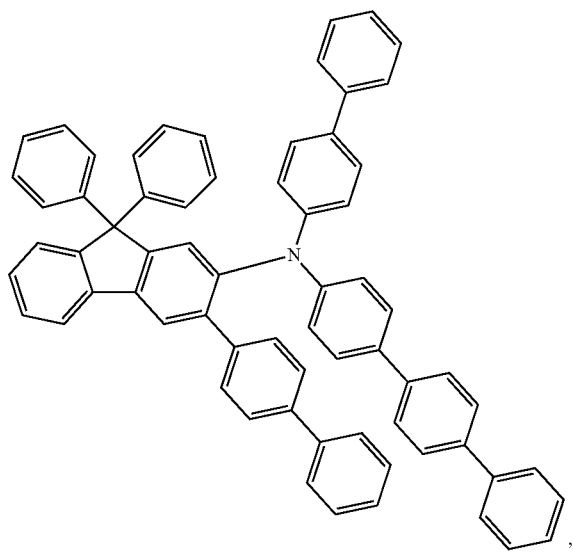
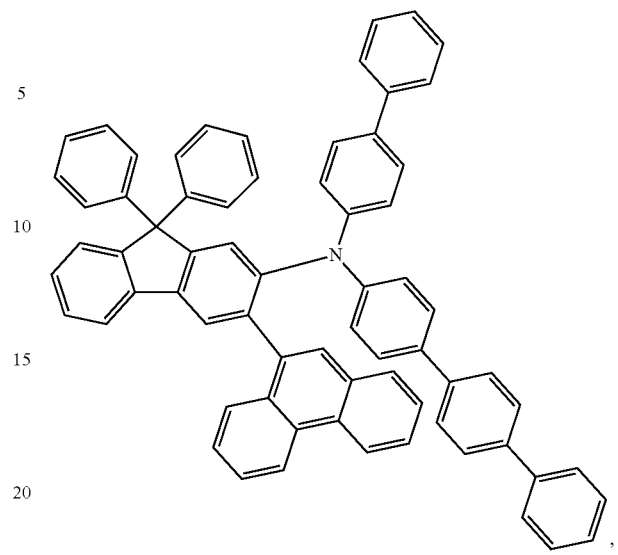
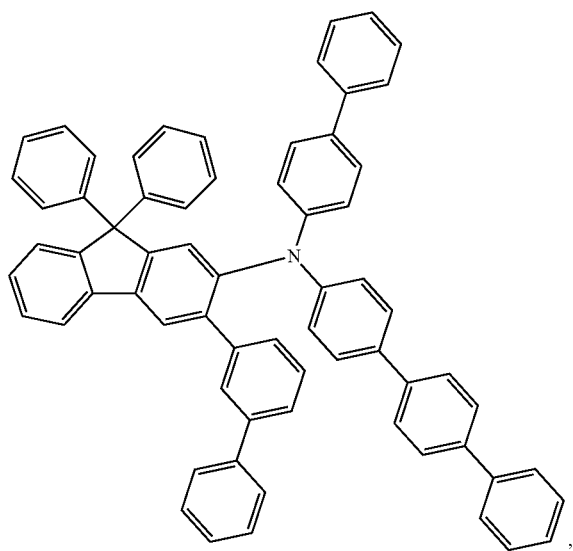
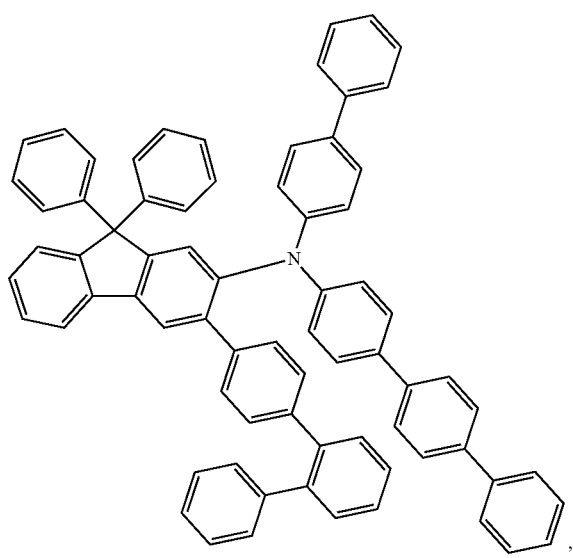

165
-continued
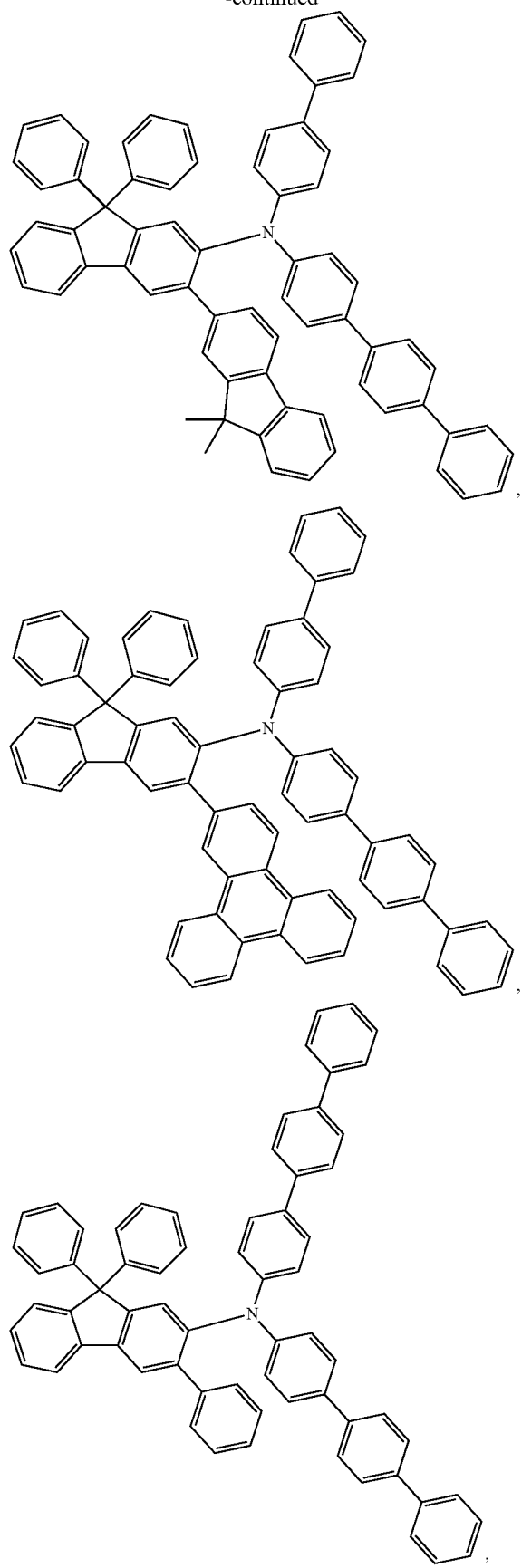
166
-continued
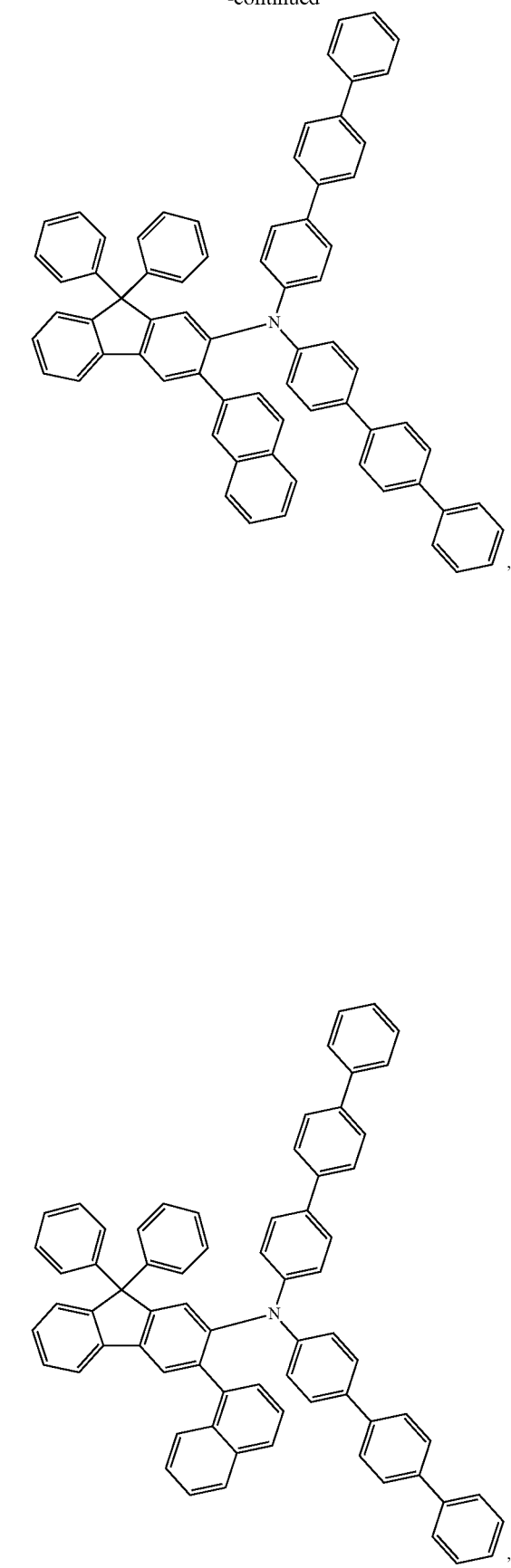

167
-continued
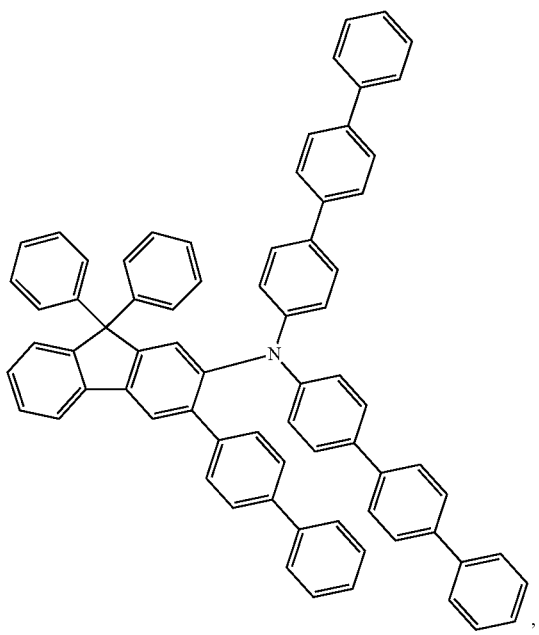
,
168
-continued
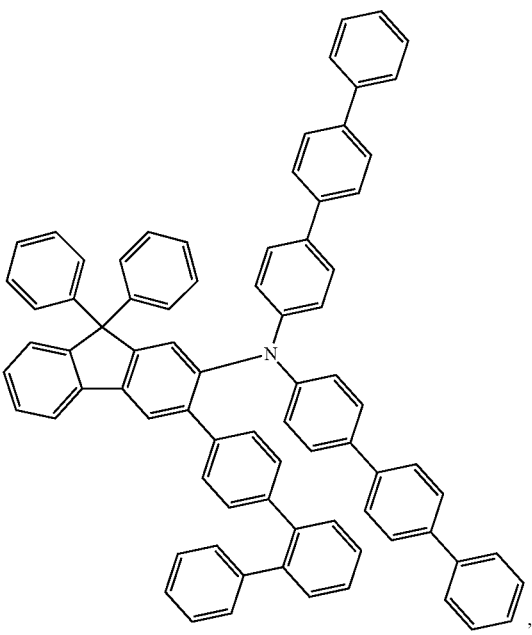
,
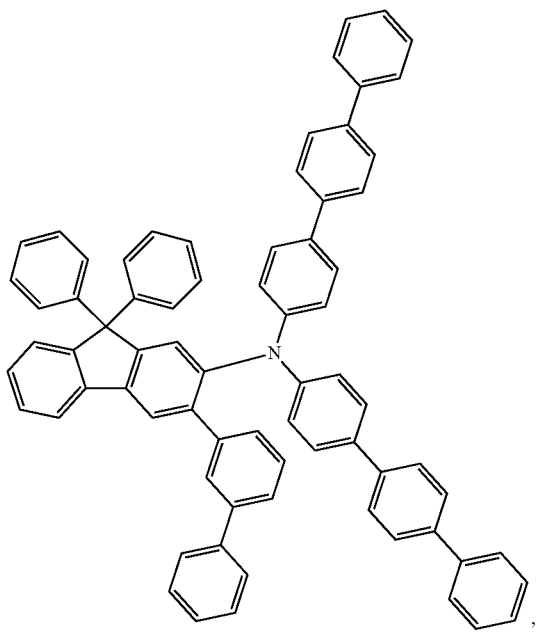
,
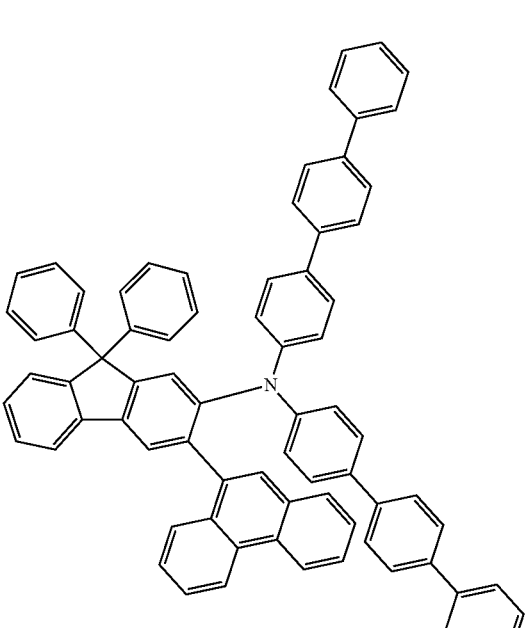
, 169
-continued
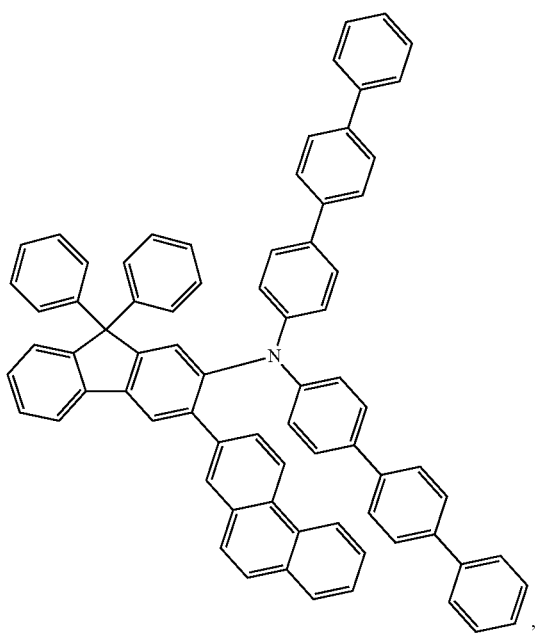
,
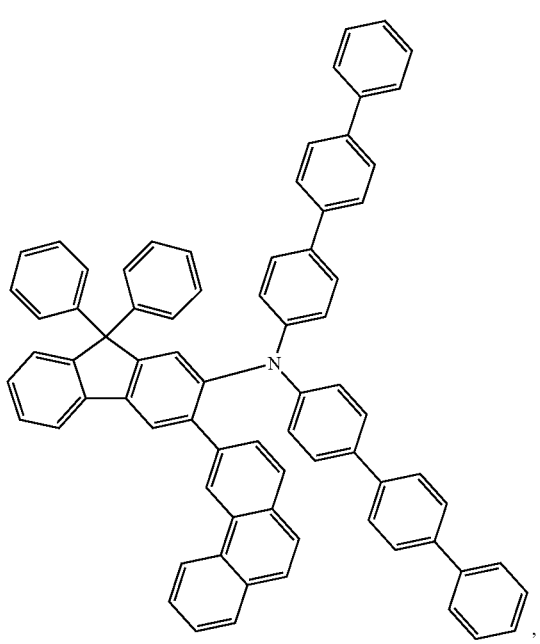
,
170
-continued
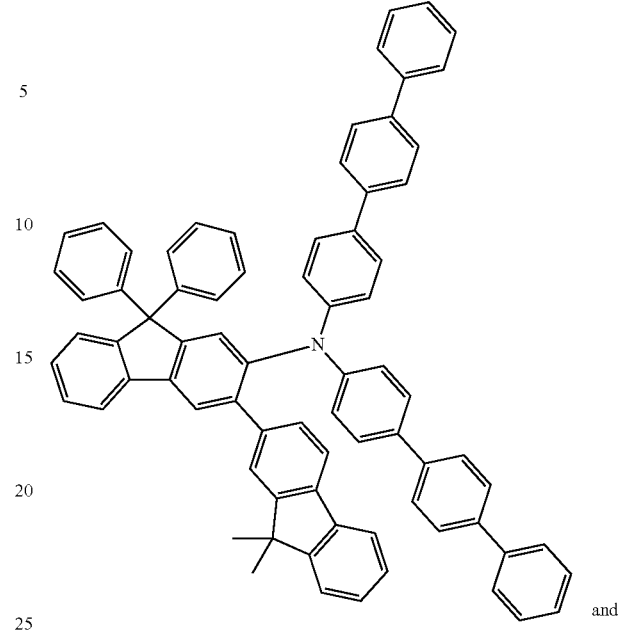
and
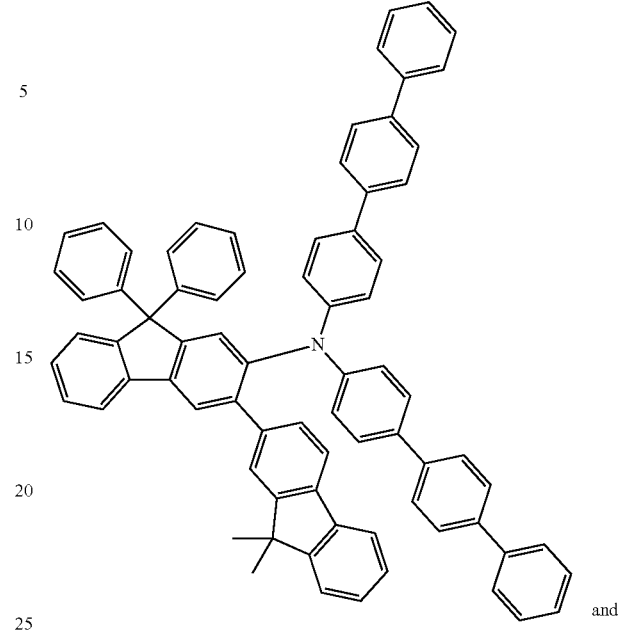
.
14. The organic light emitting device of claim 1, wherein the light emitting layer further includes a compound of the following Chemical Formula 3:

[Chemical Formula 3]

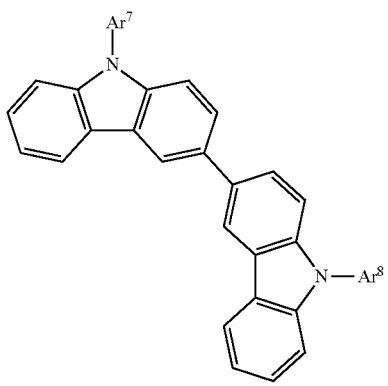

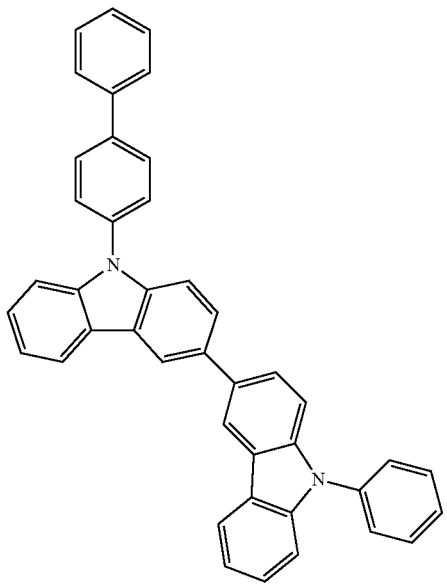

wherein in Chemical Formula 3:

Ar$^7$ and Ar$^8$ are each. independently a substituted or unsubstituted aryl group having 6 to 60 carbon atoms.

15. The organic light emitting device of claim 14, wherein Ar$^7$ and Ar$^8$ are each independently a monovalent residue derived from an arene which is selected from the group consisting of benzene, biphenyl, terphenyl, naphthalene, phenanthrene, triphenylene, 9,9-dimethylfluorene, 9,9-diphenylfluorene, spiro[fluorene-9,9'-fluorene], phenylterphenyl, phenylnaphthalene, and phenylphenanthrene.

16. The organic light emitting device of claim 14, wherein the compound of Chemical Formula 3 is selected from the group consisting of the following compounds:

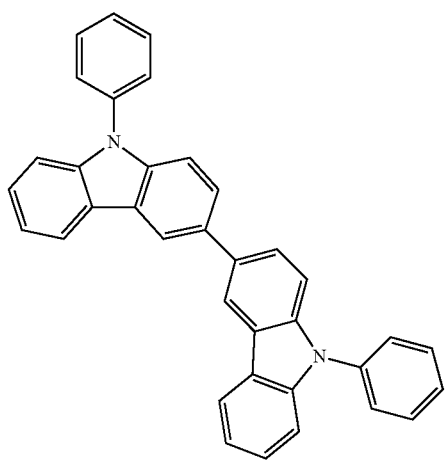

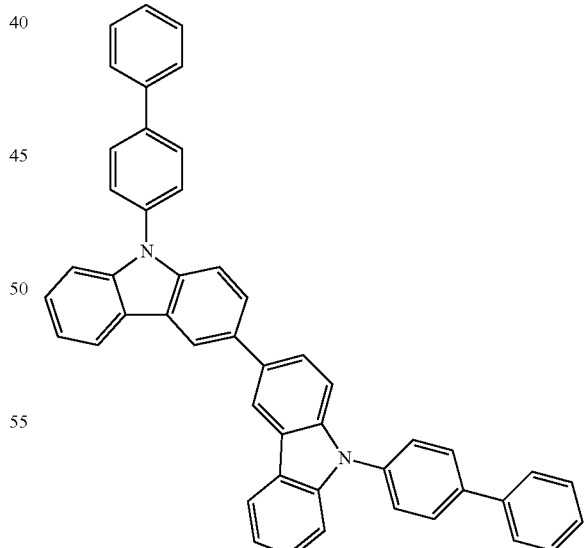

173
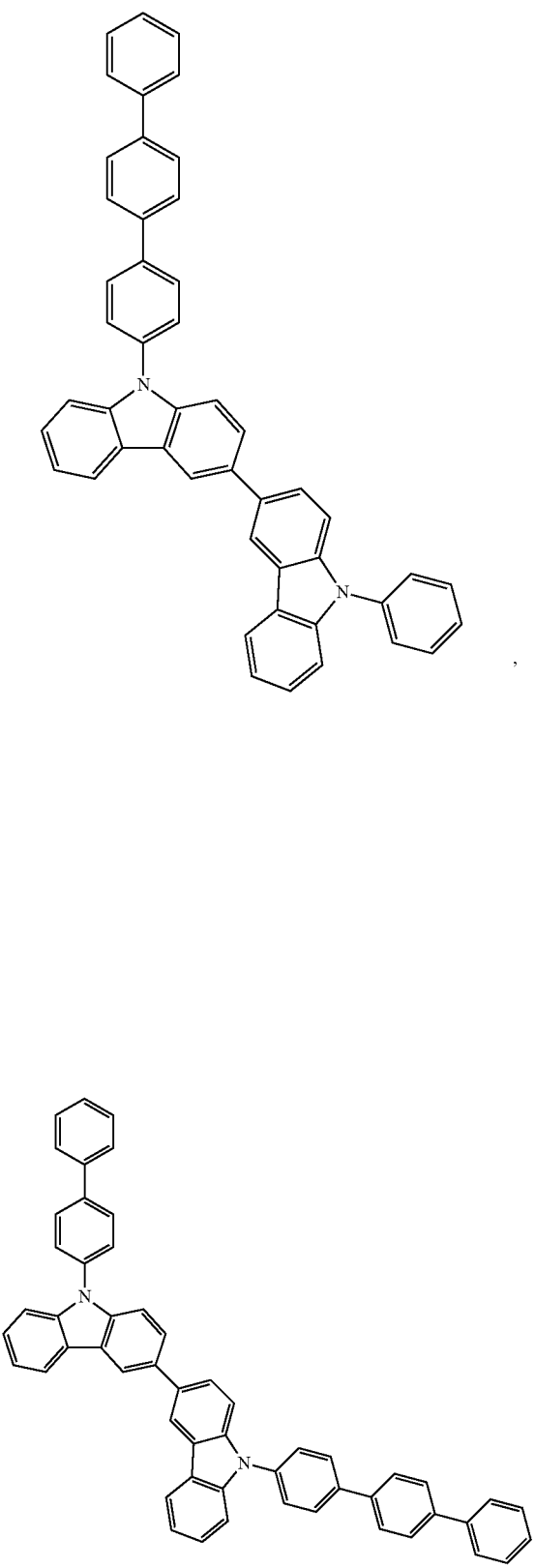
174
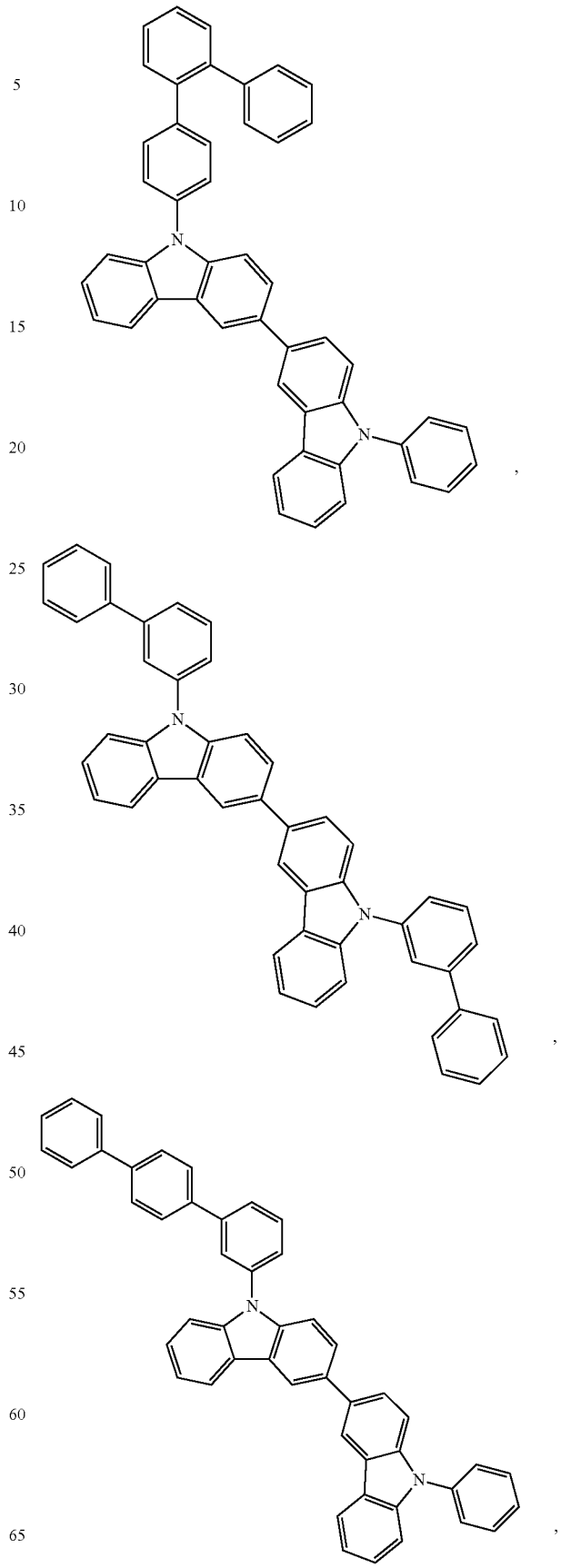

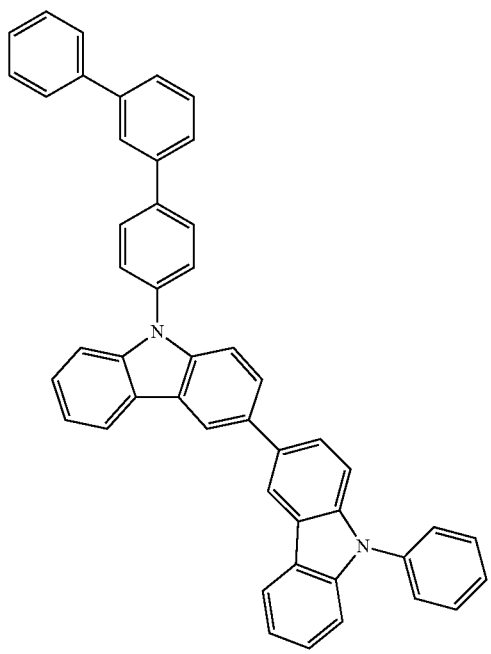
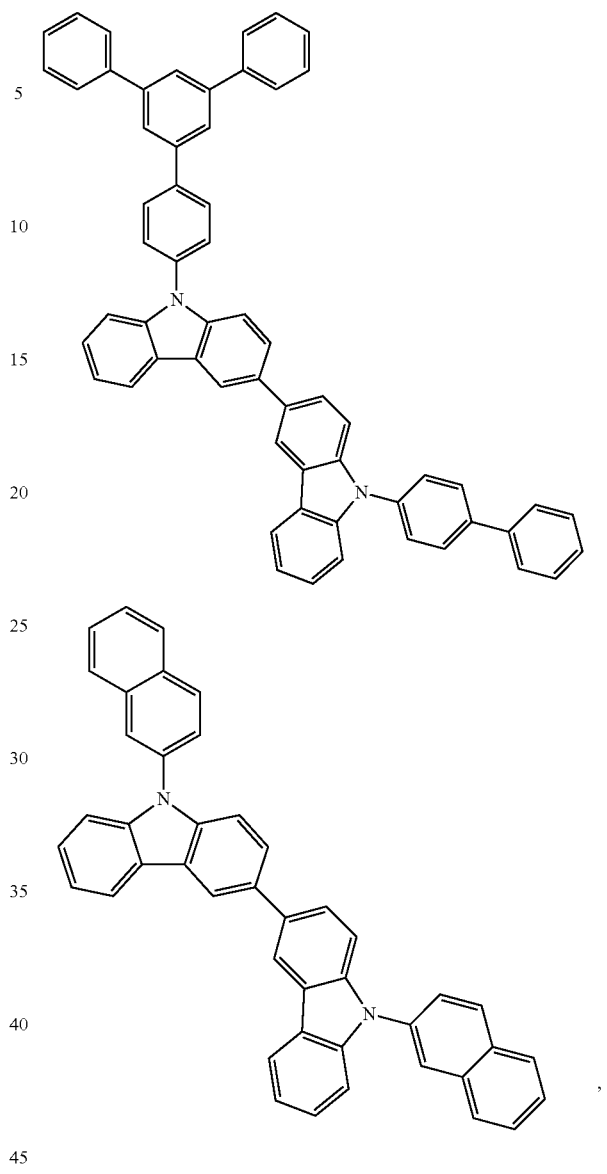
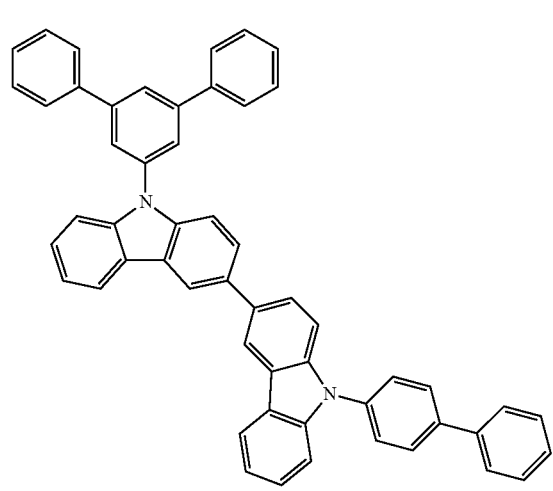

177
-continued
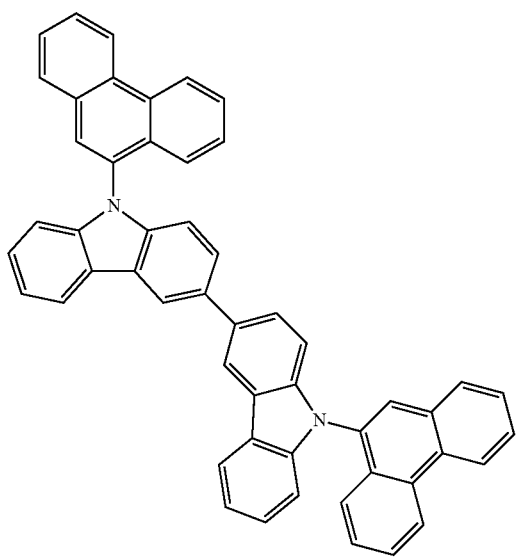
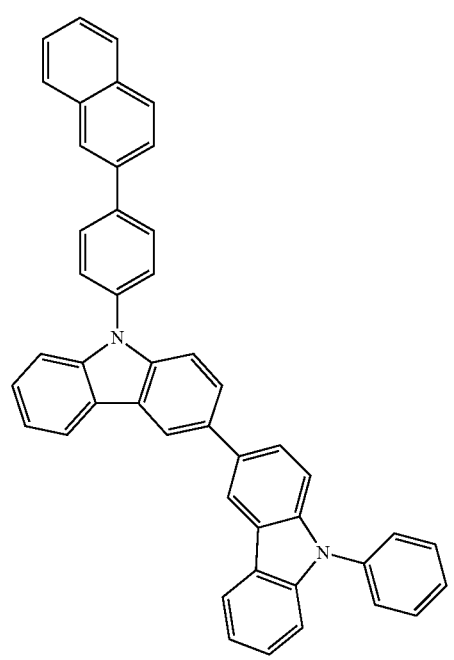
178
-continued
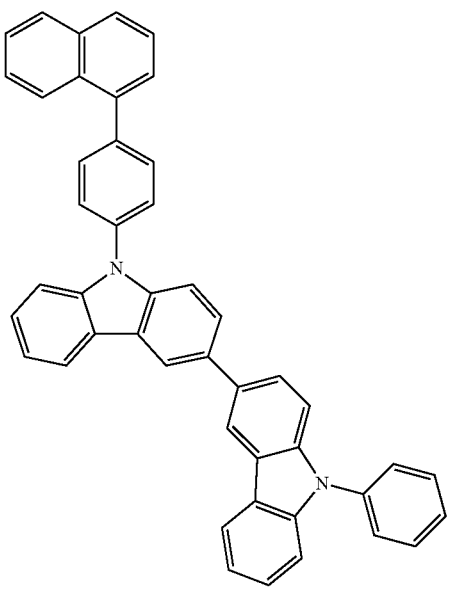
,
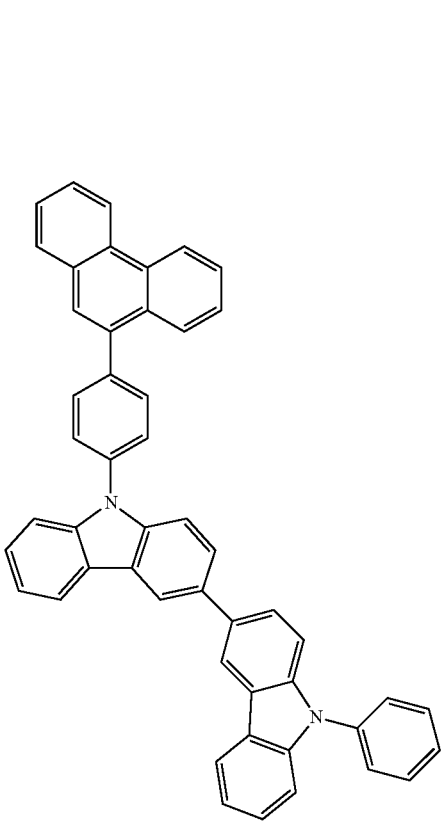
,

179
-continued
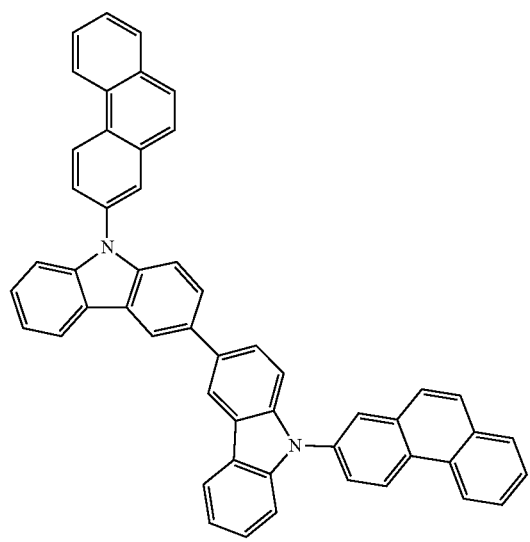
and
180
-continued
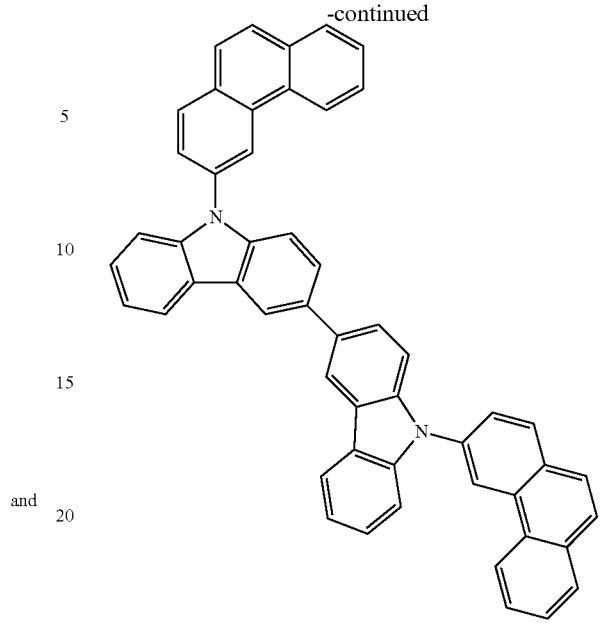
* * * * *